US012503641B2

(12) United States Patent
Li et al.

(10) Patent No.: US 12,503,641 B2
(45) Date of Patent: Dec. 23, 2025

(54) ORGANIC ELECTROLUMINESCENT DEVICE, DISPLAY PANEL AND DISPLAY DEVICE

(71) Applicant: KUNSHAN GO-VISIONOX OPTO-ELECTRONICS CO., LTD, Jiangsu (CN)

(72) Inventors: Guomeng Li, Jiangsu (CN); Yuewei Zhang, Jiangsu (CN); Xiaokang Zhou, Jiangsu (CN); Chunliang Yao, Jiangsu (CN); Qiqi Qin, Jiangsu (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 1010 days.

(21) Appl. No.: 17/580,002

(22) Filed: Jan. 20, 2022

(65) Prior Publication Data

US 2022/0149281 A1 May 12, 2022

Related U.S. Application Data

(63) Continuation of application No. PCT/CN2020/113190, filed on Sep. 3, 2020.

(30) Foreign Application Priority Data

Dec. 10, 2019 (CN) ........................ 201911260026.9

(51) Int. Cl.

| | |
|---|---|
| ***H10K 85/60*** | (2023.01) |
| ***C09K 11/06*** | (2006.01) |
| ***H10K 85/30*** | (2023.01) |
| *H10K 50/11* | (2023.01) |
| *H10K 50/12* | (2023.01) |
| *H10K 50/125* | (2023.01) |
| *H10K 50/15* | (2023.01) |
| *H10K 101/10* | (2023.01) |
| *H10K 101/20* | (2023.01) |

(52) U.S. Cl.

CPC ............ *C09K 11/06* (2013.01); *H10K 85/324* (2023.02); *H10K 85/622* (2023.02); *H10K 85/624* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/121* (2023.02); *H10K 50/125* (2023.02); *H10K 50/15* (2023.02); *H10K 2101/10* (2023.02); *H10K 2101/20* (2023.02)

(58) Field of Classification Search

None

See application file for complete search history.

(56) References Cited

U.S. PATENT DOCUMENTS

2019/0341571 A1 11/2019 Liaptsis et al.

FOREIGN PATENT DOCUMENTS

| | | | | | |
|---|---|---|---|---|---|
| CN | 106654034 A | | 5/2017 | | |
| CN | 109256474 A | | 1/2019 | | |
| CN | 109273614 A | * | 1/2019 | | ............ C07F 7/0807 |
| CN | 109659442 A | | 4/2019 | | |
| CN | 110003194 A | | 7/2019 | | |
| CN | 110003208 A | | 7/2019 | | |
| CN | 111029477 A | | 4/2020 | | |
| IN | 110407859 A | | 11/2019 | | |

OTHER PUBLICATIONS

Zhang, Dongdong, et al. "Blocking energy-loss pathways for ideal fluorescent organic light-emitting diodes with thermally activated delayed fluorescent sensitizers." Advanced Materials 30.6 (2018): 1705250. (Year: 2018).*

Machine translation of CN-110407859-A, translation generated Mar. 2025, 16 pages. (Year: 2025).*

Machine translation of CN-109256474-A, translation generated Mar. 2025, 9 pages. (Year: 2025).*

Machine translation of CN-109273614-A, translation generated Jun. 2025, 11 pages. (Year: 2025).*

Office Action issued on Feb. 26, 2021, in connection with corresponding Chinese Application No. 201911260026.9 (14 pp., including machine-generated English translation).

Office Action issued on Aug. 12, 2021, in connection with corresponding Chinese Application No. 201911260026.9 (14 pp., including machine-generated English translation).

International Search Report (with English Translation) and Written Opinion (with Machine Translation) issued on Dec. 3, 2020 in corresponding International Patent Application No. PCT/CN2020/113190; 11 pages.

* cited by examiner

*Primary Examiner* — Robert S Loewe

(74) *Attorney, Agent, or Firm* — Maier & Maier, PLLC

(57) ABSTRACT

The organic electroluminescent device includes a first electrode, a second electrode and an organic layer located between the first electrode and the second electrode, the organic layer includes a light-emitting layer, the light-emitting layer includes a host material, a thermally activated delayed fluorescence sensitizer and a green fluorescent dye, the green fluorescent dye includes a structure as shown in formula I. A thermally activated sensitized fluorescence technique is used, and the green fluorescent dye of a specific structure in combination with the sensitizer and the host material is used, so as to achieve the effects of narrowing the spectrum of a device and improving the green color purity. The efficiency of the organic electroluminescent device is equivalent to that of a phosphorescent green light device, so that a display panel including the organic electroluminescent device has a large display color gamut area.

18 Claims, 1 Drawing Sheet

ORGANIC ELECTROLUMINESCENT DEVICE, DISPLAY PANEL AND DISPLAY DEVICE

CROSS-REFERENCES TO RELATED APPLICATION

This is a continuation of International Patent Application No. PCT/CN2020/113190, filed Sep. 3, 2020, which claims priority to Chinese Patent Application No. 201911260026.9 filed on Dec. 10, 2019, the disclosure of which is incorporated herein by reference in its entirety.

TECHNICAL FIELD

The present application relates to the technical field of organic electroluminescence, in particular to an organic electroluminescent device, a display panel and a display device.

BACKGROUND

In the thermally activated sensitized fluorescence (TASF) system, when a thermally activated delayed fluorescence (TADF) material is used as a sensitizer, the energy of the host material is transferred to the TADF material, then the triplet state energy thereof returns to the singlet state through the reverse intersystem crossing (RISC) process, and in turn the energy is transferred to the doped fluorescent dye to emit light, which can achieve complete energy transfer from the host to the dye molecule, so that the traditional fluorescent doped dye can also break through 25% of the internal quantum efficiency limit.

At present, most of the dyes of green light organic electroluminescent devices are phosphorescent materials, of which the half-peak width is relatively wide, generally greater than 50 nm, so that the phosphorescent material device has low color purity, resulting in a smaller display color gamut area of the screen body.

Therefore, there is an urgent need in the art to develop a green light TASF device with narrow spectrum, high color purity, and high efficiency, and a display panel with a higher color gamut display area.

SUMMARY

The present application is to provide an organic electroluminescent device, in particular to a thermally activated delayed fluorescent green light device. The organic electroluminescent device uses the TASF luminescence mechanism and is matched with a specific fluorescent dye to realize green light emission with narrow spectrum and high color purity, and the device efficiency is relatively high.

In a first aspect, the present application provides an organic electroluminescent device which comprises a first electrode, a second electrode and an organic layer located between the first electrode and the second electrode;

the organic layer comprises a light-emitting layer, the light-emitting layer comprises a host material, a thermally activated delayed fluorescence sensitizer and a green fluorescent dye, and the green fluorescent dye comprises a structure as shown in formula I.

Preferably, the green fluorescent dye is selected from any one of following compounds as shown in C-1 to C-204.

Preferably, the energy level difference between a singlet state and a triplet state of the thermally activated delayed fluorescence sensitizer is less than or equal to 0.3 eV.

Preferably, the thermally activated delayed fluorescence sensitizer comprises one or a combination of at least two of following compounds as shown in T-1 to T-99, wherein in T-71, T-72 and T-73, n is either 1, 2 or 3 independently.

Preferably, the host material comprises one or a combination of at least two of following compounds as shown in GPH-1 to GPH-80.

Preferably, the mass ratio of the green fluorescent dye to the light-emitting layer is from 0.1% to 30%;

and/or, the mass ratio of the thermally activated delayed fluorescence sensitizer to the light-emitting layer is from 1% to 99%.

Preferably, the mass ratio of the thermally activated delayed fluorescence sensitizer to the light-emitting layer is from 10% to 50%.

Preferably, the organic layer further comprises one or a combination of at least two of a hole injection layer, a hole transport layer, an electron blocking layer, a hole blocking layer, an electron transport layer and an electron injection layer.

In a second aspect, the present application provides a display panel comprising the organic electroluminescent device as described in the first aspect.

In a third aspect, the present application provides a display device comprising the display panel as described in the second aspect.

The present application has the following beneficial effects:

The present application provides a novel organic electroluminescent device. The device uses a thermally activated sensitized fluorescence technology, utilizes its characteristic of sensitizing fluorescent materials, and selects a fluorescent dye having a structure of formula I to match the sensitizer and the host material at the same time. The fluorescent dye having a structure of formula I is a type of boron-nitrogen resonance material, which has no D-A (donor-acceptor) structure, and has a small Stokes shift and a narrow emission spectrum. The present application uses a collocation combination of such dye, host, and sensitizer to finally achieve the effects of narrowing the spectrum of the device and improving the color purity of the device, and the device has an efficiency equivalent to that of a phosphorescent device and has a higher current efficiency.

The display panel comprising the above-mentioned organic electroluminescent device provided by the present application has a larger display color gamut area.

DETAILED DESCRIPTION

Figure 1:
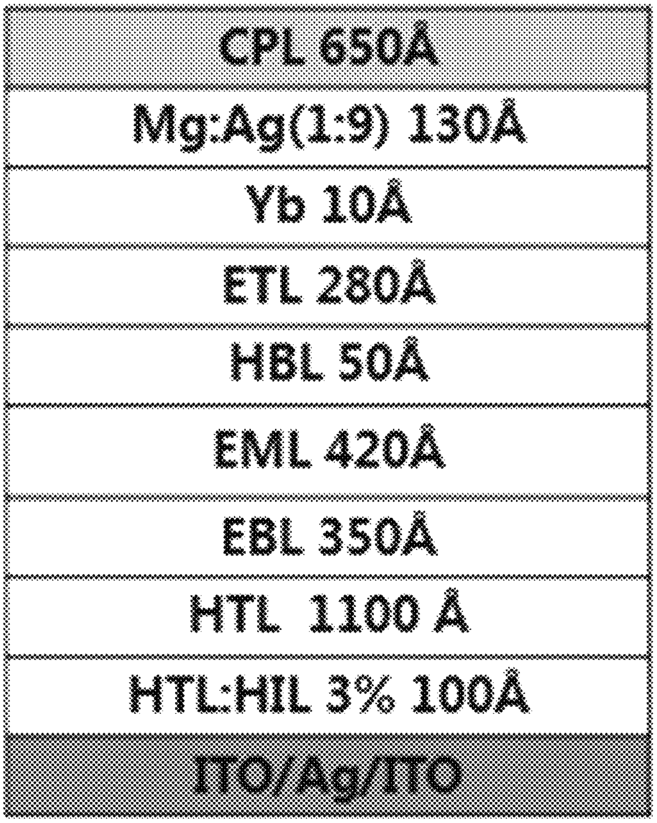
FIG. 1 is a schematic diagram of the structure of an organic electroluminescent device provided in Example 1.

In order to facilitate the understanding of the present application, the following examples are listed in the present application. It will be apparent to those skilled in the art that the examples are merely intended to facilitate the understanding of the present application and should not be construed as specific limitations to the present application.

At present, most of the dyes of green light organic electroluminescent devices are phosphorescent dyes. Due to the heavy atom effect of the phosphorescent material itself, spin-orbit coupling occurs, so that the phosphorescent material transfers a singlet state energy to its own triplet state energy through the intersystem crossing, then the triplet state energy returns to the ground state to emit light so as to achieve 100% internal quantum effect, so that the device has excellent device efficiency. However, due to the absorption of $MLCT^3$ between the heavy atoms of the phosphorescent material itself and the adjacent ligand(s), the absorption spectrum will be significantly red shifted, the half-peak width of the phosphorescent material is wider than that of the fluorescent material, generally greater than 50 nm, so that the phosphorescent material device has low color purity, resulting in a smaller display color gamut area of the screen body.

To this end, the present application provides an organic electroluminescent device which comprises a first electrode, a second electrode and an organic layer located between the first electrode and the second electrode;

the organic layer comprises a light-emitting layer (EML), the light-emitting layer comprises a host material, a thermally activated delayed fluorescence sensitizer and a green fluorescent dye, and the green fluorescent dye comprises a structure as shown in formula I:

Formula I

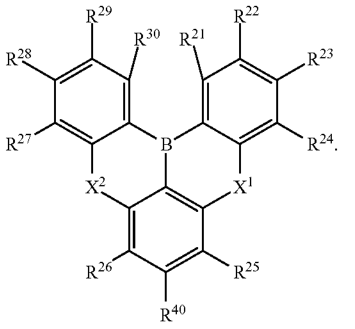

In formula I, $X^1$ is $NR^1$, $X^2$ is $NR^2$, $R^1$ and $R^2$ are respectively independently selected from one of following substituted or unsubstituted groups: C1-C10 alkyl, C6-C30 monocyclic aryl, C10-C30 fused ring aryl, C5-C30 monocyclic heteroaryl or C8-C30 fused ring heteroaryl; and IV and $R^2$ are respectively independently bonded to adjacent benzene ring through —O—, —S—,

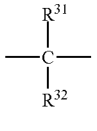

or single bond, or $R^1$ and $R^2$ are not bonded to the adjacent benzene ring;

the short straight lines appeared in the above-mentioned —O—, —S— and

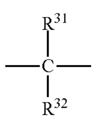

represent the connection position, rather than methyl; the above-mentioned "adjacent benzene ring" refers to the three benzene rings shown in formula I, $R^1$ and $R^2$ may or may not be bonded thereto;

$R^{21}$, $R^{22}$, $R^{23}$, $R^{24}$, $R^{25}$, $R^{26}$, $R^{27}$, $R^{28}$, $R^{29}$, $R^{30}$, $R^{31}$ and $R^{32}$ are respectively independently selected from hydrogen, deuterium or one of following substituted or unsubstituted groups: C6-C48 monocyclic aryl, C10-C48 fused ring aryl, C3-C48 monocyclic heteroaryl, C6-C48 fused ring heteroaryl, C6-C30 aryl amino, C3-C30 miscellaneous aryl amino, C1-C36 alkyl or C1-C6 alkoxyl, and $R^{21}$ to $R^{30}$ are not hydrogen at the same time, and two adjacent groups selected from $R^{21}$ to $R^{30}$ are not bonded to each other or bonded to form one of following substituted or unsubstituted groups: C1-C10 cycloalkyl, C6-C30 aryl or C5-C30 heteroaryl; and $R^{21}$ to $R^{30}$ may be bonded to each other, and $R^{21}$ to $R^{30}$ may not be bonded to each other, that is, they only exist as a single substitution;

$R^{40}$ is selected from one of substituted or unsubstituted C6-C48 monocyclic aryl, substituted or unsubstituted C10-C48 fused ring aryl, substituted or unsubstituted C3-C48 nitrogenous monocyclic heteroaryl, or substituted or unsubstituted C6-C48 nitrogenous fused ring heteroaryl;

when above-mentioned groups are substituted by substituent groups, the substituent groups are respectively independently selected from one of C1-C10 alkyl, C3-C10 cycloalkyl, C2-C10 alkenyl, C1-C6 alkoxyl, C1-C6 thioalkoxyl, C6-C30 monocyclic aryl, C10-C30 fused ring aryl, C3-C30 monocyclic heteroaryl or C6-C30 fused ring heteroaryl.

The present application provides a novel organic electroluminescent device. The device uses a thermally activated sensitized fluorescence technology, utilizes its characteristic of sensitizing fluorescent materials, and selects a fluorescent dye having a structure of formula I to match the sensitizer and the host material at the same time. The fluorescent dye having a structure of formula I is a type of boron-nitrogen resonance material. This type of material itself has no D-A structure, and has a small Stokes shift and a narrow emission spectrum. The use of a collocation combination of such dye, host and sensitizer finally achieves the effects of narrowing the spectrum of the device and improving the color purity of the device, and the device has an efficiency equivalent to that of a phosphorescent device and has a higher current efficiency.

Further, the half-peak width of the green fluorescent dye is 10 to 45 nm, for example, 15 nm, 20 nm, 25 nm, 30 nm, 35 nm, or 40 nm, etc. The narrower half-peak width can narrow the spectrum of the device and improve the color purity of green light.

Further, the green fluorescent dye is selected from any one of following compounds as shown in C-1 to C-204:

C-1
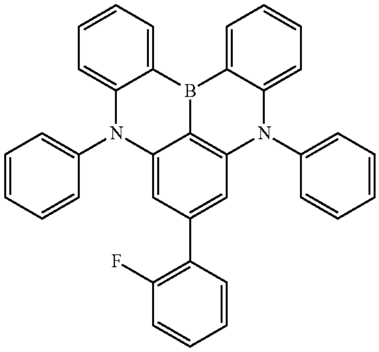
C-2
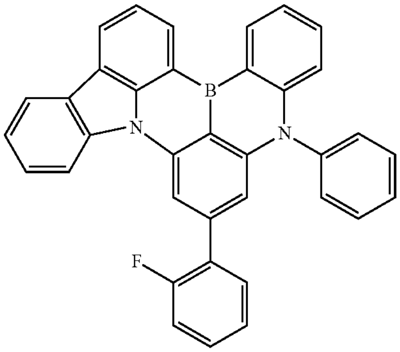
C-3
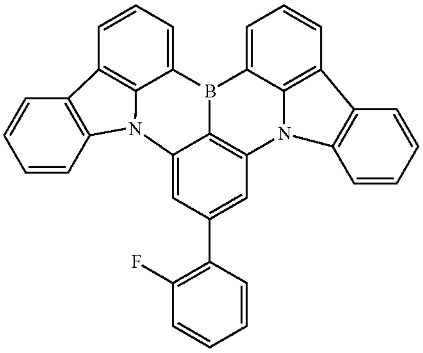
C-4
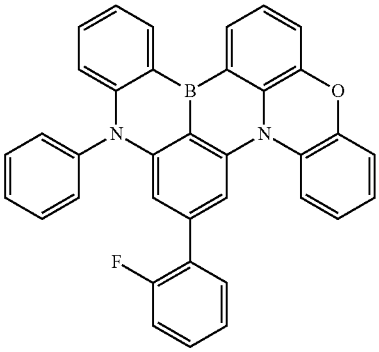
-continued
C-5
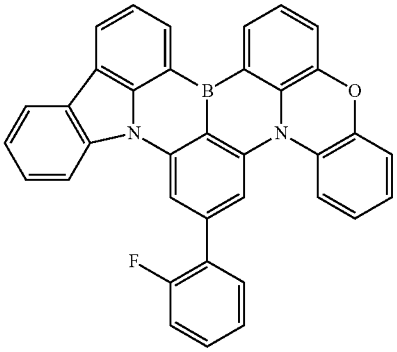
C-6
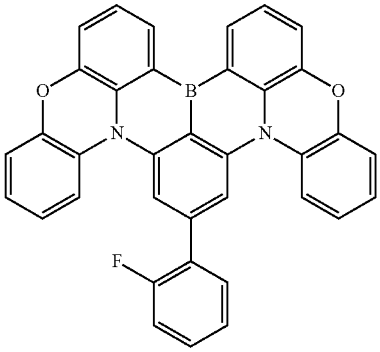
C-7
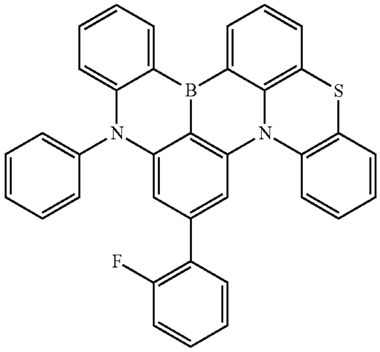
C-8
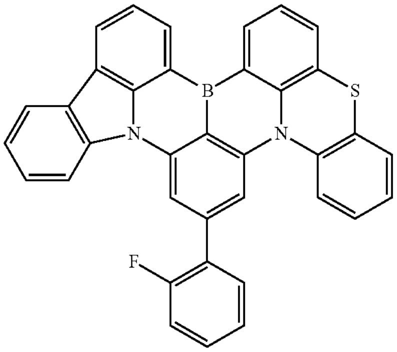

-continued
C-9
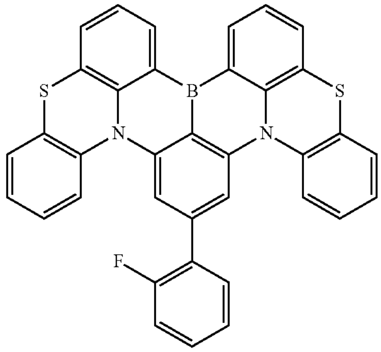
C-10
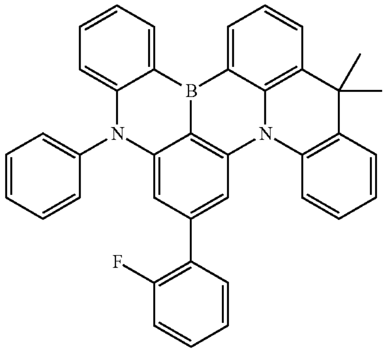
C-11
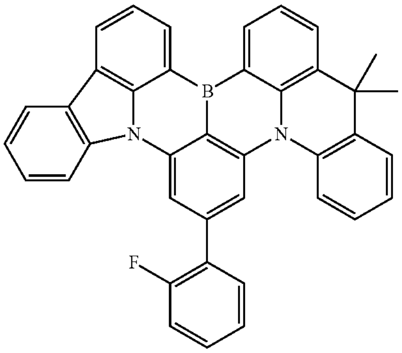
C-12
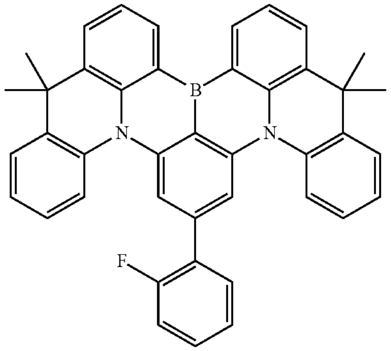
-continued
C-13
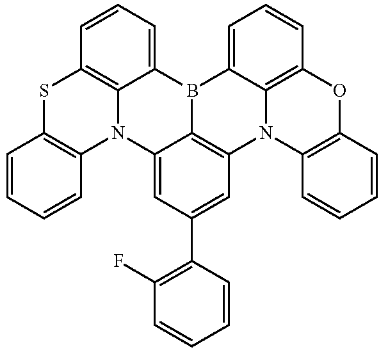
C-14
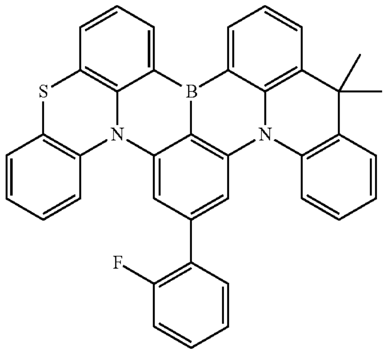
C-15
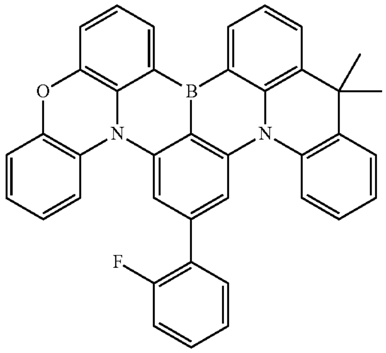
C-16
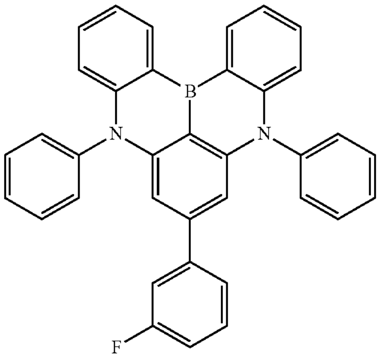

-continued
C-17
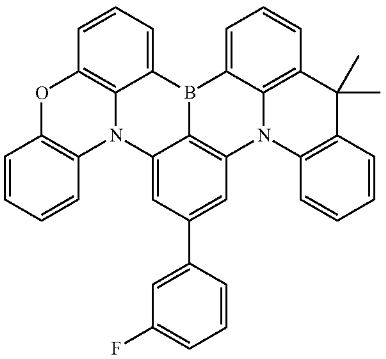
C-18
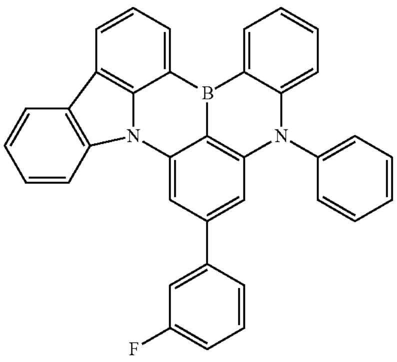
C-19
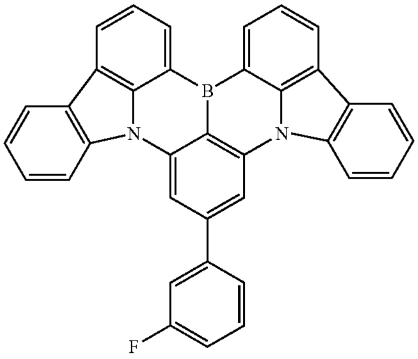
C-20
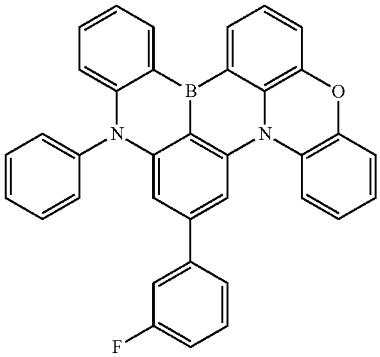
-continued
C-21
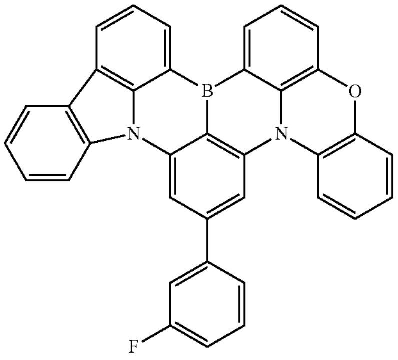
C-22
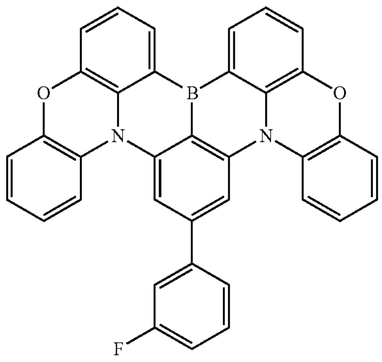
C-23
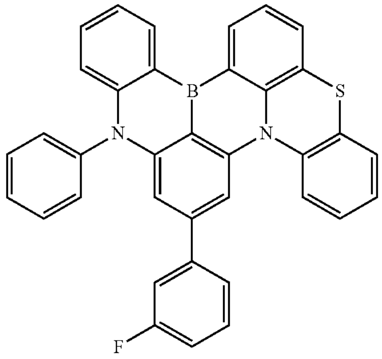
C-24
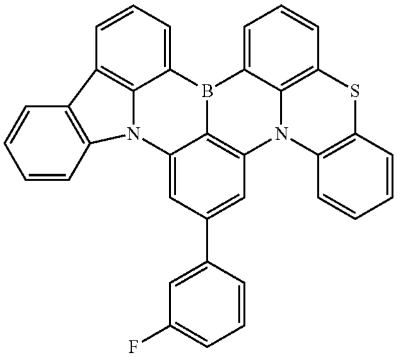

-continued
C-25
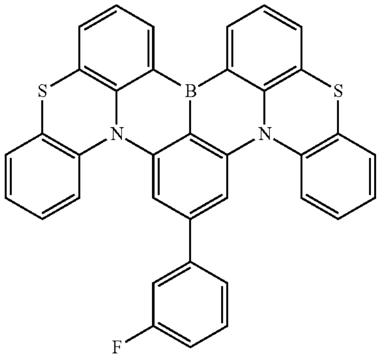
C-26
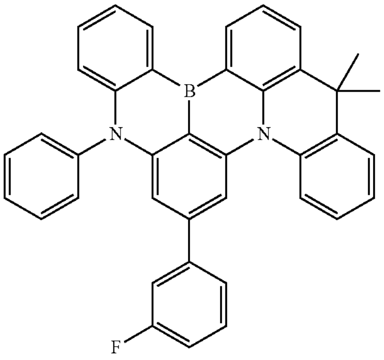
C-27
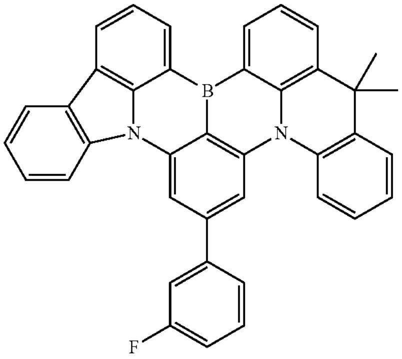
C-28
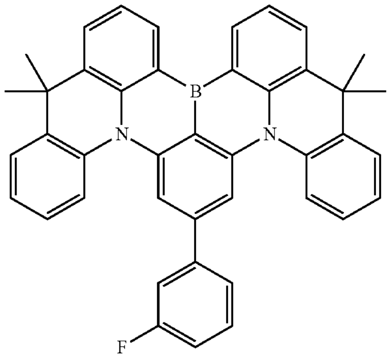
-continued
C-29
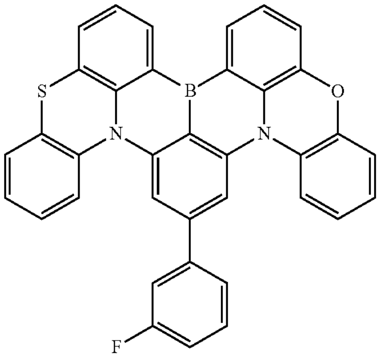
C-30
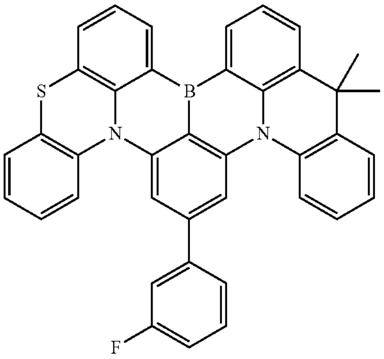
C-31
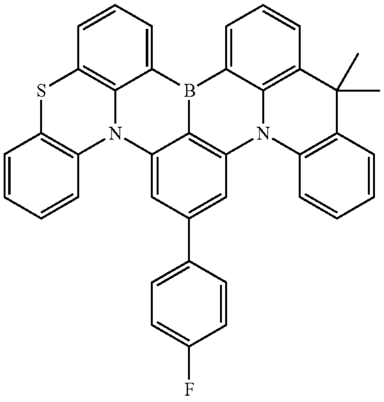
C-32
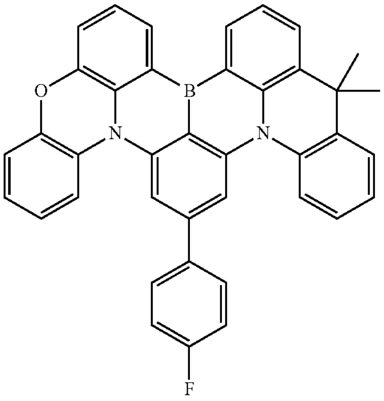

-continued
C-33
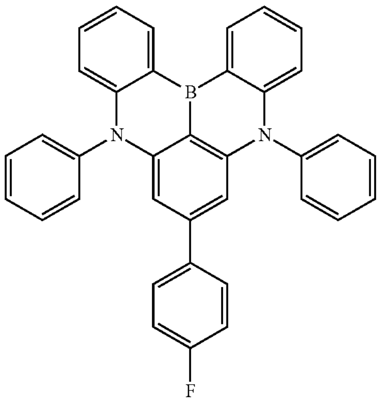
C-34
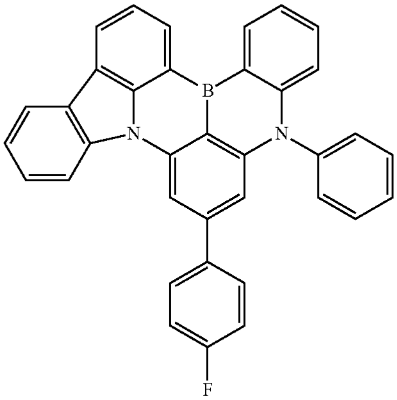
C-35
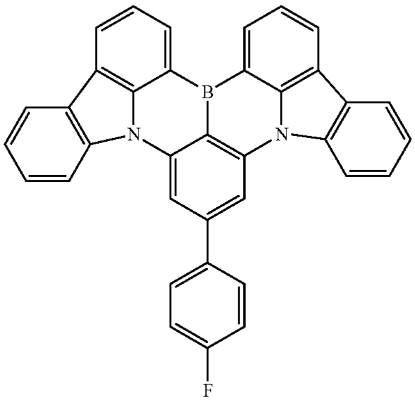
C-36
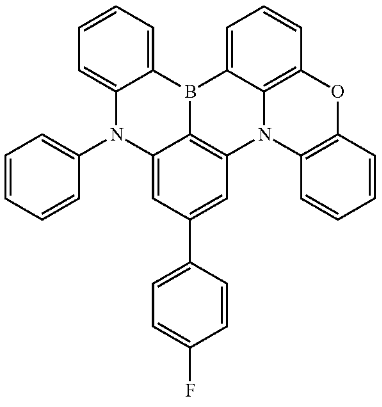
-continued
C-37
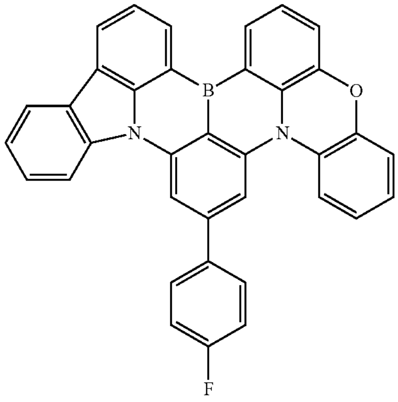
C-38
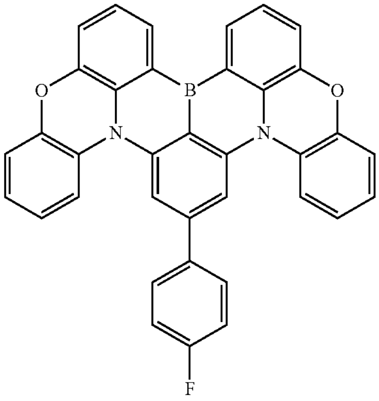
C-39
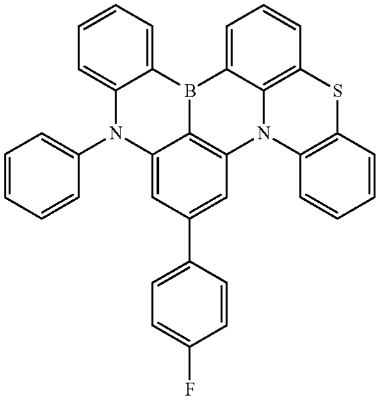
C-40
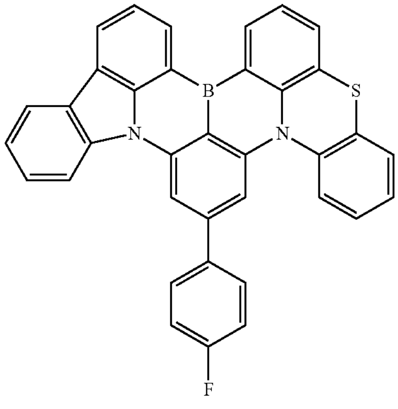

-continued
C-41
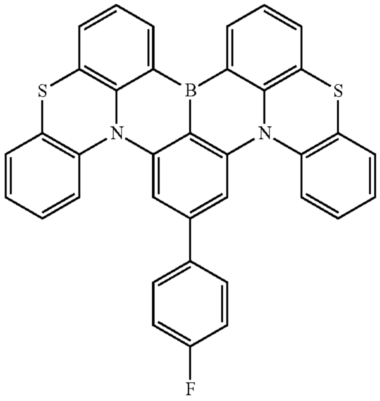
C-42
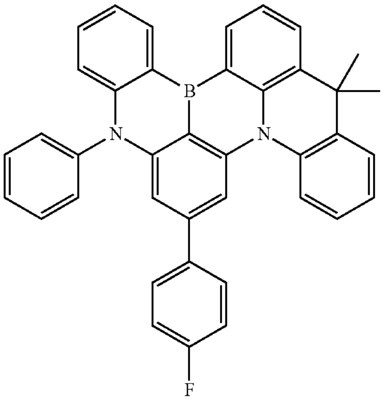
C-43
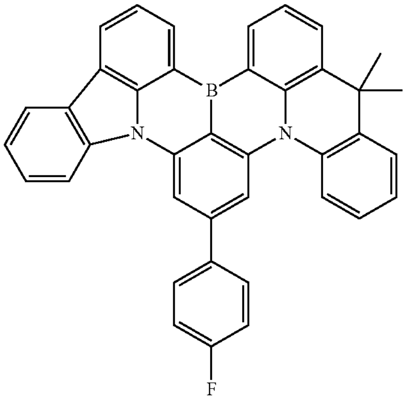
C-44
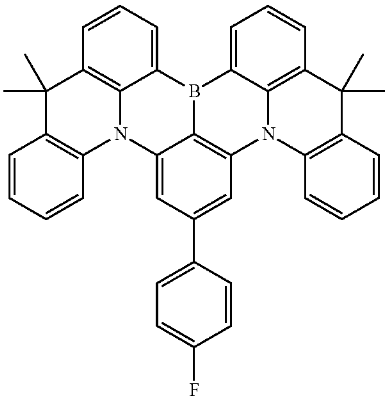
-continued
C-45
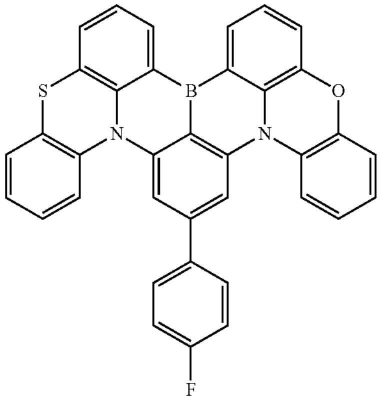
C-46
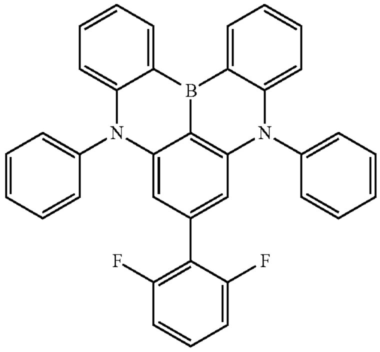
C-47
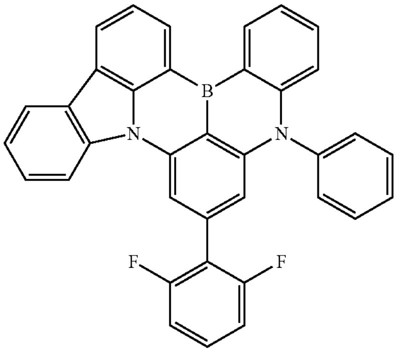
C-48
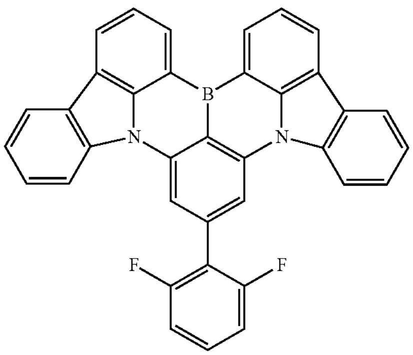

C-49
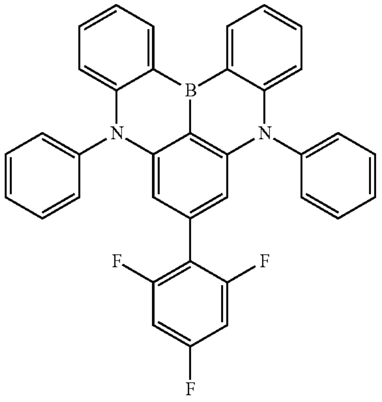
C-50
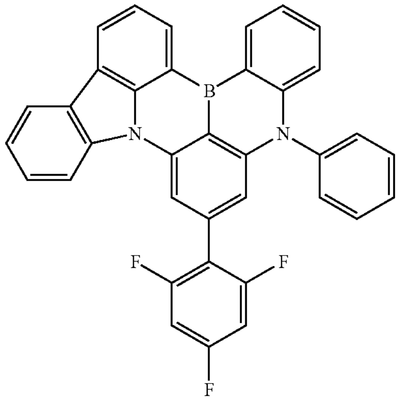
C-51
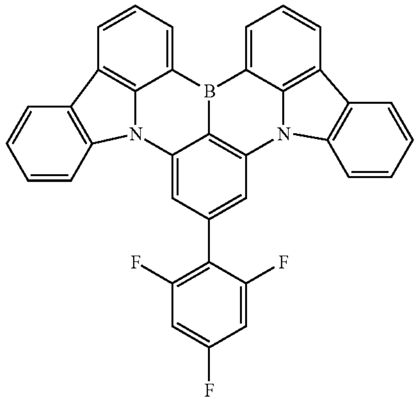
C-52
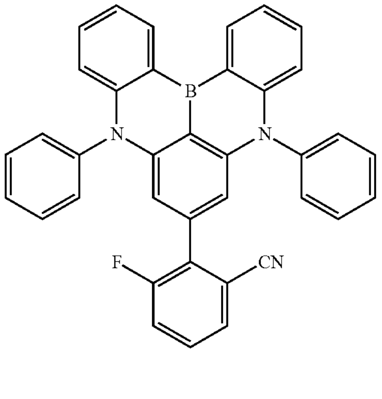
C-53
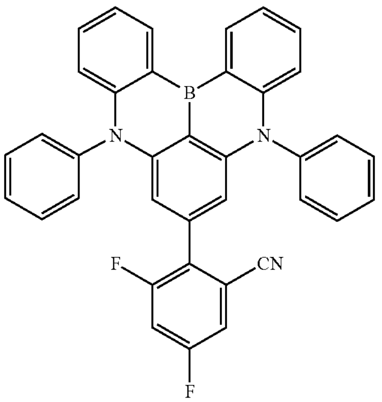
C-54
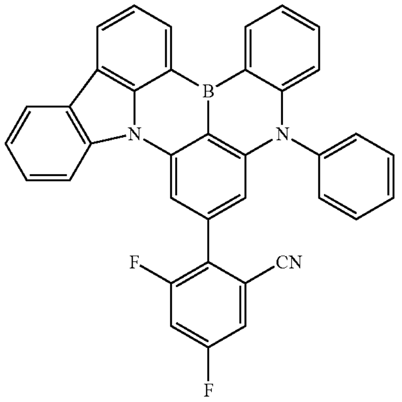
C-55
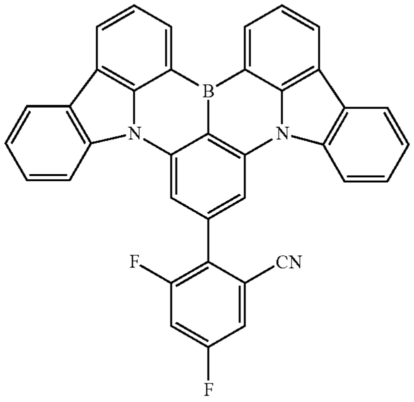
C-56
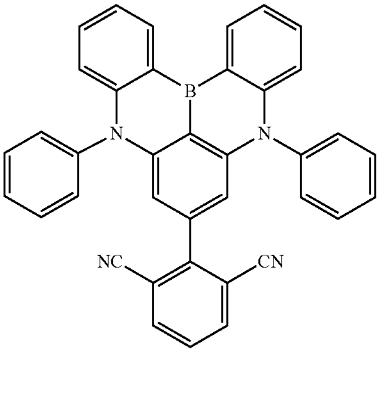

-continued
C-57
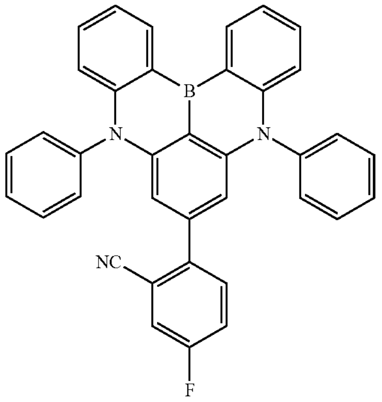
C-58
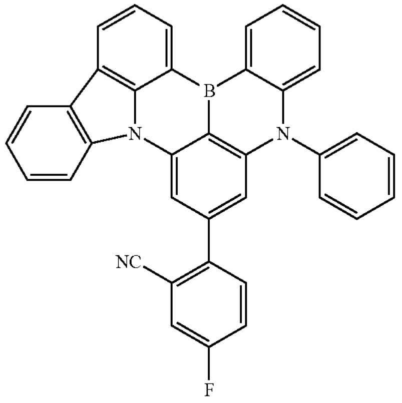
C-59
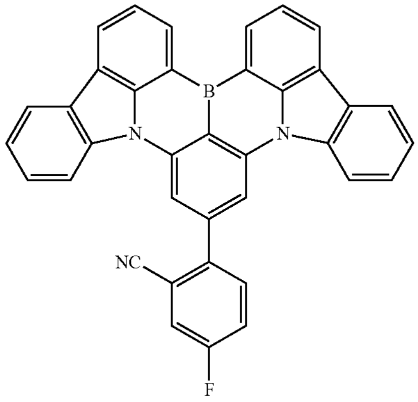
C-60
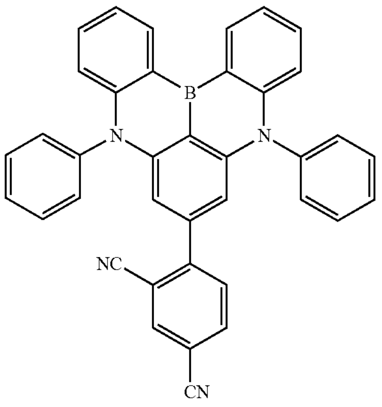
-continued
C-61
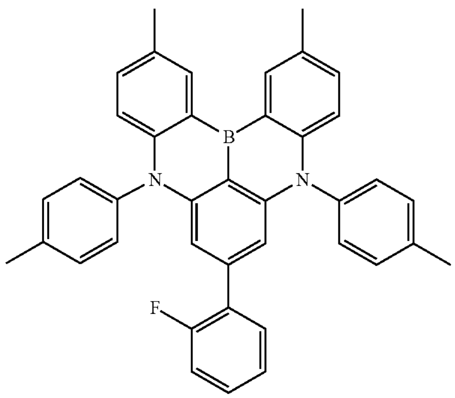
C-62
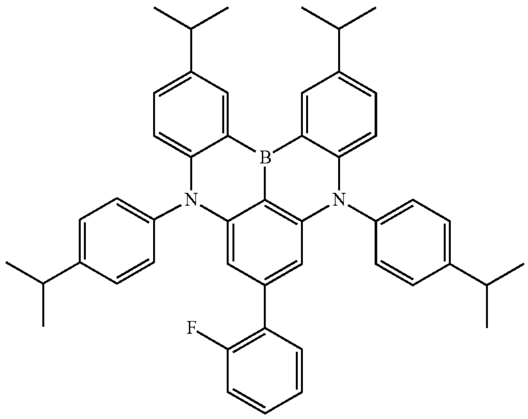
C-63
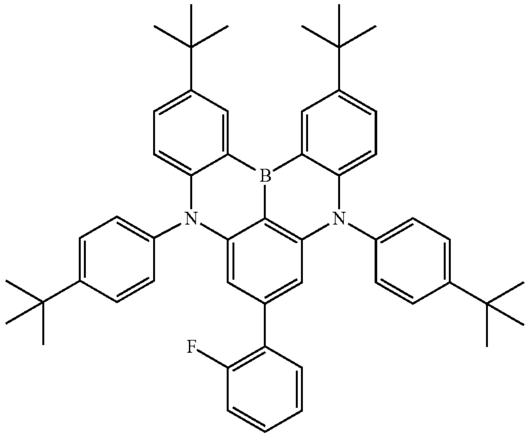

-continued
C-64
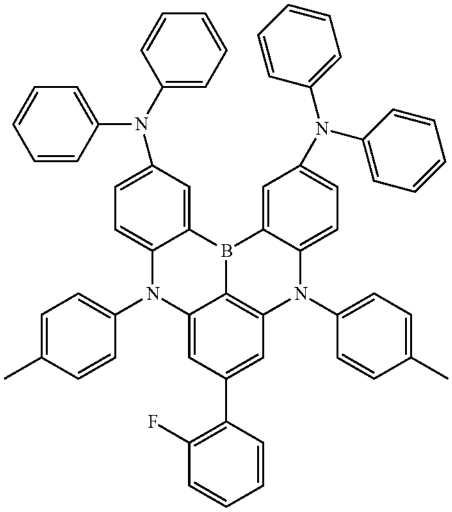
C-65
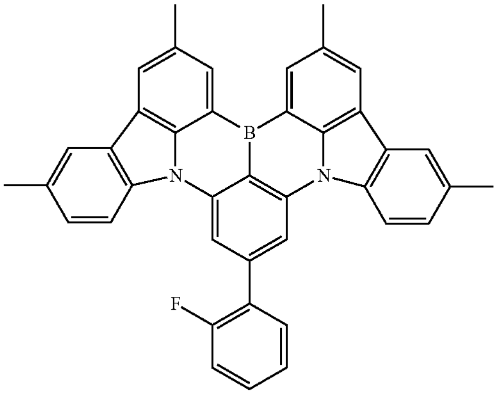
C-66
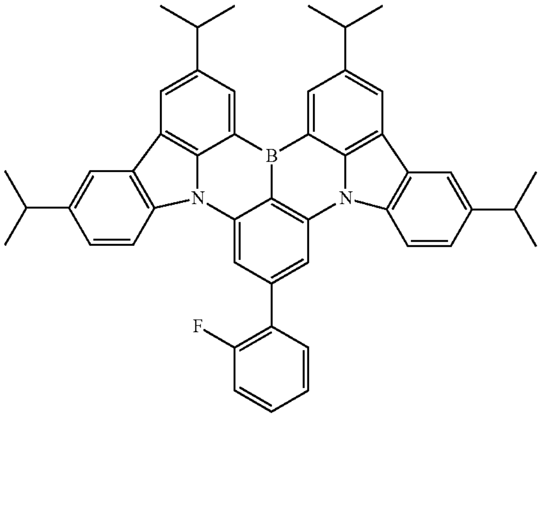
-continued
C-67
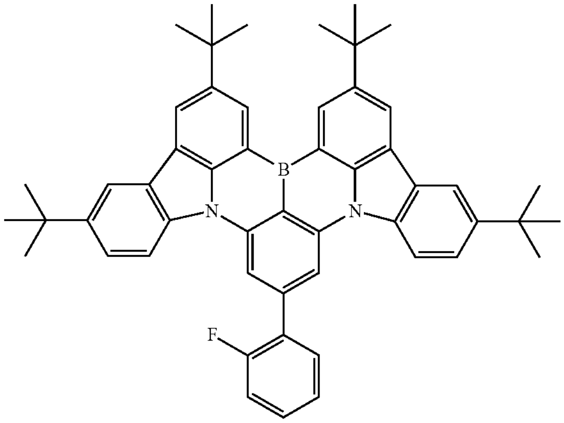
C-68
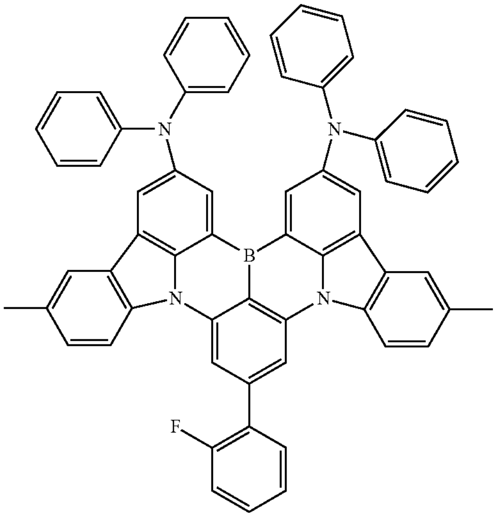
C-69
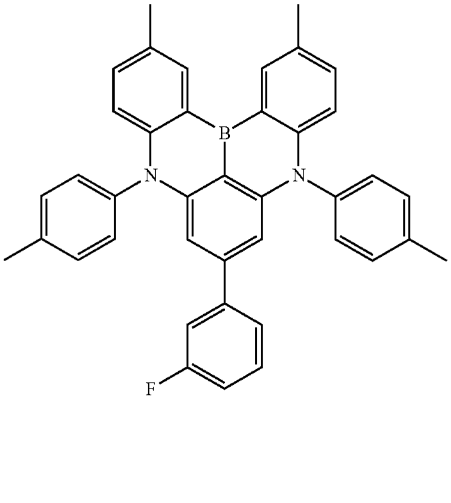

C-70
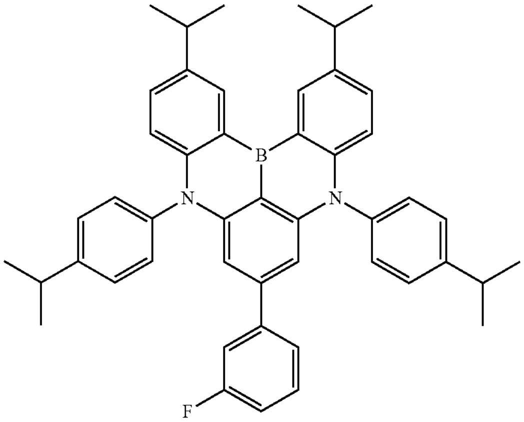
C-71
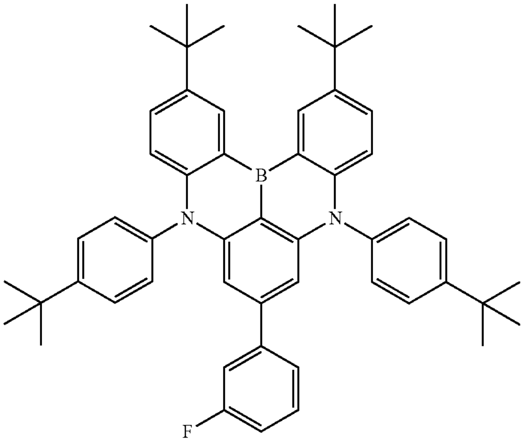
C-72
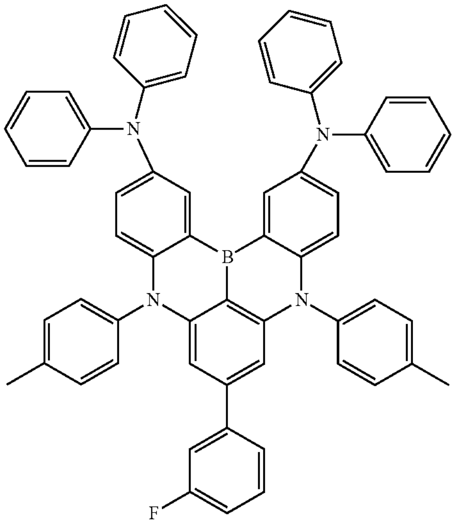
C-73
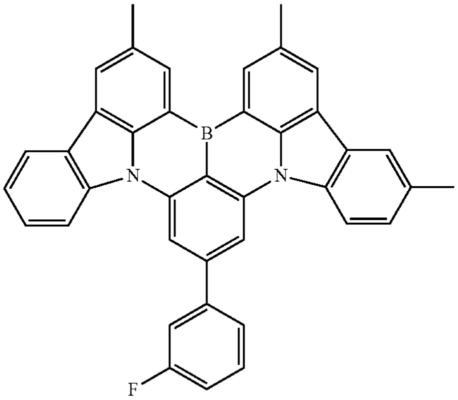
C-74
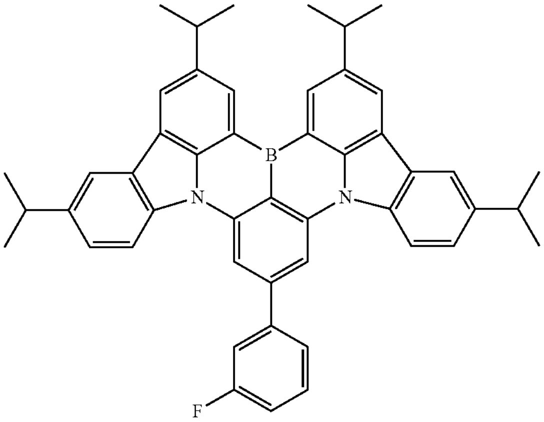
C-75
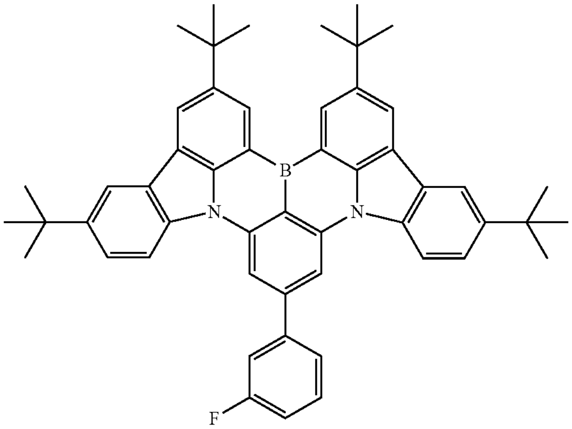

-continued
C-76
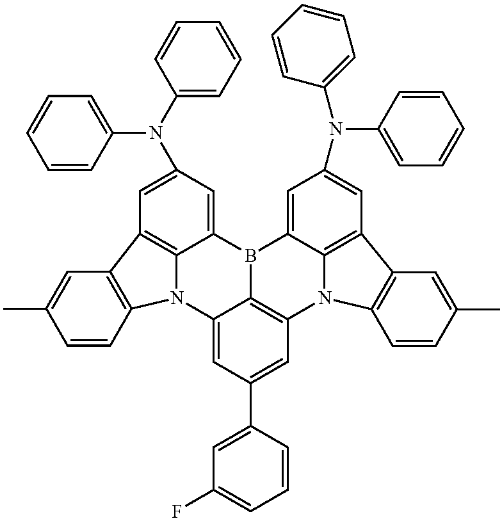
C-77
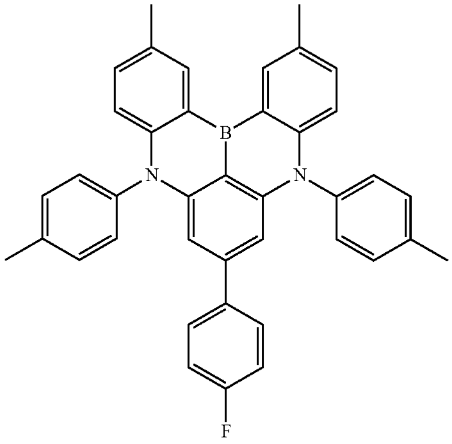
C-78
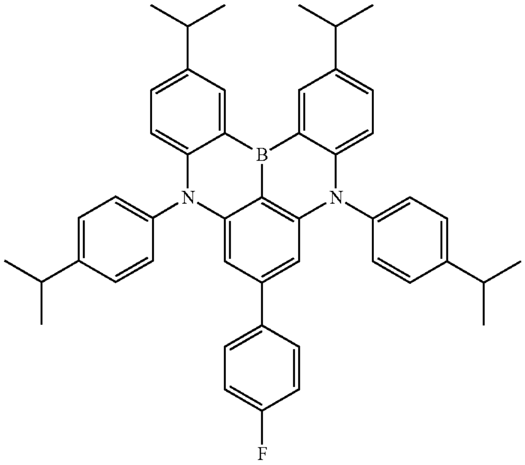
-continued
C-79
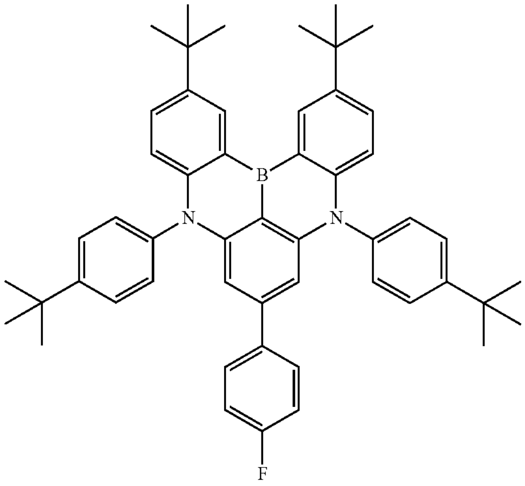
C-80
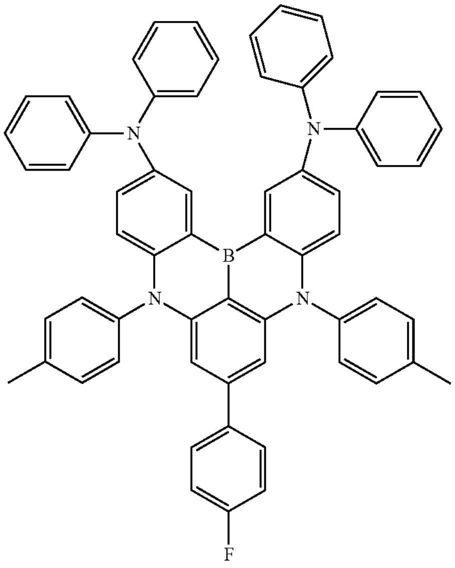
C-81
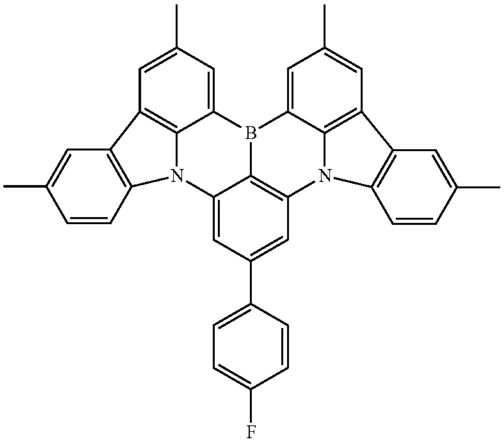

C-82
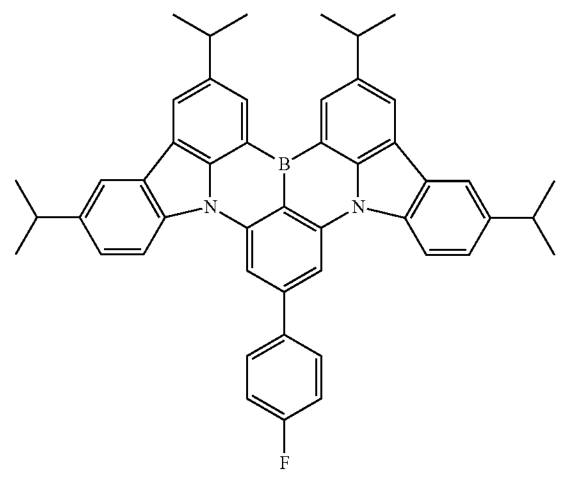
C-83
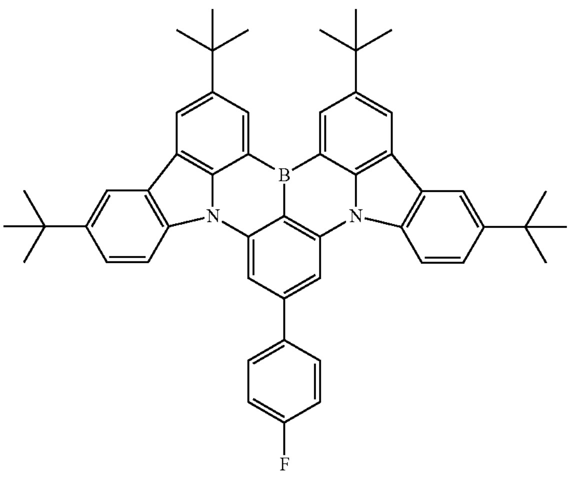
C-84
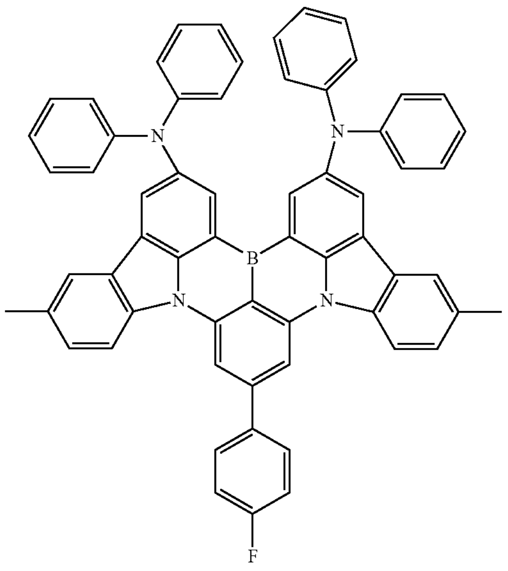
C-85
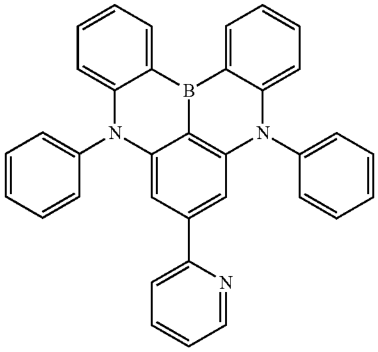
C-86
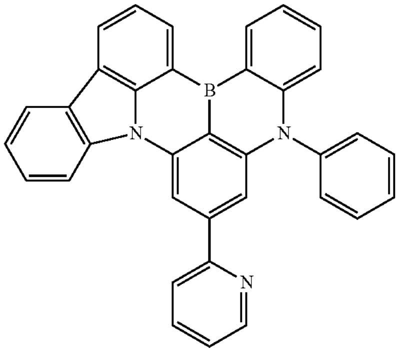
C-87
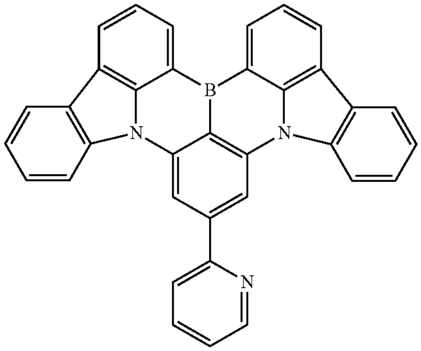
C-88
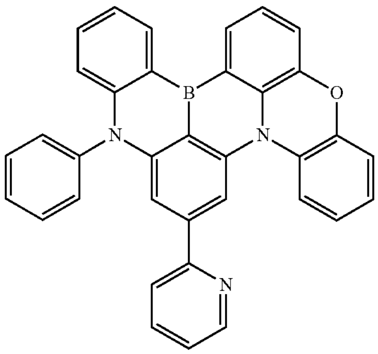

-continued
C-89
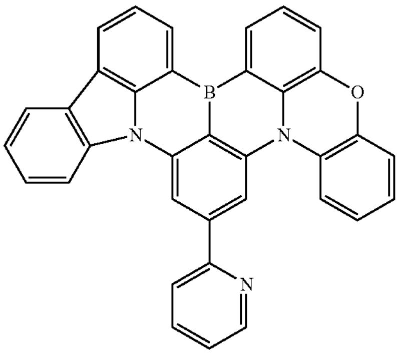
C-90
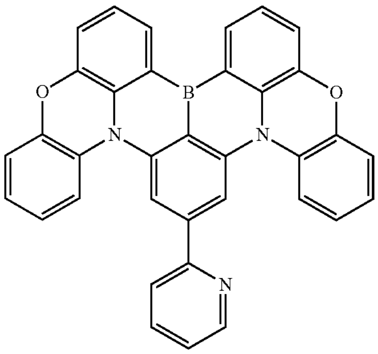
C-91
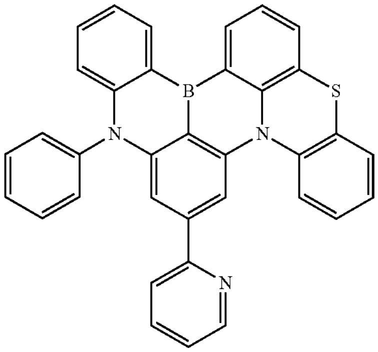
C-92
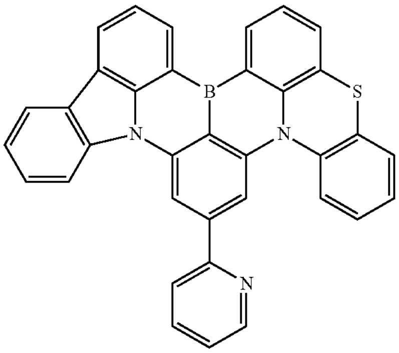
-continued
C-93
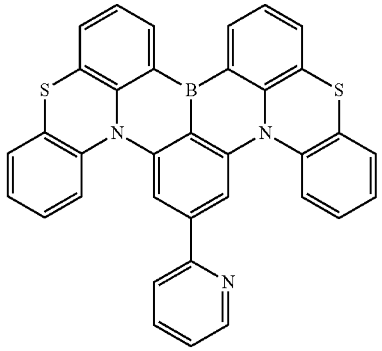
C-94
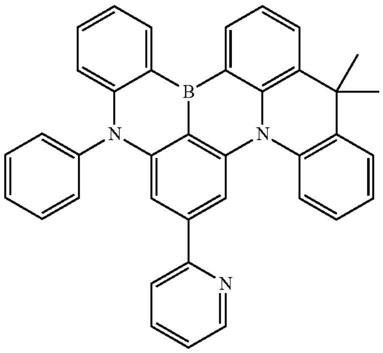
C-95
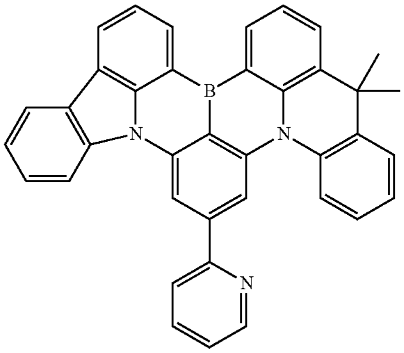
C-96
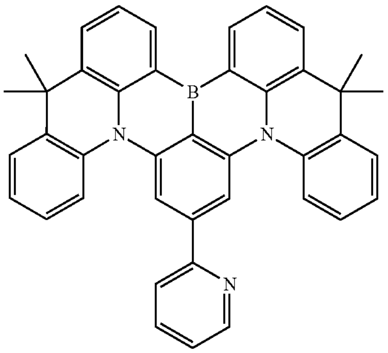

-continued
C-97
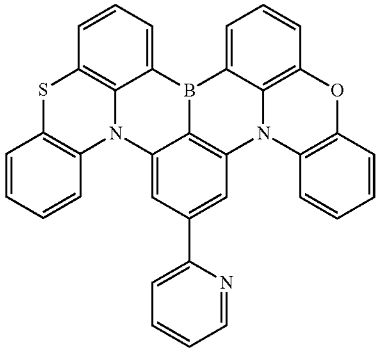
C-98
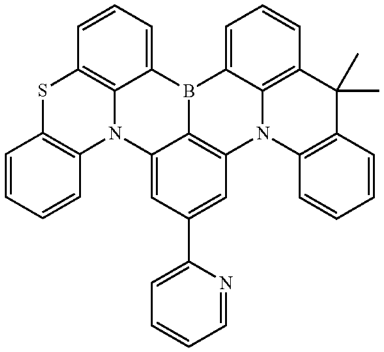
C-99
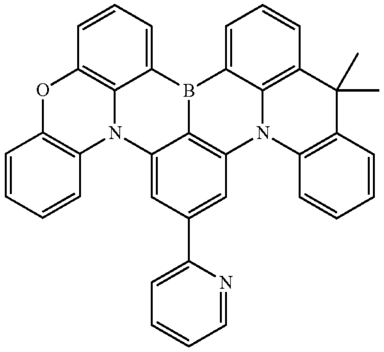
C-100
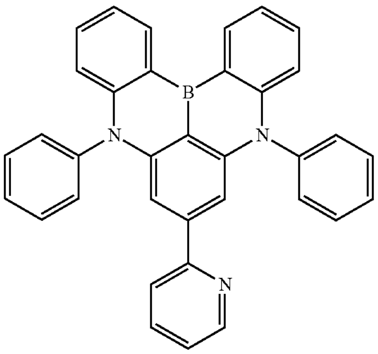
-continued
C-101
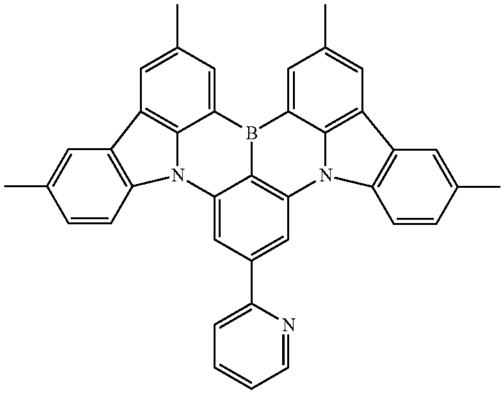
C-102
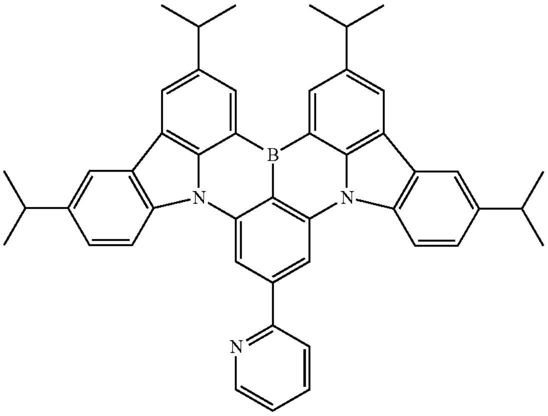
C-103
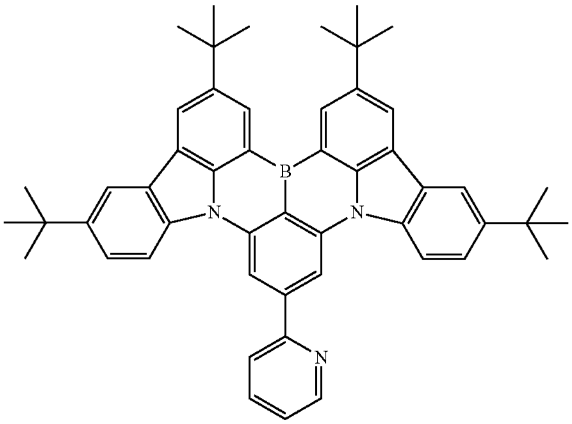

-continued
C-104
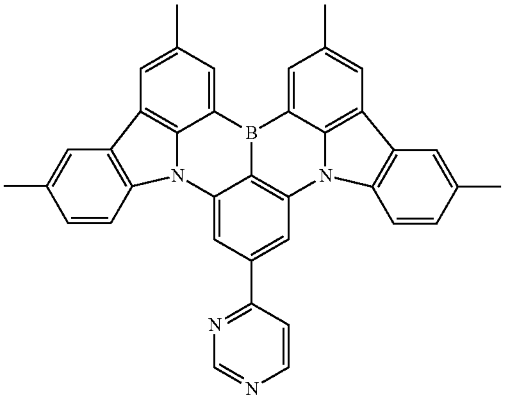
C-105
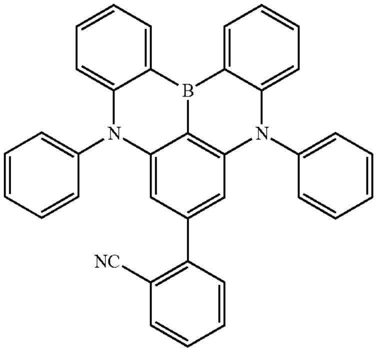
C-106
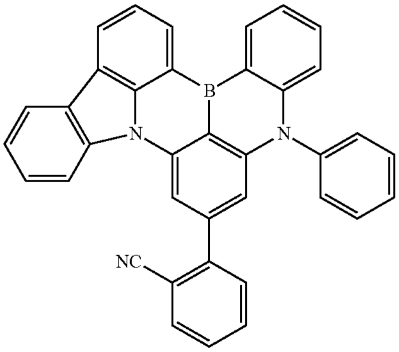
C-107
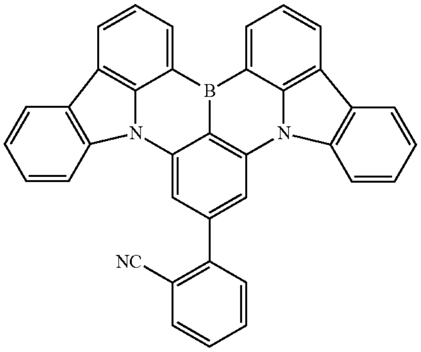
-continued
C-108
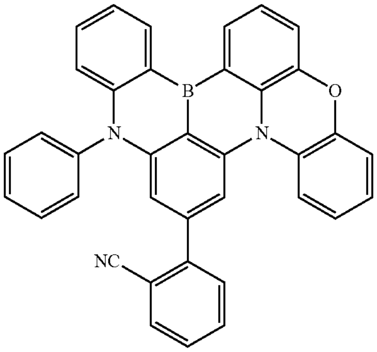
C-109
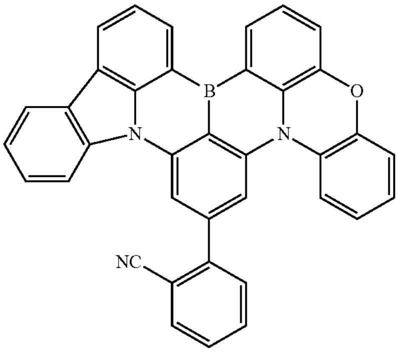
C-110
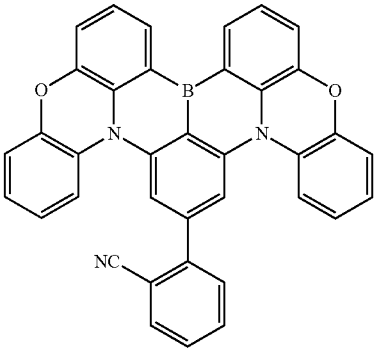
C-111
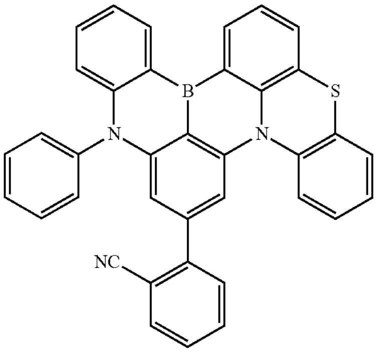

-continued
C-112
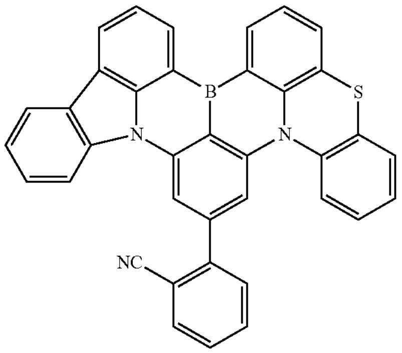
C-113
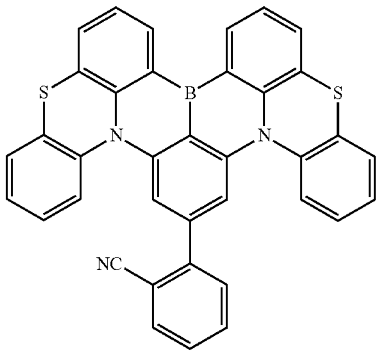
C-114
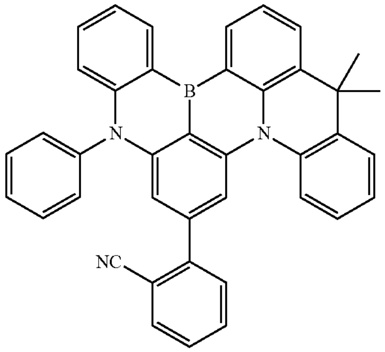
C-115
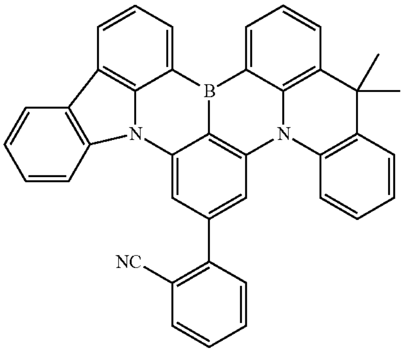
-continued
C-116
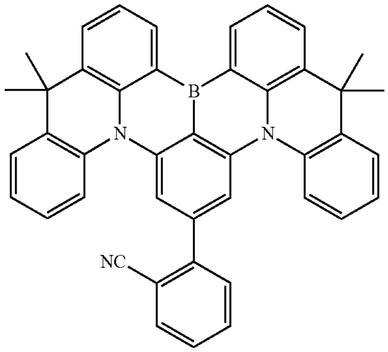
C-117
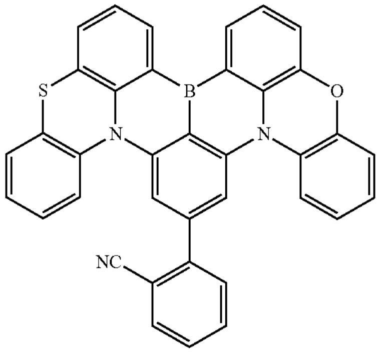
C-118
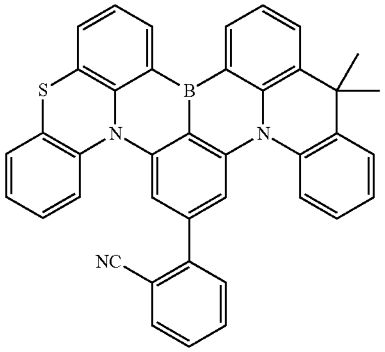
C-119
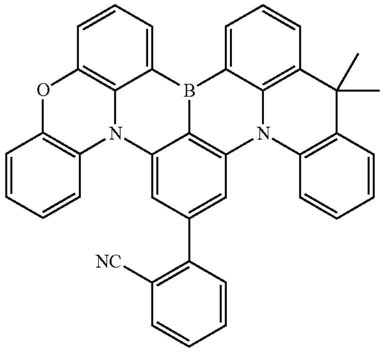

-continued
C-120
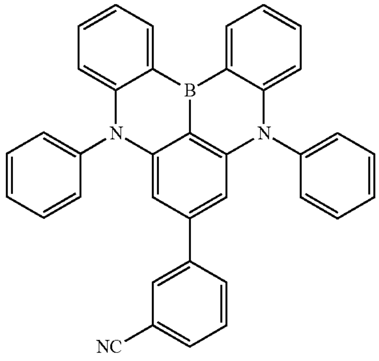
C-121
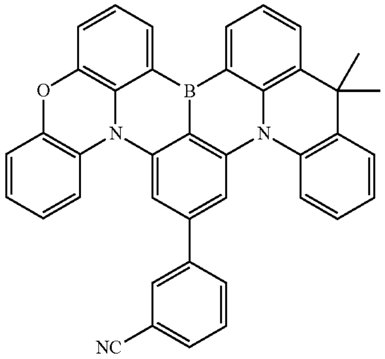
C-122
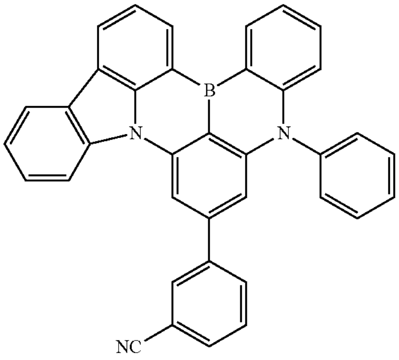
C-123
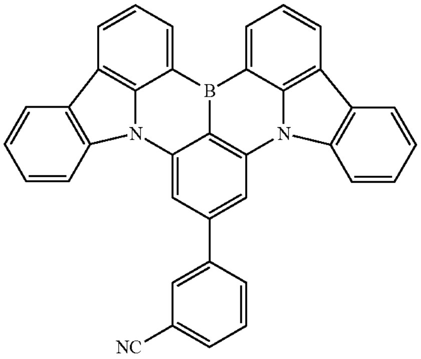
-continued
C-124
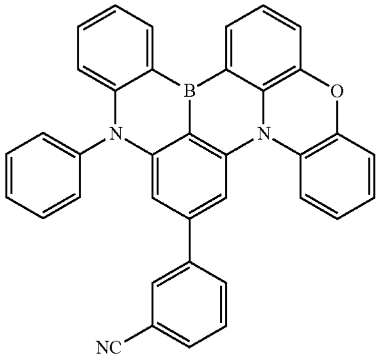
C-125
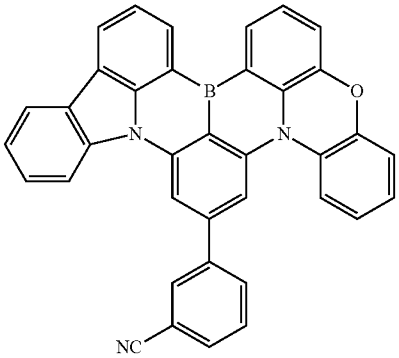
C-126
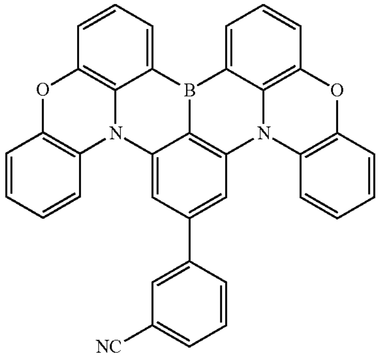
C-127
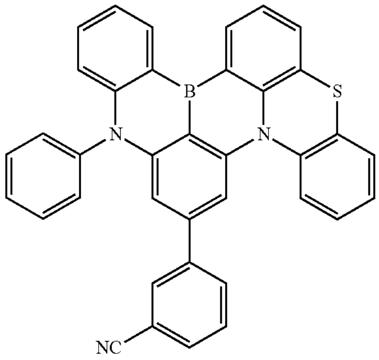

-continued
C-128
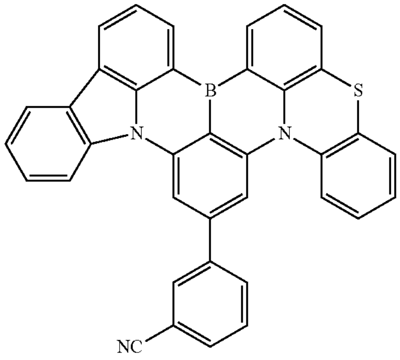
C-129
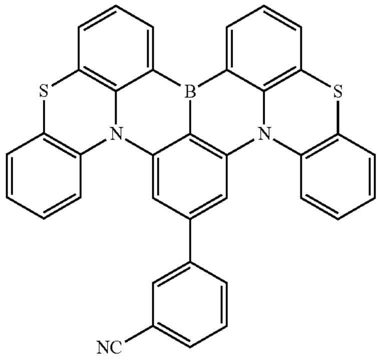
C-130
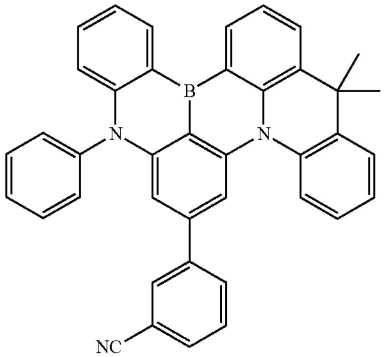
C-131
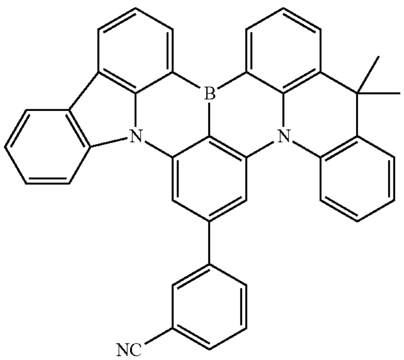
-continued
C-132
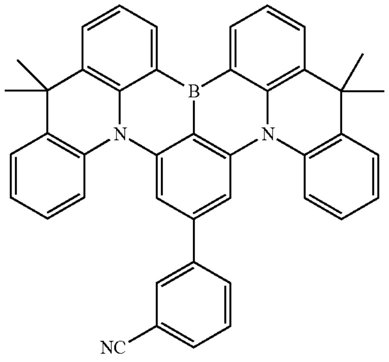
C-133
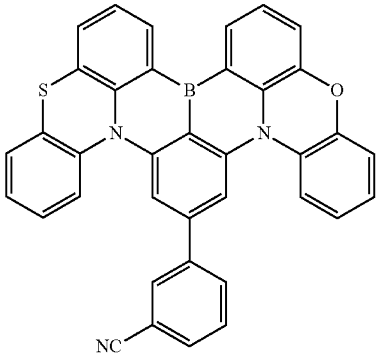
C-134
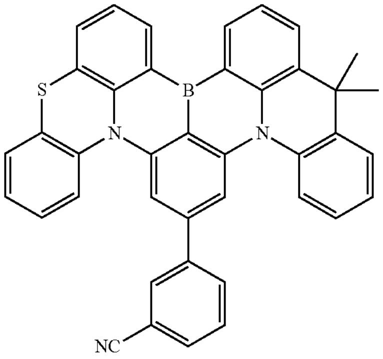
C-135
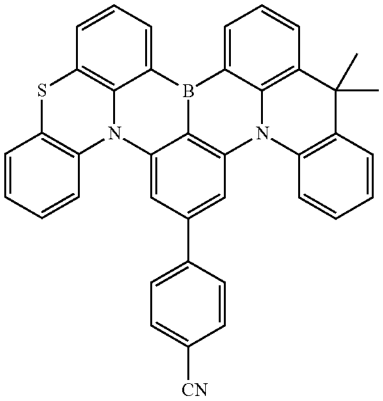

-continued
C-136
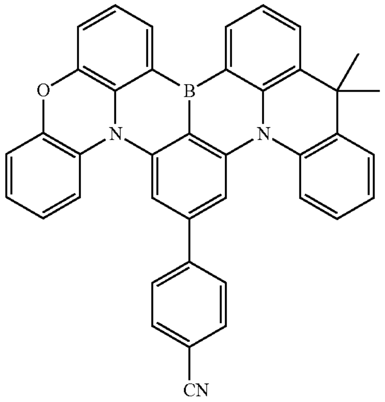
C-137
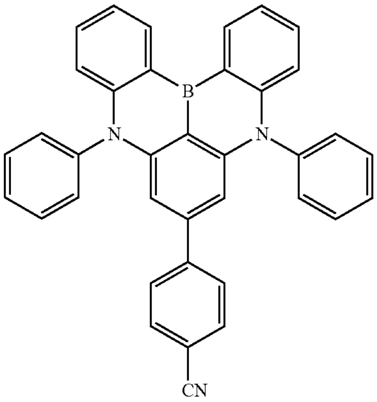
C-138
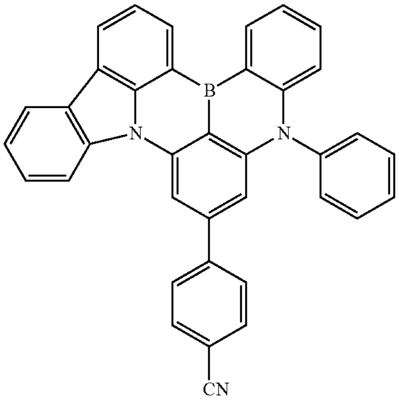
C-139
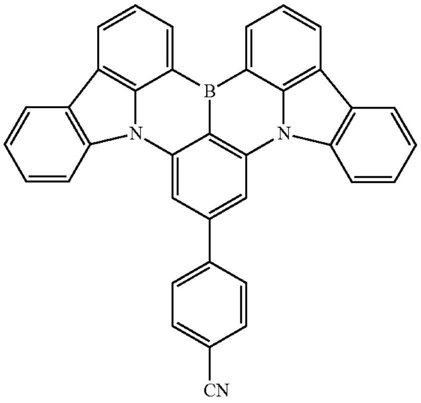
-continued
C-140
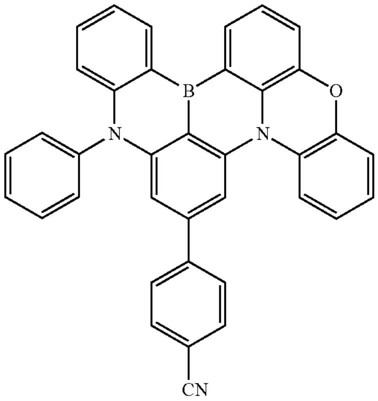
C-141
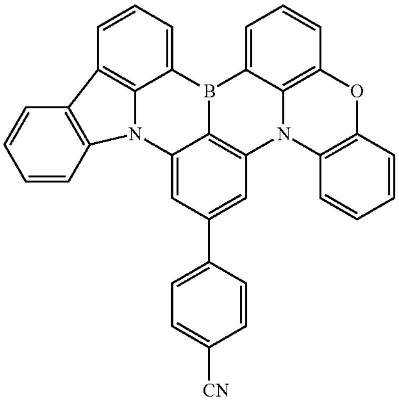
C-142
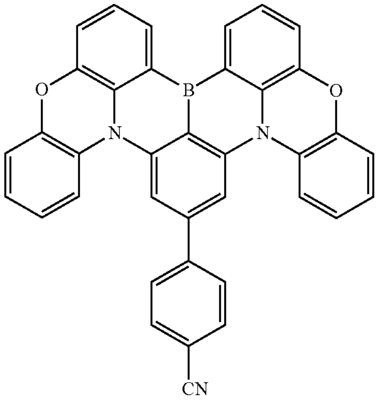
C-143
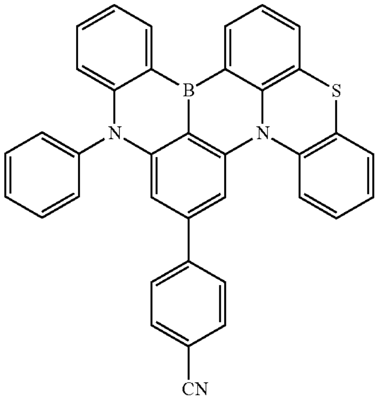

-continued
C-144
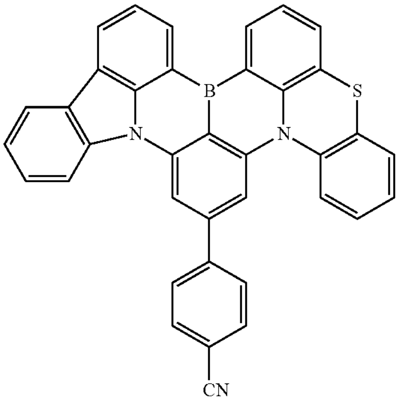
C-145
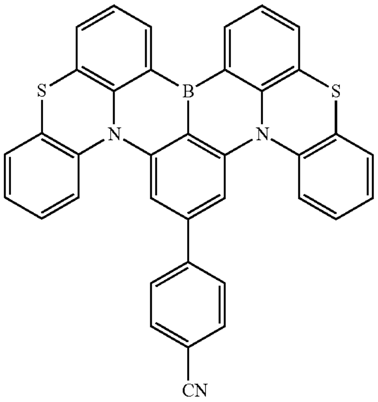
C-146
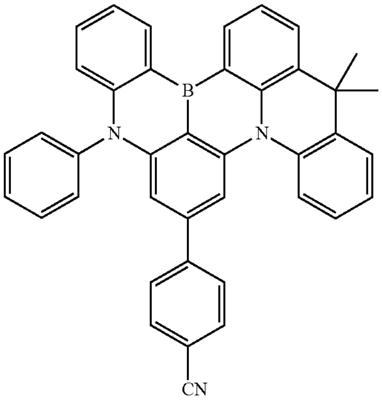
C-147
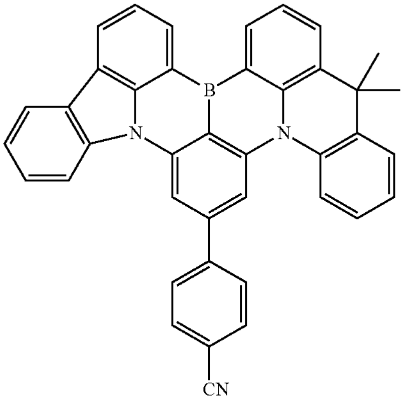
-continued
C-148
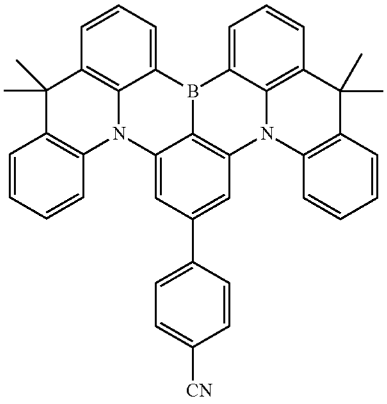
C-149
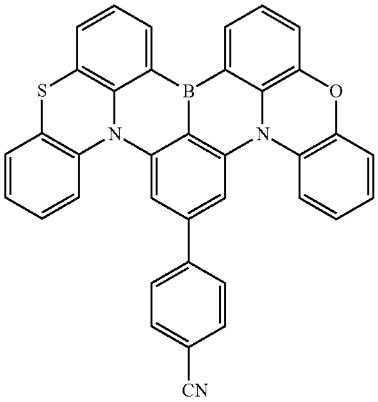
C-150
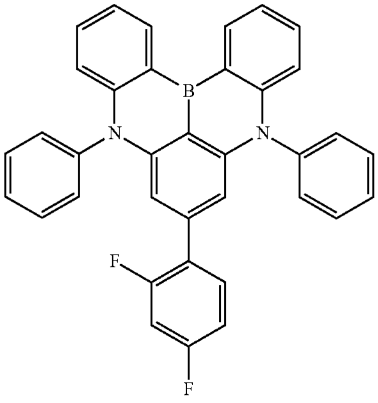
C-151
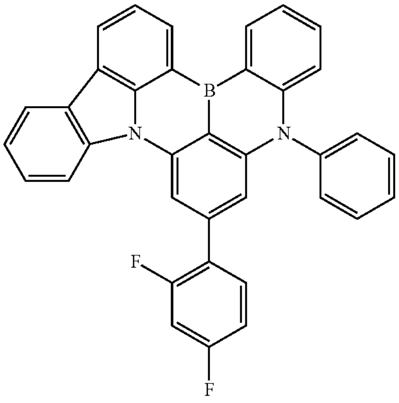

-continued
C-152
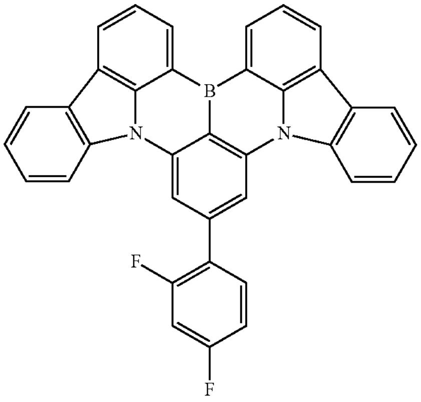
C-153
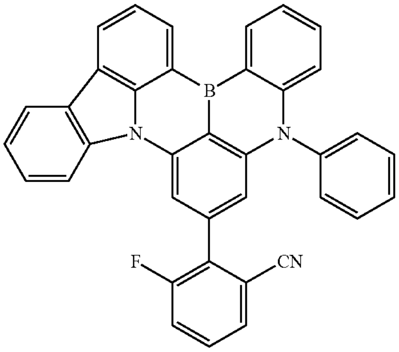
C-154
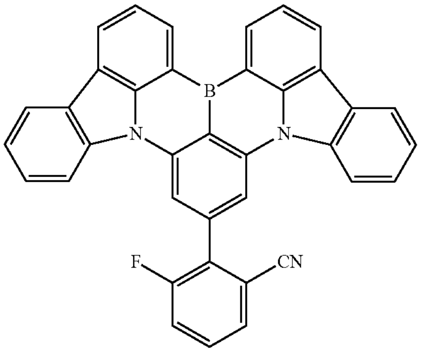
C-155
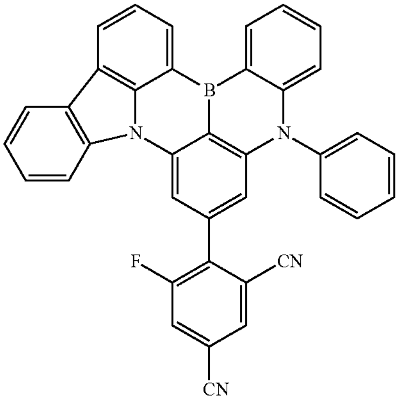
-continued
C-156
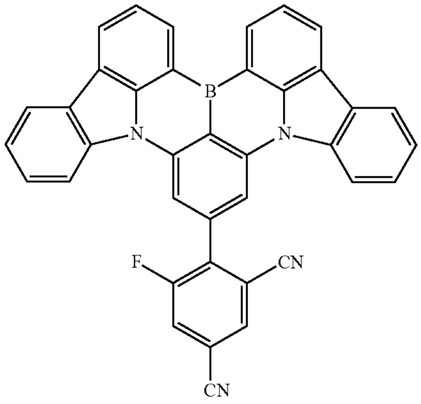
C-157
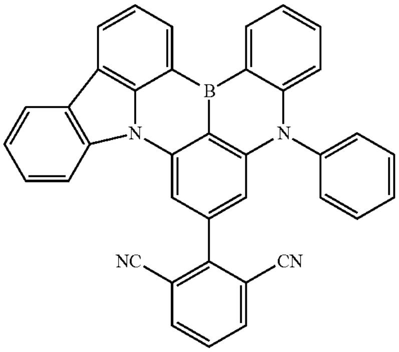
C-158
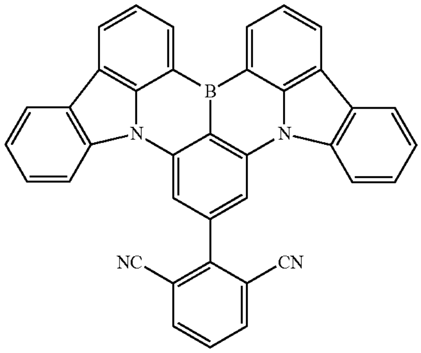
C-159
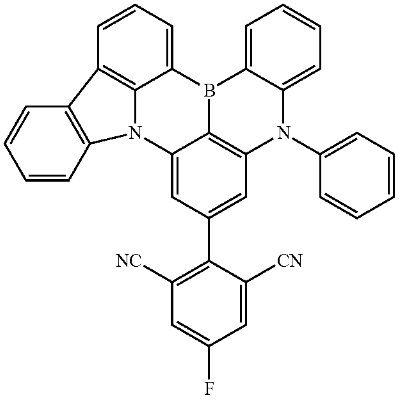

-continued
C-160
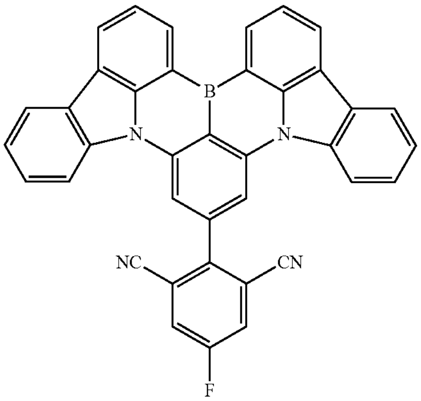
C-161
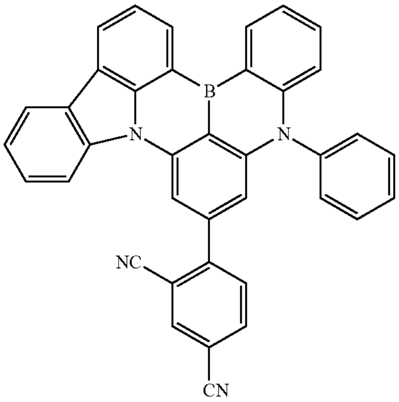
C-162
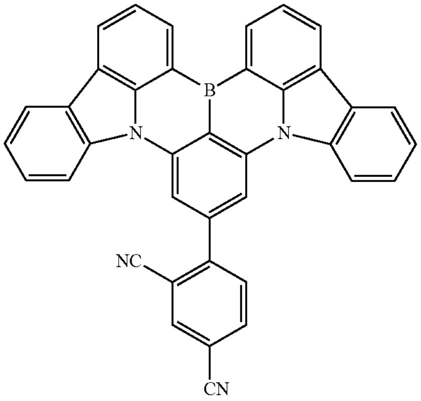
C-163
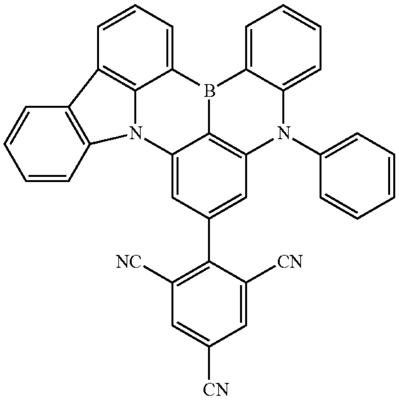
-continued
C-164
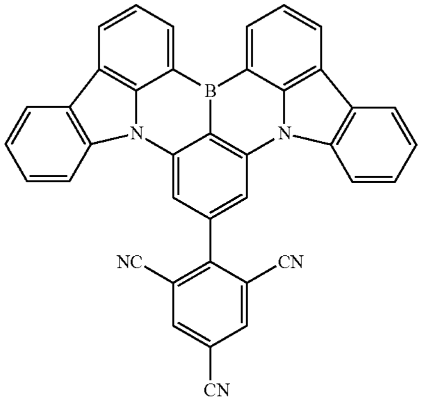
C-165
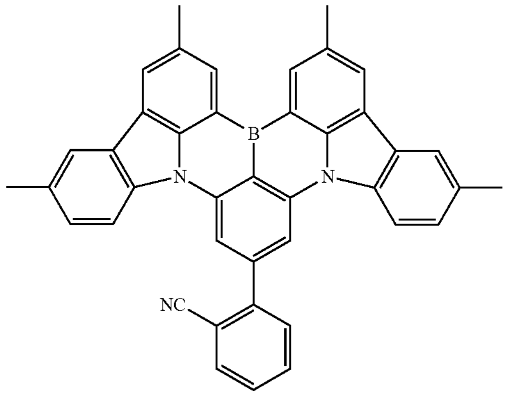
C-166
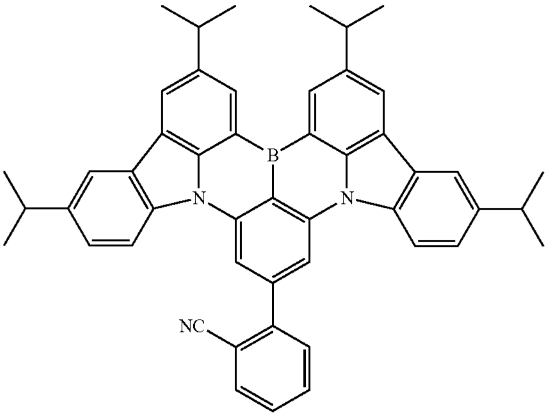

-continued
C-167
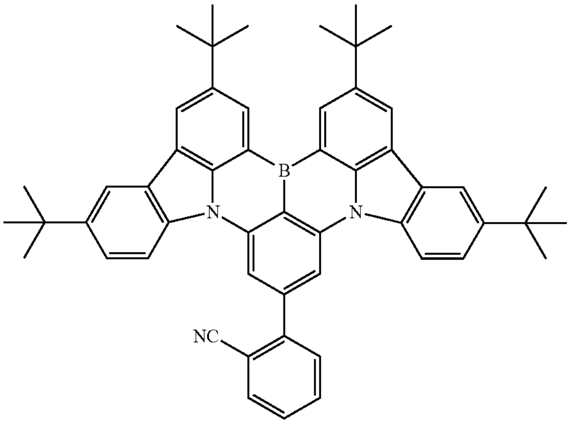
C-168
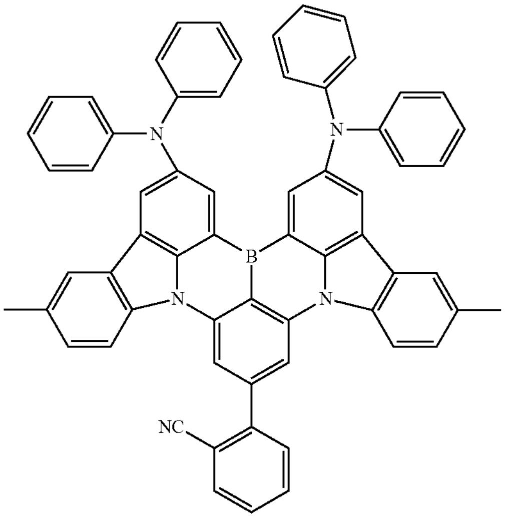
C-169
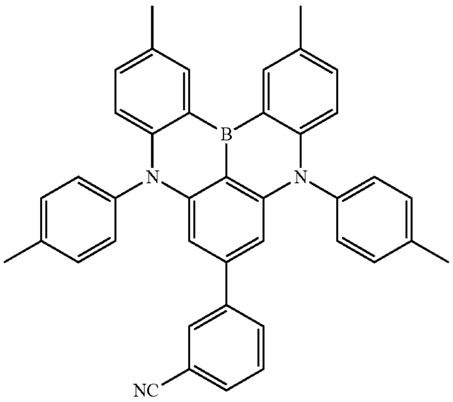
-continued
C-170
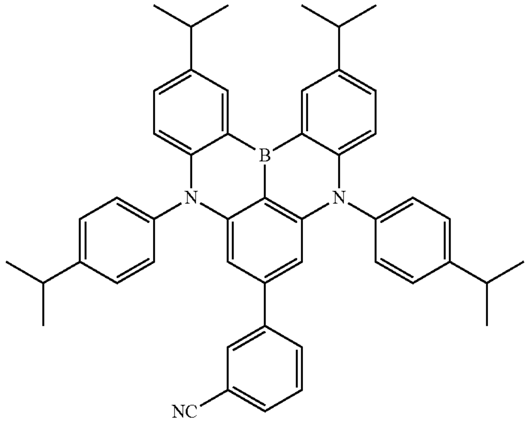
C-171
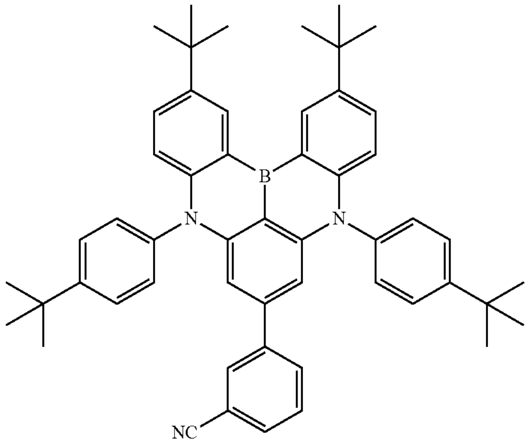
C-172
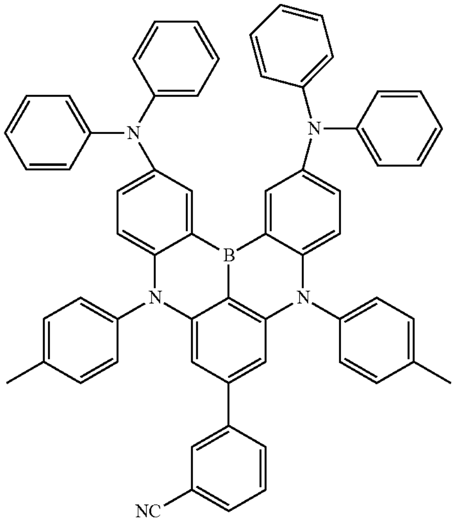

-continued
C-173
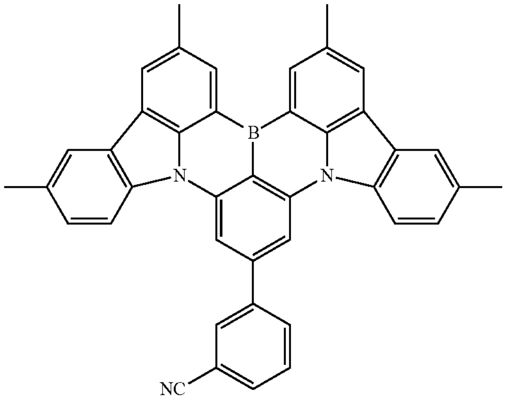
C-174
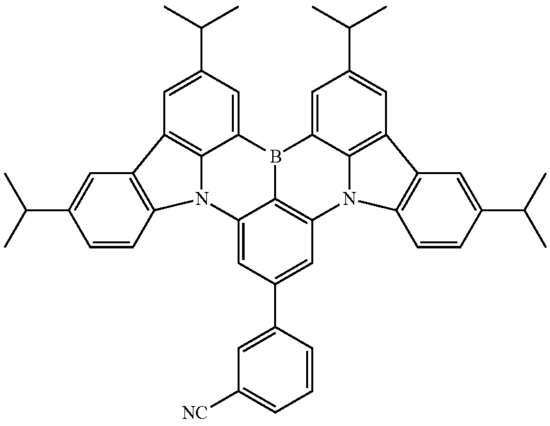
C-175
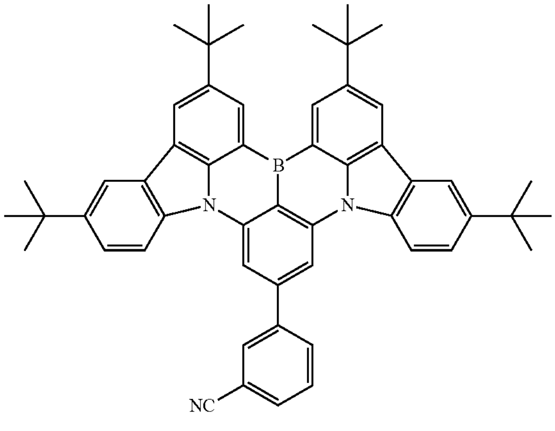
-continued
C-176
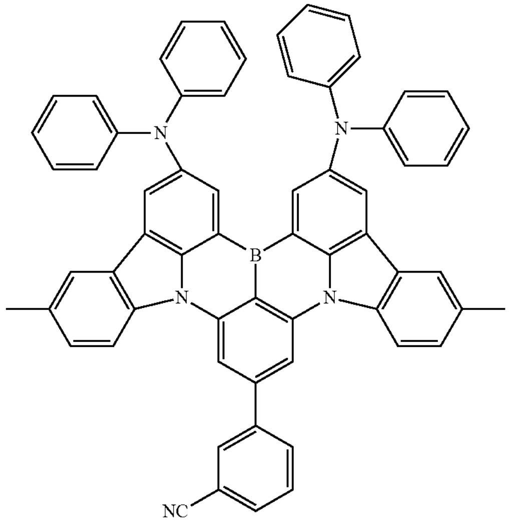
C-177
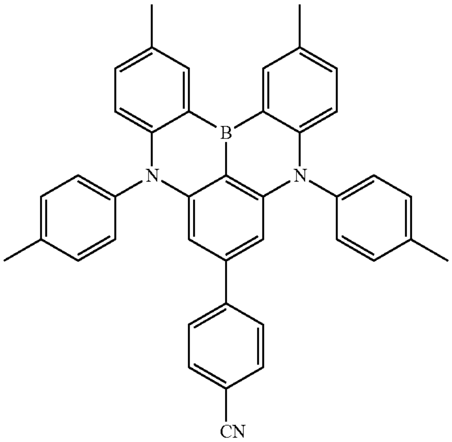
C-178
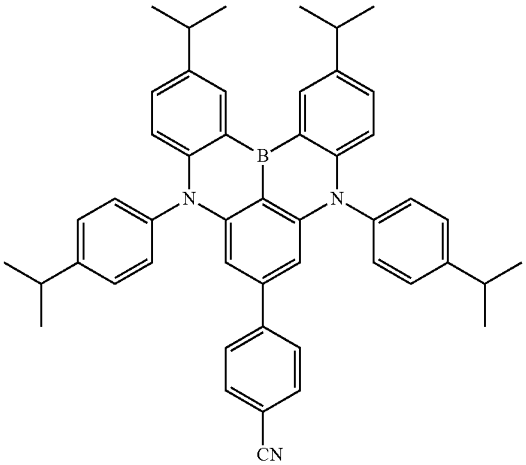

-continued
C-179
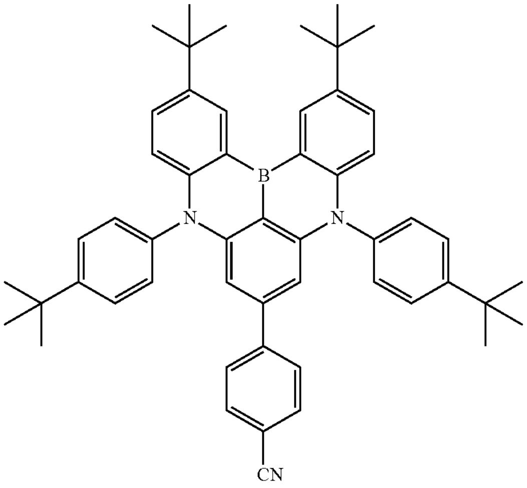
C-180
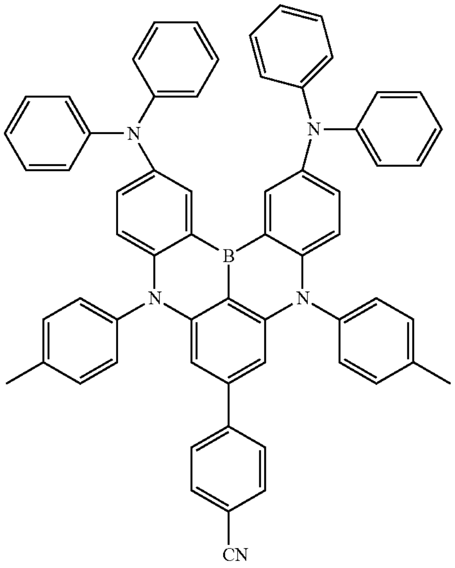
C-181
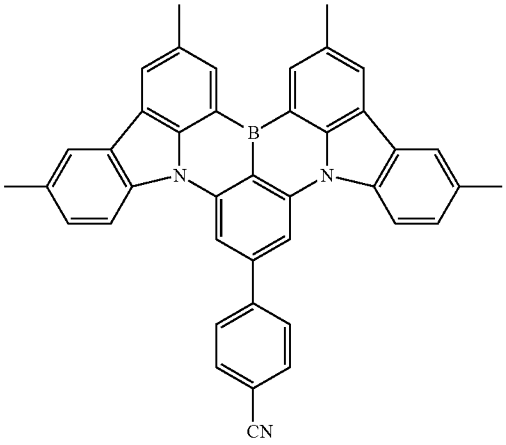
-continued
C-182
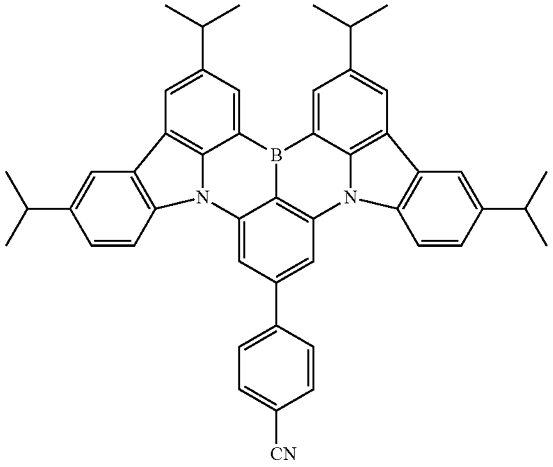
C-183
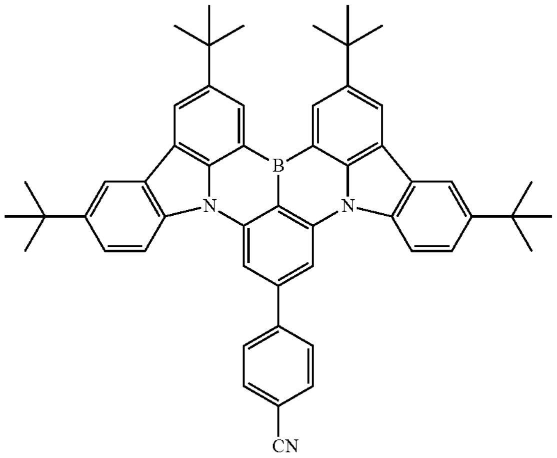
C-184
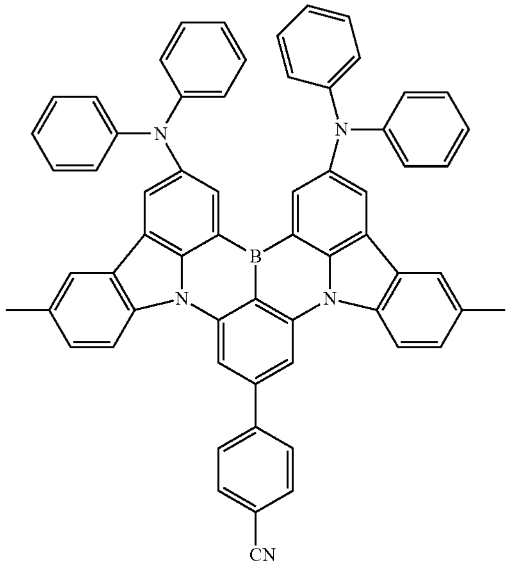

-continued
C-185
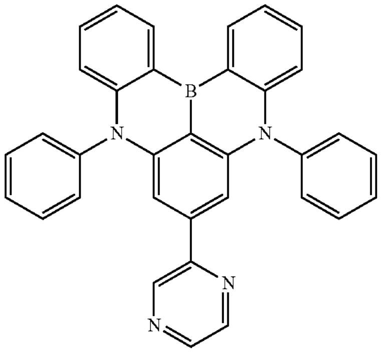
C-186
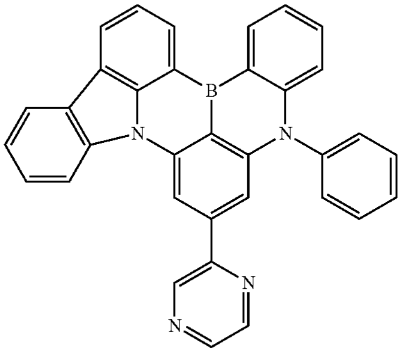
C-187
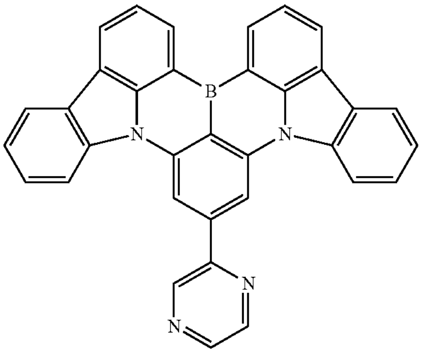
C-188
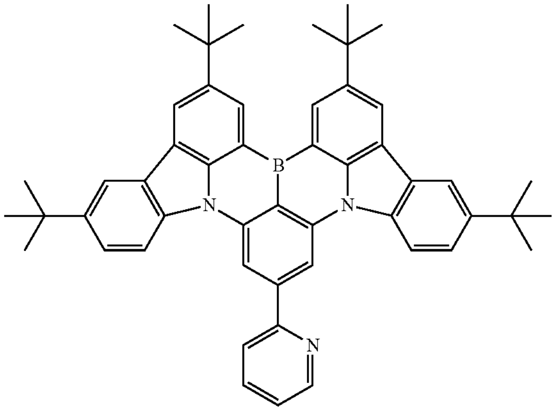
-continued
C-189
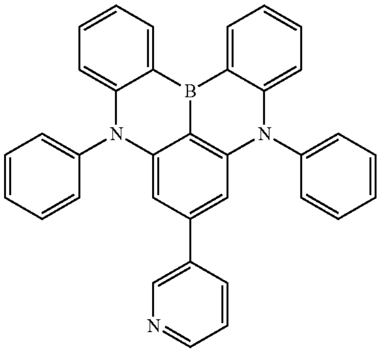
C-190
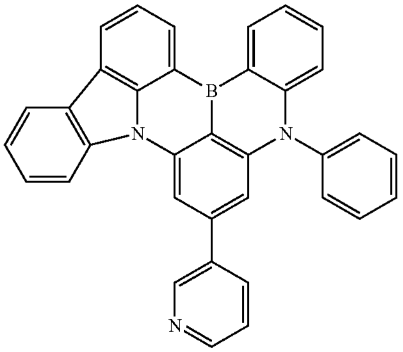
C-191
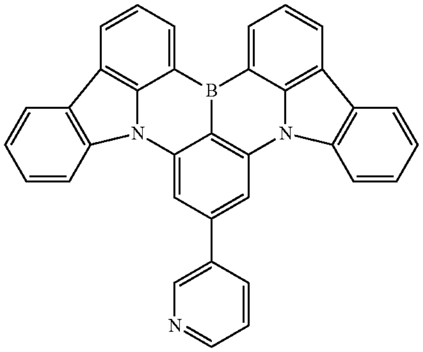
C-192
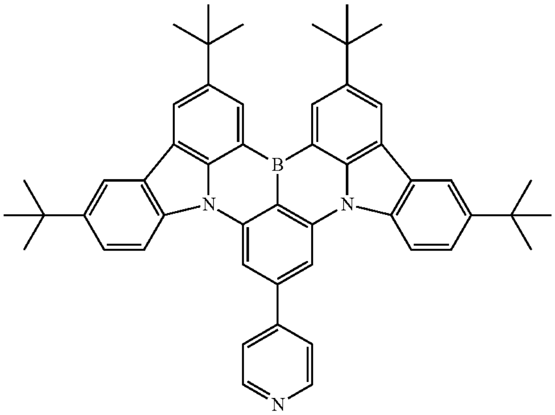

-continued
C-193
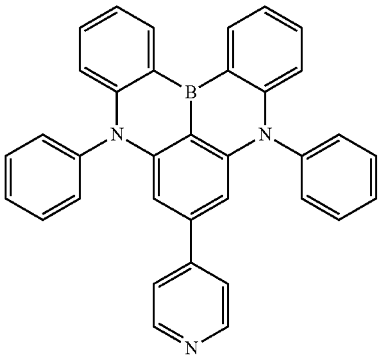
C-194
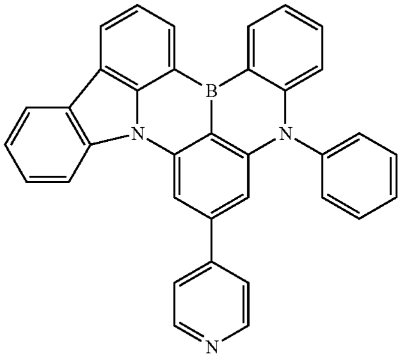
C-195
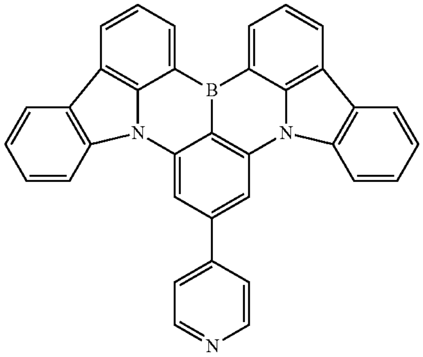
C-196
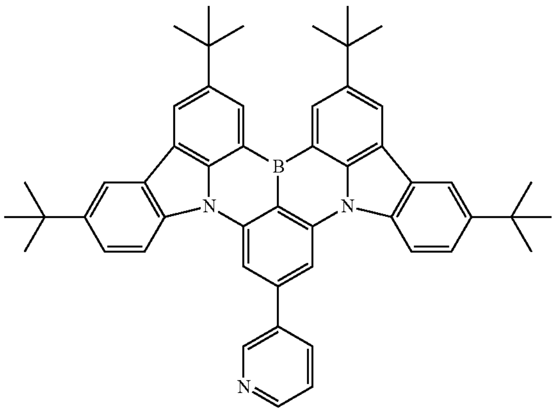
-continued
C-197
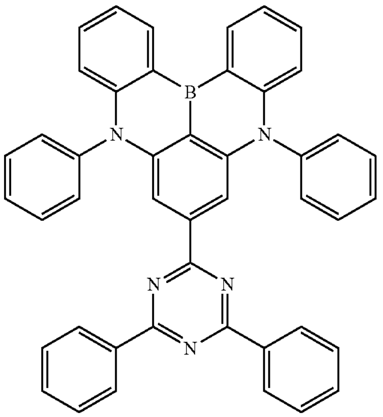
C-198
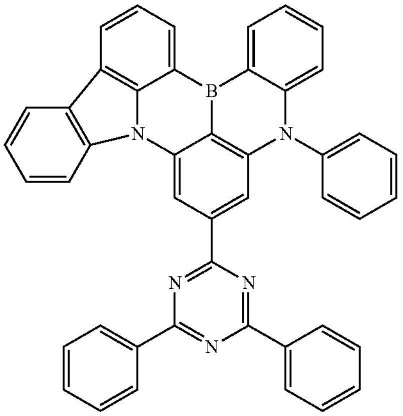
C-199
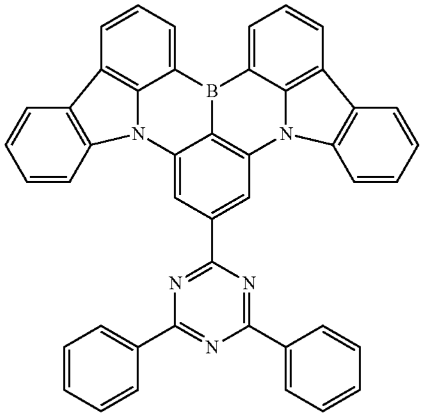

-continued

C-200

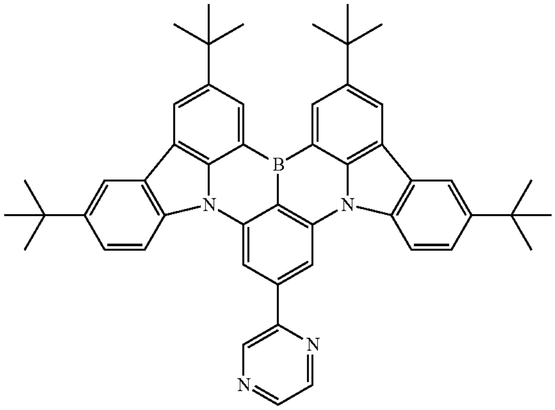

C-201

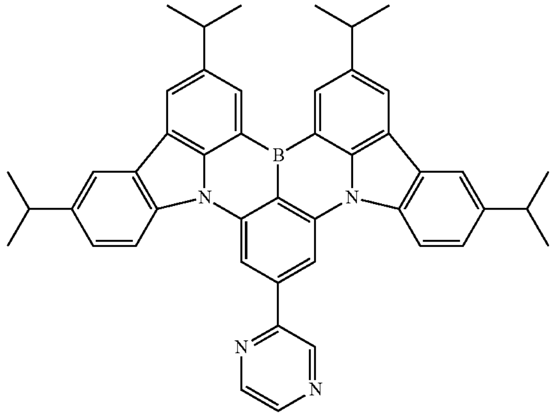

C-202

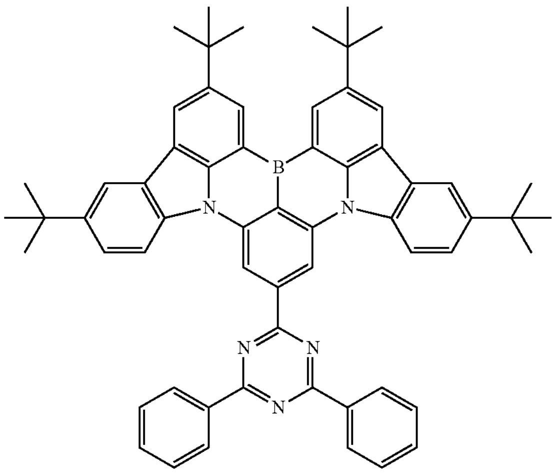

-continued

C-203

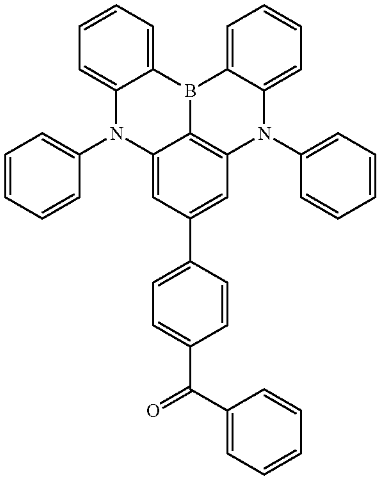

C-204

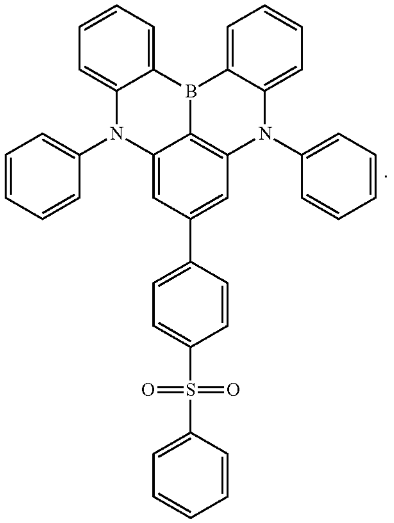

When the above-mentioned series of specific compounds are used as green fluorescent dyes, they enable the device to have a narrower green light emission spectrum and better color purity.

Further, the energy level difference between a singlet state and a triplet state of the thermally activated delayed fluorescence sensitizer is less than or equal to 0.3 eV, for example, 0.1 eV, 0.12 eV, 0.14 eV, 0.16 eV, 0.18 eV, 0.2 eV, 0.22 eV, 0.24 eV, 0.26 eV, 0.28 eV, or 0.29 eV, etc.

Further, the thermally activated delayed fluorescence sensitizer comprises one or a combination of at least two of following compounds as shown in T-1 to T-99 (for example, a combination of T-1 and T-2, a combination of T-5, T-7 and T-12, and a combination of T-3, T-60, T-70 and T-80, etc.):

-continued
T-1
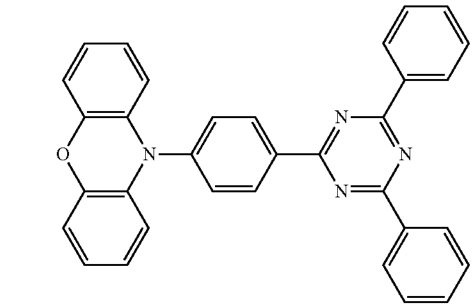
T-2
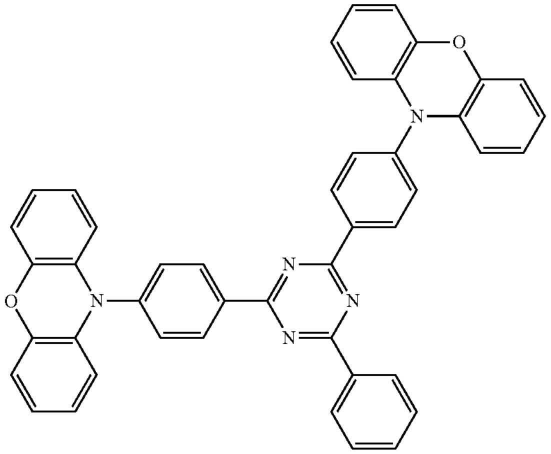
T-3
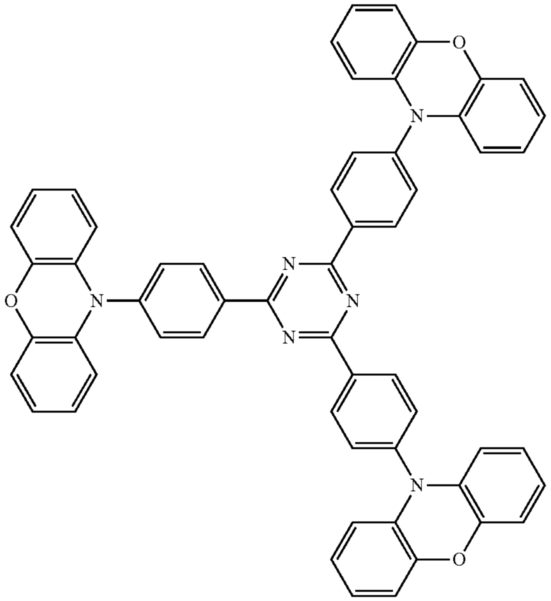
T-4
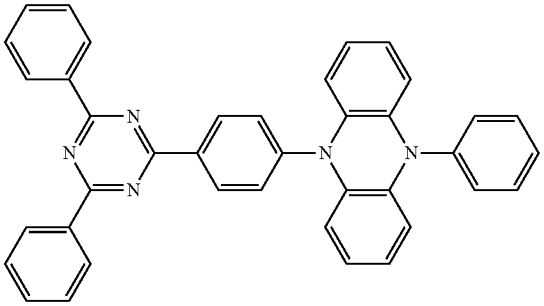
T-5
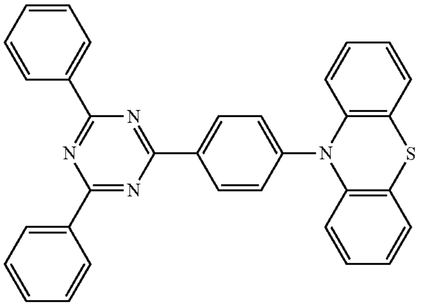
T-6
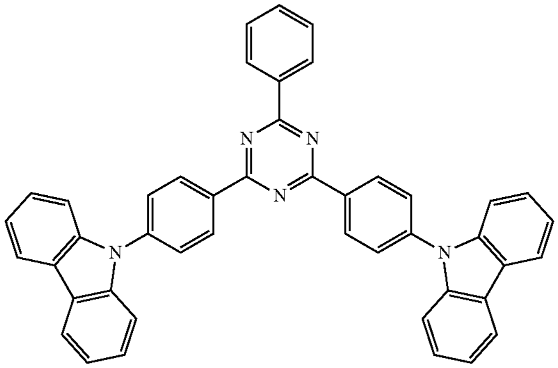
T-7
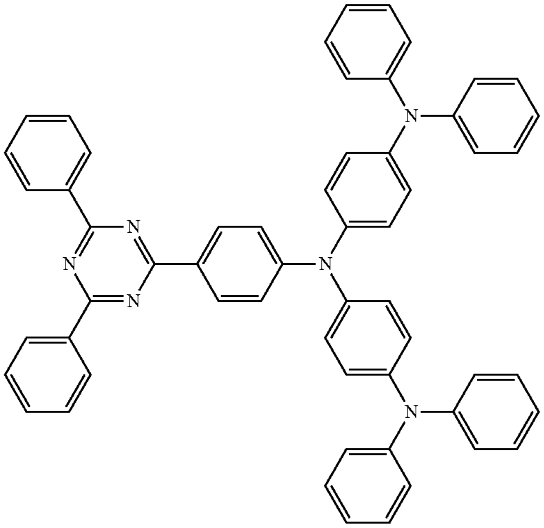

-continued
T-8
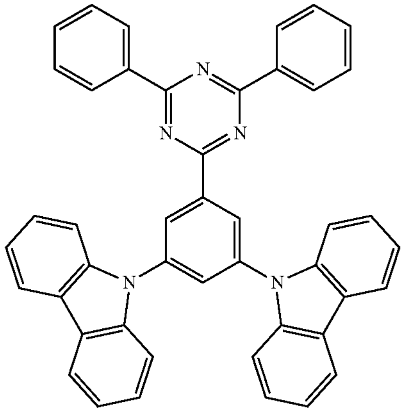
T-9
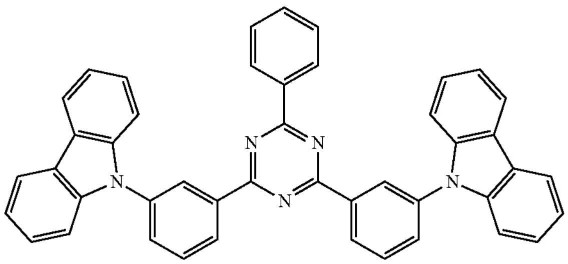
T-10
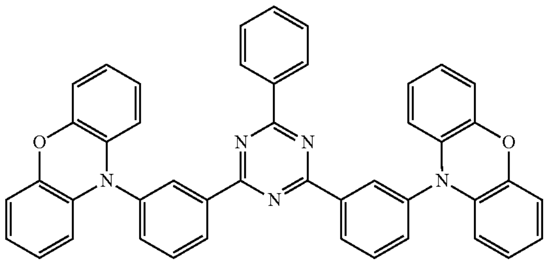
T-11
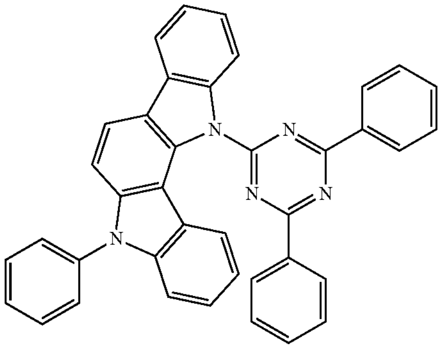
-continued
T-12
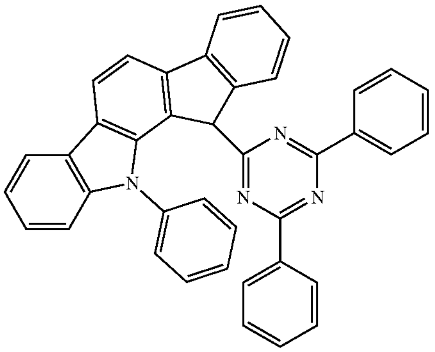
T-13
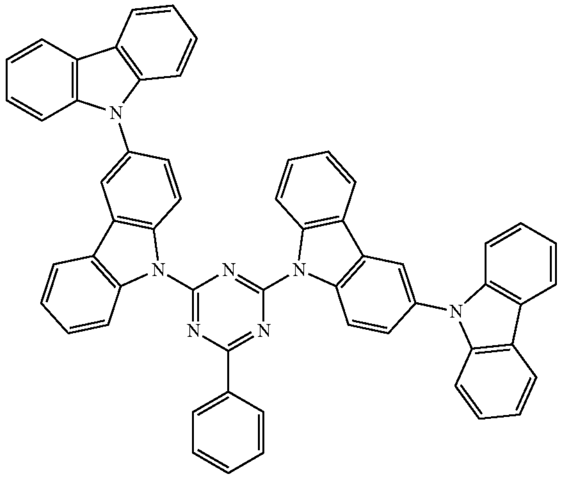
T-14
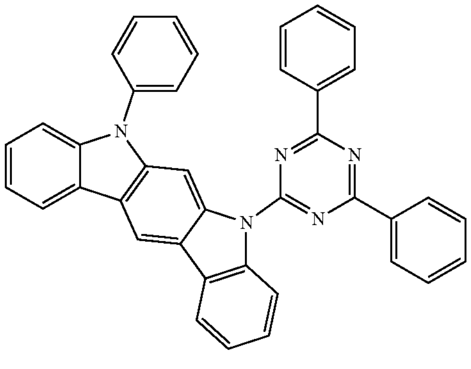
T-15
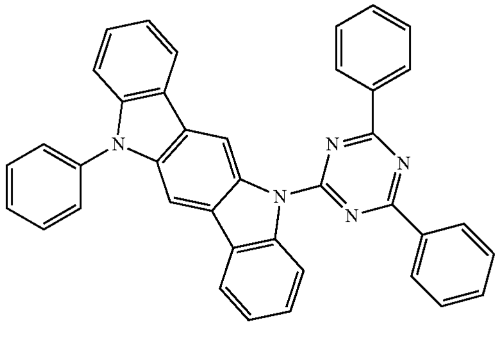

-continued
T-16
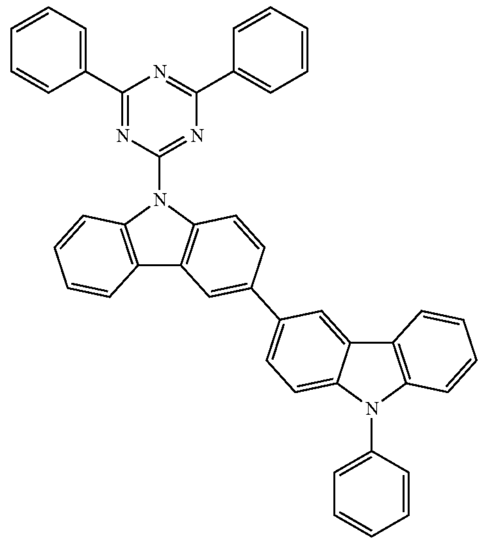
T-17
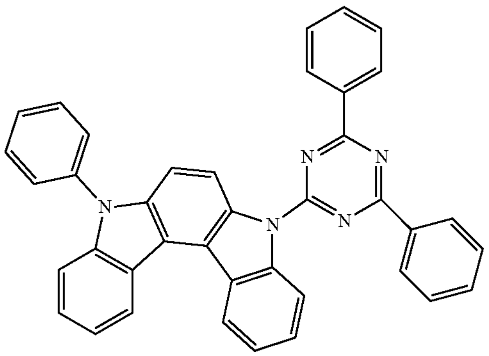
T-18
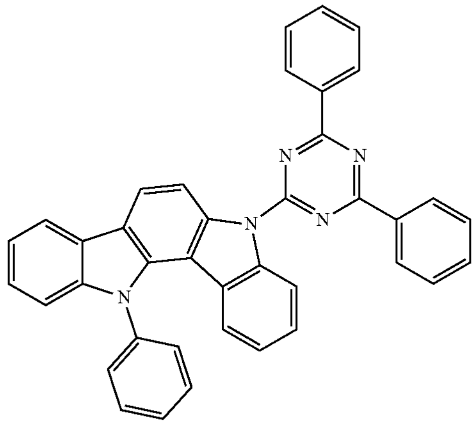
-continued
T-19
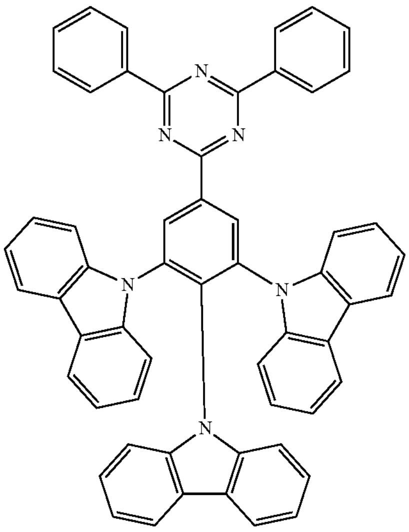
T-20
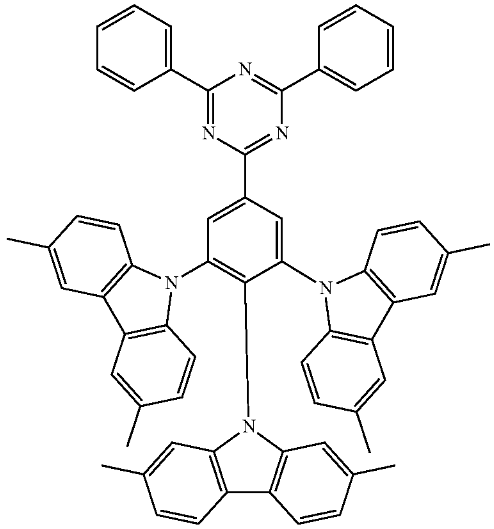
T-21
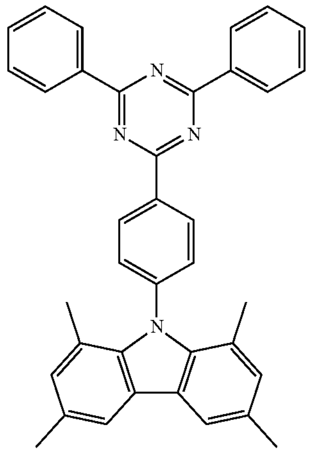

-continued
T-22
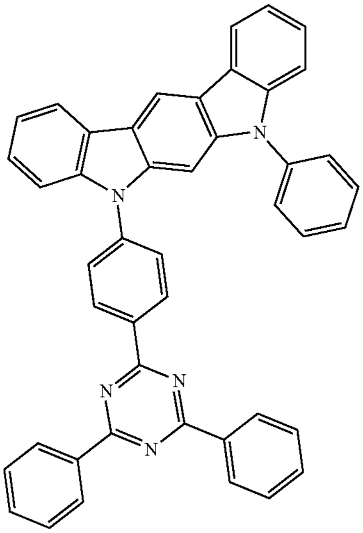
T-23
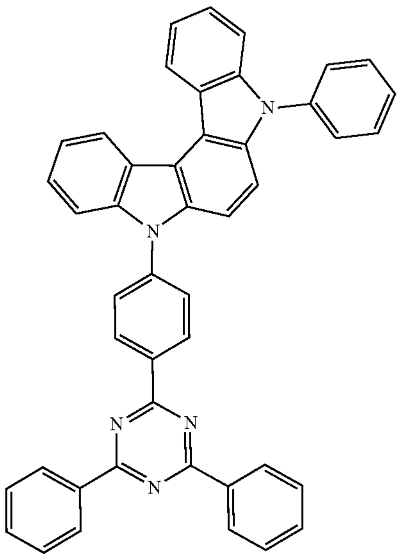
T-24
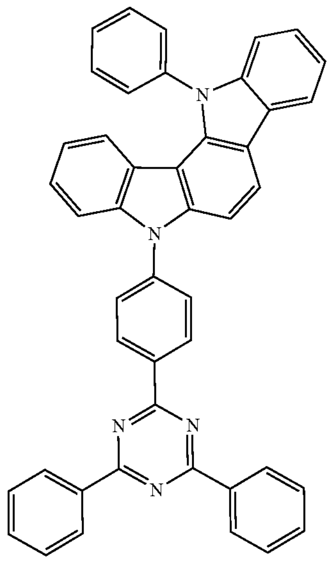
-continued
T-25
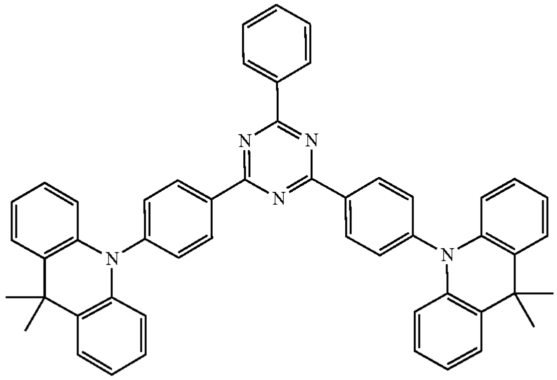
T-26
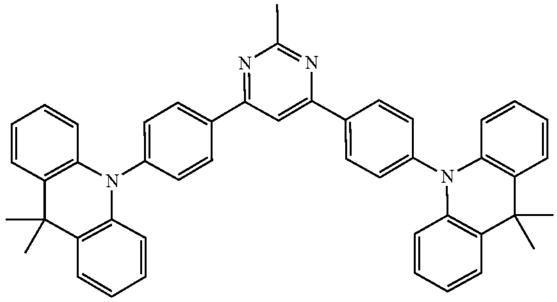
T-27
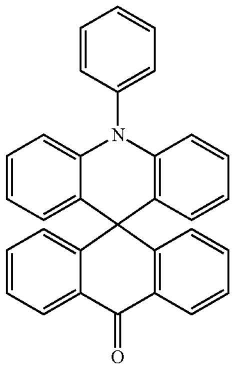
T-28
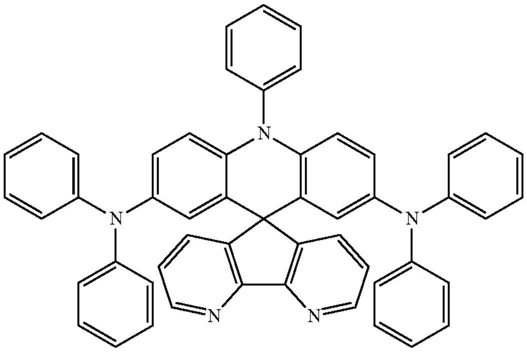

-continued
T-29
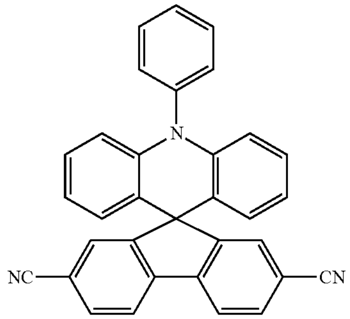
T-30
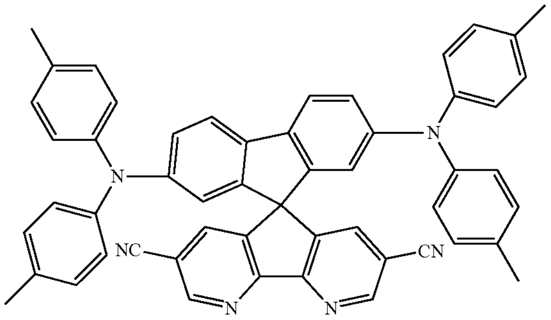
T-31
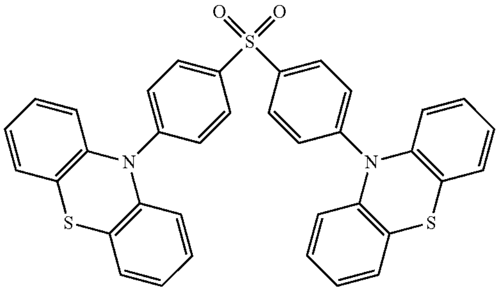
T-32
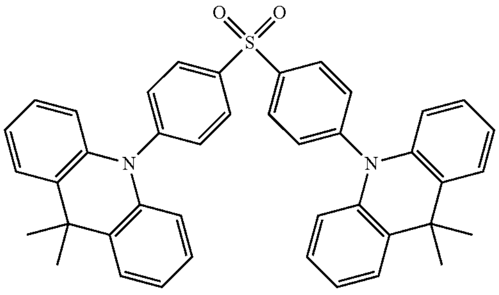
-continued
T-33
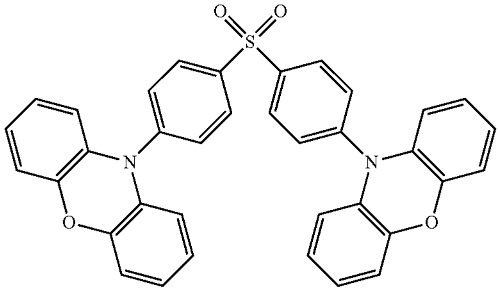
T-34
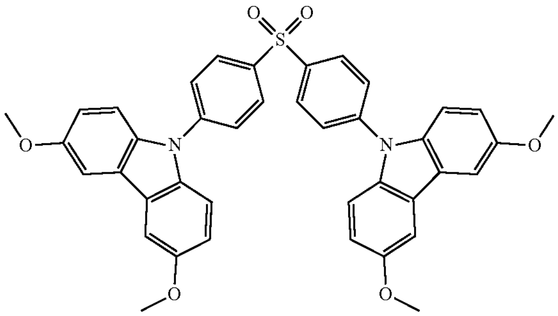
T-35
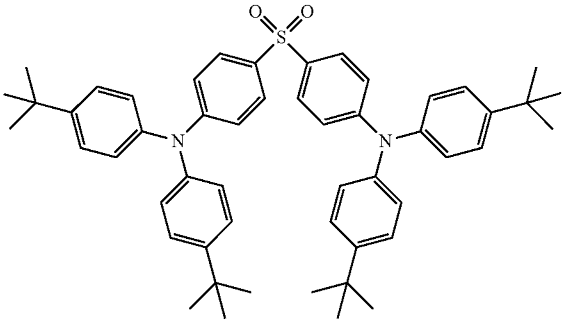
T-36
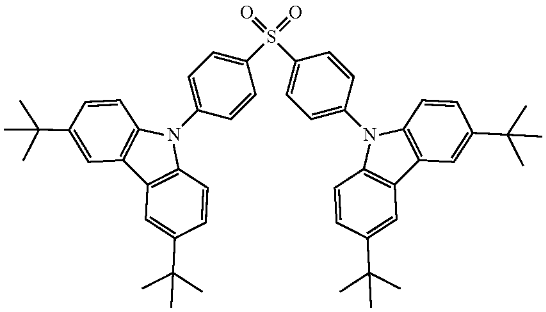

-continued
T-37
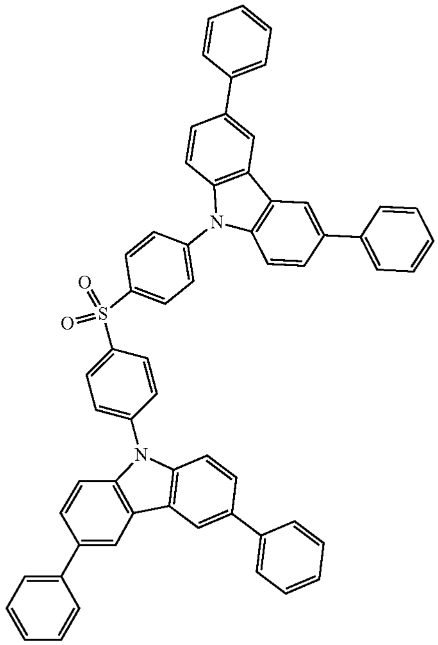
T-38
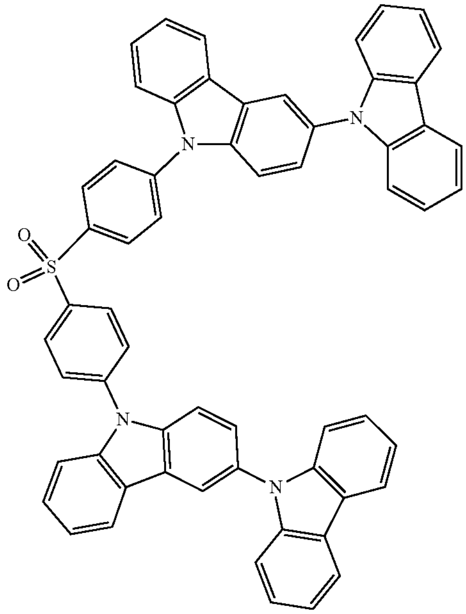
-continued
T-39
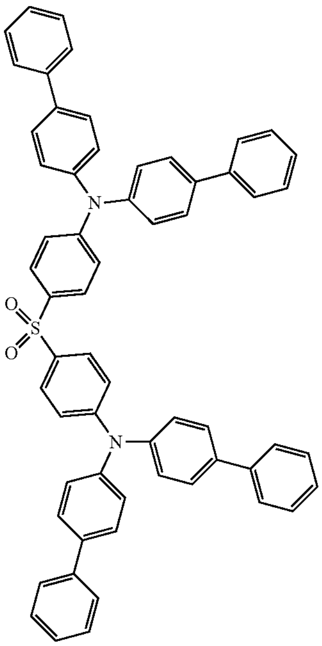
T-40
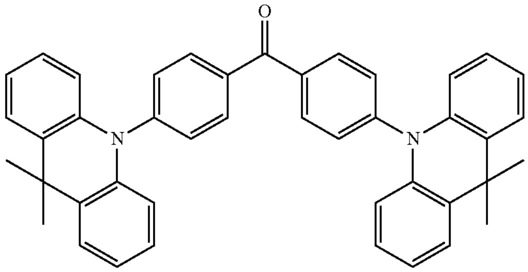
T-41
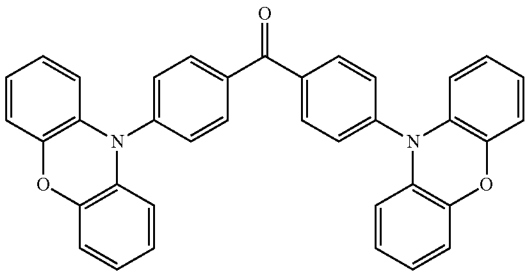
T-42
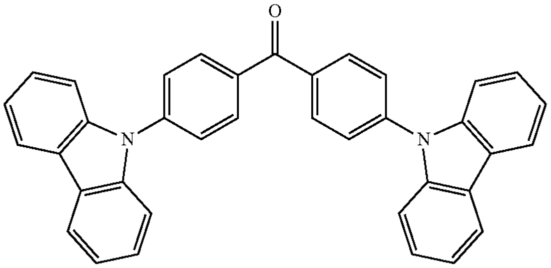

-continued
T-43
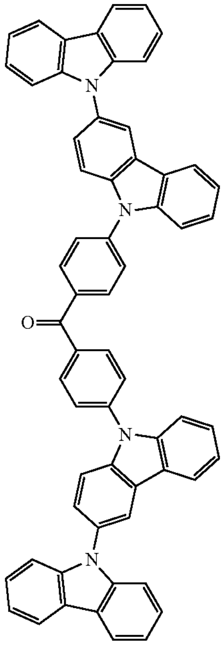
T-44
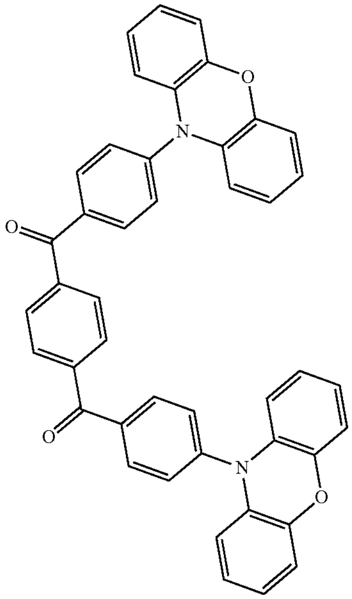
-continued
T-45
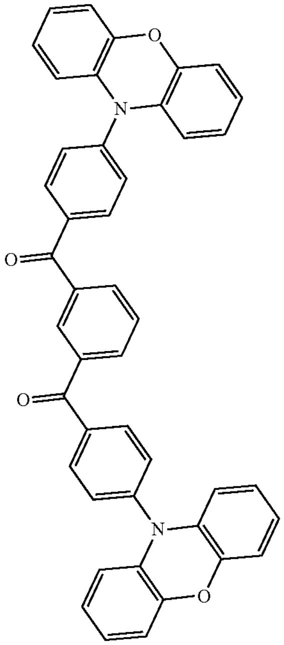
T-46
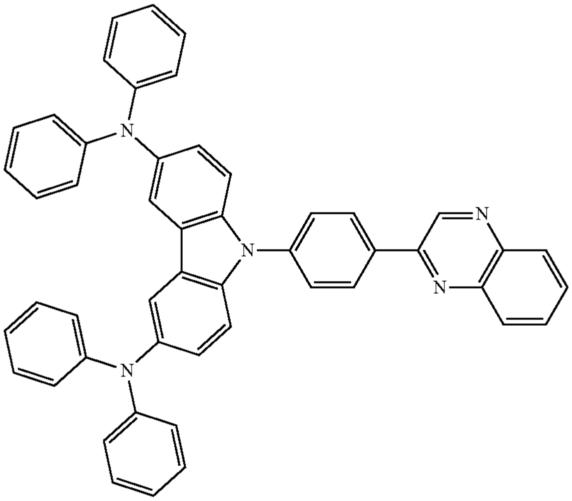
T-47
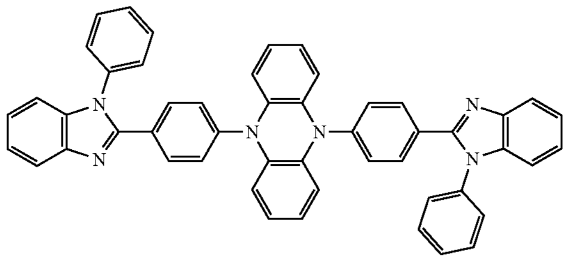

-continued
T-48
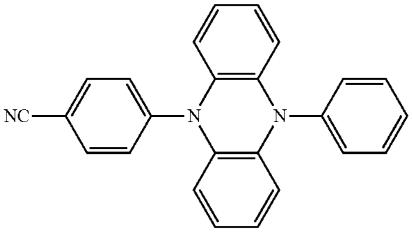
T-49
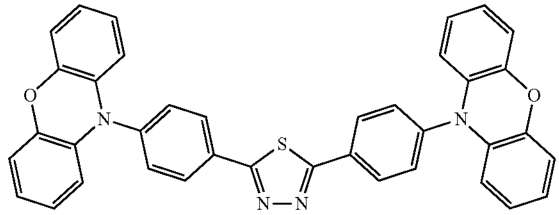
T-50
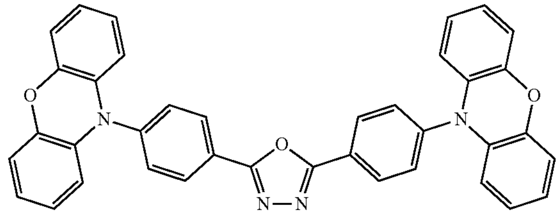
T-51
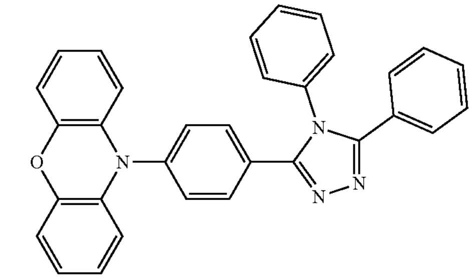
T-52
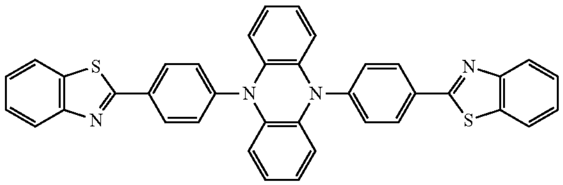
T-53
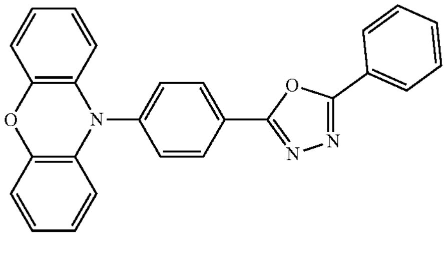
-continued
T-54
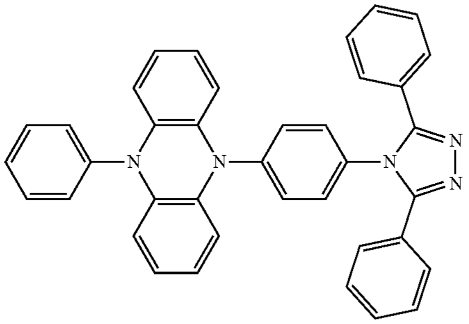
T-55
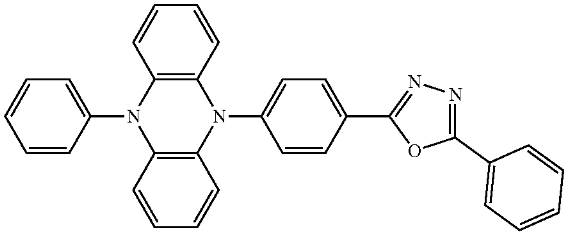
T-56
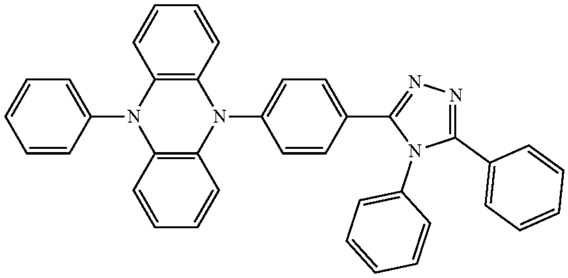
T-57
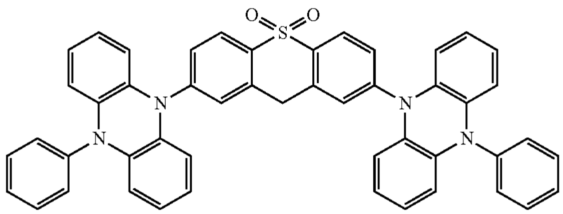
T-58
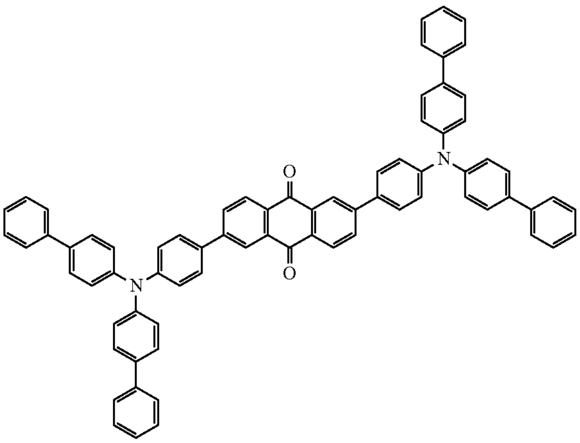

-continued
T-59
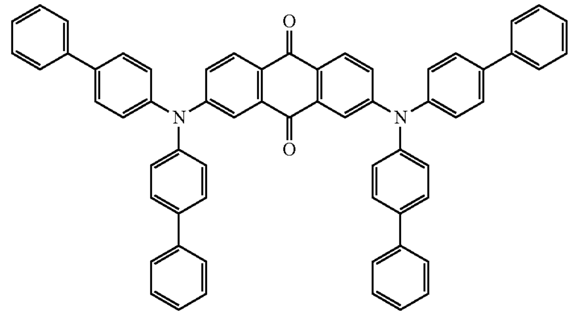
T-60
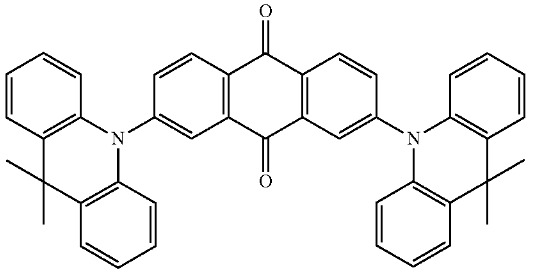
T-61
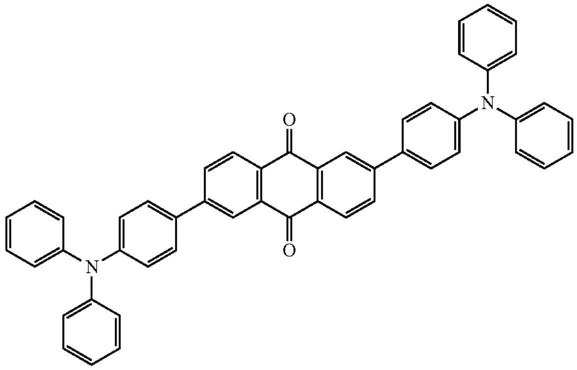
T62
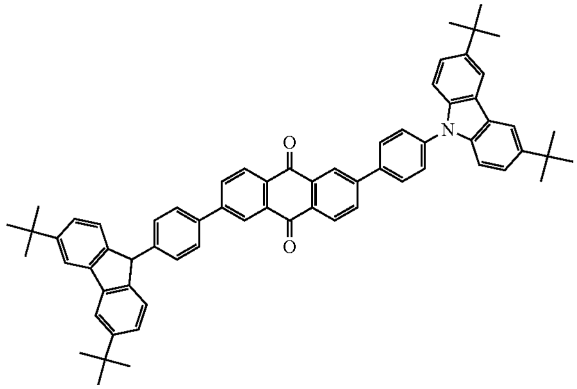
-continued
T-63
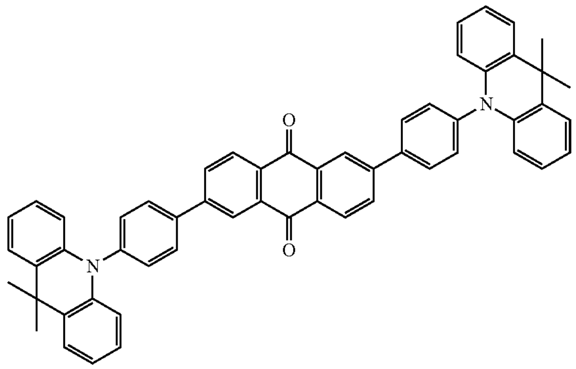
T-64
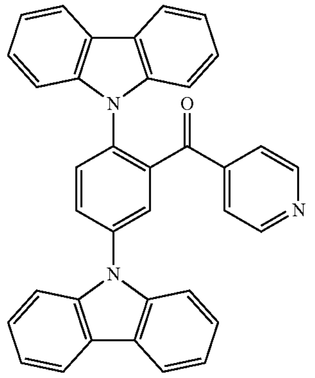
T-65
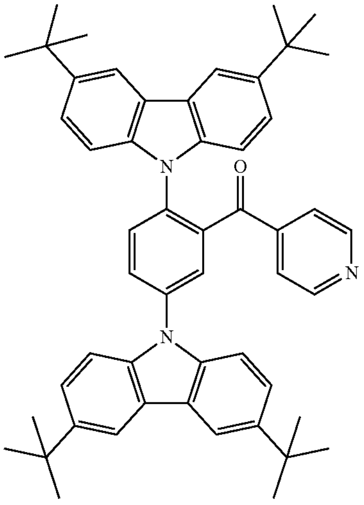
T-66
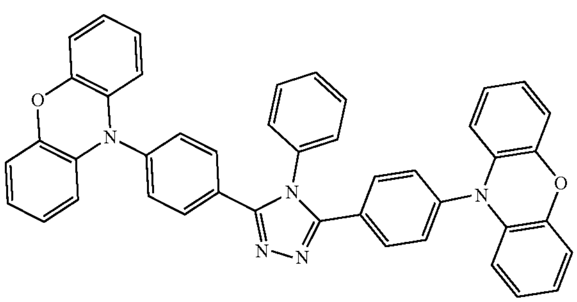

-continued
T-67
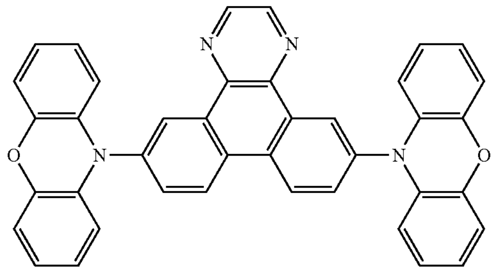
T-68
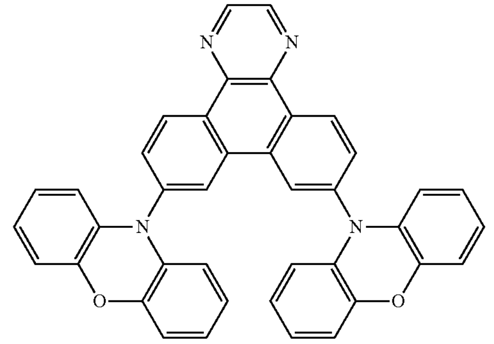
T-69
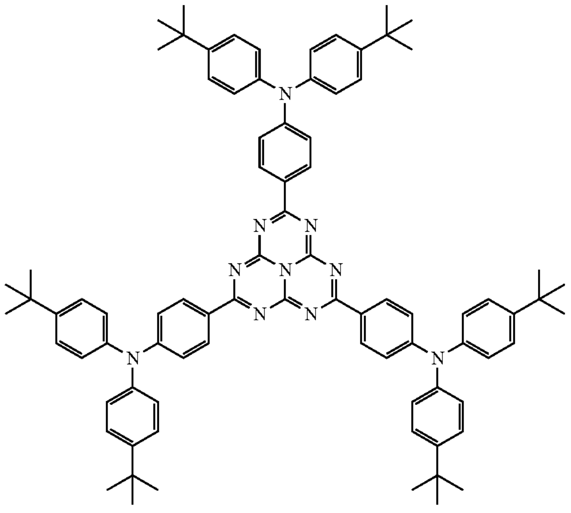
-continued
T-70
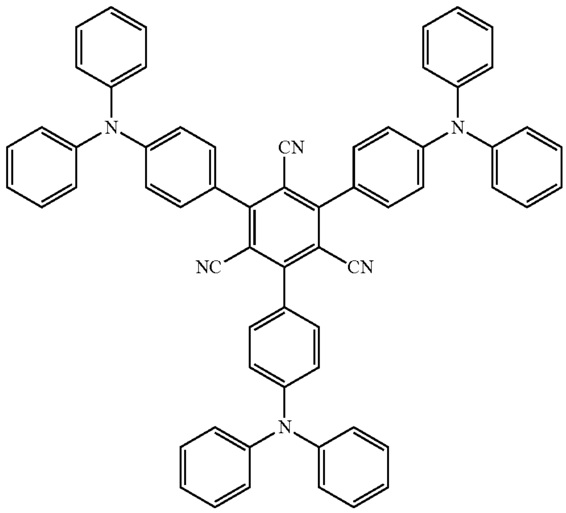
T-71
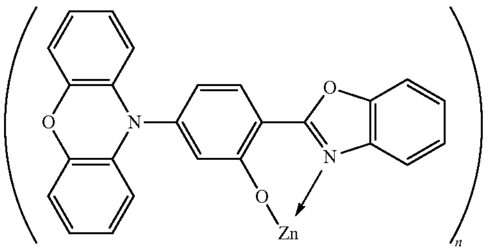
T-72
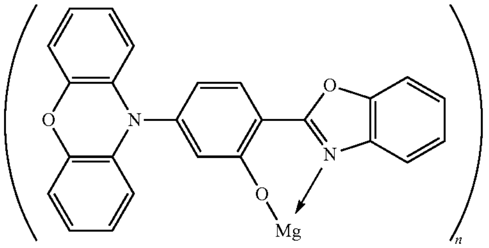
T-73
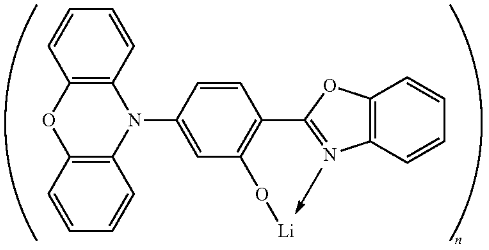

-continued
T-74
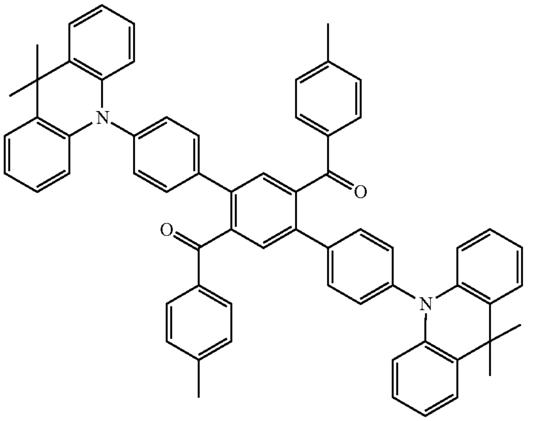
T-75
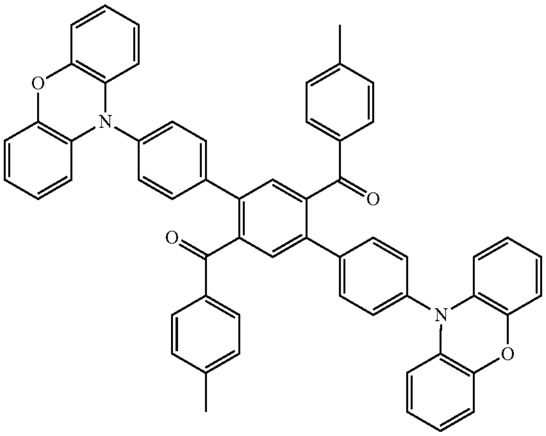
T-76
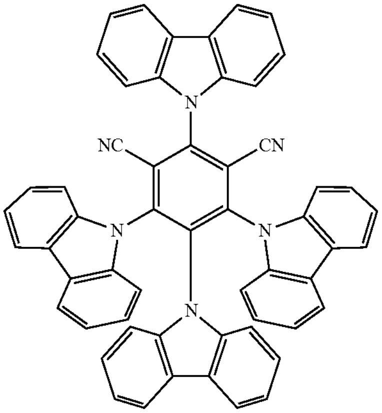
T-77
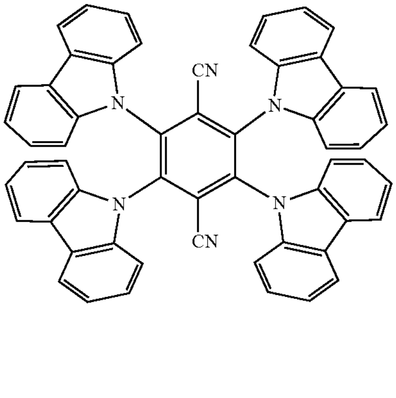
-continued
T-78
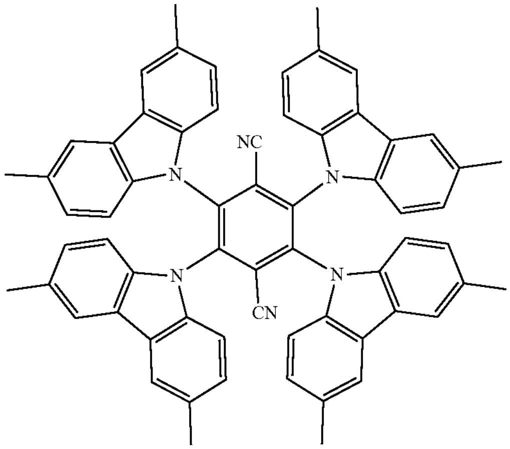
T-79
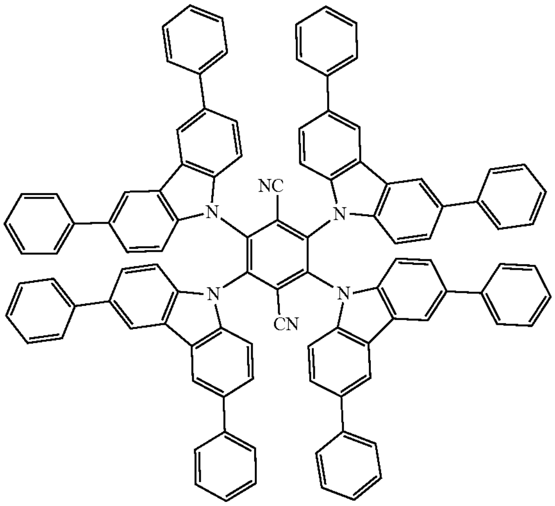
T-80
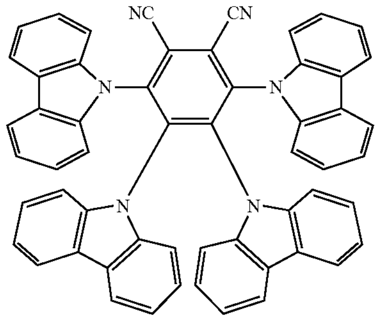
T-81
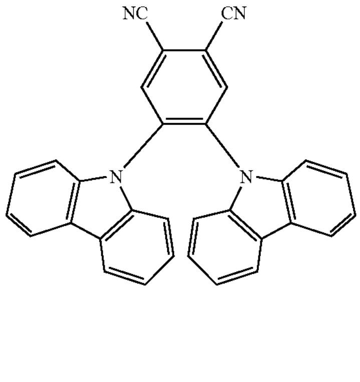

T-82
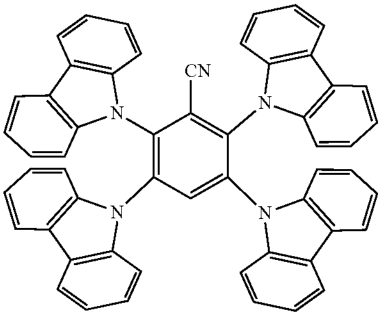
T-83
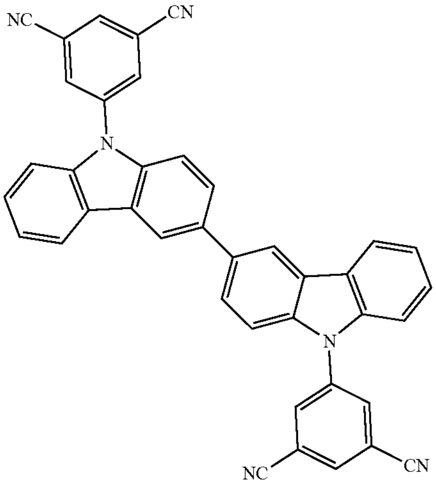
T-84
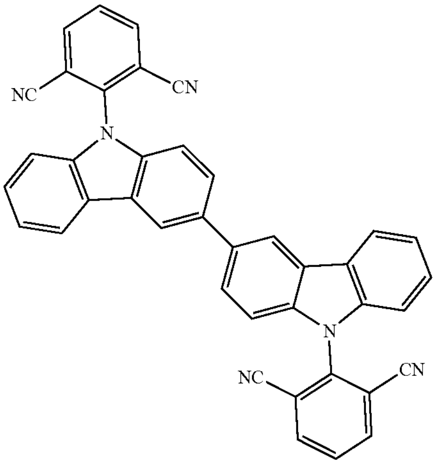
T-85
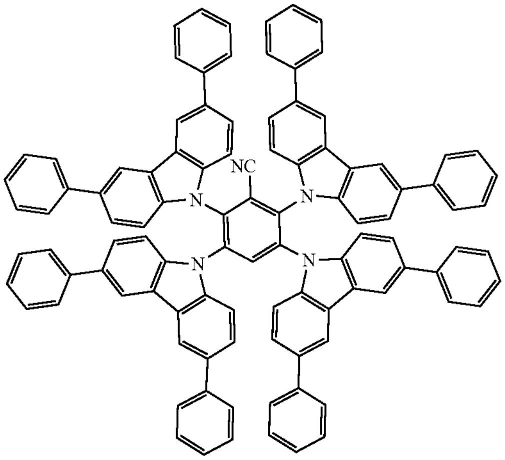
T-86
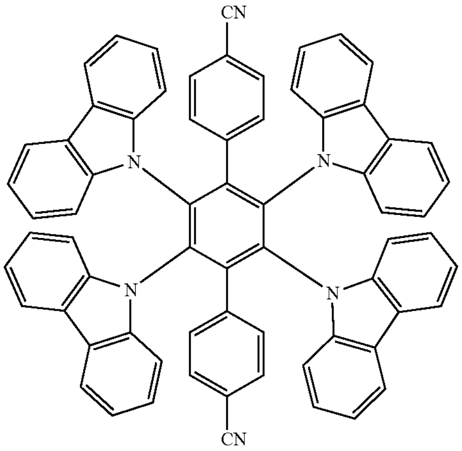
T-87
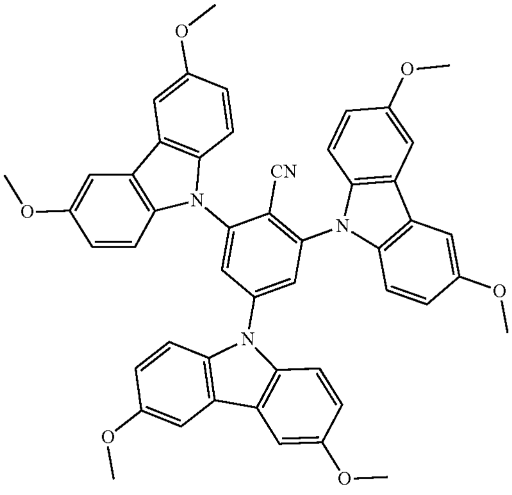

-continued
T-88
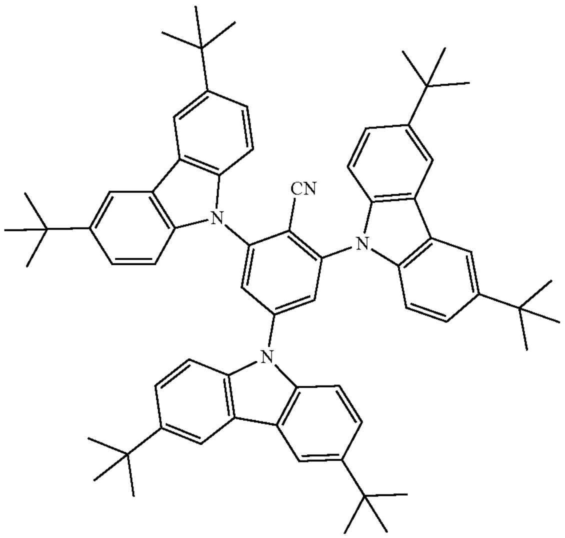
T-89
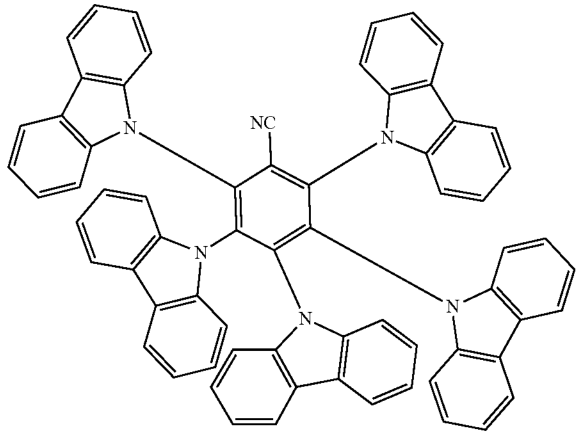
T-90
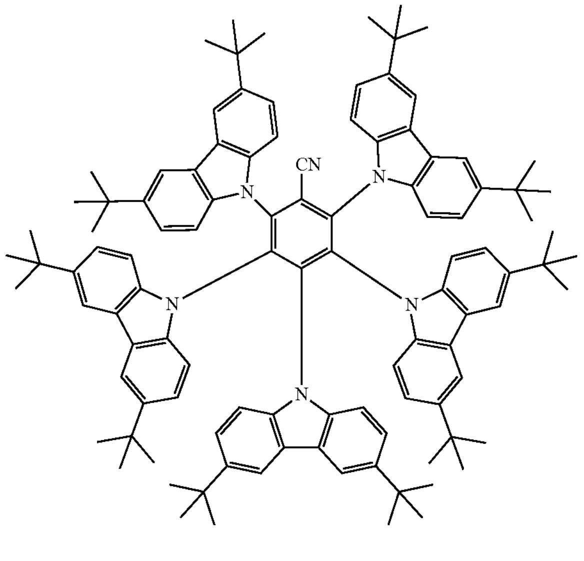
-continued
T-91
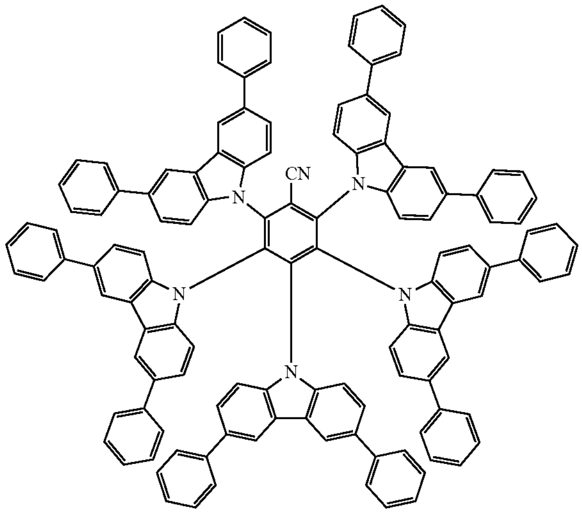
T-92
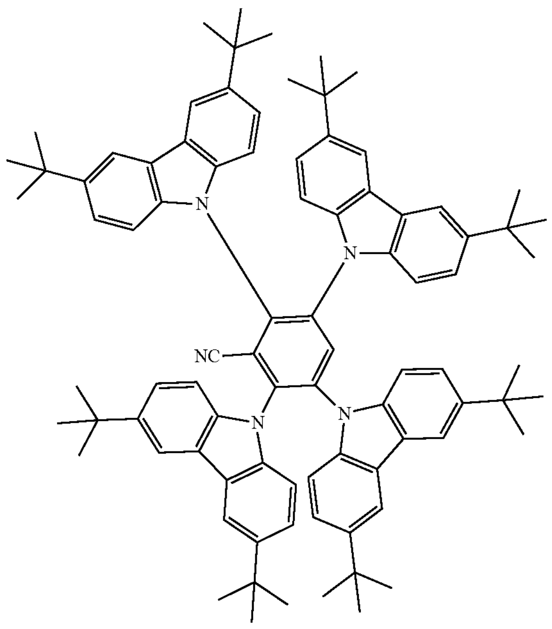
T-93
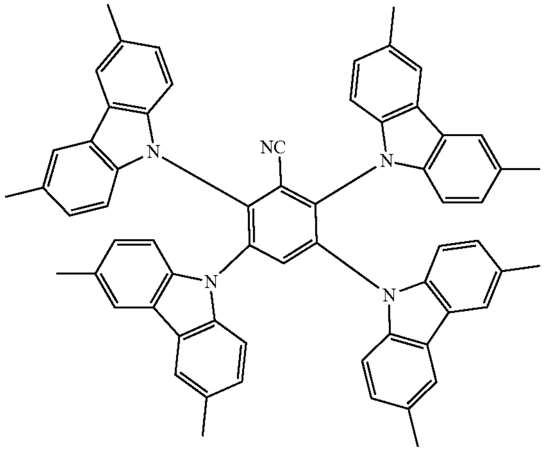

-continued

T-94

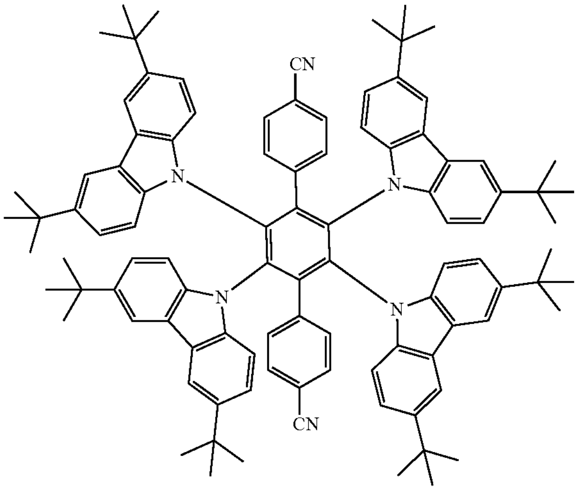

T-95

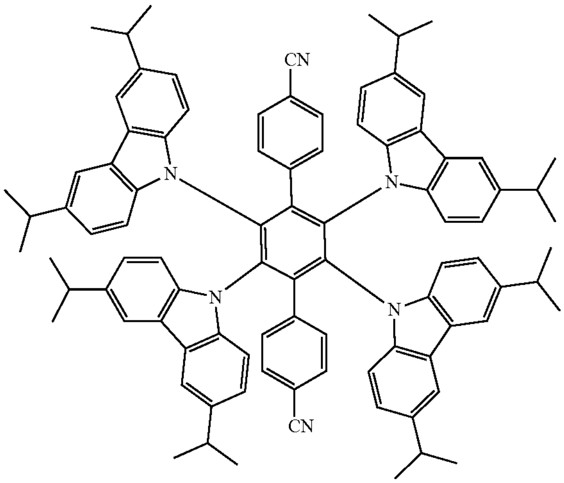

T-96

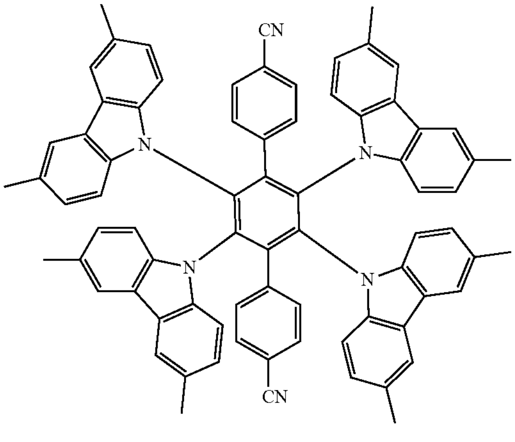

-continued

T-97

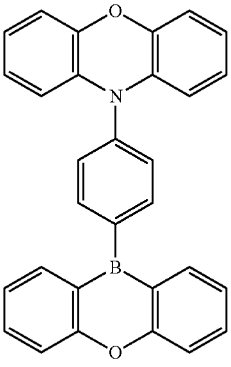

T-98

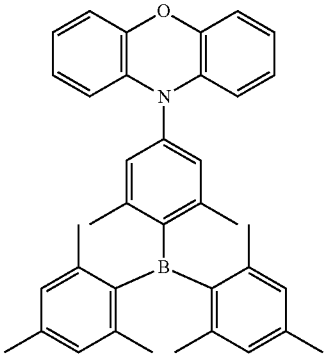

T-99

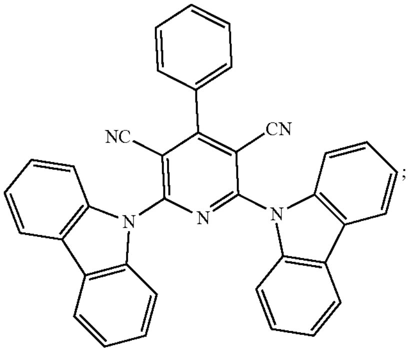

;

in T-71, T-72 and T-73, n is either 1, 2 or 3 independently.

In the present application, the above-mentioned series of sensitizers with specific structures are preferably used in combination with green fluorescent dyes, which can further narrow the spectrum, improve the color purity of green light, and improve the efficiency of the device at the same time.

Further, the host material comprises one or a combination of at least two of following compounds of GPH-1 to GPH-80 (for example, a combination of GPH-1 and GPH-2, a combination of GPH-5, GPH-7 and GPH-12, and a combination of GPH-3, GPH-60, GPH-70 and GPH-80, etc.):

GPH-1
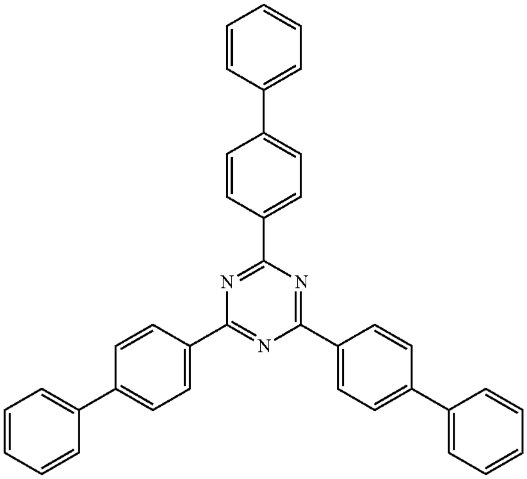
GPH-2
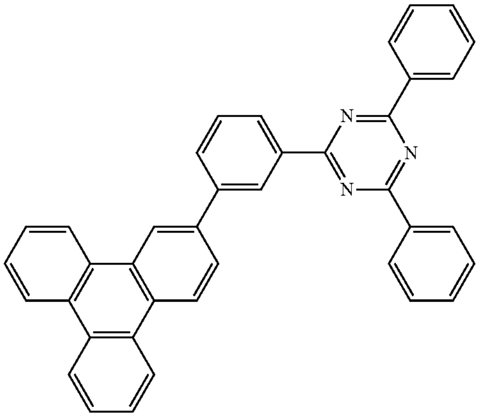
GPH-3
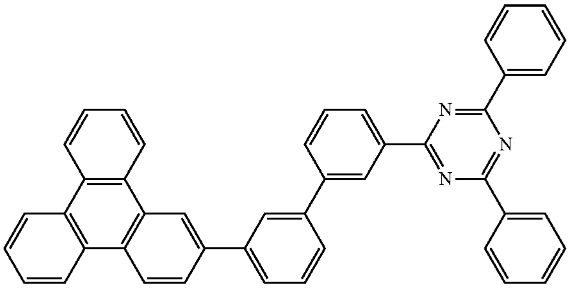
GPH-4
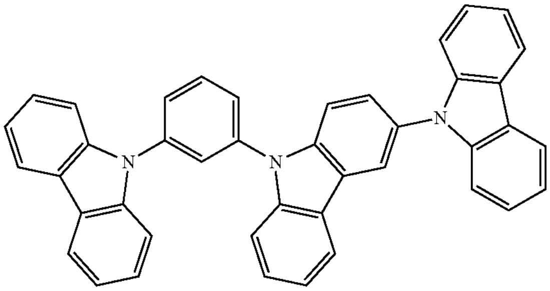
-continued
GPH-5
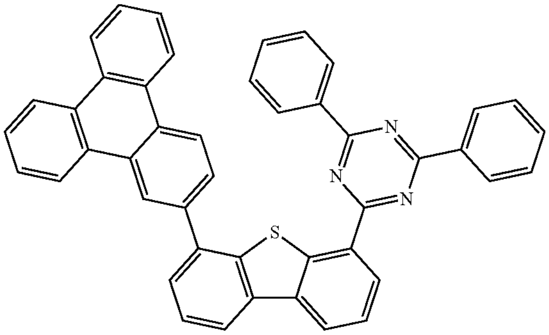
GPH-6
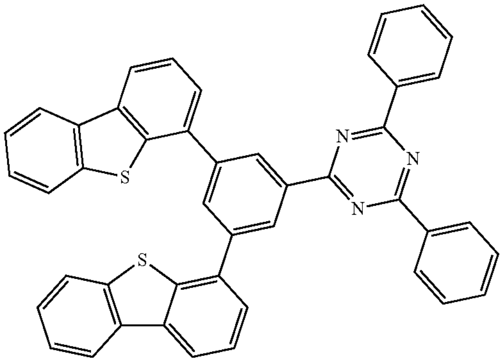
GPH-7
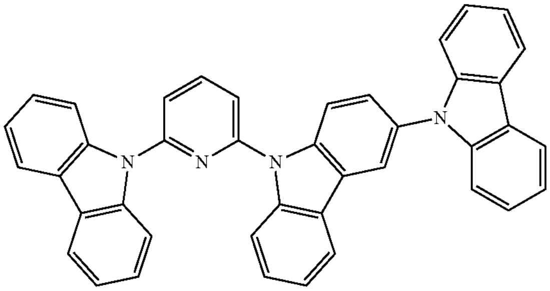
GPH-8
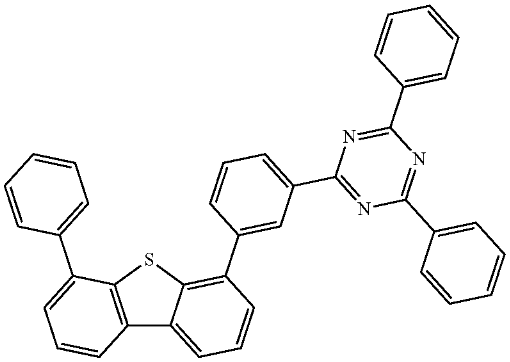

-continued
GPH-9
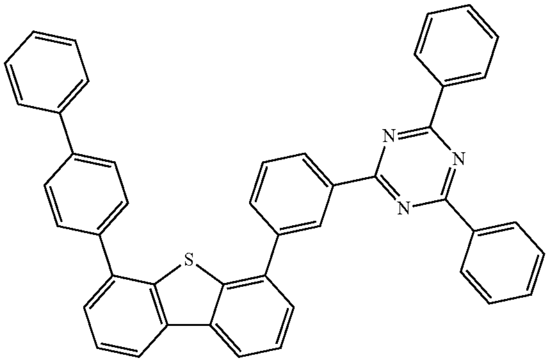
GPH-10
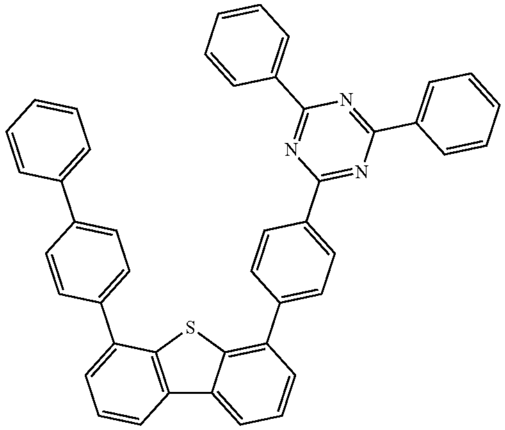
GPH-11
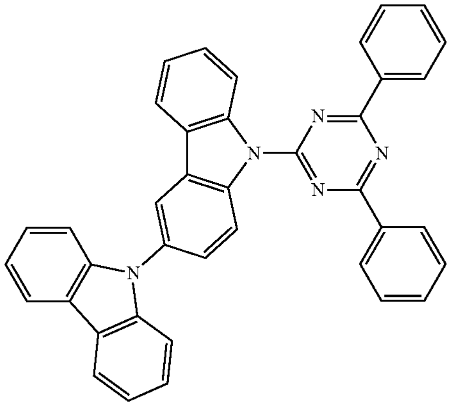
GPH-12
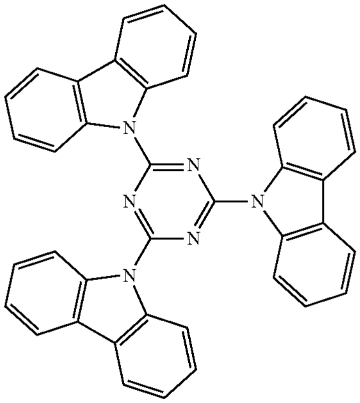
-continued
GPH-13
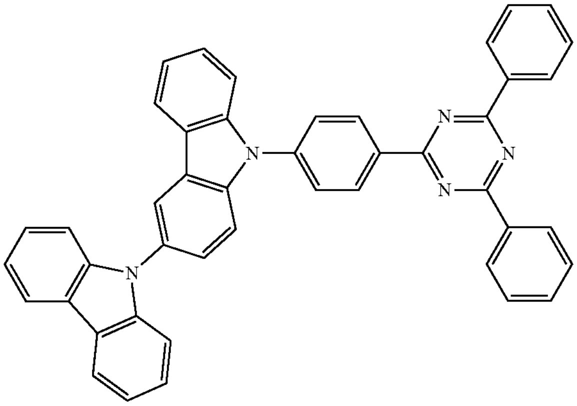
GPH-14
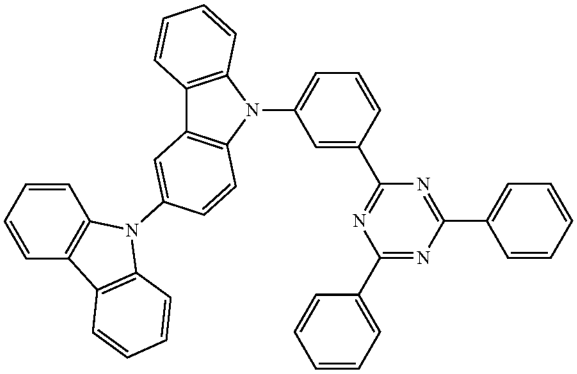
GPH-15
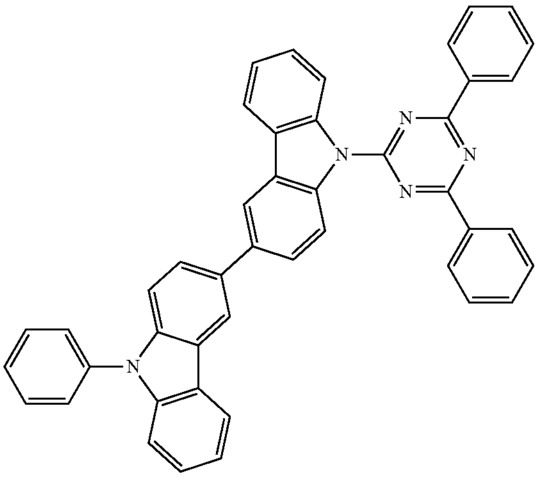

-continued
GPH-16
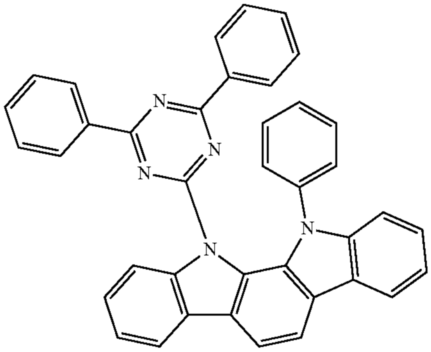
GPH-17
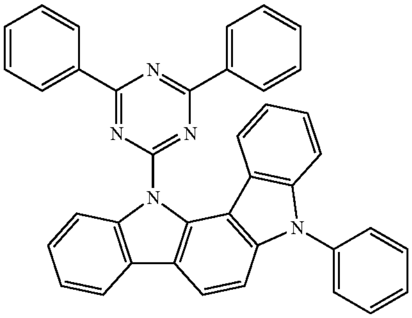
GPH-18
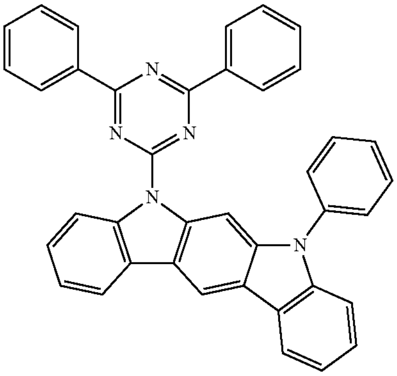
GPH-19
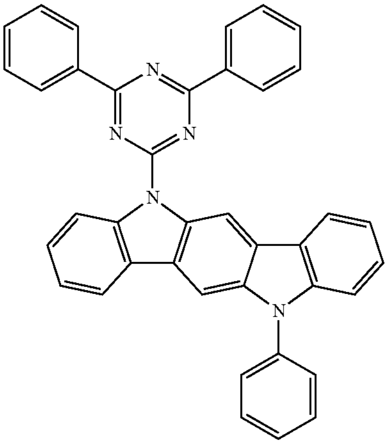
-continued
GPH-20
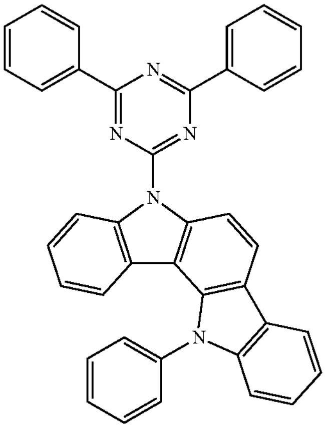
GPH-21
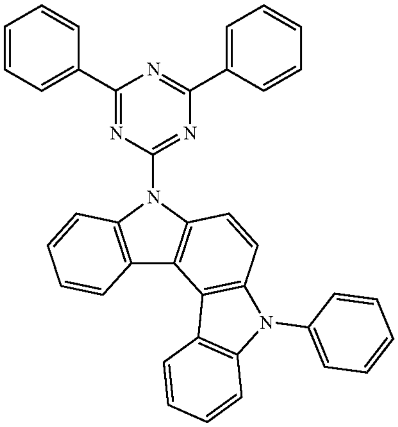
GPH-22
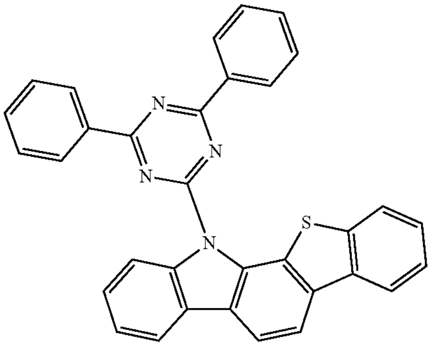
GPH-23
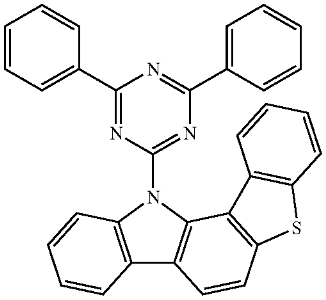

-continued
GPH-24
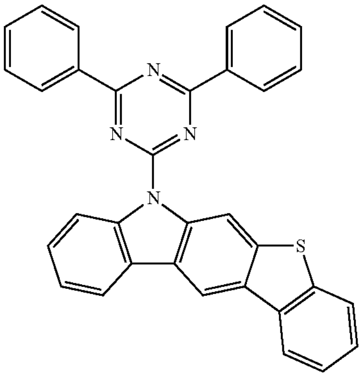
GPH-25
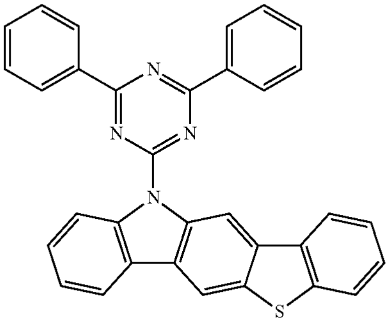
GPH-26
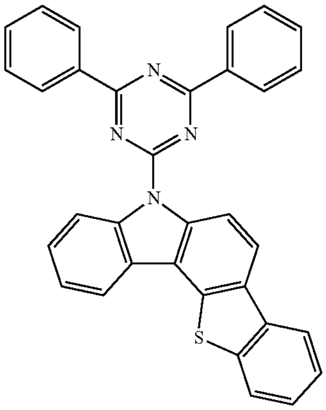
GPH-27
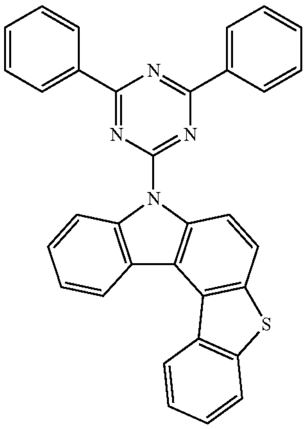
-continued
GPH-28
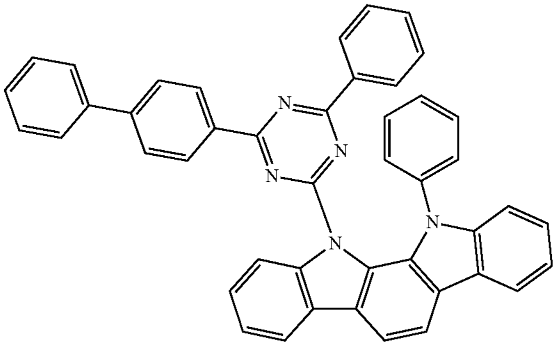
GPH-29
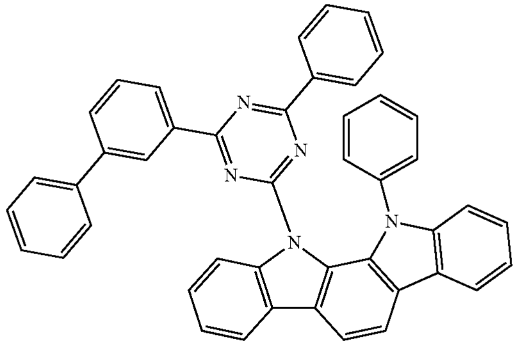
GPH-30
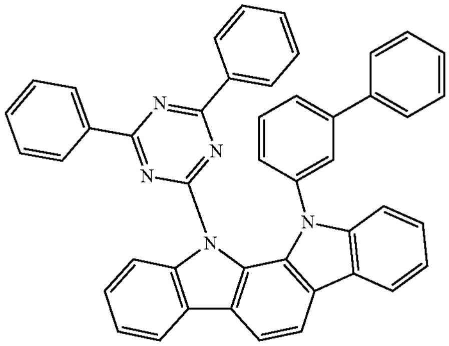
GPH-31
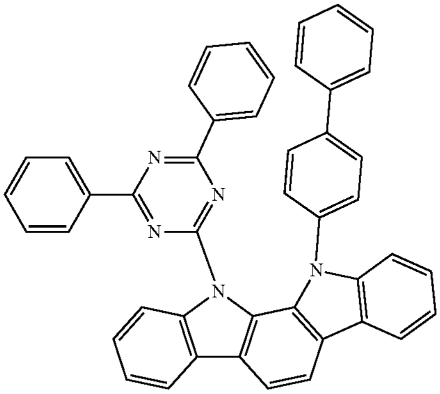

-continued
GPH-32
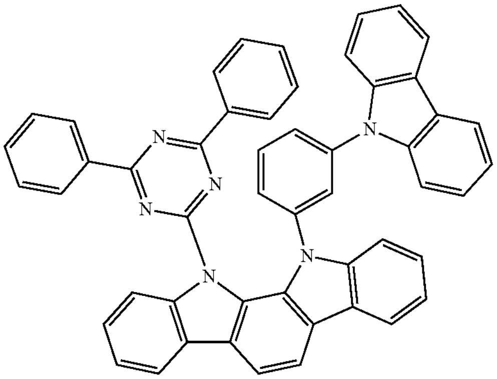
GPH-33
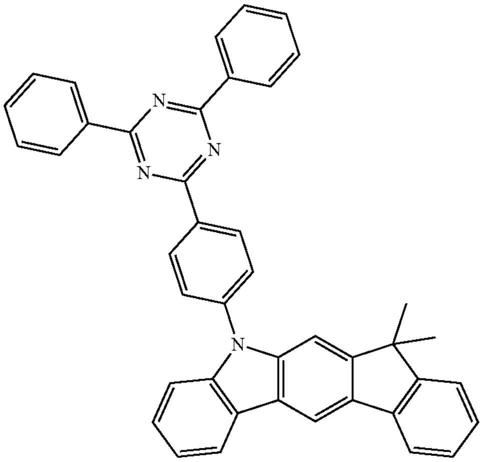
GPH-34
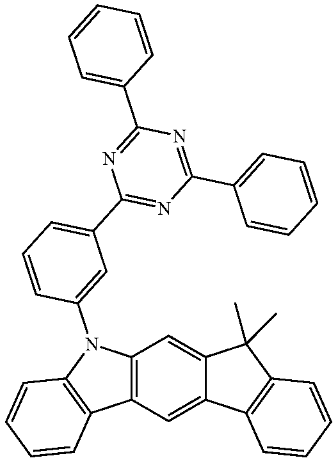
-continued
GPH-35
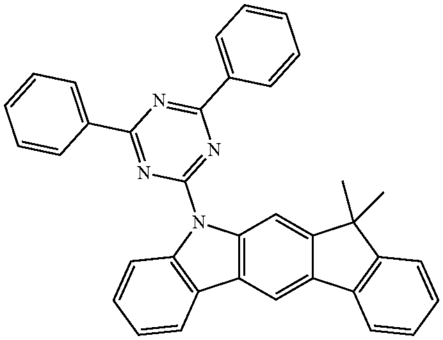
GPH-36
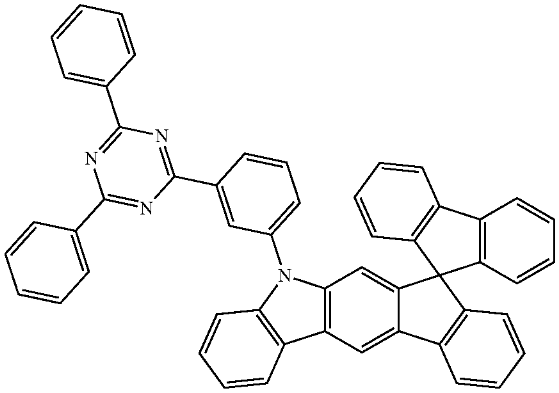
GPH-37
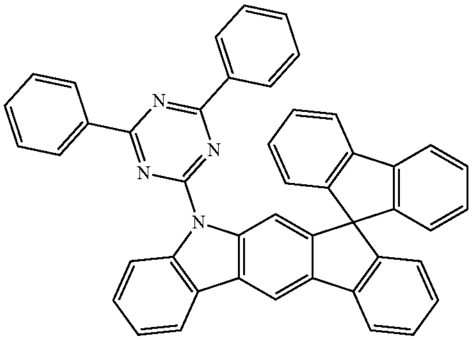
GPH-38
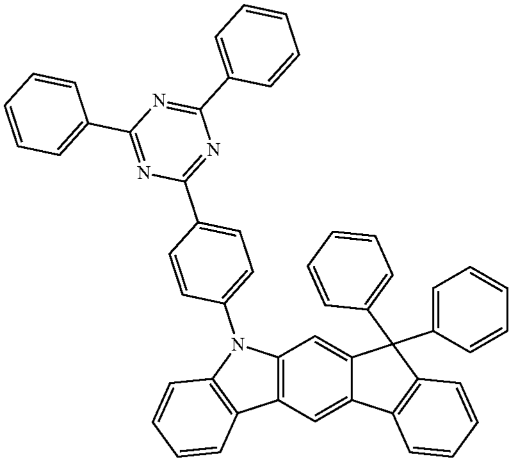

-continued
GPH-39
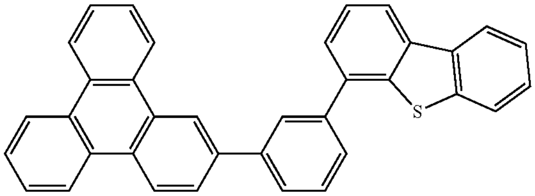
GPH-40
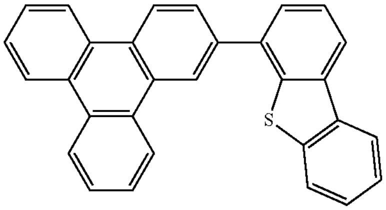
GPH-41
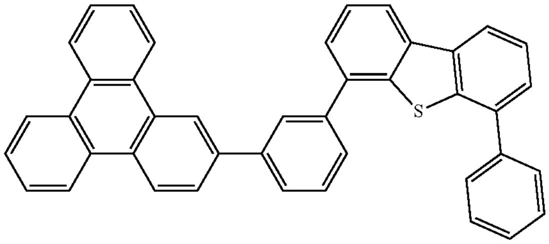
GPH-42
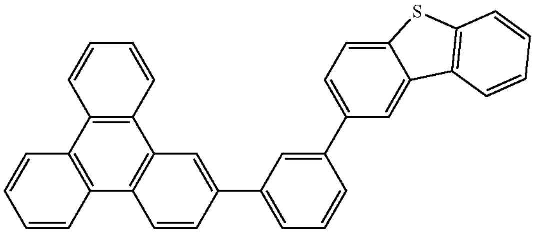
-continued
GPH-43
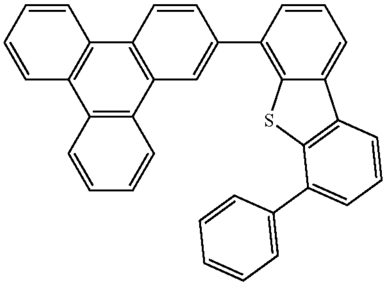
GPH-44
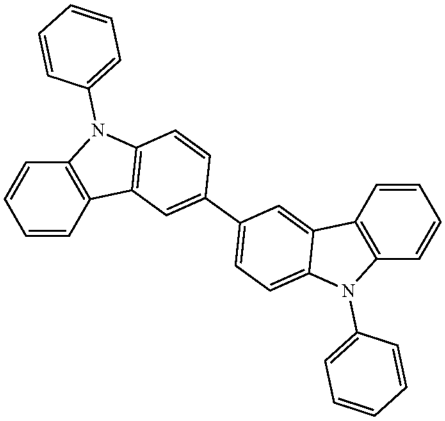
GPH-45
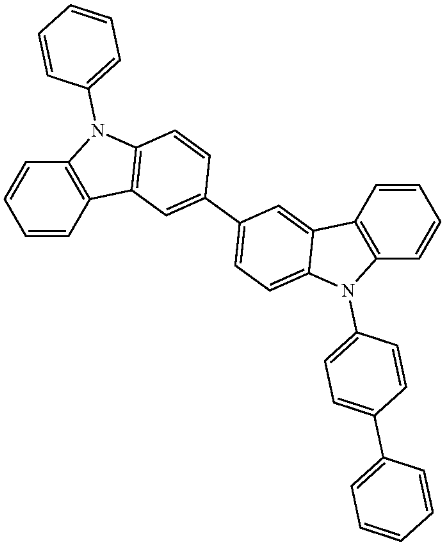

-continued
GPH-46
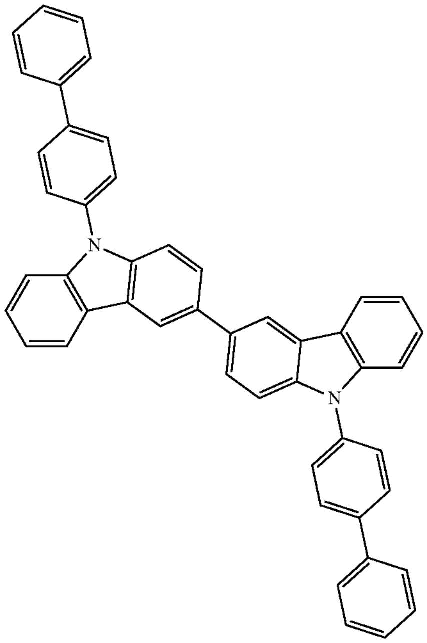
GPH-47
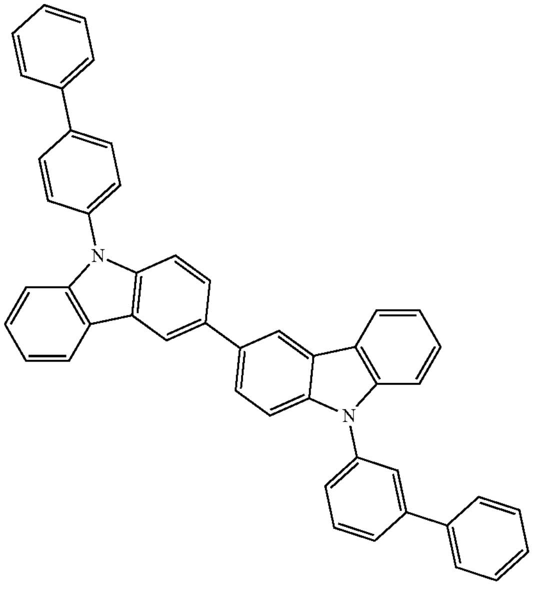
-continued
GPH-48
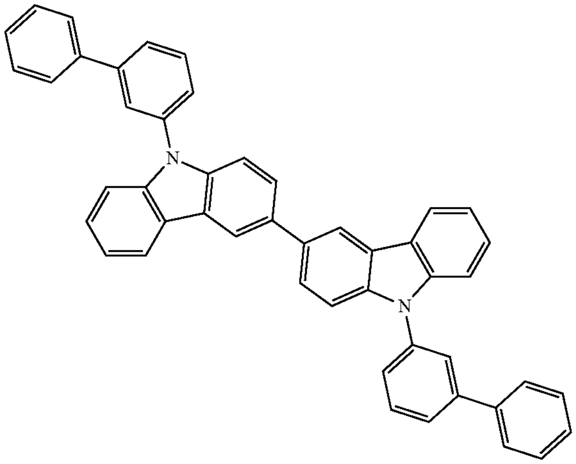
GPH-49
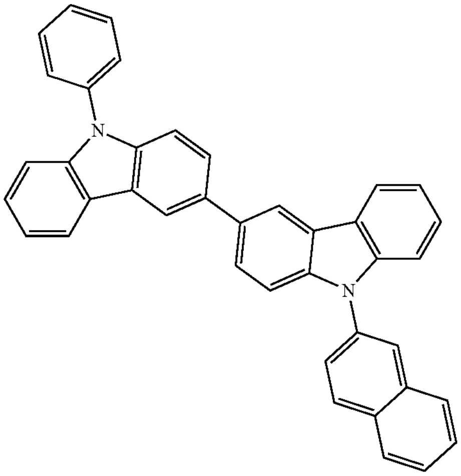
GPH-50
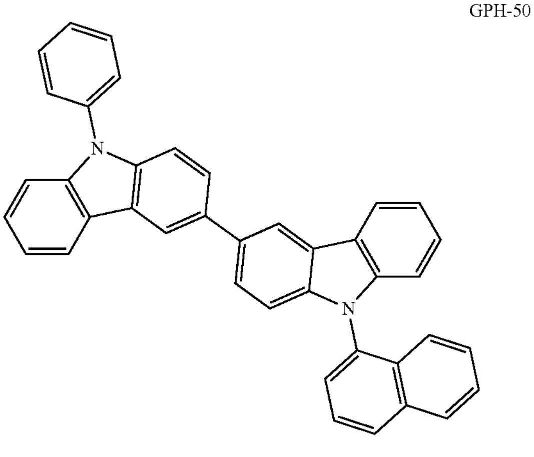

-continued
GPH-51
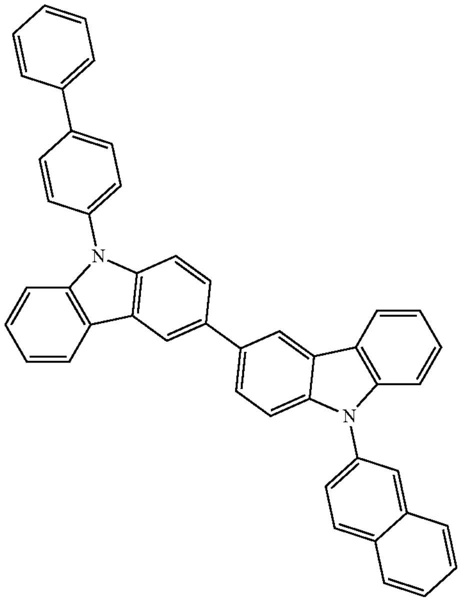
GPH-52
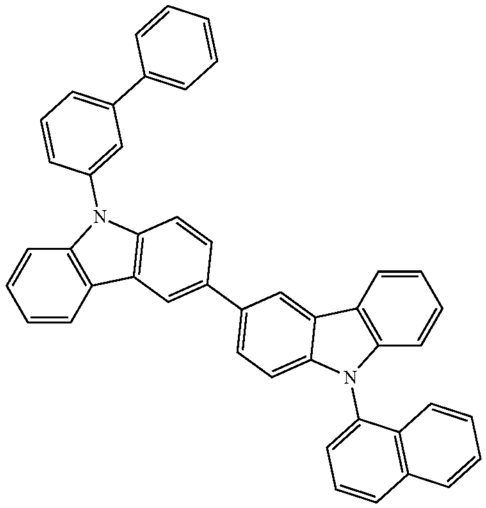
-continued
GPH-53
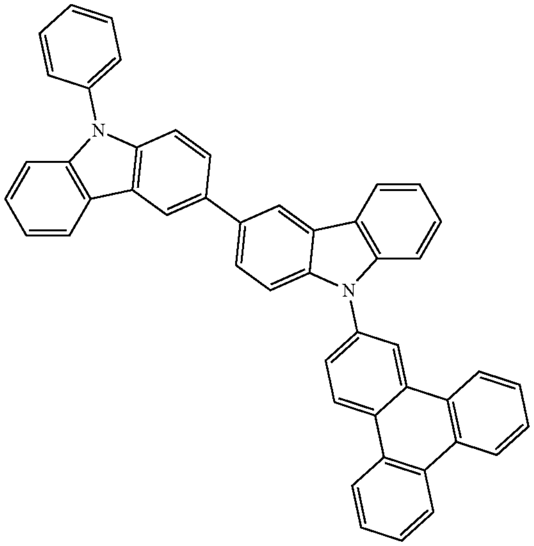
GPH-54
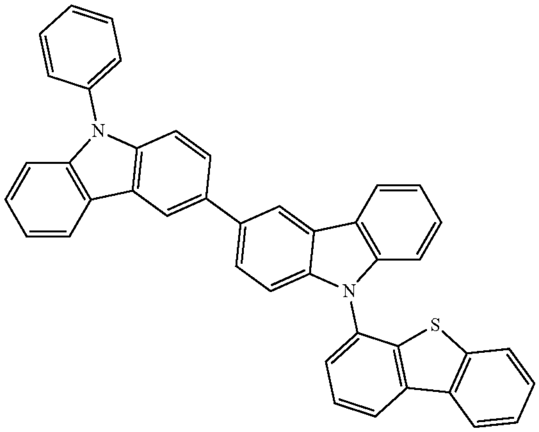
GPH-55
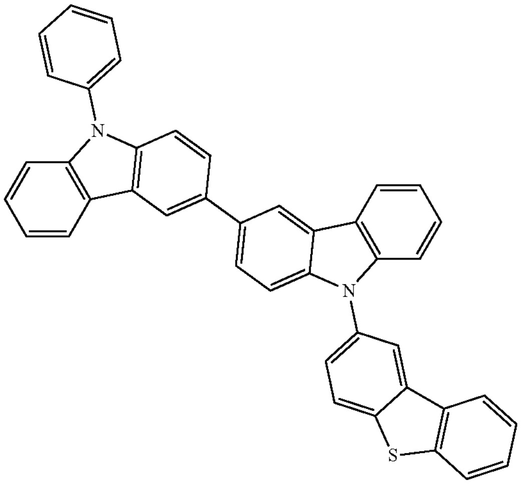

-continued
GPH-56
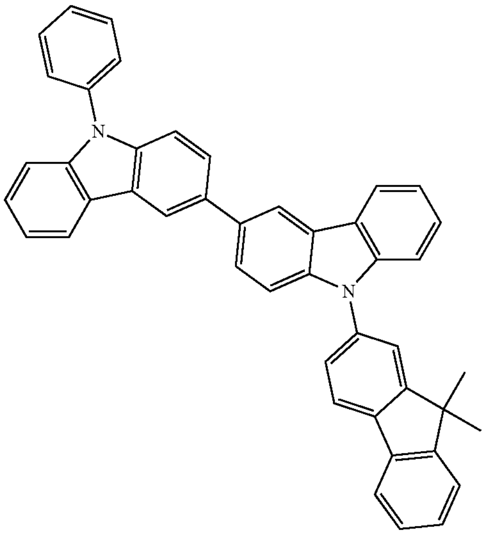
GPH-57
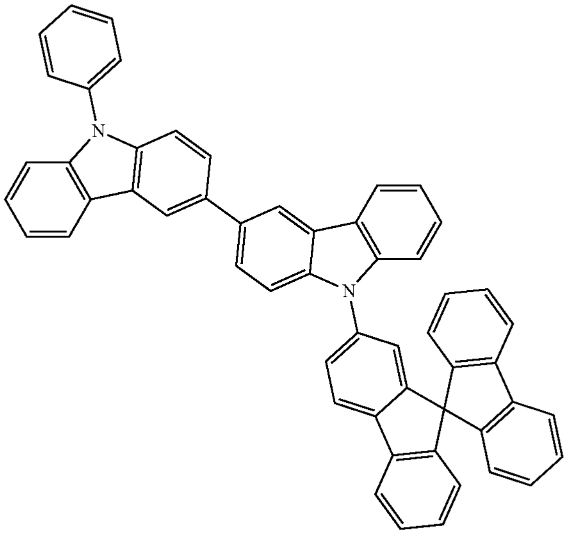
GPH-58
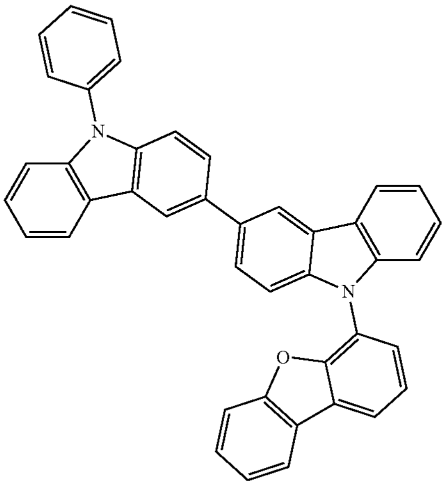
-continued
GPH-59
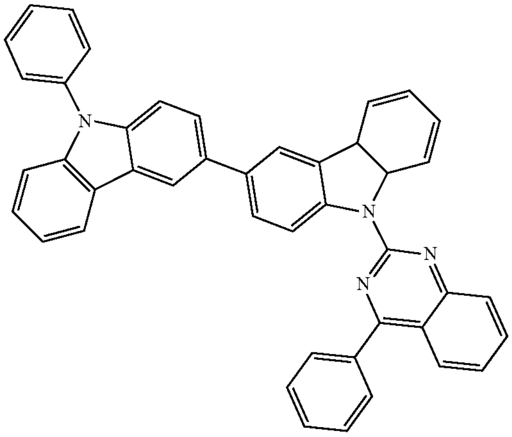
GPH-60
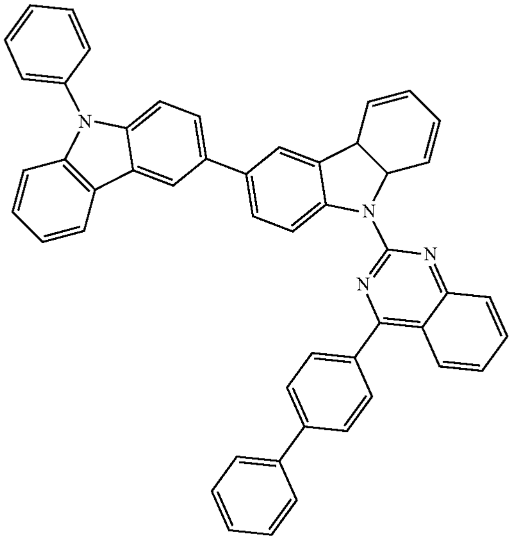
GPH-61
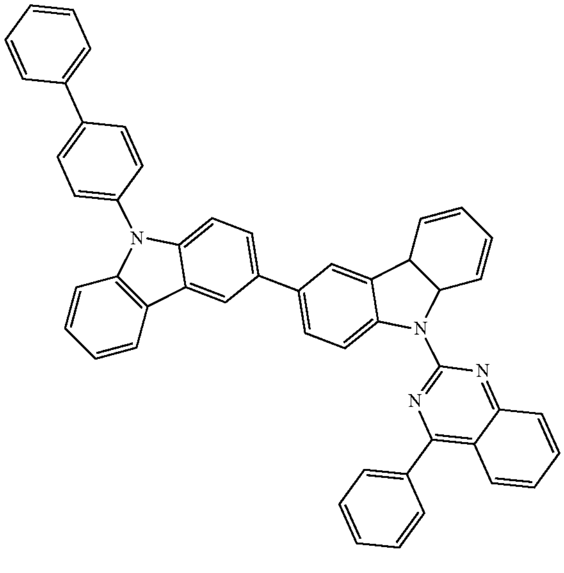

-continued
GPH-62
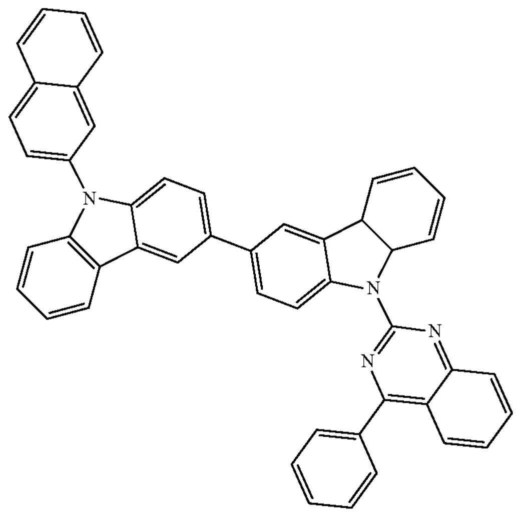
GPH-63
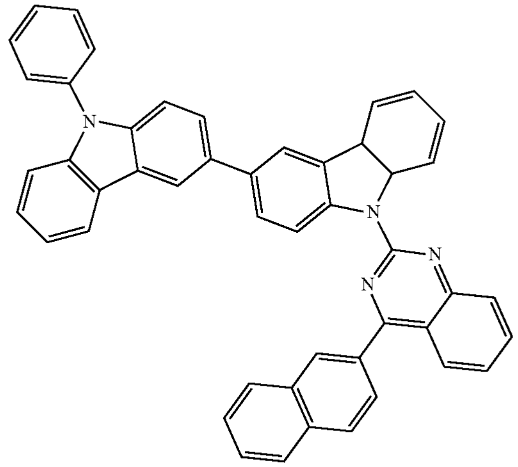
GPH-64
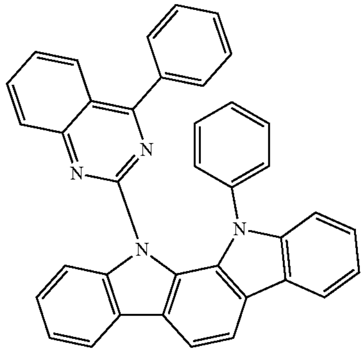
-continued
GPH-65
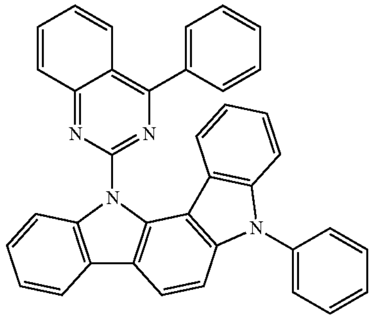
GPH-66
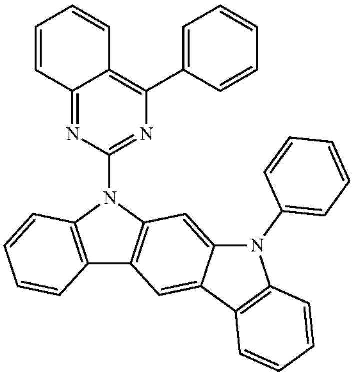
GPH-67
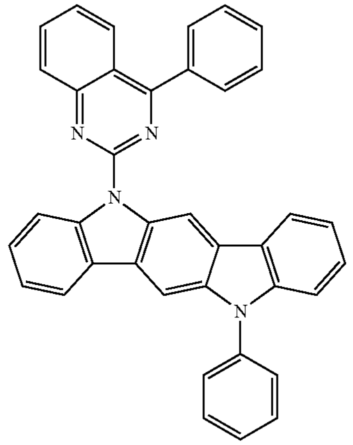
GPH-68
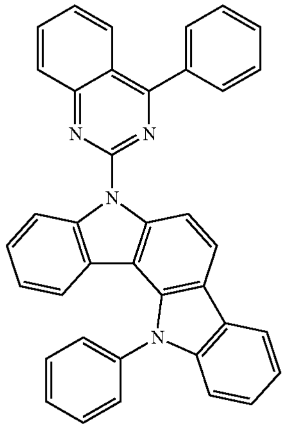

-continued
GPH-69
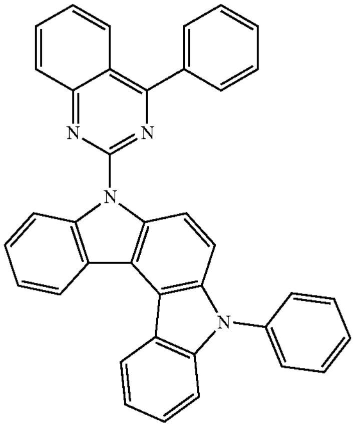
GPH-70
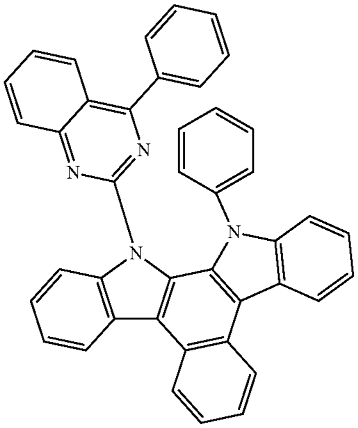
GPH-71
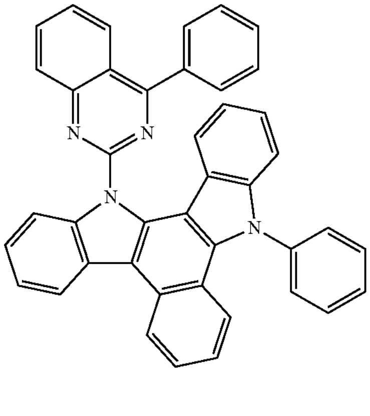
-continued
GPH-72
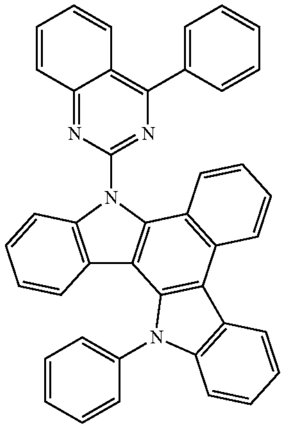
GPH-73
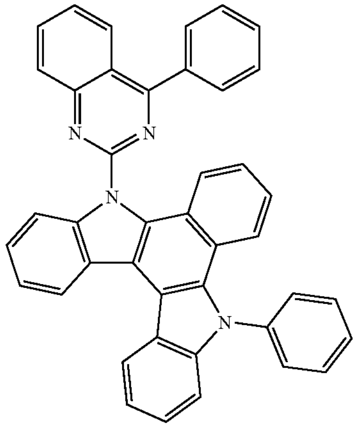
GPH-74
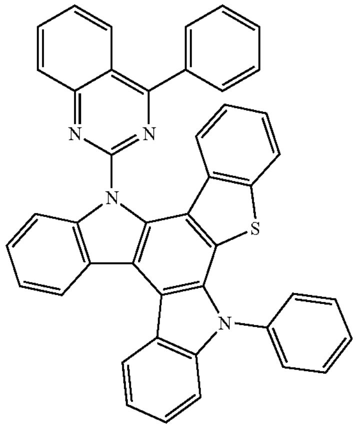

-continued

GPH-75

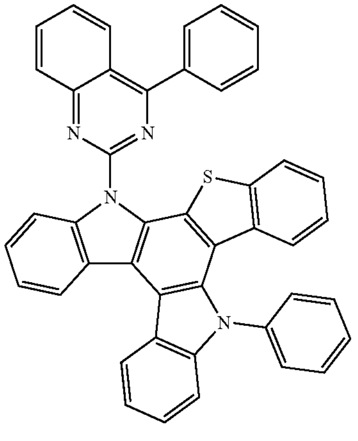

GPH-76

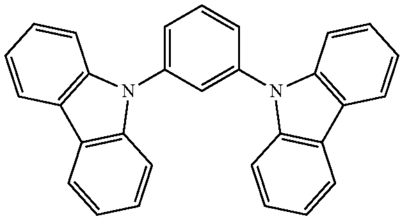

GPH-77

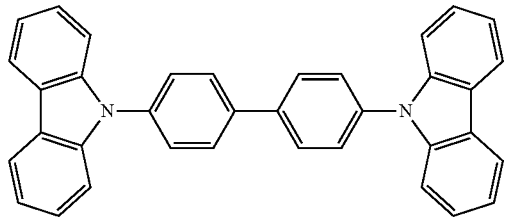

GPH-78

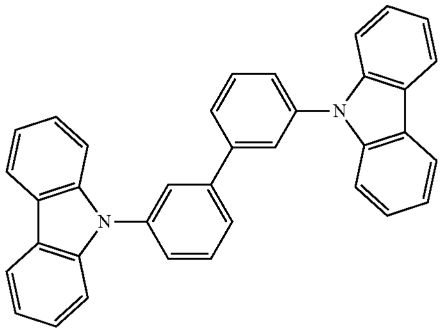

GPH-79

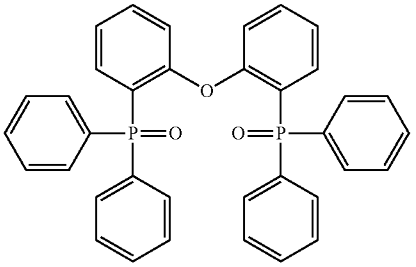

-continued

GPH-80

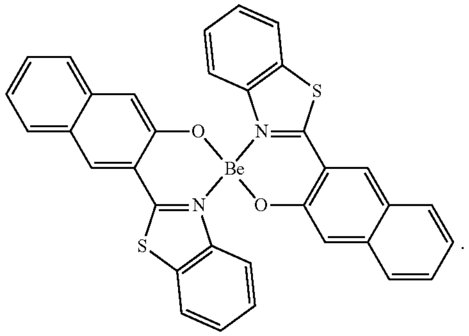

In the present application, the above-mentioned series of host materials with specific structures are preferably used in combination with green fluorescent dyes, which can further narrow the spectrum, improve the color purity of green light, and improve the efficiency of the device at the same time. When the above-mentioned host material of specific structure and the sensitizer of specific structure together are combined with the green fluorescent dye, the best effect is achieved.

Further, the mass ratio (doping concentration) of the green fluorescent dye to the light-emitting layer is from 0.1% to 30%, for example, 2%, 5%, 10%, 15%, or 20%, etc.;

and/or, the mass ratio (doping concentration) of the thermally activated delayed fluorescence sensitizer to the light-emitting layer is from 1% to 99%, for example, 2%, 5%, 10%, 15%, 20%, 25%, 30%, 35%, 40%, 45%, 50%, 60%, 70%, 80%, or 90%, etc.

Further, the mass ratio of the thermally activated delayed fluorescence sensitizer to the light-emitting layer is from 10% to 50%.

The material of the light-emitting layer refers to the sum of the host material, the thermally activated delayed fluorescence sensitizer and the green fluorescent dye.

Further, the thickness of the light-emitting layer is from 1 to 100 nm, for example, 5 nm, 10 nm, 20 nm, 30 nm, 40 nm, 50 nm, 60 nm, 70 nm, 80 nm or 90 nm, etc.

Further, the organic layer further comprises one or a combination of at least two of a hole injection layer (HIL), a hole transport layer (HTL), an electron blocking layer (EBL), a hole blocking layer (HBL), an electron transport layer (ETL) and an electron injection layer (EIL).

The hole transport region is located between the anode and the light-emitting layer. The hole transport region can be a hole transport layer (HTL) with a single-layer structure, including a single-layer hole transport layer containing only one compound and a single-layer hole transport layer containing a plurality of compounds. The hole transport region can also be a multilayer structure including at least one of a hole injection layer (HIL), a hole transport layer (HTL) and an electron blocking layer (EBL).

The material of the hole transport region can be selected from, but not limited to, a phthalocyanine derivative such as CuPc, a conductive polymer or a conductive dopant-containing polymer such as polyphenylene vinylene, polyaniline/dodecylbenzene sulfonic acid (Pani/DB SA), poly(3,4-ethylenedioxythiophene)/poly(4-styrene sulfonate) (PEDOT/PSS), polyaniline/camphorsulfonic acid (Pani/CSA), polyaniline/poly(4-styrene sulfonate) (Pani/PSS), an aromatic amine derivative such as following compounds as shown in HT-1 to HT-34; or any combination thereof (for example, a combination of HT-1 and HT-2, a combination of HT-5, HT-10 and HT-16, and a combination of HT-31, HT-3, HT-27 and HT-28, etc.).
HT-1
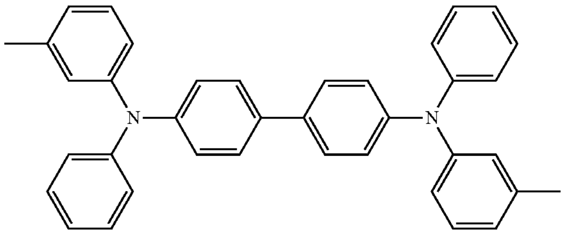
HT-2
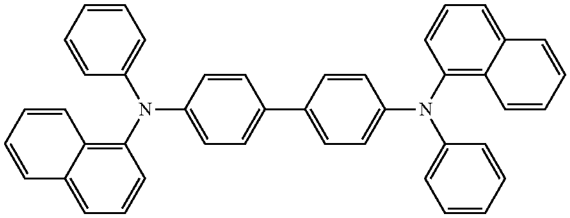
HT-3
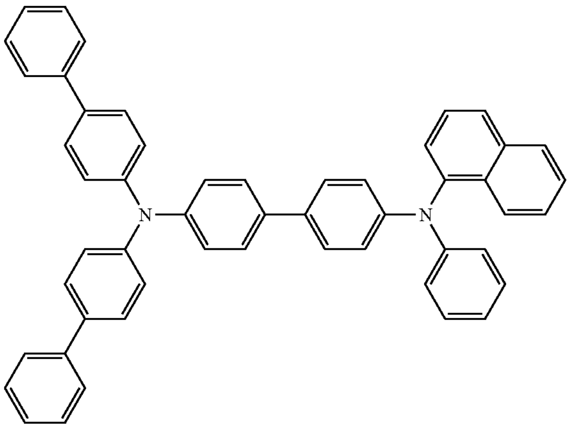
HT-4
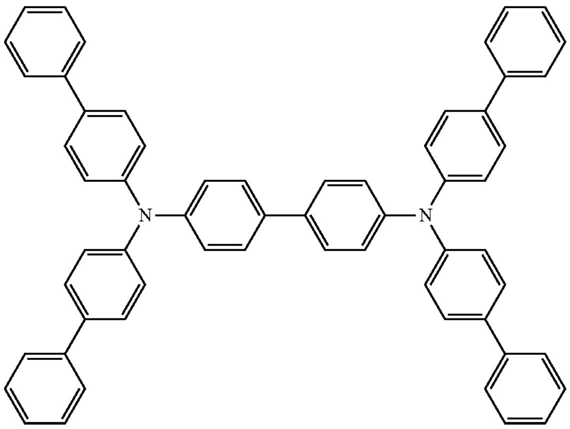
-continued
HT-5
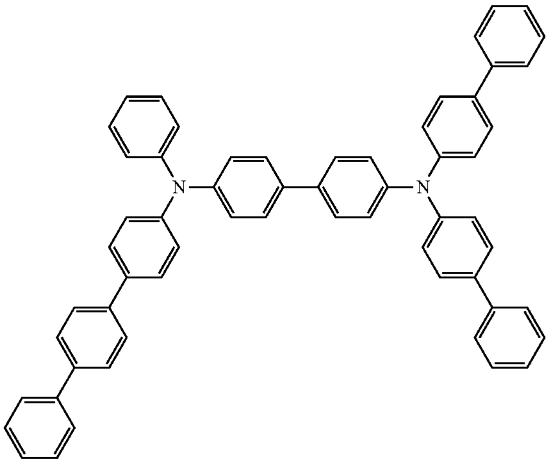
HT-6
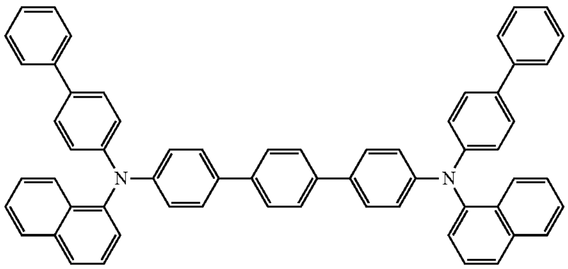
HT-7
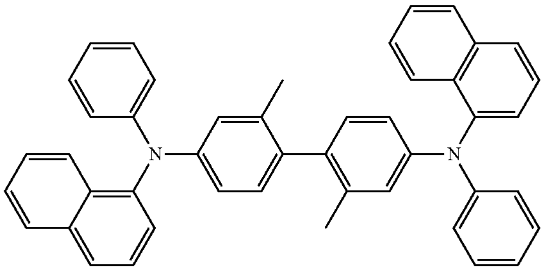
HT-8
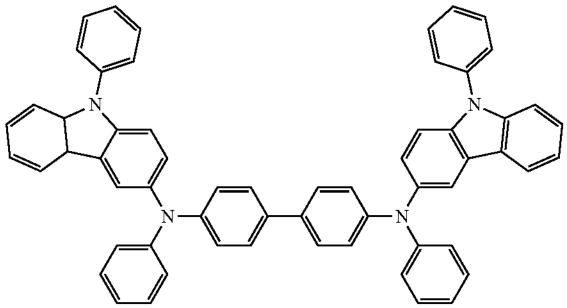

-continued
HT-9
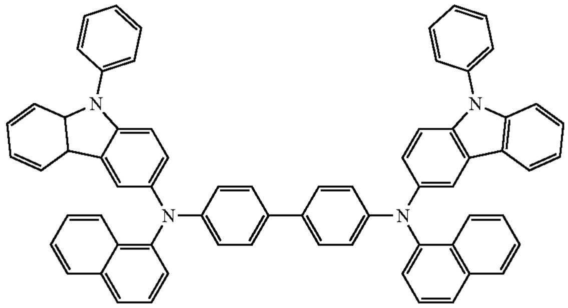
HT-10
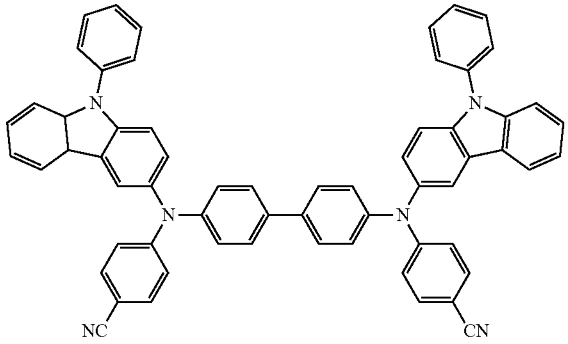
HT-11
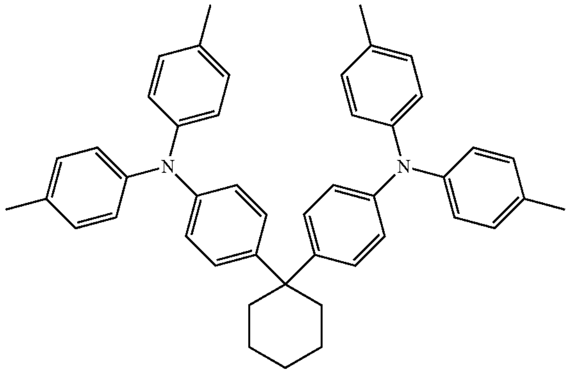
HT-12
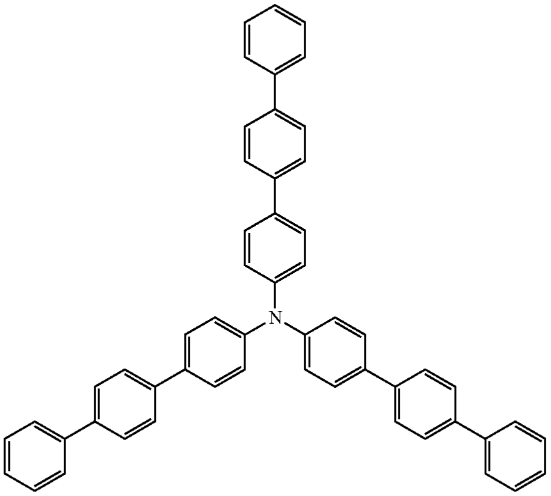
-continued
HT-13
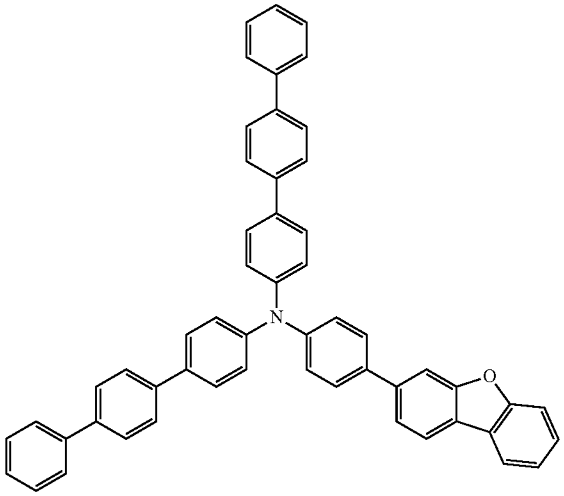
HT-14
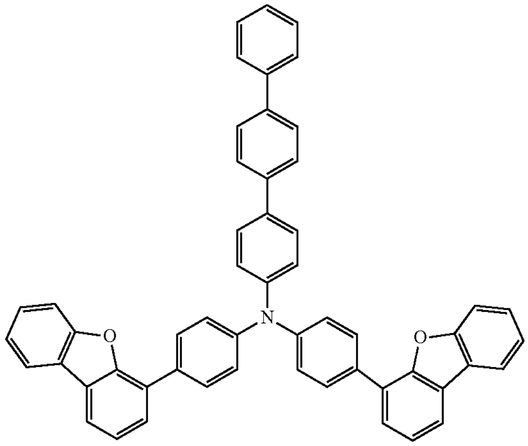
HT-15
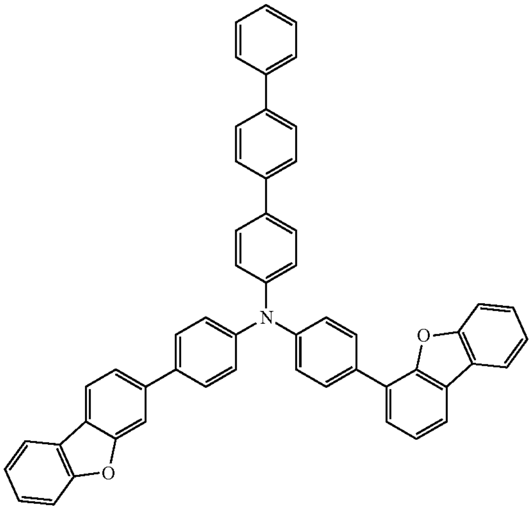

-continued
HT-16
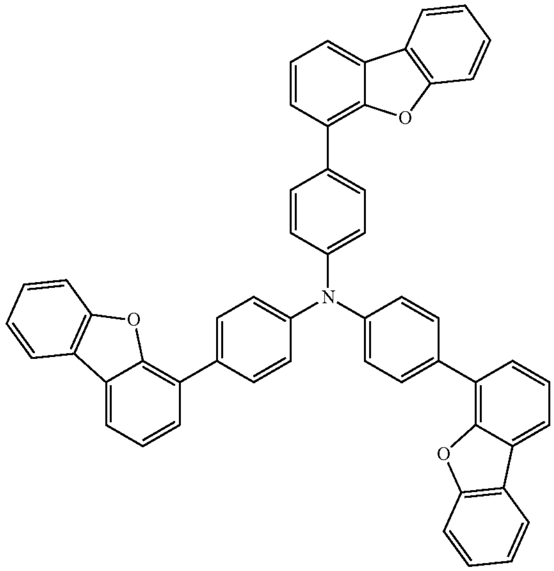
HT-17
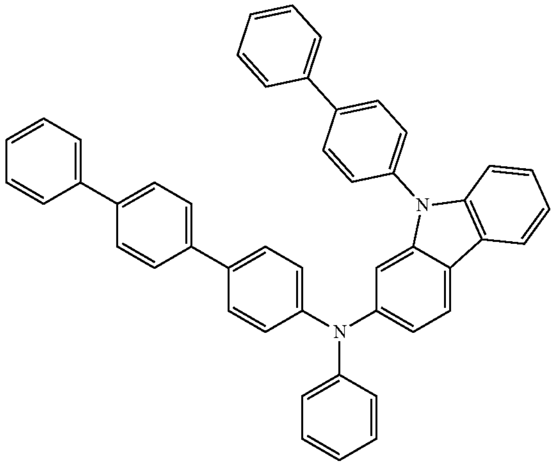
HT-18
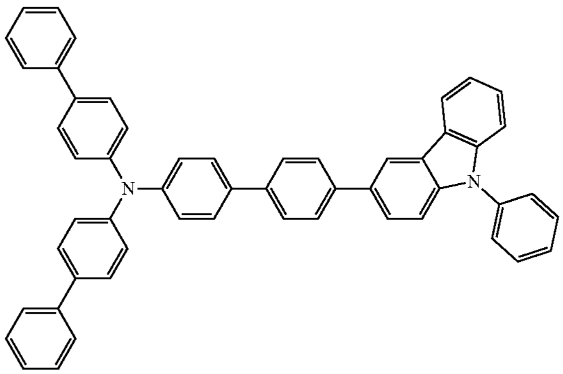
-continued
HT-19
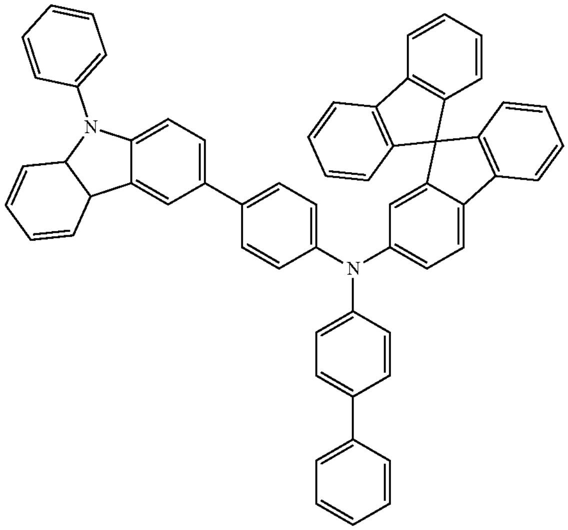
HT-20
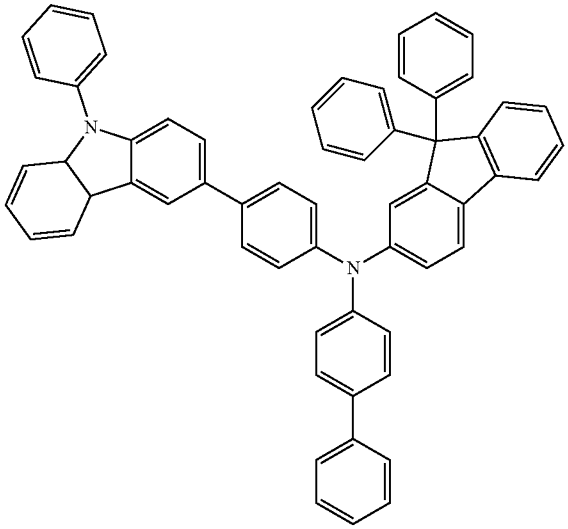
HT-21
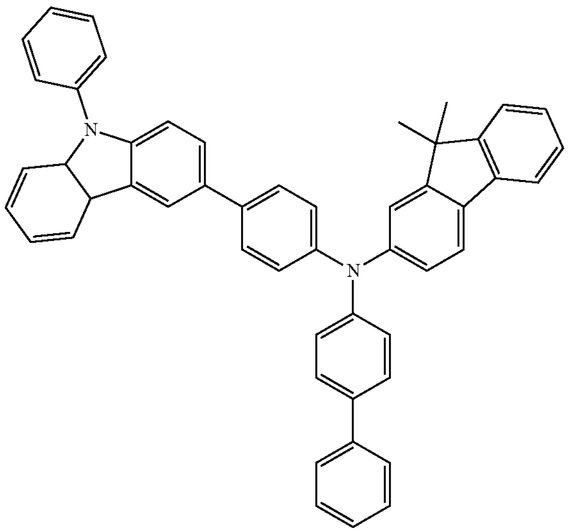

-continued
HT-22
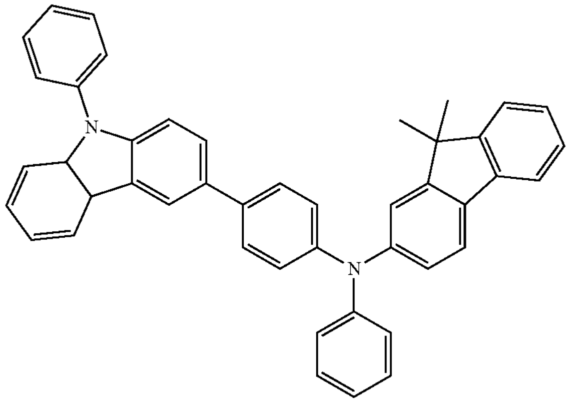
HT-23
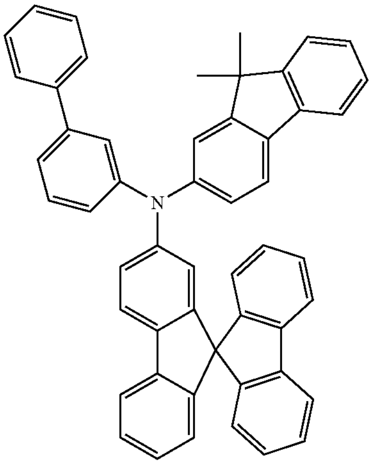
HT-24
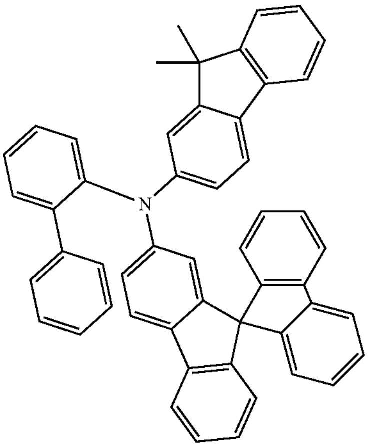
-continued
HT-25
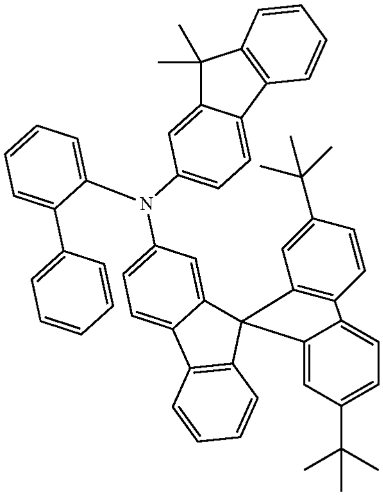
HT-26
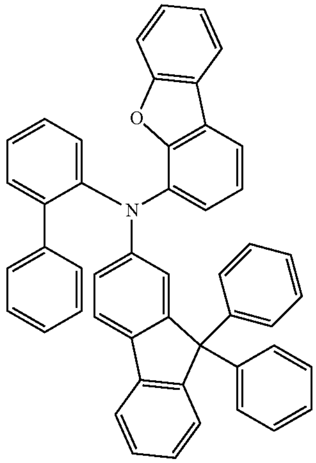
HT-27
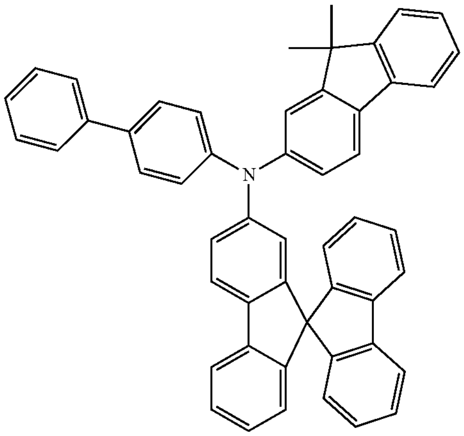

-continued
HT-28
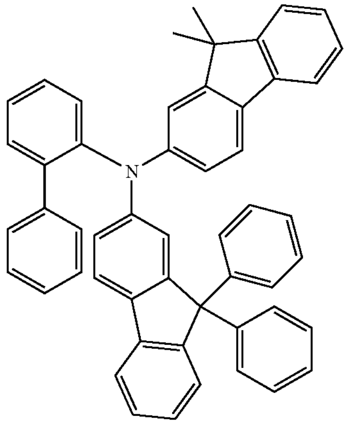
HT-29
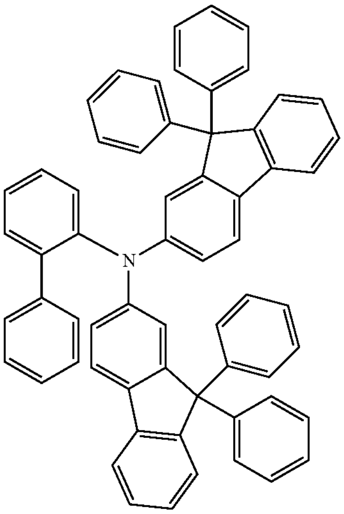
HT-30
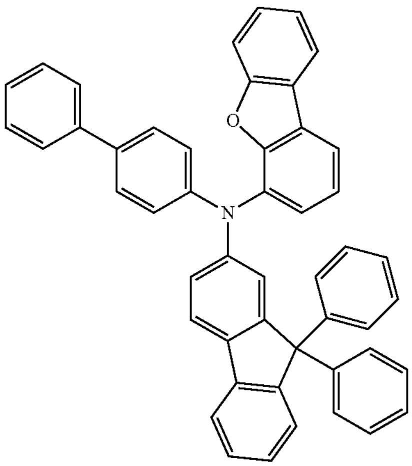
-continued
HT-31
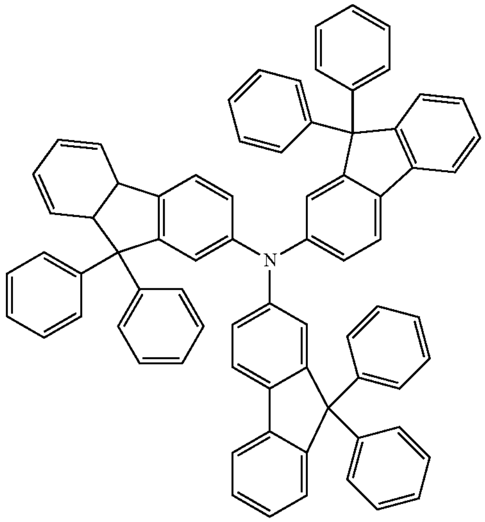
HT-32
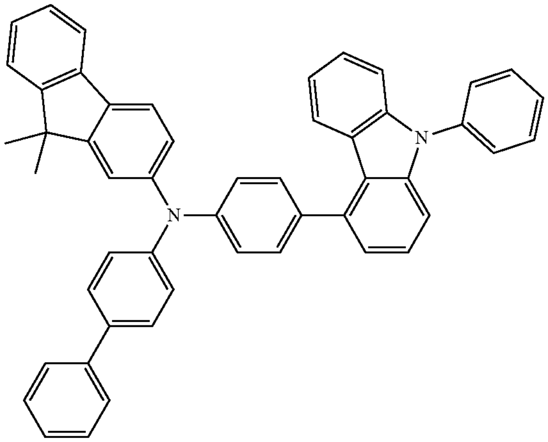
HT-33
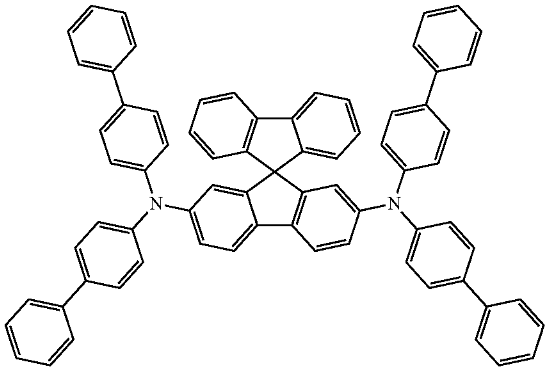
HT-34
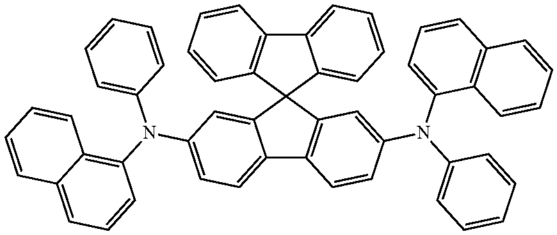
.

The hole injection layer is located between the anode and the hole transport layer. The hole injection layer can be a single compound material or a combination of a plurality of compounds. For example, the hole injection layer can use one or more of the above-mentioned compounds of HT-1 to HT-34, or use one or more of the following compounds of HI-1 to HI-3; or use one or more of the compounds of HT-1 to HT-34 doped with one or more of the following compounds of HI-1 to HI-3 (for example, a combination of HT-1 and HI-2, and a combination of HT-1, HT-2 and HI-3, etc.).

HI-1

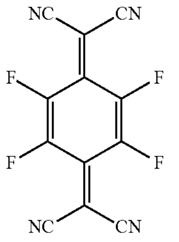

HI-2

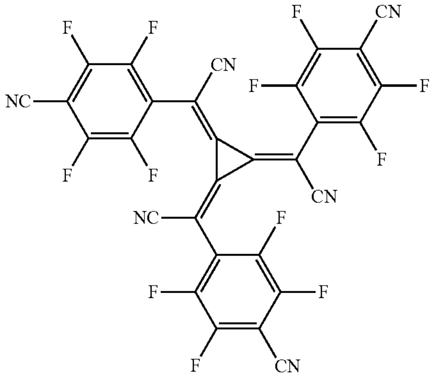

HI-3

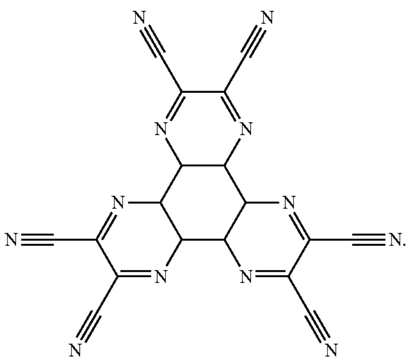

Further, the electron transport layer comprises one or a combination of at least two of the compounds as shown in ET-1 to ET-57 (for example, a combination of ET-1 and ET-2, a combination of ET-5, ET-10 and ET-16, and a combination of ET-3, ET-30, ET-27 and ET-18, etc.):

ET-1

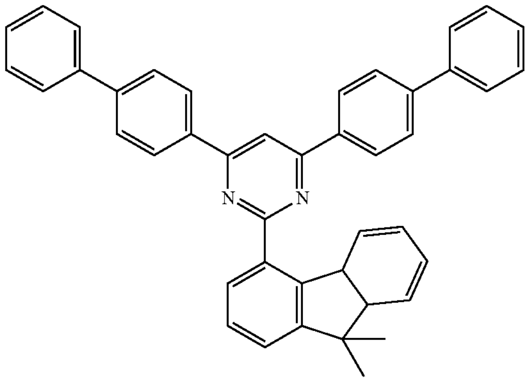

ET-2

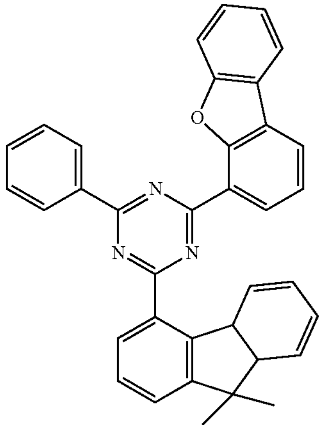

ET-3

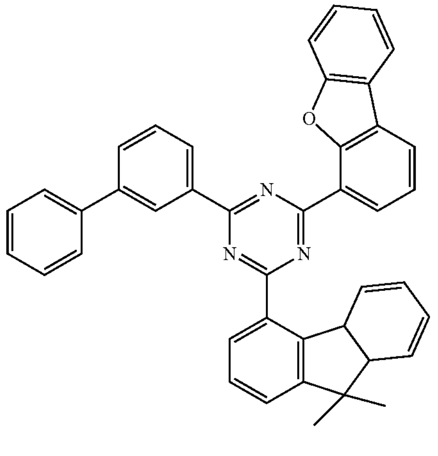

-continued
ET-4
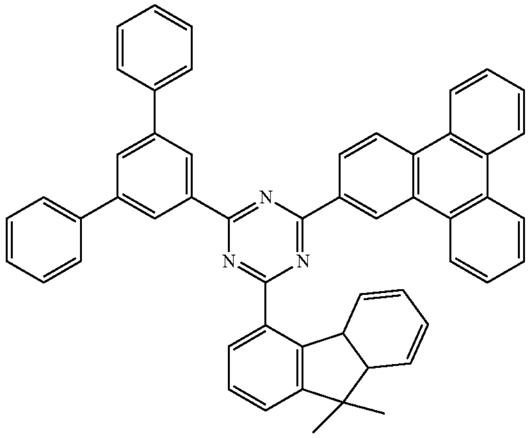
ET-5
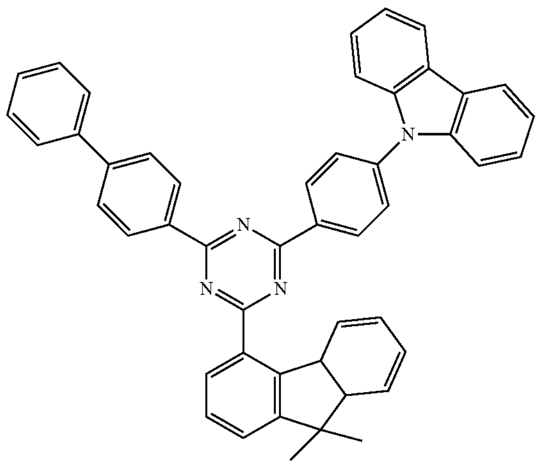
ET-6
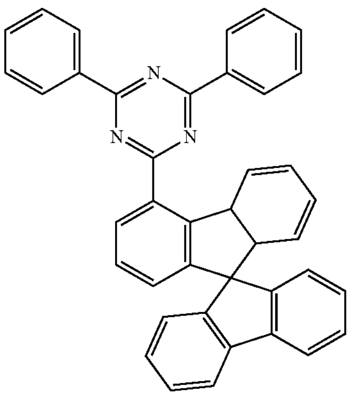
-continued
ET-7
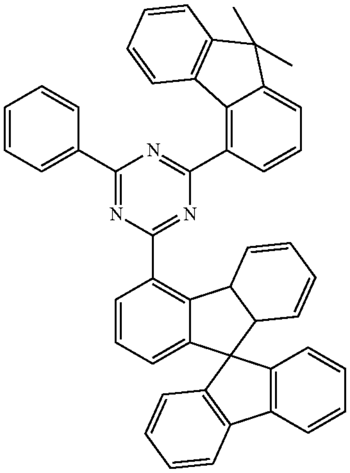
ET-8
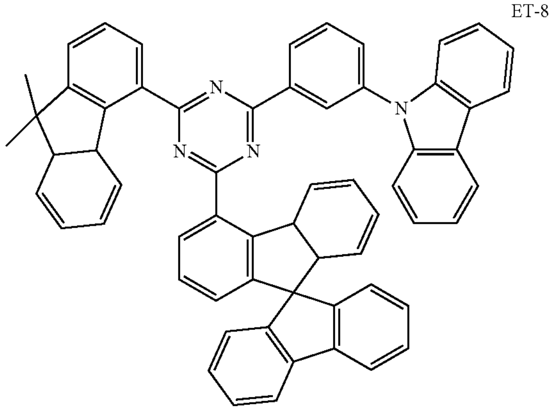
ET-9
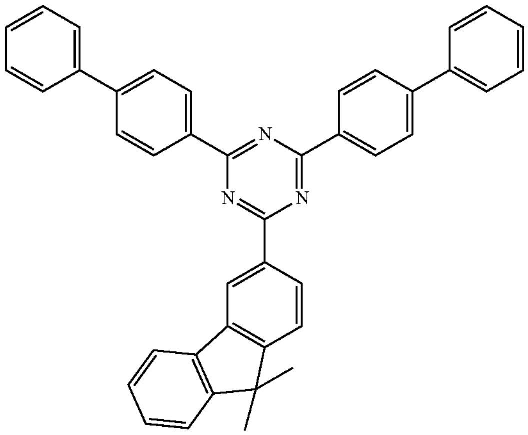

-continued
ET-10
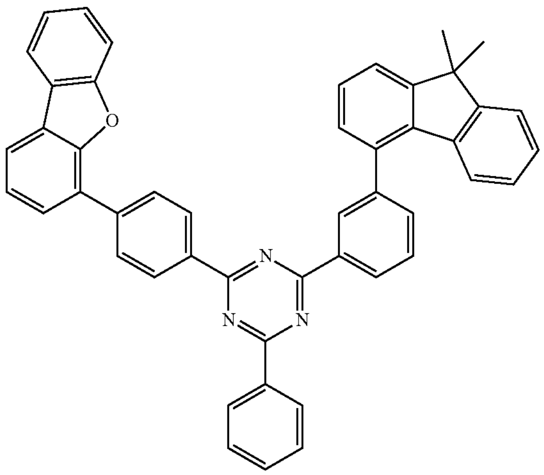
ET-11
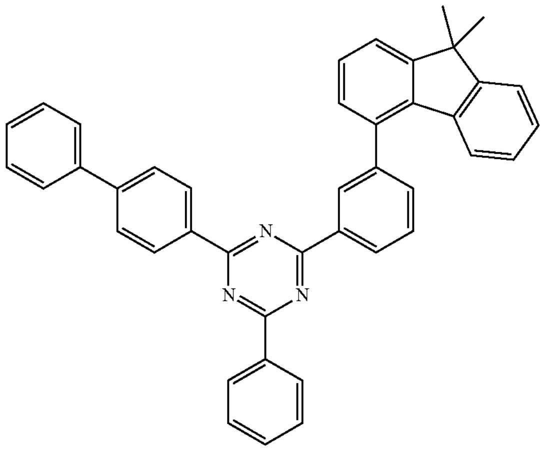
ET-12
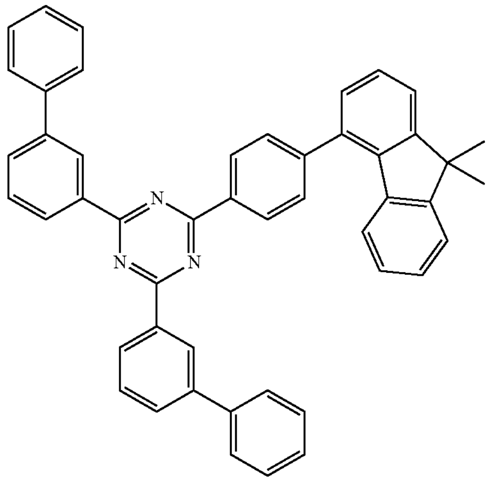
-continued
ET-13
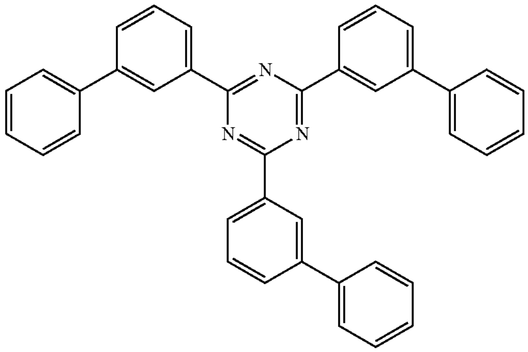
ET-14
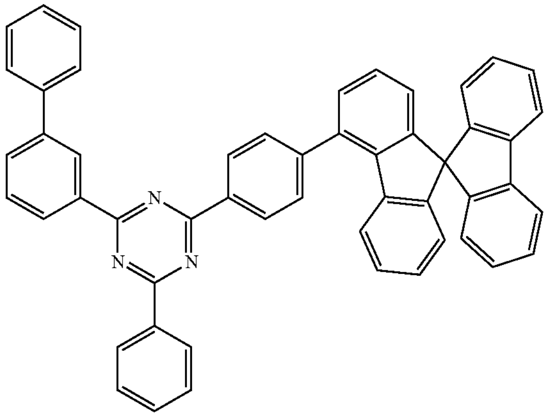
ET-15
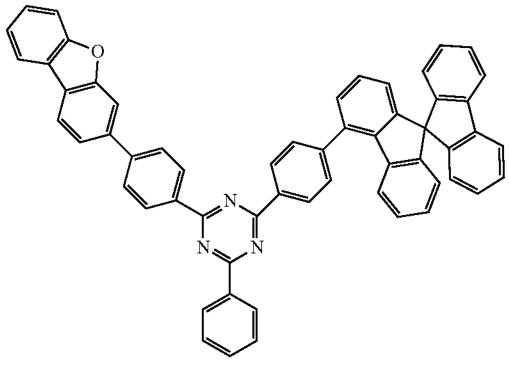

-continued
ET-16
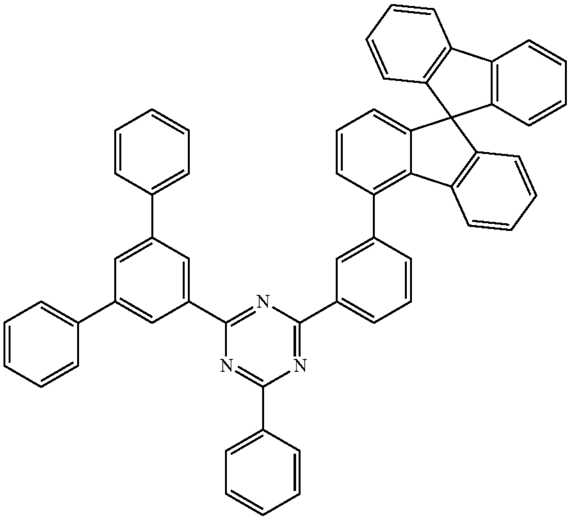
ET-17
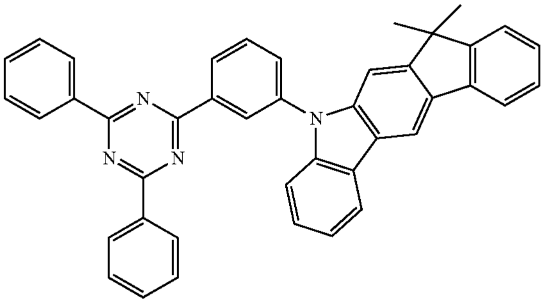
ET-18
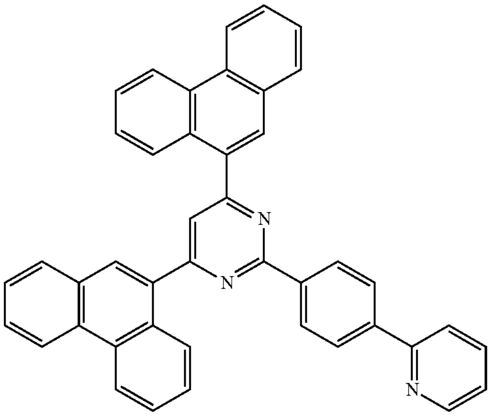
-continued
ET-19
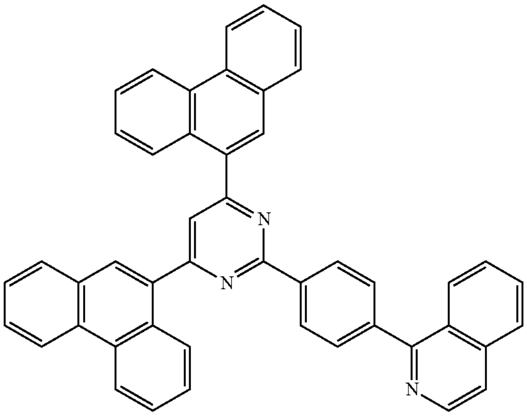
ET-20
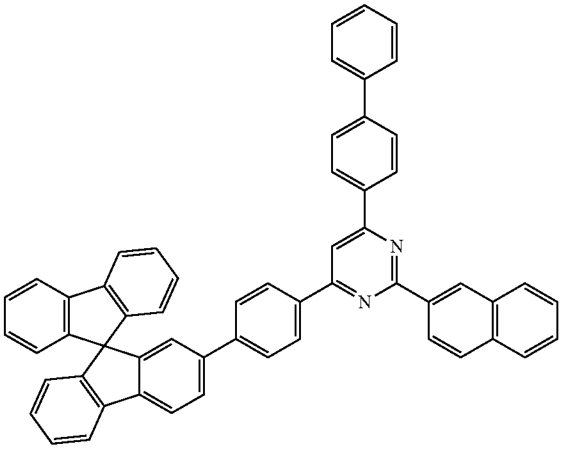
ET-21
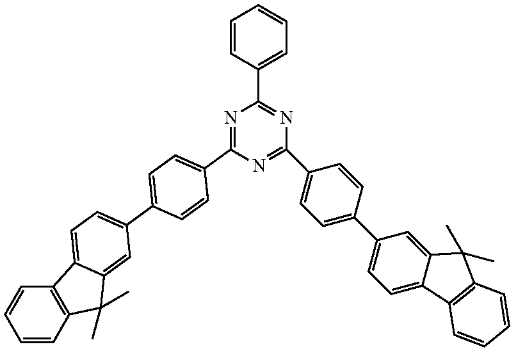

-continued
ET-22
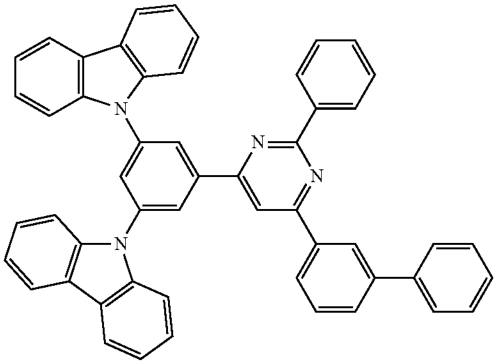
ET-23
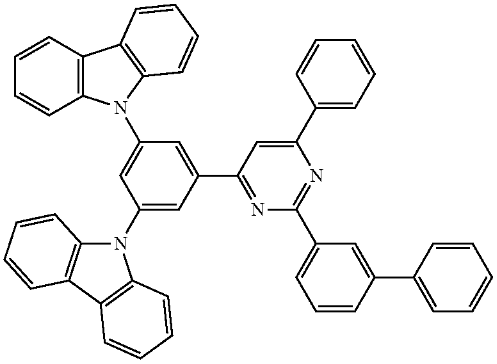
ET-24
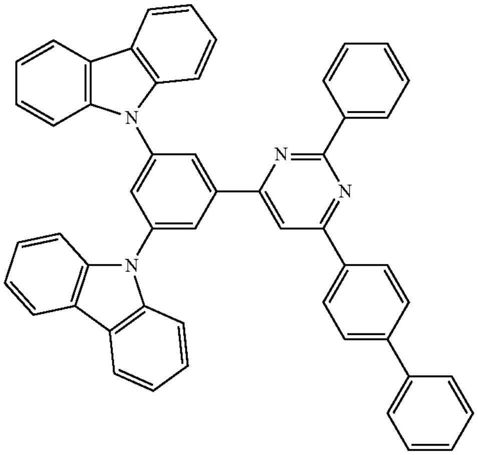
-continued
ET-25
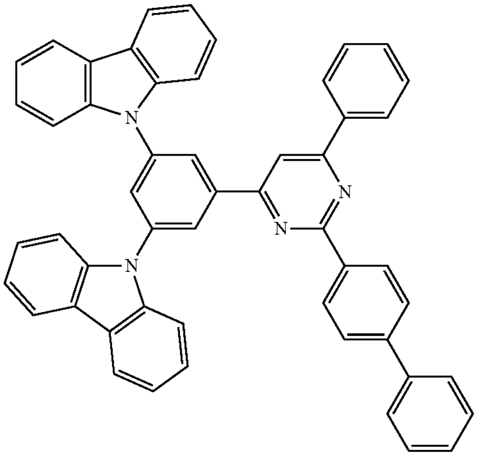
ET-26
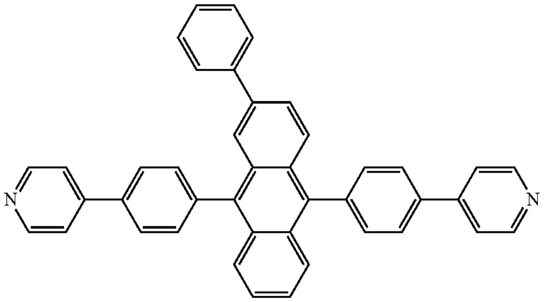
ET-27
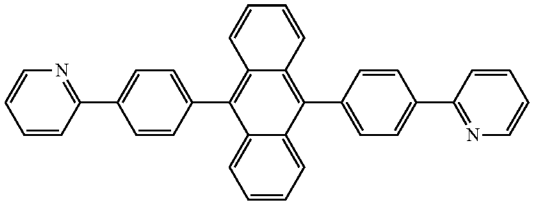
ET-28
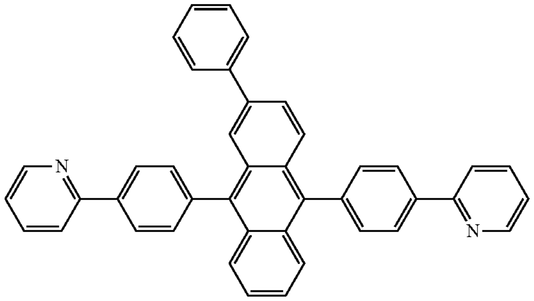

-continued
ET-29
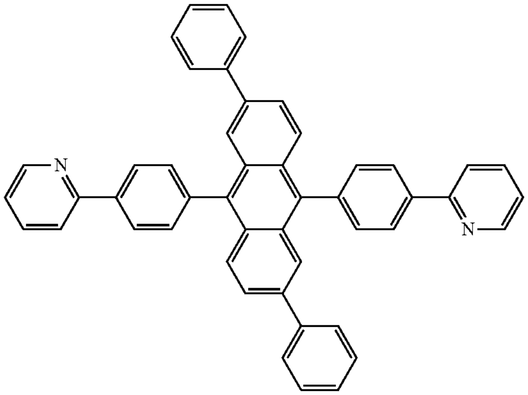
ET-30
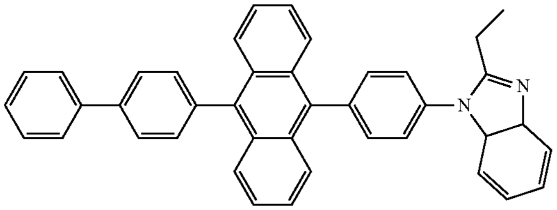
ET-31
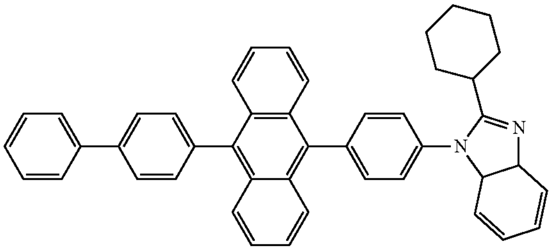
ET-32
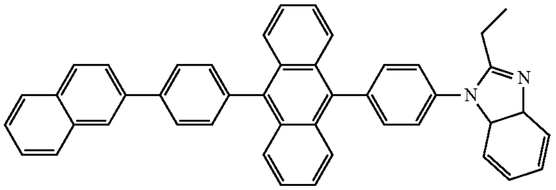
ET-33
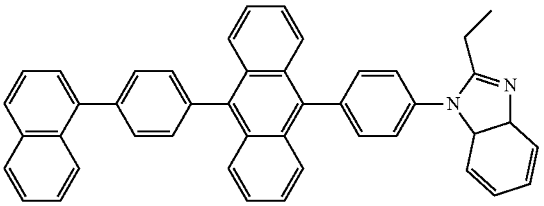
-continued
ET-34
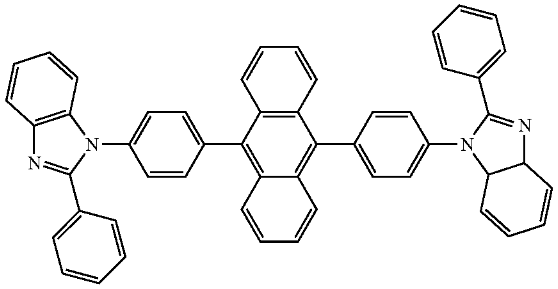
ET-35
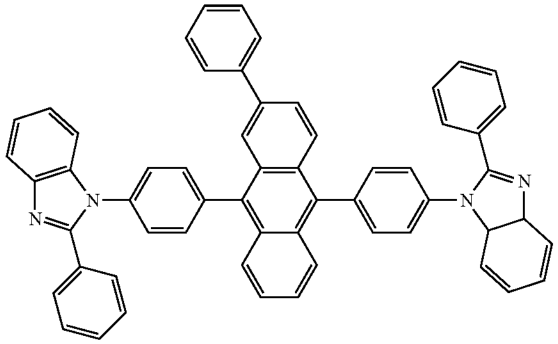
ET-36
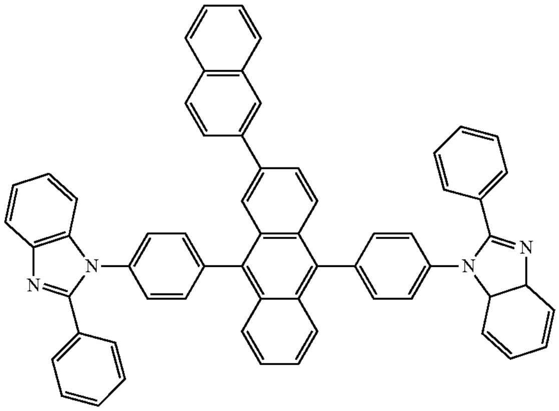
ET-37
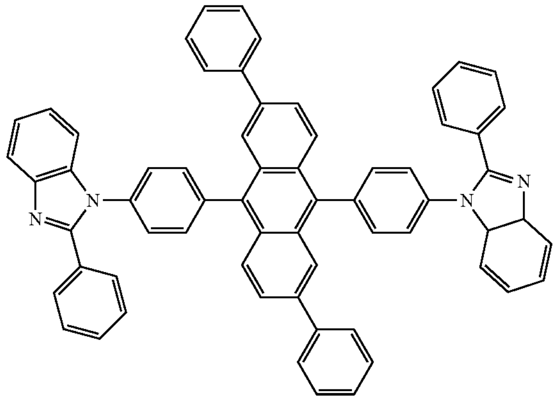

-continued
ET-38
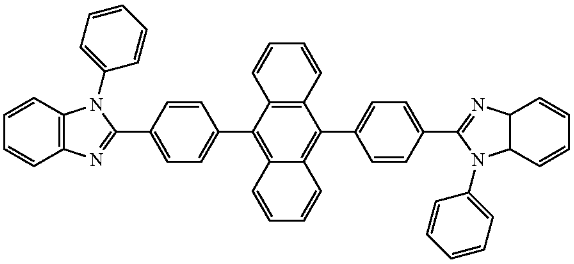
ET-39
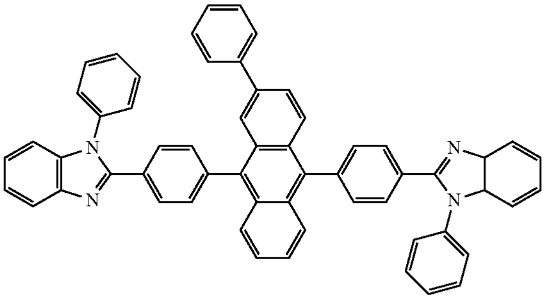
ET-40
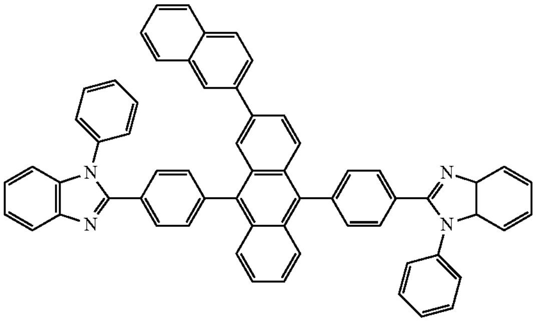
ET-41
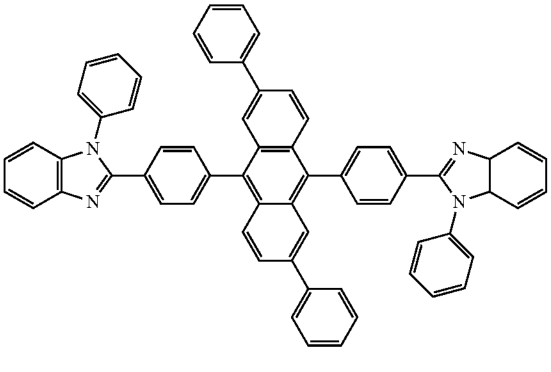
-continued
ET-42
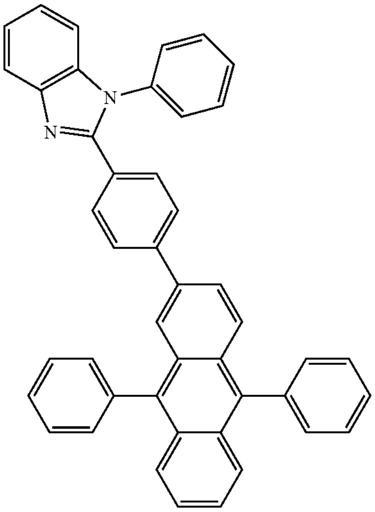
ET-43
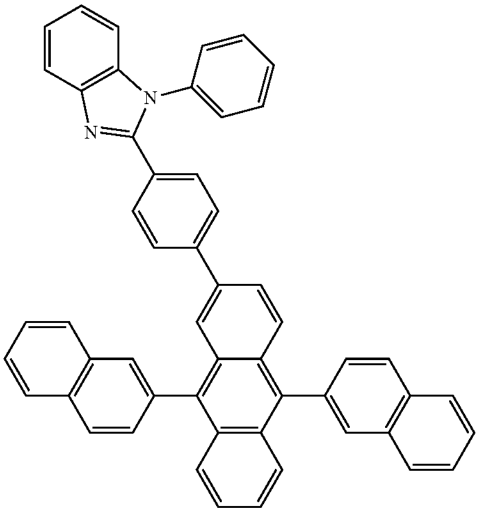
ET-44
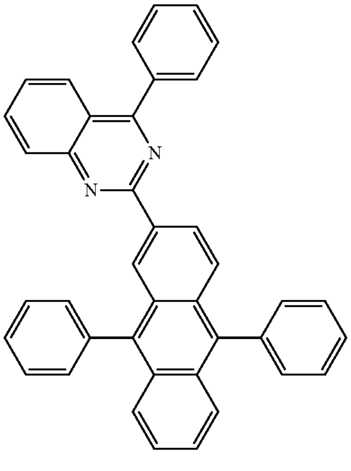

-continued
ET-45
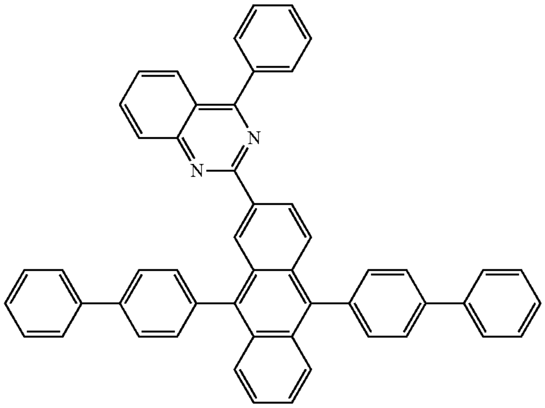
ET-46
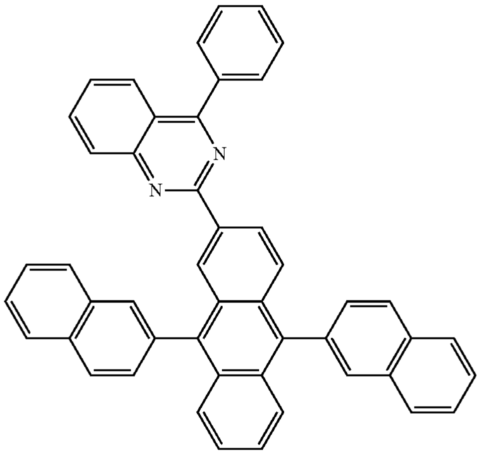
ET-47
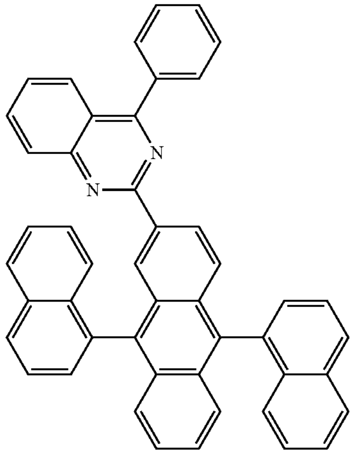
-continued
ET-48
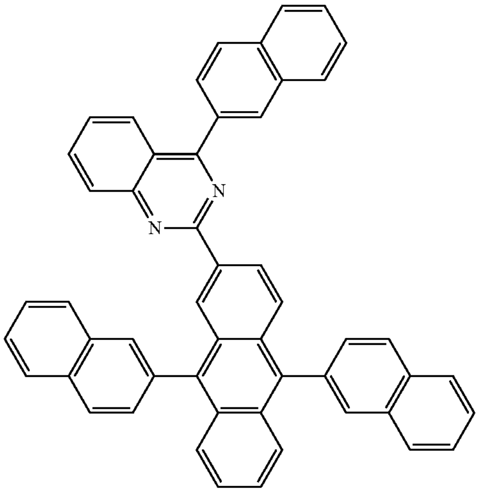
ET-49
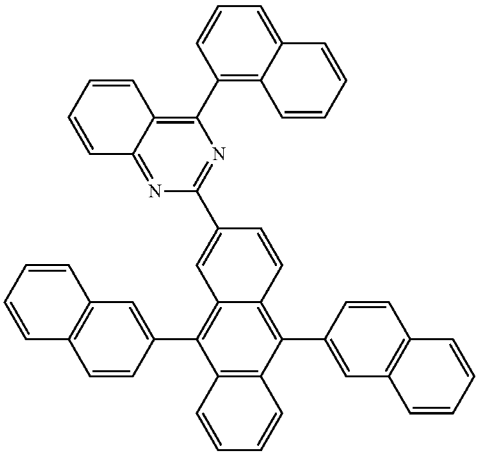
ET-50
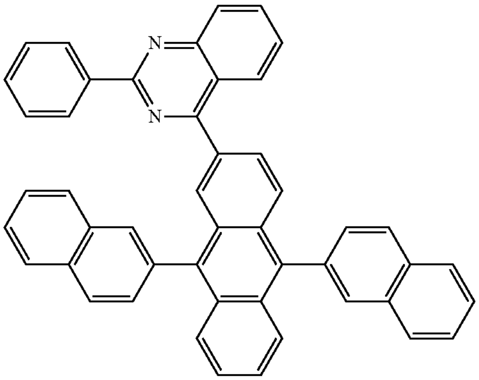

-continued

ET-51

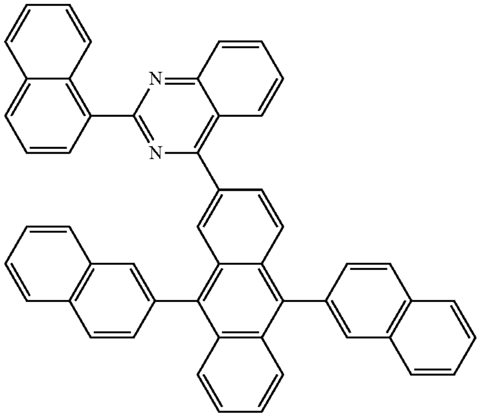

ET-52

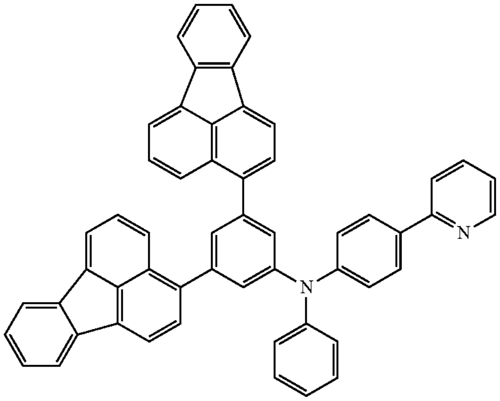

ET-53

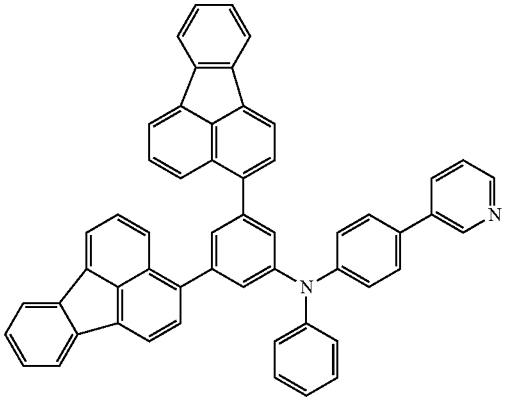

-continued

ET-54

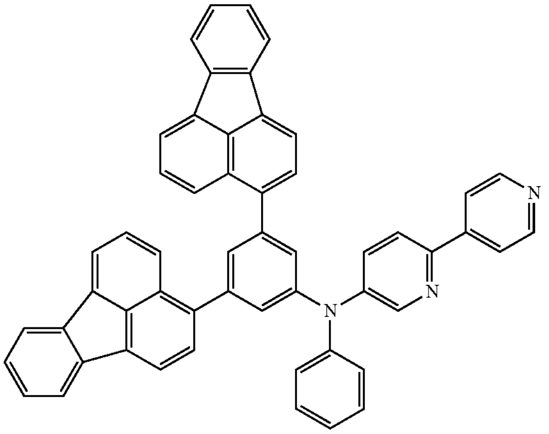

ET-55

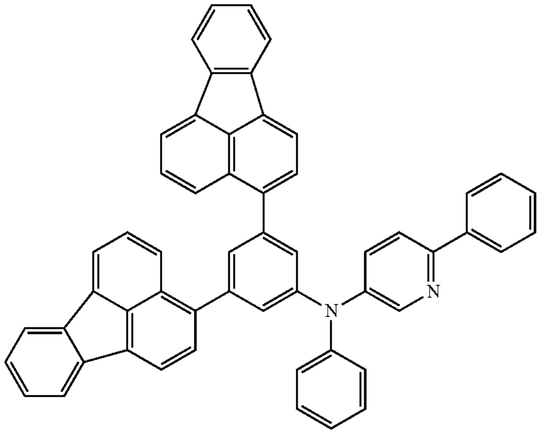

ET-56

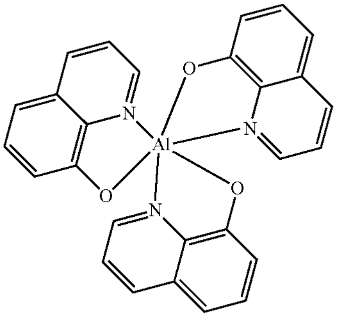

ET-57

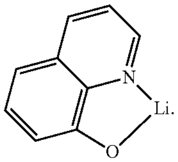

Further, the electron injection material in the electron injection layer comprises one or a combination of at least two of the following compounds (for example, a combination of Liq and CsF, a combination of $Cs_2CO_3$, BaO and $Li_2O$, and a combination of Mg, Ca, Yb and LiF, etc.):

Liq, LiF, NaCl, CsF, $Li_2O$, $Cs_2CO_3$, BaO, Na, Li, Ca, Mg, Ag, and Yb.

Further, a substrate can be used below the first electrode or above the second electrode. The substrate is glass or a polymer material with excellent mechanical strength, thermal stability, and water resistance. In addition, when organic electroluminescent devices are used in display panels, thin film transistors (TFTs) can also be provided on the substrate.

Further, the first electrode can be formed by sputtering or depositing a material used as the first electrode on the substrate. The first electrode can be used as an anode or a cathode. When the first electrode is used as the anode, a conductive material such as indium tin oxide (ITO), indium zinc oxide (IZO), tin dioxide ($SnO_2$), zinc oxide (ZnO), silver (Ag), etc. and any combination thereof can be used. When the first electrode is used as the cathode, a metal or an alloy such as magnesium (Mg), silver (Ag), aluminum (Al), aluminum-lithium (Al—Li), calcium (Ca), magnesium-indium (Mg—In), magnesium-silver (Mg—Ag), etc. and any combination thereof can be used.

Further, the second electrode can be formed by sputtering or depositing a material used as the second electrode on the substrate. The second electrode can be used as an anode or a cathode. When the second electrode is used as the anode, a conductive material such as indium tin oxide (ITO), indium zinc oxide (IZO), tin dioxide ($SnO_2$), zinc oxide (ZnO), silver (Ag), etc. and any combination thereof can be used. When the second electrode is used as the cathode, a metal or an alloy such as magnesium (Mg), silver (Ag), aluminum (Al), aluminum-lithium (Al—Li), calcium (Ca), magnesium-indium (Mg—In), magnesium-silver (Mg—Ag), etc. and any combination thereof can be used. In one embodiment, the first electrode is an anode, and the second electrode is a cathode. In another embodiment, the first electrode is a cathode, and the second electrode is an anode.

Further, the organic layer can be formed on the electrode by a method such as vacuum thermal evaporation, spin coating, or printing, etc. The compound used as the organic layer can be an organic small molecule, an organic macromolecule and a polymer, and a combination thereof.

The present application also provides a display panel which comprises the organic electroluminescent device of the present application.

Since the organic electroluminescent device provided in the present application has green light emission with narrow spectrum and high color purity, an application of the organic electroluminescent device in a display panel can enable the display panel to have a larger display color gamut area, which is conducive to the realization of the wide color gamut display of the display panel in the future.

The present application also provides a display device which comprises the display panel of the present application. Exemplarily, the display device can be a mobile phone, a tablet computer, a television, or a display screen of computer, etc.

The synthesis method of the compound of formula I is briefly described below. First, the hydrogen atom between $X^1$ and $X^2$ is ortho-metalized using n-butyl lithium or tert-butyl lithium, etc. Then, after adding boron tribromide and the like to carry out the metal exchange of lithium-boron or lithium-phosphorus, a Bronsted base such as N,N-diisopropylethylamine, etc. is added, thereby performing the Tandem Bora-Friedel-Crafts Reaction, and the target can be obtained. The reaction formula is as follows:

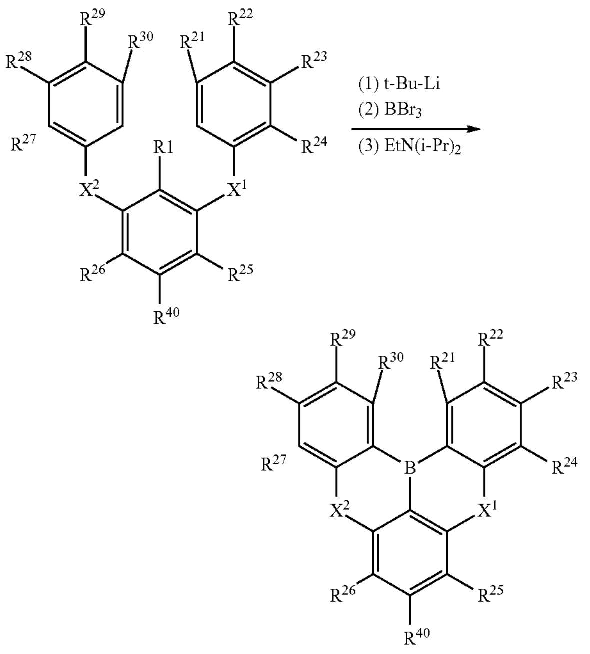

$X^1$, $X^2$, $R^{21}$ to $R^{30}$ and $R^{40}$ all have the same meaning as in formula I, wherein adjacent groups in $R^{21}$, $R^{22}$, $R^{23}$, $R^{24}$, $R^{25}$, $R^{26}$, $R^{27}$, $R^{28}$, $R^{29}$ and $R^{30}$ can be bonded to each other and can form an aryl ring or a heteroaryl ring together with the three benzene rings in the parent nucleus, and at least one hydrogen in the formed ring can be substituted by aryl, heteroaryl, diarylamino, diheteroarylamino, aryl heteroarylamino, alkyl, alkoxyl or aryloxyl.

Various basic chemical raw materials used in the present application such as petroleum ether, tert-butylbenzene, ethyl acetate, sodium sulfate, toluene, dichloromethane, potassium carbonate, boron tribromide, N,N-diisopropylethylamine, and reaction intermediates, etc. are purchased from Shanghai Titan Scientific Co., Ltd. and Xilong Chemical Co., Ltd. The mass spectrometer used to determine the following compounds is ZAB-HS mass spectrometer (manufactured by Micromass, UK).

More specifically, the following synthesis examples provide the synthetic methods of representative compounds of the present application.

Synthesis Example 1: Synthesis of Compound C-1

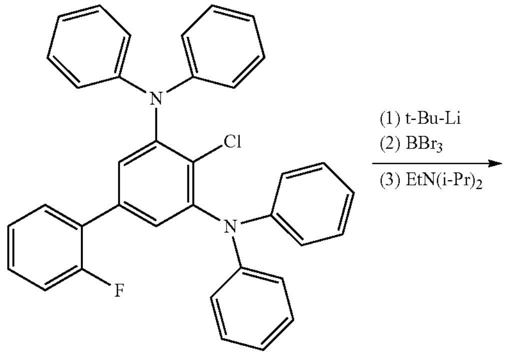

C-1-1

-continued

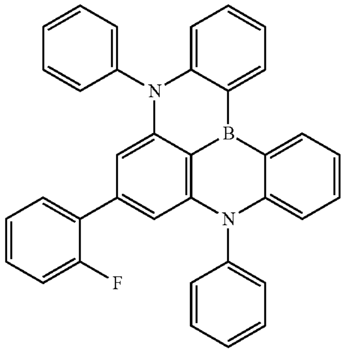

C-1

Under a nitrogen atmosphere, a pentane solution of tert-butyllithium (11.09 mL, 1.60M, 17.74 mmol) was slowly added to a 0° C. solution of C-1-1 (8.00 g, 14.79 mmol) in tert-butylbenzene (150 mL), which was then sequentially heated to 80° C., 100° C., 120° C. and reacted for 1 hour at each temperature. After the reaction was completed, the temperature was lowered to −30° C., boron tribromide (5.56 g, 22.18 mmol) was slowly added, and continuously stirred at room temperature for 0.5 hours. N,N-diisopropylethylamine (3.82 g, 29.57 mmol) was added at room temperature, and the reaction was kept at 145° C. for 5 hours, then stopped. The solvent was rotary evaporation dried under vacuum and passed through a silica gel column (developing solvent: ethyl acetate:petroleum ether=50:1) to obtain the target compound C-1 (1.00 g, 13% yield, HPLC analytical purity 99.56%), as a yellow solid. MALDI-TOF-MS results: molecular ion peak: 514.45; elemental analysis results: theoretical values: C, 84.06%; H, 4.70%; B, 2.10%; F, 3.69%; N, 5.45%; experimental values: C, 84.42%; H, 4.66%; B, 2.23%; F, 3.71%; N, 4.98%.

Synthesis Example 2: Synthesis of Compound C-2

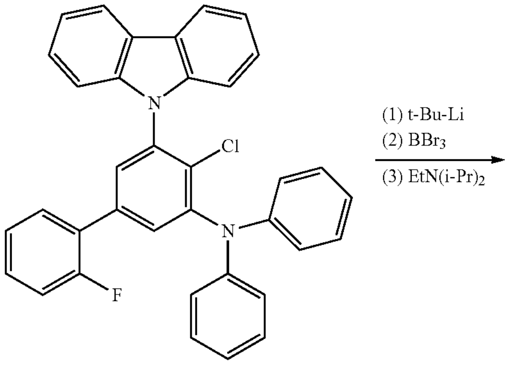

C-2-1

-continued

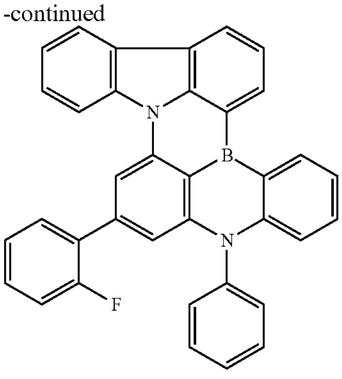

C-2

The difference between this example and Synthesis Example 1 lies in that: in this example, C-1-1 needs to be replaced with C-2-1 in an equal amount of substance. The target compound C-2 (1.00 g, 13% yield, HPLC analytical purity 99.66%) is a yellow solid. MALDI-TOF-MS results: molecular ion peak: 512.45 elemental analysis results: theoretical values: C, 84.39%; H, 4.33%; B, 2.11%; F, 3.71%; N, 5.47%; experimental values: C, 84.42%; H, 4.01 B, 2.52; F, 3.51%; N, 5.54%.

Synthesis Example 3: Synthesis of Compound C-6

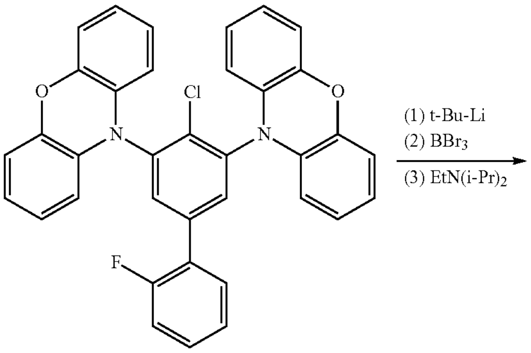

C-6-1

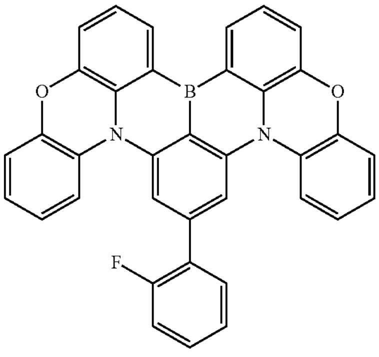

C-6

The difference between this example and Synthesis Example 1 lies in that: in this example, C-1-1 needs to be replaced with C-6-1 in an equal amount of substance. The target compound C-6 (0.62 g, 8% yield, HPLC analytical purity 99.56%) is a yellow solid. MALDI-TOF-MS results:

molecular ion peak: 542.32 elemental analysis results: theoretical values: C, 79.72%; H, 3.72%; B, 1.99%; F, 3.50%; N, 5.17%; 0, 5.90%; experimental values: C, 79.77%; H, 3.72%; B, 1.94%; F, 3.55%; N, 5.17%; 0, 5.85%.

Synthesis Example 4: Synthesis of Compound C-9

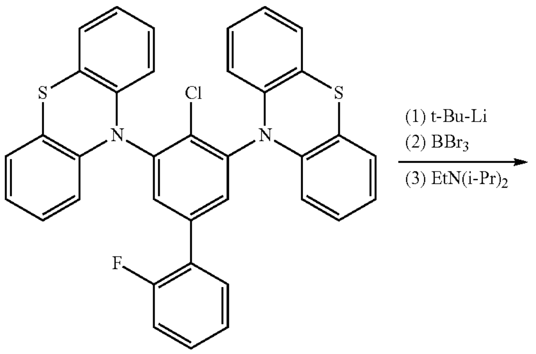

C-9-1

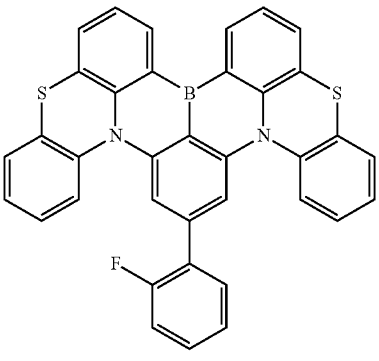

C-9

The difference between this example and Synthesis Example 1 lies in that: in this example, C-1-1 needs to be replaced with C-9-1 in an equal amount of substance. The target compound C-9 (0.76 g, 9% yield, HPLC analytical purity 99.56%) is a yellow solid. MALDI-TOF-MS results: molecular ion peak: 574.42 elemental analysis results: theoretical values: C, 75.26%; H, 3.51%; B, 1.88%; F, 3.31%; N, 4.88%; S, 11.16%; experimental values: C, 75.16%; H, 3.41%; B, 1.98%; F, 3.21%; N, 4.88%; S, 11.16%.

Synthesis Example 5: Synthesis of Compound C-12

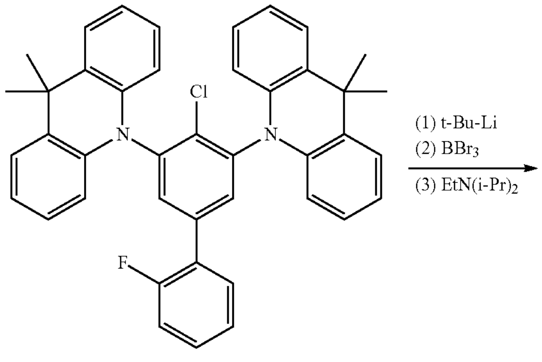

C-12-1

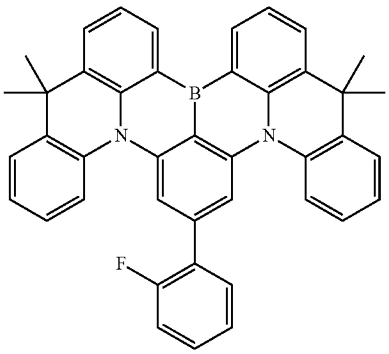

C-12

The difference between this example and Synthesis Example 1 lies in that: in this example, C-1-1 needs to be replaced with C-12-1 in an equal amount of substance. The target compound C-12 (0.90 g, 10% yield, HPLC analytical purity 99.56%) is a yellow solid. MALDI-TOF-MS results: molecular ion peak: 606.37 elemental analysis results: theoretical values: C, 85.15%; H, 5.32%; B, 1.78%; F, 3.13%; N, 4.62%; experimental values: C, 85.25%; H, 5.32%; B, 1.68%; F, 3.33%; N, 4.42%.

Synthesis Example 6: Synthesis of Compound C-16

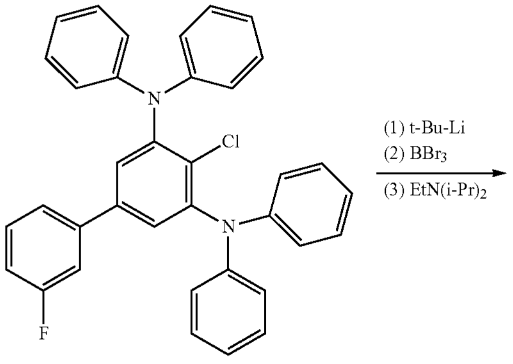

C-16-1

-continued

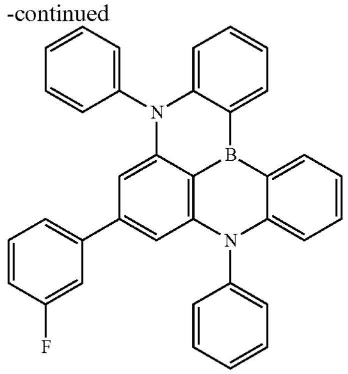

C-16

The difference between this example and Synthesis Example 1 lies in that: in this example, C-1-1 needs to be replaced with C-16-1 in an equal amount of substance. C-16 (1.02 g, 13% yield, HPLC analytical purity 99.74%) is obtained as a yellow solid. MALDI-TOF-MS results: molecular ion peak: 514.35; elemental analysis results: theoretical values: C, 84.06%; H, 4.70%; B, 2.10%; F, 3.69%; N, 5.45%; experimental values: C, 84.22%; H, 4.86%; B, 2.23%; F, 3.91%; N, 4.78%.

Synthesis Example 7: Synthesis of Compound C-18

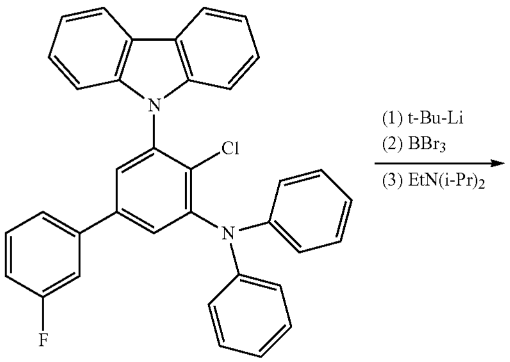

C-18-1

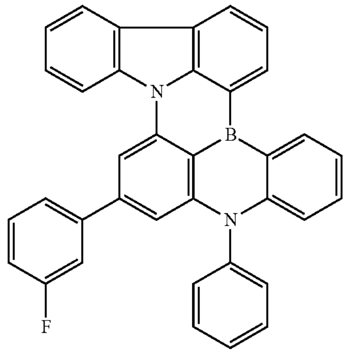

C-18

The difference between this example and Synthesis Example 1 lies in that: in this example, C-1-1 needs to be replaced with C-18-1 in an equal amount of substance. The target compound C-18 (1.00 g, 13% yield, HPLC analytical purity 99.66%) is a yellow solid. MALDI-TOF-MS results:

molecular ion peak: 512.33; elemental analysis results: theoretical values: C, 84.39%; H, 4.33%; B, 2.11%; F, 3.71%; N, 5.47%; experimental values: C, 84.52%; H, 4.11 B, 2.42; F, 3.41%; N, 5.54%.

Synthesis Example 8: Synthesis of Compound C-33

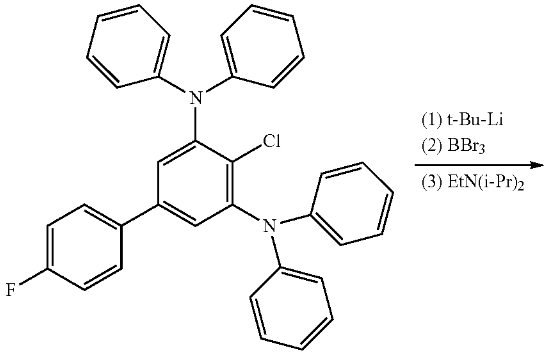

C-33-1

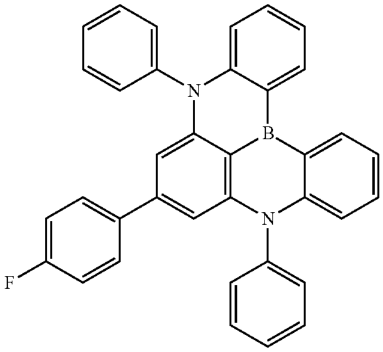

C-33

The difference between this example and Synthesis Example 1 lies in that: in this example, C-1-1 needs to be replaced with C-33-1 in an equal amount of substance. C-33 (1.02 g, 13% yield, HPLC analytical purity 99.74%) is obtained as a yellow solid. MALDI-TOF-MS results: molecular ion peak: 515.15; elemental analysis results: theoretical values: C, 84.06%; H, 4.70%; B, 2.10%; F, 3.69%; N, 5.45%; experimental values: C, 84.12%; H, 4.96%; B, 2.03%; F, 3.71%; N, 4.78%.

Synthesis Example 9: Synthesis of Compound C-34

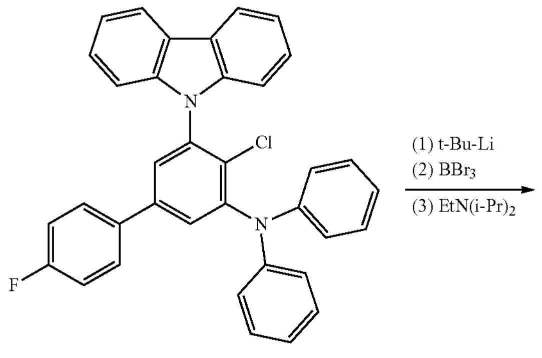

C-34-1

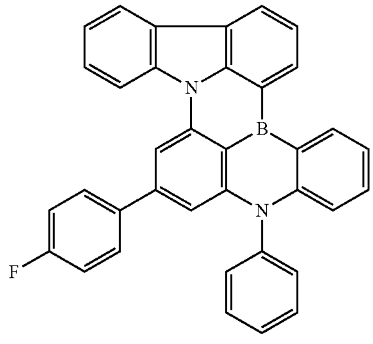

C-34

The difference between this example and Synthesis Example 1 lies in that: in this example, C-1-1 needs to be replaced with C-34-1 in an equal amount of substance. The target compound C-34 (1.00 g, 13% yield, HPLC analytical purity 99.46%) is a yellow solid. MALDI-TOF-MS results: molecular ion peak: 511.93; elemental analysis results: theoretical values: C, 84.39%; H, 4.33%; B, 2.11%; F, 3.71%; N, 5.47%; experimental values: C, 84.56%; H, 4.07 B, 2.33; F, 3.50%; N, 5.54%.

Synthesis Example 10: Synthesis of Compound C-75

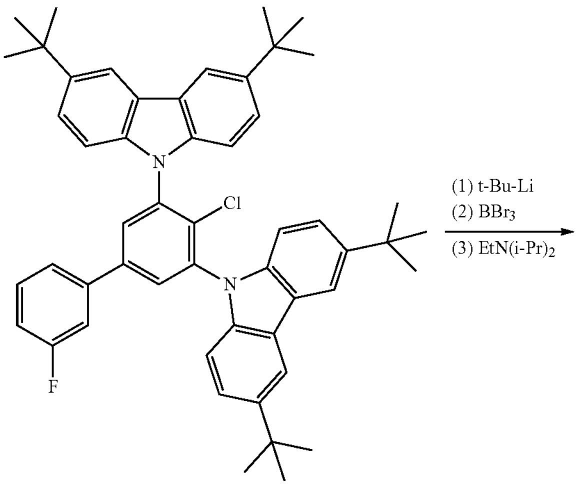

C-75-1

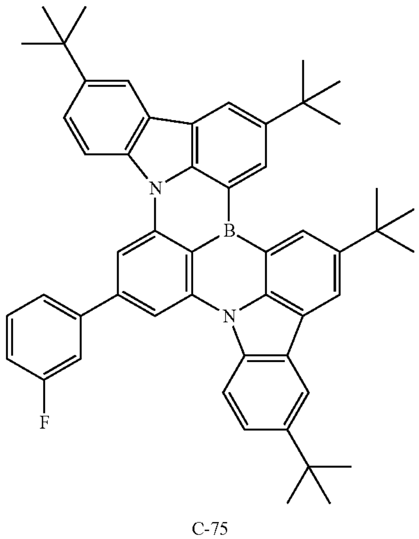

C-75

The difference between this example and Synthesis Example 1 lies in that: in this example, C-1-1 needs to be replaced with C-75-1 in an equal amount of substance. The target compound C-75 (2.22 g, 20% yield, HPLC analytical purity 99.56%) is a yellow solid. MALDI-TOF-MS results: molecular ion peak: 743.42; elemental analysis results: theoretical values: C, 85.00%; H, 7.13%; B, 1.47%; F, 2.59%; N, 3.81%; experimental values: C, 85.20%; H, 7.03%; B, 1.44%; F, 2.49%; N, 3.84%.

Synthesis Example 11: Synthesis of Compound C-35

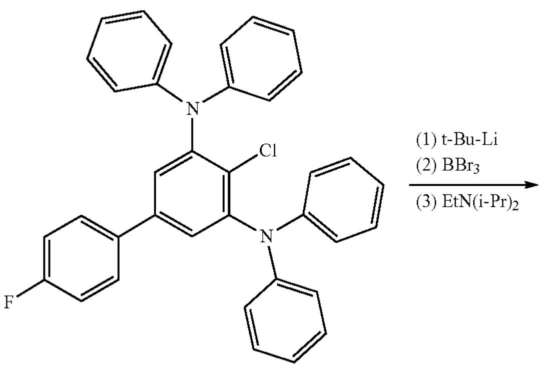

C-35-1

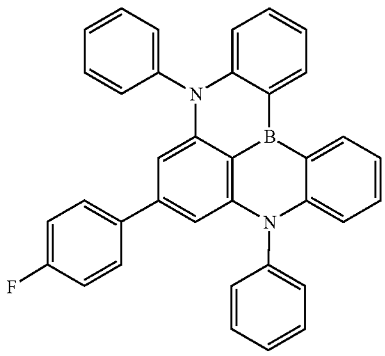

C-35

The difference between this example and Synthesis Example 1 lies in that: C-1-1 needs to be replaced with C-35-1 in an equal amount of substance. The target compound C-35 (1.29 g, 17% yield, HPLC analytical purity 99.59%) is a yellow solid. MALDI-TOF-MS results: molecular ion peak: 512.31 elemental analysis results: theoretical values: C, 84.06%; H, 4.70%; B, 2.10%; F, 3.69%; N, 5.45%; N, 5.47%; experimental values: C, 84.22%; H, 4.65 B, 2.22; F, 3.61%; N, 5.51%.

Synthesis Example 12: Synthesis of Compound C-175

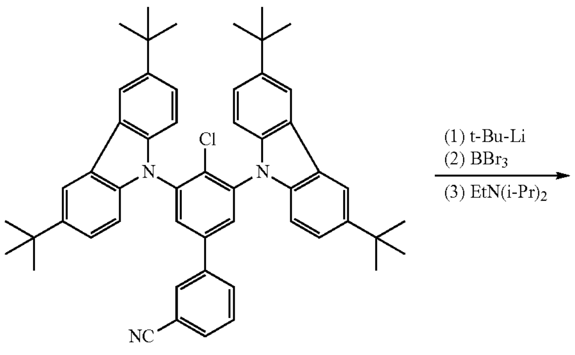

C-175-1

-continued

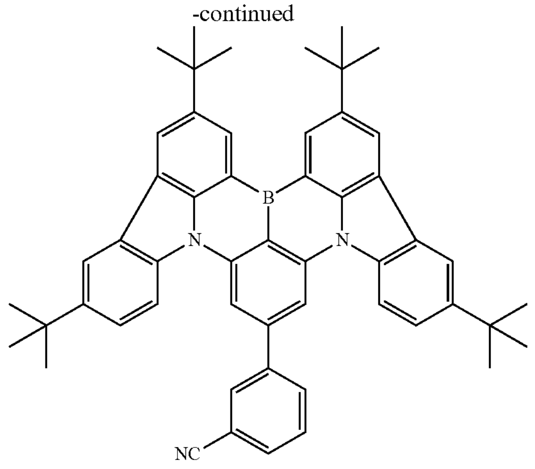

C-175

The difference between this example and Synthesis Example 1 lies in that: in this example, C-1-1 needs to be replaced with C-175-1 in an equal amount of substance. The target compound C-175 (1.59 g, 14.5% yield, HPLC analytical purity 99.91%) is a yellow solid. MALDI-TOF-MS results: molecular ion peak: 741.32 elemental analysis results: theoretical values: C, 85.81%; H, 7.07%; B, 1.46%; N, 5.66%; N, 5.17%; experimental values: C, 85.67%; H, 7.11%; B, 1.53%; N, 5.74%; N, 5.22%.

The technical solutions of the present application will be further described below through specific embodiments. It will be apparent to those skilled in the art that the examples are merely intended to facilitate the understanding of the present application and should not be construed as specific limitations to the present application.

The organic electroluminescent device of the present application will be further introduced through specific examples below.

Examples 1-24 and Comparative Examples 1-5

Examples 1-24 and Comparative Examples 1-5 respectively provide an organic electroluminescent device, the structure of which includes an anode, a hole injection layer (HIL), a hole transport layer (HTL), an electron blocking layer (EBL), a light-emitting layer (EML), a hole blocking layer (HBL), an electron transport layer (ETL), an electron injection layer (EIL), a cathode and a light extraction layer (CPL) in sequence.

Wherein, the anode is an ITO/Ag/ITO conductive layer, the material of the hole injection layer is a co-doped mixed layer of HI-2 and HT-24, the mass percentage of HI-2 is 3%, and the thickness of the hole injection layer is 10 nm; the material of the hole transport layer is HT-24 with a thickness of 110 nm; the material of the electron blocking layer is EB-1 with a thickness of 35 nm; and the material of the light-emitting layer includes a host material, a sensitizer and a fluorescent dye, and the thickness of the light-emitting layer is 42 nm. The material of the hole blocking layer is HB-1, and the thickness is 5 nm. The material of the electron transport layer is mixed co-evaporation of ET-52 and ET-57, the mass ratio of the ET-52 to the ET-57 is 1:1, and the thickness is 28 nm. The material of the electron injection layer is Yb (1 nm), the cathode material is a blend of Mg and Ag with a mass ratio of 1:9, and the thickness is 13 nm; and the material of the light extraction layer (CPL) is CPL-1, and the thickness is 65 nm.

EB-1

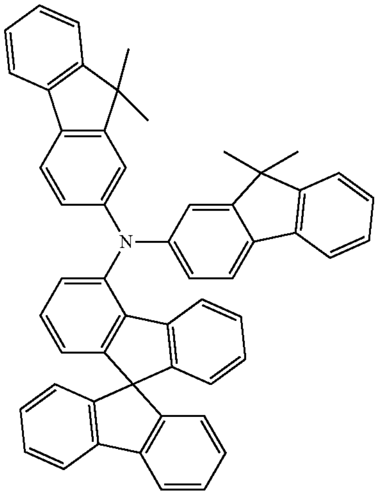

HB-1

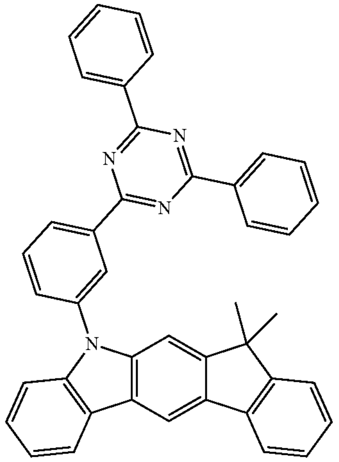

CPL-1

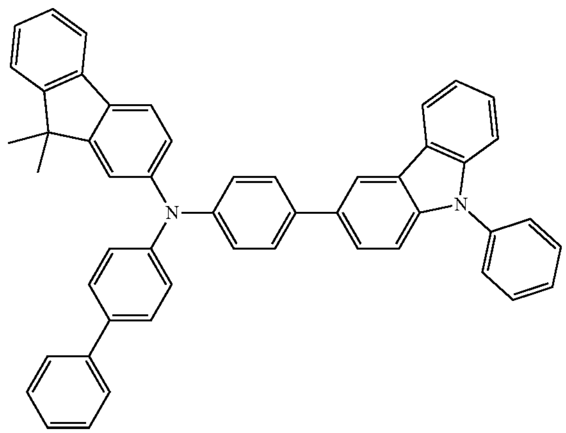

The specific structure of the organic electroluminescent device provided in Example 1 is shown in FIG. 1. As shown in FIG. 1, the device includes an anode layer, HIL, HTL, EBL, EML, HBL, ETL, EIL, a cathode layer and CPL.

In the organic electroluminescent devices provided in Examples 1-24 and Comparative Examples 1-5, the host materials, sensitizers and dyes as well as doping concentrations are specifically described in Table 1.

The preparation methods of the organic electroluminescent devices of Examples 1-24 and Comparative Examples 1-5 are as follows:

(1) a glass plate coated with a ITO/Ag/ITO conductive layer was ultrasonically treated in a commercial cleaning agent, rinsed in deionized water, and ultrasonically degreased in a mixed solvent of acetone and ethanol, then oven dried to completely remove water in a clean environment, cleaned with ultraviolet light and ozone, and the surface was bombarded with low-energy cation beam;

(2) the above-mentioned glass substrate with an anode was put in a vacuum chamber, which was evacuated to less than $1\times10^{-5}$ Pa, and vacuum evaporation was conducted on the above-mentioned anode layer film as a hole injection layer, the evaporation rate was 0.1 nm/s, and the thickness of the evaporation film was 10 nm;

(3) a hole transport layer was vacuum evaporated on the hole injection layer, the evaporation rate was 0.1 nm/s, and the thickness of the total film of the evaporation was 110 nm;

(4) an electron blocking layer was vacuum evaporated on the hole transport layer, the evaporation rate was 0.1 nm/s, and the thickness of the total film of the evaporation was 35 nm;

(5) a light-emitting layer was vacuum evaporated on the electron blocking layer, the light-emitting layer including a host material, a sensitizer and a fluorescent dye, using a multi-source co-evaporation method, the evaporation rate was 0.1 nm/s, and the thickness of the evaporation film was 42 nm.

(6) a hole blocking layer was vacuum evaporated on the light-emitting layer, the evaporation rate was 0.1 nm/s, and the thickness of the total film of the evaporation was 5 nm;

(7) an electron transport layer was vacuum evaporated on the hole blocking layer, the evaporation rate thereof was 0.1 nm/s, and the thickness of the total film of the evaporation was 28 nm;

(8) an electron injection layer with a thickness of 1 nm, a cathode with a thickness of 13 nm, and a light extraction layer with a thickness of 65 nm was vacuum evaporated on the electron transport layer.

The structures of the dyes involved in the Comparative Examples are as follows:

GD-1

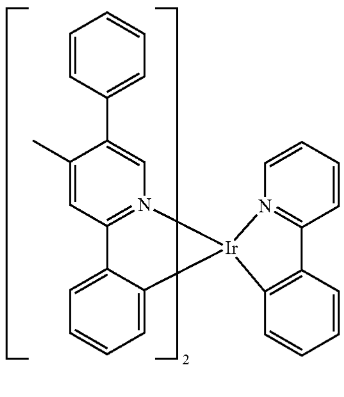

-continued

GD-2

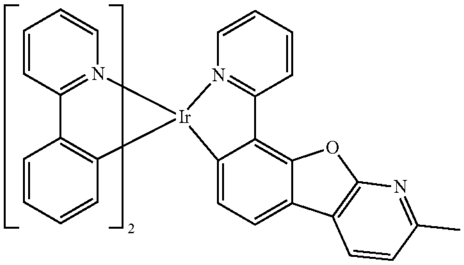

GD-3

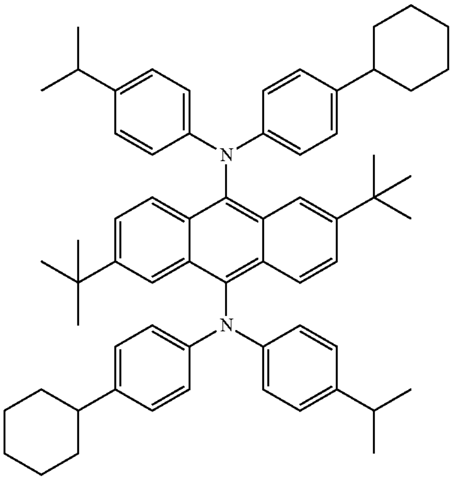

Performance Test (1) Current Efficiency Test:

Under the same luminance, the PR 750 Optical Radiometer from Photo Research, ST-86LA Luminance Meter (Beijing Shida Photoelectric Technology Co., Ltd.) and Keithley 4200 test system were used to determine the current efficiencies of the organic electroluminescent devices prepared in the examples and comparative examples. Specifically, the voltage was increased at a rate of 0.1 V per second, and the current density when the luminance of the organic electroluminescent device reaches 5000 cd/$m^2$ was determined; the ratio of the luminance to the current density was the current efficiency (cd/A);

the current efficiency of the device in Comparative Example 1 was calculated as 100%, and the current efficiencies of the remaining devices were all relative values compared therewith.

(2) Half-Peak Width Test:

Under a luminance of 5000 cd/$m^2$, it was calculated using the PR 750 Optical Radiometer from Photo Research.

The above performance test results are shown in Table 1.

TABLE 1

| | Host material | Sensitizer | Doping Concentration of Sensitizer | Dye | Doping Concentration of Dye | Half-peak width (nm) | Current efficiency (cd/A) |
|---|---|---|---|---|---|---|---|
| Example 1 | GPH-4 | T-90 | 30% | C-35 | 5% | 21 | 113% |
| Example 2 | GPH-4 | T-90 | 30% | C-51 | 5% | 22 | 107% |
| Example 3 | GPH-4 | T-90 | 30% | C-103 | 5% | 22 | 109% |
| Example 4 | GPH-4 | T-90 | 30% | C-120 | 5% | 23 | 126% |
| Example 5 | GPH-4 | T-90 | 30% | C-123 | 5% | 21 | 121% |
| Example 6 | GPH-4 | T-90 | 30% | C-132 | 5% | 23 | 108% |
| Example 7 | GPH-4 | T-90 | 30% | C-175 | 5% | 20 | 129% |
| Example 8 | GPH-4 | T-90 | 30% | C-175 | 40% | 26 | 93% |
| Example 9 | GPH-5 | T-90 | 30% | C-175 | 5% | 21 | 117% |
| Example 10 | GPH-78 | T-90 | 30% | C-175 | 5% | 20 | 113% |
| Example 11 | GPH-46:GPH-3 (Ratio 1:1) | T-90 | 30% | C-175 | 5% | 21 | 133% |
| Example 12 | GPH-45:GPH-3 (Ratio 1:1) | T-90 | 30% | C-175 | 5% | 21 | 130% |
| Example 13 | GPH-4 | T-37 | 30% | C-175 | 5% | 20 | 115% |
| Example 14 | GPH-4 | T-82 | 30% | C-175 | 5% | 21 | 119% |
| Example 15 | GPH-4 | T-89 | 30% | C-175 | 5% | 21 | 126% |
| Example 16 | GPH-4 | T-91 | 30% | C-175 | 5% | 20 | 124% |
| Example 17 | GPH-4 | T-91 | 85% | C-175 | 5% | 25 | 104% |
| Example 18 | GPH-4 | T-90 | 5% | C-75 | 1% | 19 | 102% |
| Example 19 | GPH-4 | T-90 | 50% | C-75 | 10% | 19 | 112% |
| Example 20 | GPH-4 | T-90 | 50% | C-75 | 30% | 19 | 107% |
| Example 21 | GPH-5 | T-37 | 30% | C-103 | 5% | 23 | 108% |
| Example 22 | GPH-46:GPH-3 (Ratio 1:1) | T-91 | 30% | C-123 | 10% | 23 | 109% |
| Example 23 | GPH-78 | T-82 | 30% | C-35 | 5% | 20 | 112% |
| Example 24 | GPH-45:GPH-3 (Ratio 1:1) | T-82 | 30% | C-120 | 5% | 24 | 125% |
| Comparative Example 1 | GPH-4 | / | / | GD-1 | 10% | 32 | 100% |
| Comparative Example 2 | GPH-4 | / | / | GD-2 | 10% | 30 | 103% |
| Comparative Example 3 | GPH-4 | / | / | GD-3 | 5% | 26 | 22% |

TABLE 1-continued

| | Host material | Sensitizer | Doping Concentration of Sensitizer | Dye | Doping Concentration of Dye | Half-peak width (nm) | Current efficiency (cd/A) |
|---|---|---|---|---|---|---|---|
| Comparative Example 4 | GPH-4 | T-90 | 40% | GD-3 | 5% | 27 | 84% |
| Comparative Example 5 | GPH-4 | / | / | C-175 | 5% | 20 | 24% |

In Table 1,
/ means that no corresponding substance was added.

It can be seen from Table 1 that the organic electroluminescent device provided in the present application achieves green light emission with narrow spectrum and high color purity, and the device has high efficiency, with a half-peak width of 19 nm to 26 nm.

In the devices provided in Comparative Example 1 and Comparative Example 2, a sensitizer was not added, phosphorescent dyes GD-1 and GD-2 were used, and the half-peak width was wider.

In the device provided in Comparative Example 3, a sensitizer was not added, a fluorescent dye with a structure different from that of formula I was used, the half-peak width was wider, and the current efficiency was lower;

In the device provided in Comparative Example 4, a sensitizer was added, a fluorescent dye with a structure different from that of formula I was used, the half-peak width was wider, and the current efficiency was lower;

In the device provided in Comparative Example 5, a sensitizer was not added, and a fluorescent dye with a structure of formula I was used, although the half-peak width was narrower, the current efficiency was lower.

It can be seen that only when the green fluorescent dye of formula I is used in a triple-doped device (the light-emitting layer includes a host material, a sensitizer, and a dye), an organic electroluminescent device having green light emission with narrow spectrum and high color purity and high device efficiency can be obtained.

Compared with Example 7, the doping concentration of the dye was only increased to 40% in Example 8, the half-peak width became larger, and the current efficiency decreased; Compared with Example 16, the doping concentration of the sensitizer was only increased to 85% in Example 17, the half-peak width became larger and the current efficiency decreased, which proved that the doping concentration of the dye and sensitizer shouldn't be too high, and the best performances can be achieved in the range of 0.1% to 30% and 10% to 50%, respectively.

Application Example 1

This application example provides a display panel. The display panel includes a red light unit, a green light unit and a blue light unit, wherein the emission light color of the red light unit CIE=(0.669, 0.329); the emission light color of the blue light unit CIE=(0.140, 0.051); the organic electroluminescent device of Example 4 is used for the green light unit, and the emission light color of the green light unit CIE=(0.164, 0.771).

Figure 2:
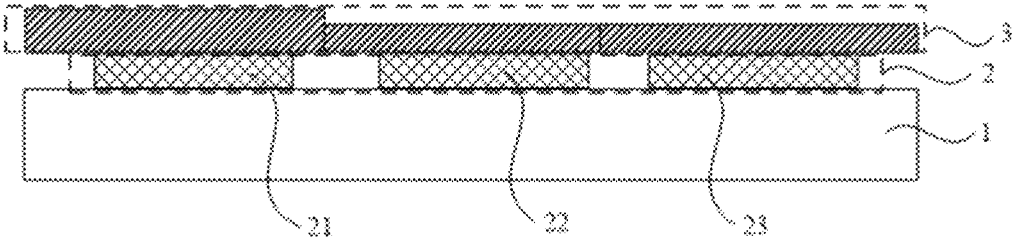
FIG. 2 is a schematic diagram of the structure of the display panel provided by Application Example 1.

The structure of the display panel of Application Example 1 is shown in FIG. 2. The display panel includes a substrate 1, a light-emitting unit 2 and a buffer encapsulation layer 3. The light-emitting unit 2 includes a red light unit 21, a green light unit 22 and a blue light unit 23.

Application Example 2

The difference from Application Example 1 is that the green light unit uses the organic electroluminescent device of Example 7, and the emission light color of the green light unit CIE=(0.153, 0.787).

Comparative Application Example 1

The difference from Application Example 1 is that the green light unit uses the organic electroluminescent device of Comparative Example 1, and the emission light color of the green light unit CIE=(0.206,0.726).

Performance Test

The following performance tests for the display panels obtained from the Application Examples and the Comparative Application Example were tested:

(1) CIE-x and CIE-y were obtained by using the PR 750 Optical Radiometer from Photo Research;

(2) the RGB light color coordinates of the screen body was tested, imported into the CIE 1931 color gamut diagram, and the color gamut display area was calculated.

The color gamut display area of Comparative Application Example 1 was recorded as 100%, and the color gamut display areas of other Application Examples were all relative values compared therewith, and the test results are shown in Table 2.

TABLE 2

| | Blue light unit CIE (x, y) | Red light unit CIE (x ,y) | Green light unit CIE (x, y) | Color gamut display area (CIE 1931) |
|---|---|---|---|---|
| Application Example 1 | 0.140, 0.051 | 0.669, 0.329 | 0.164, 0.771 | 110.5% |
| Application Example 2 | 0.140, 0.051 | 0.669, 0.329 | 0.153, 0.787 | 113.9% |
| Comparative Application Example 1 | 0.140, 0.051 | 0.669, 0.329 | 0.206, 0.726 | 100% |

It can be seen from Table 2 that compared with Comparative Application Example 1, the color gamut display areas of the display panels of Application Examples 1-2 are significantly increased, which proves that applying the organic electroluminescent device provided in the present application to the display panel can increase the color gamut display area of the display panel.

The applicant declares that the present application illustrates the detailed process equipment and process flow of the present application through the above-mentioned examples, but the present application is not limited thereto, that is, it doesn't meant that the present application can only be implemented depending on the above-mentioned detailed process equipment and process flow. It will be apparent to those skilled in the art that any improvements made to the present application, equivalent replacements and addition of adjuvant ingredients to the raw materials of the products of the present application, and selections of the specific implementations, etc., all fall within the protection scope and the disclosed scope of the present application.

What is claimed is:

1. An organic electroluminescent device comprising:

a first electrode;

a second electrode; and an organic layer located between the first electrode and the second electrode, wherein the organic layer comprises a light-emitting layer, the light-emitting layer comprises a host material, a thermally activated delayed fluorescence sensitizer and a green fluorescent dye, and the green fluorescent dye is selected from any one of following compounds as shown in C-1 to C-204:

C-1

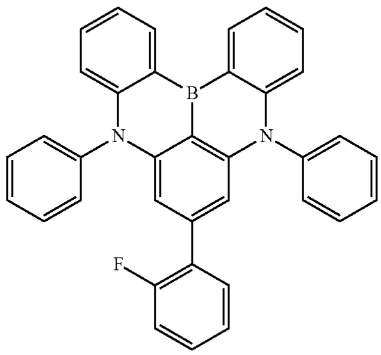

C-2

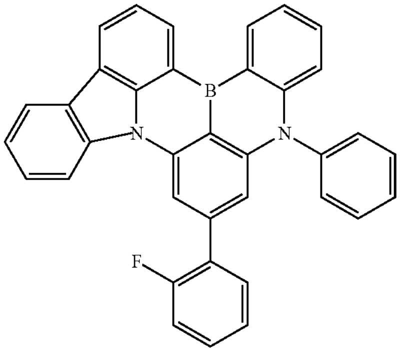

C-3

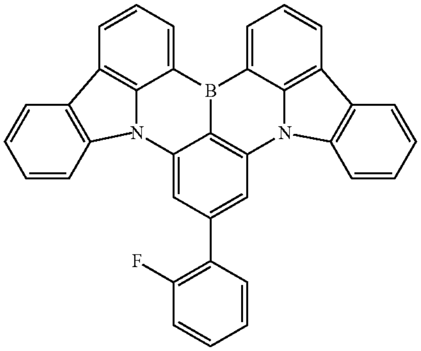

-continued

C-4

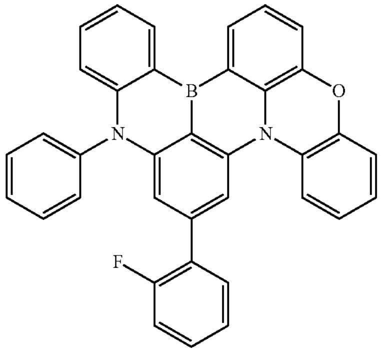

C-5

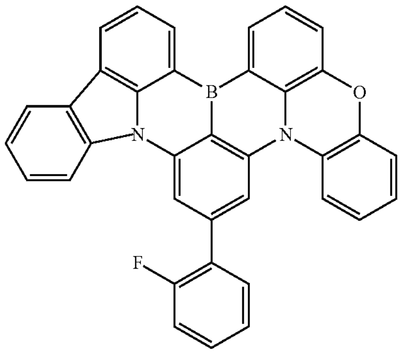

C-6

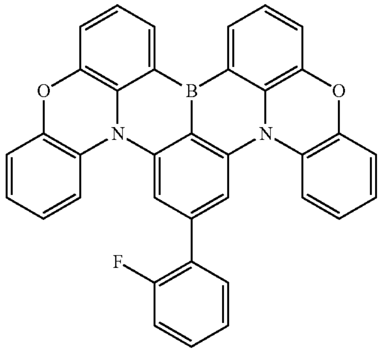

C-7

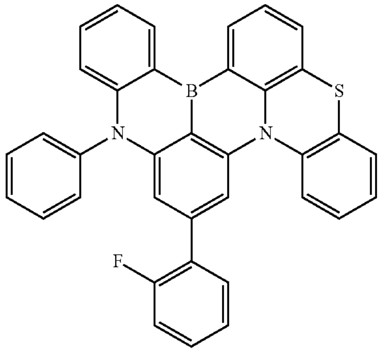

-continued
C-8
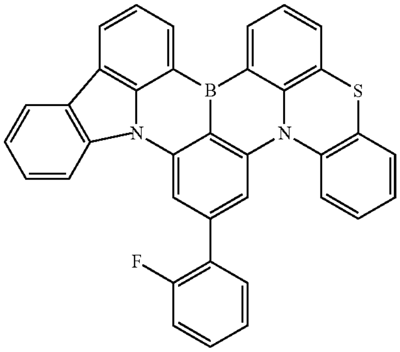
C-9
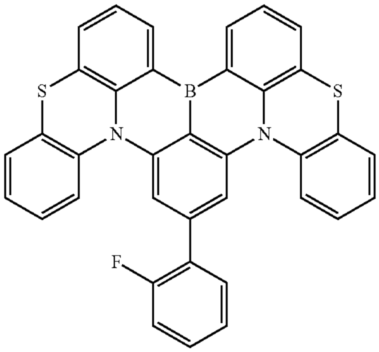
C-10
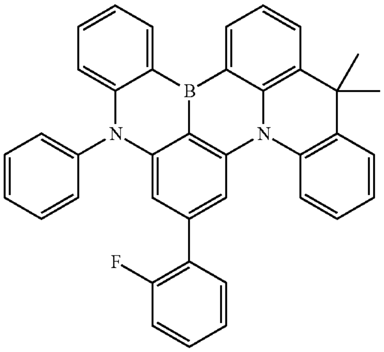
C-11
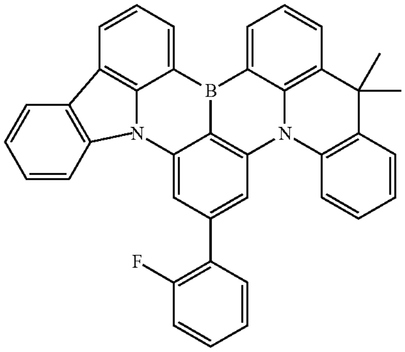
-continued
C-12
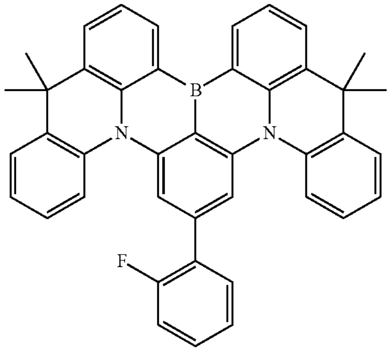
C-13
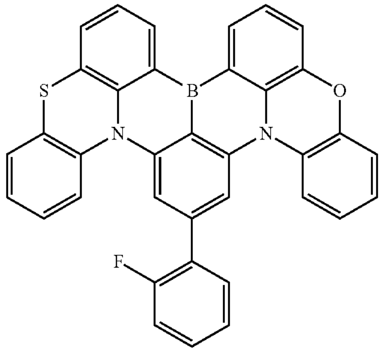
C-14
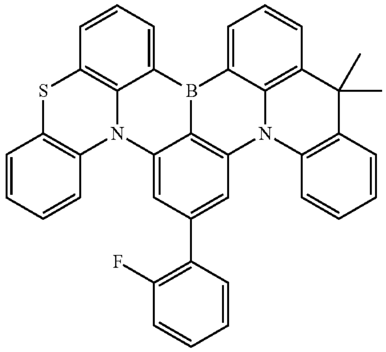
C-15
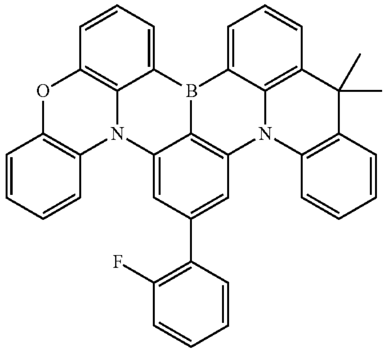

-continued
C-16
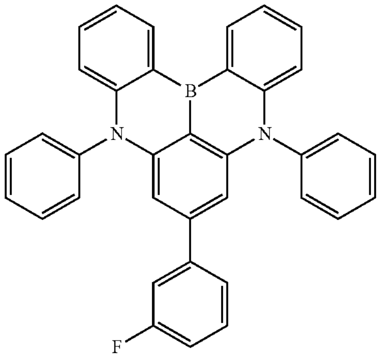
C-17
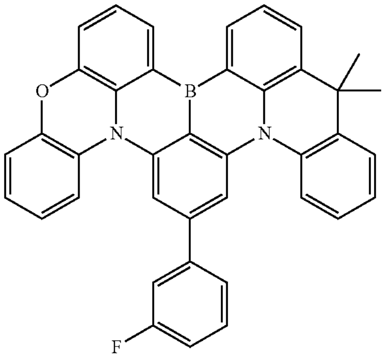
C-18
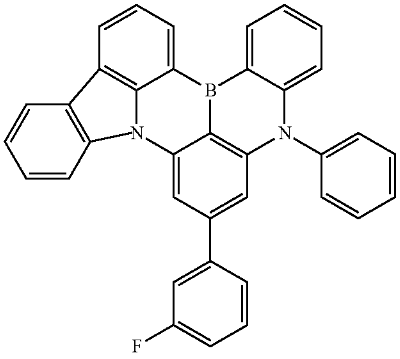
C-19
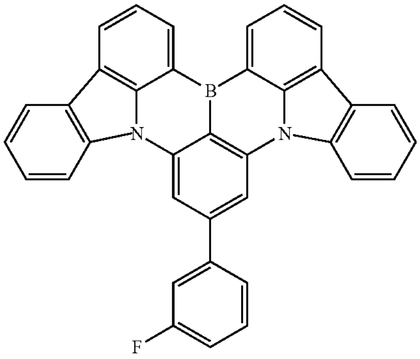
-continued
C-20
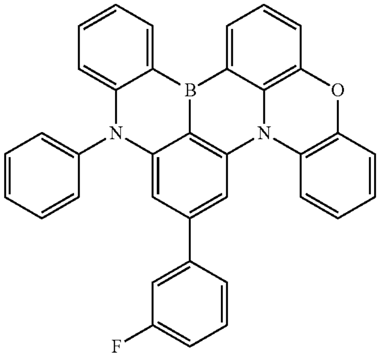
C-21
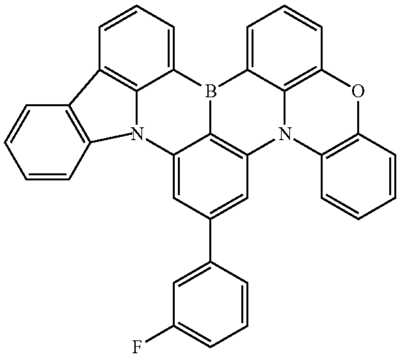
C-22
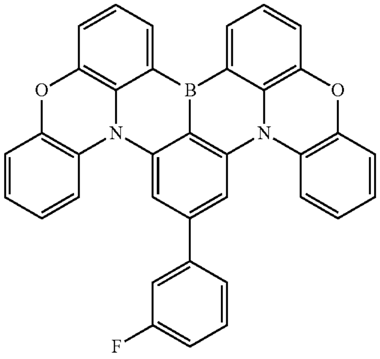
C-23
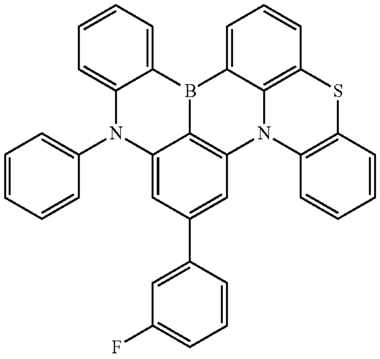

-continued
C-24
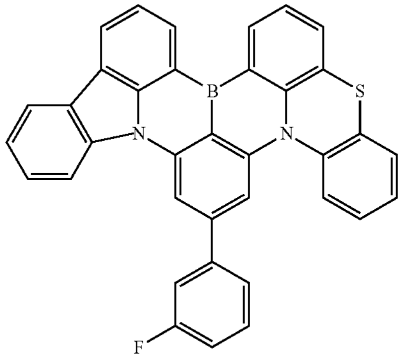
C-25
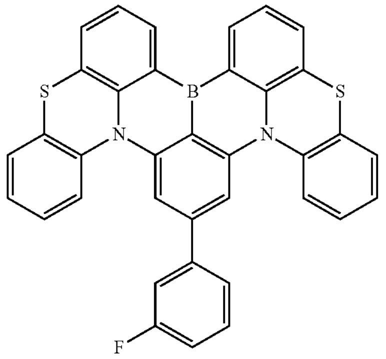
C-26
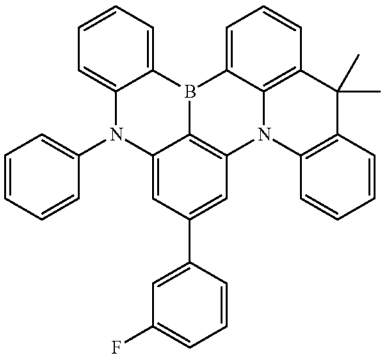
C-27
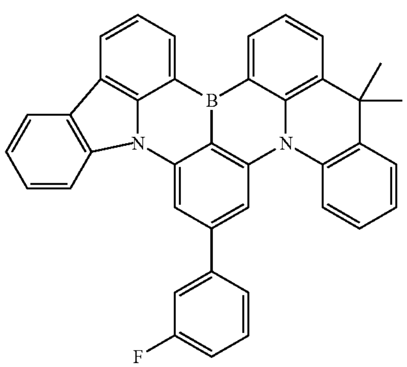
-continued
C-28
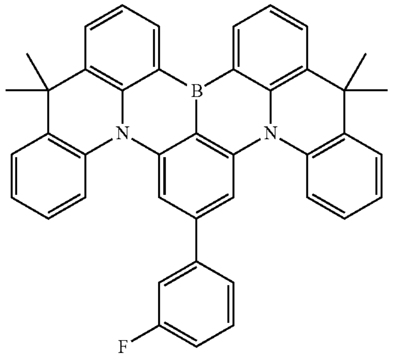
C-29
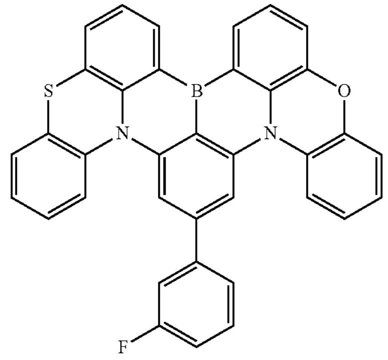
C-30
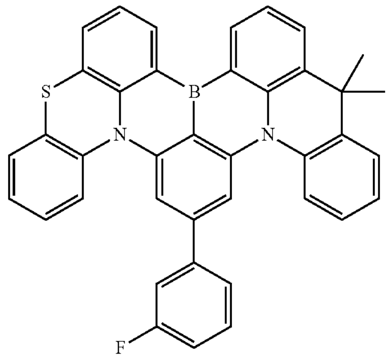
C-31
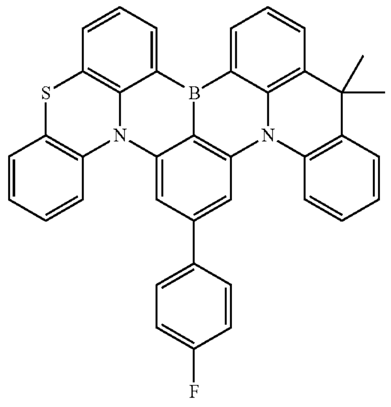

-continued
C-32
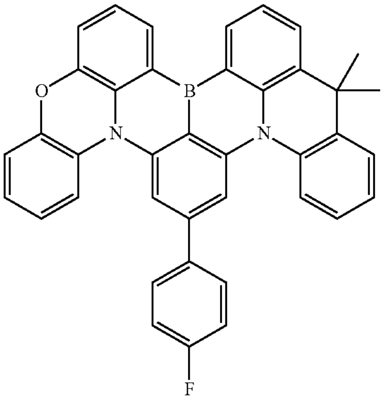
C-33
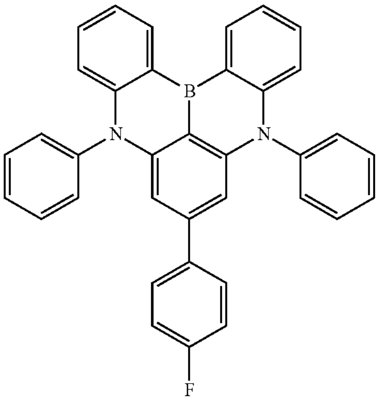
C-34
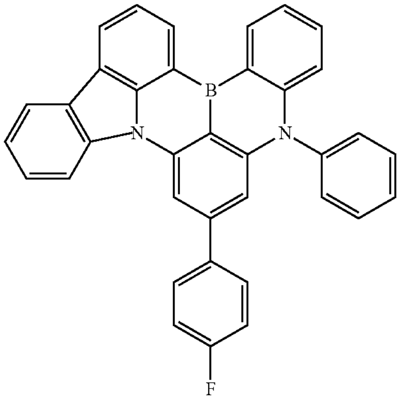
C-35
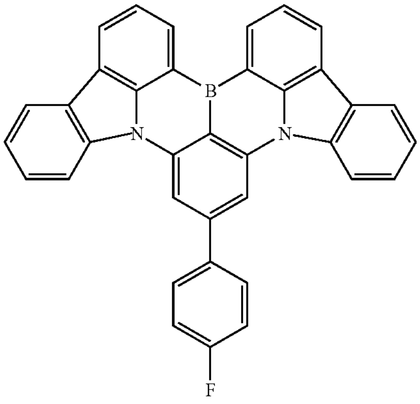
-continued
C-36
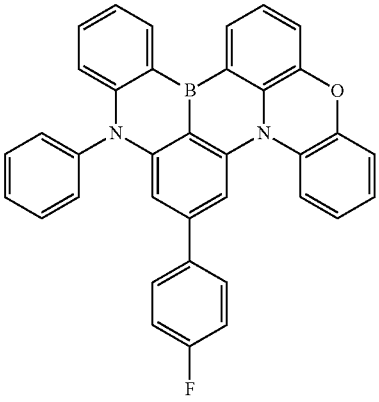
C-37
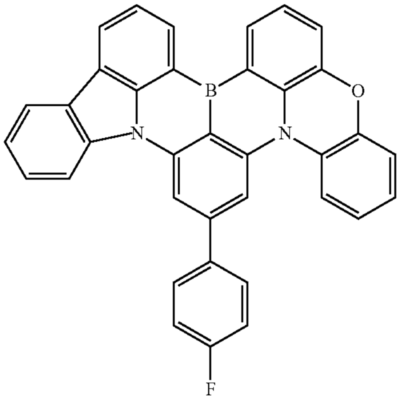
C-38
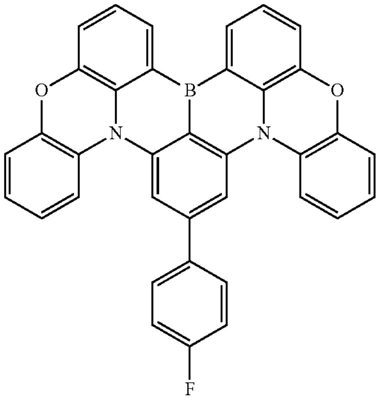
C-39
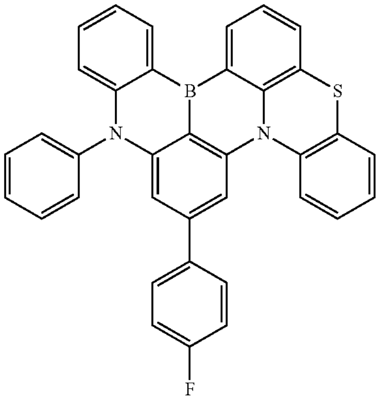

C-40
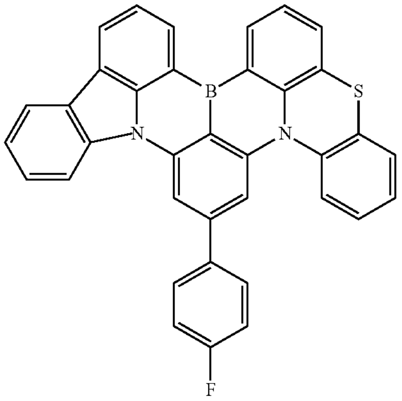
C-41
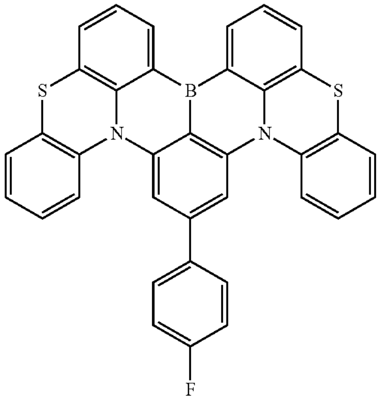
C-42
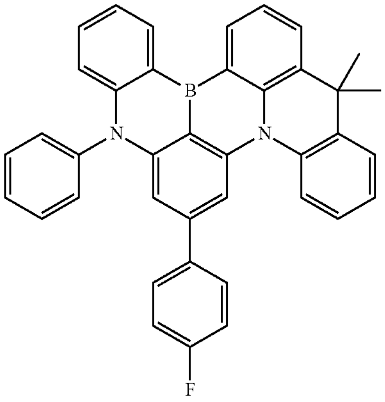
C-43
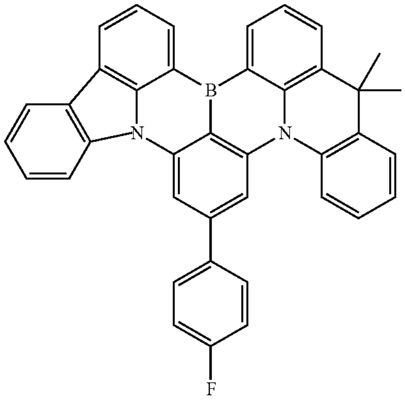
C-44
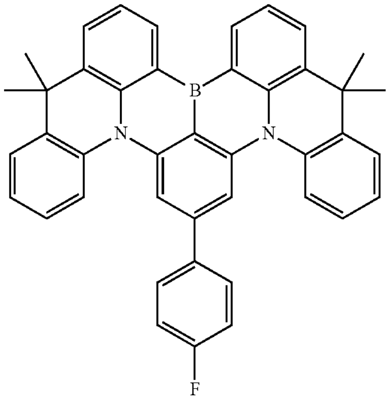
C-45
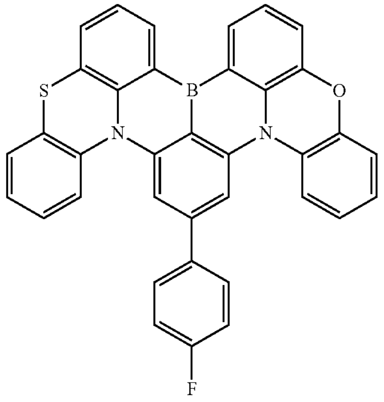
C-46
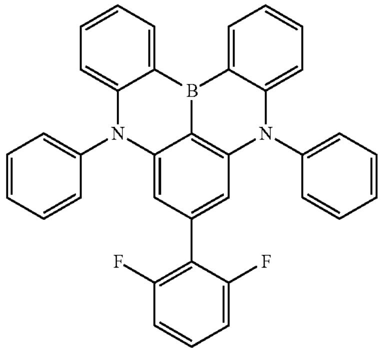
C-47
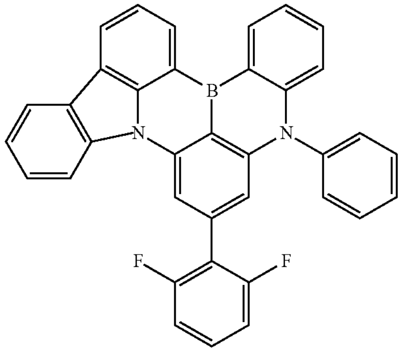

-continued
C-48
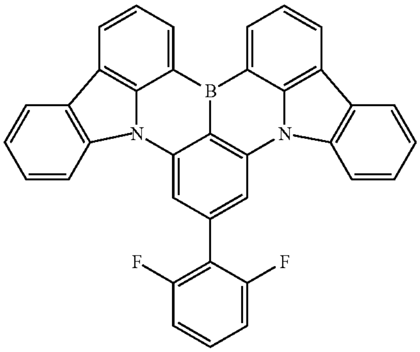
C-49
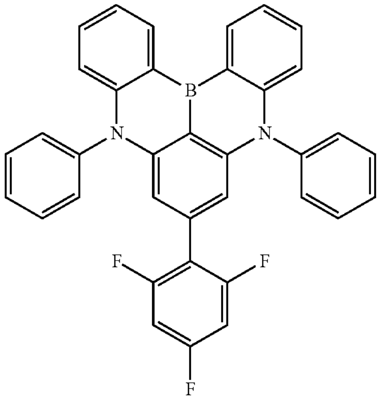
C-50
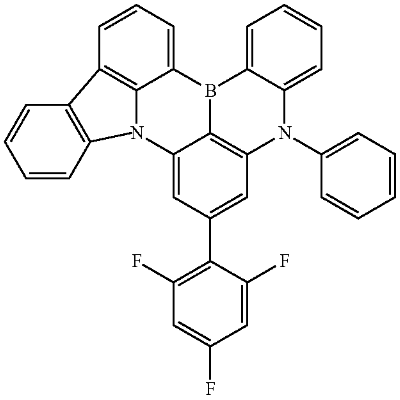
C-51
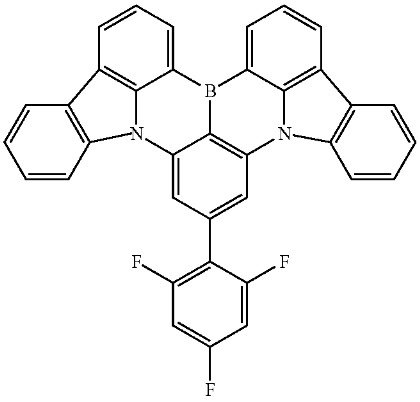
-continued
C-52
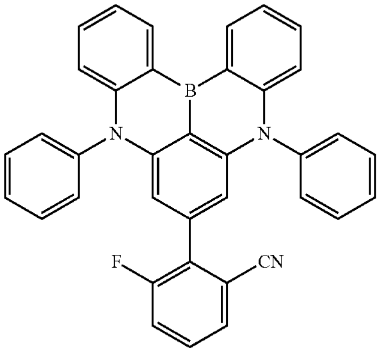
C-53
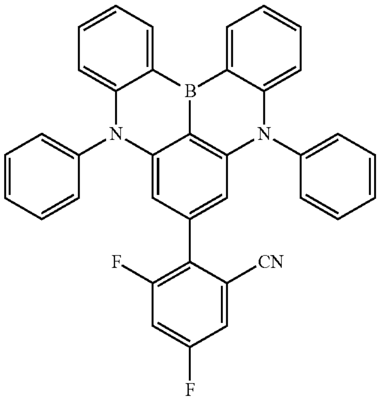
C-54
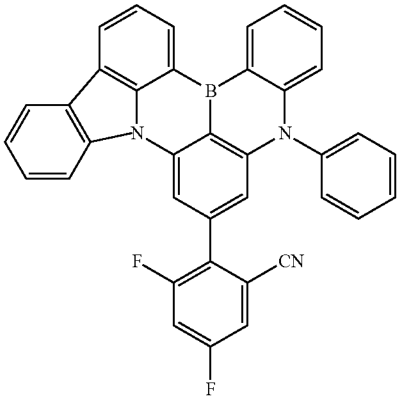
C-55
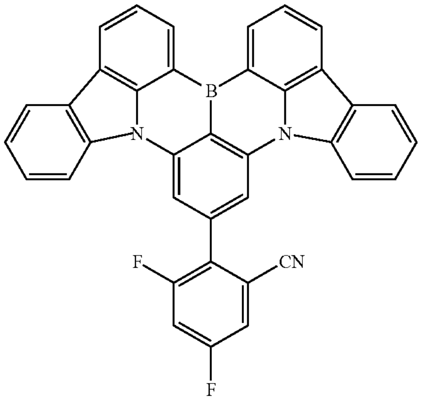

-continued
C-56
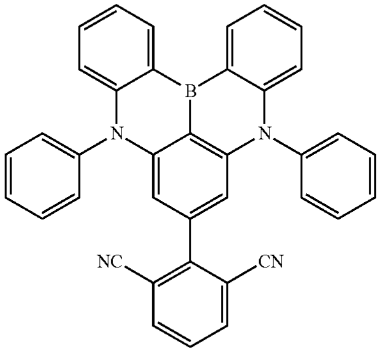
C-57
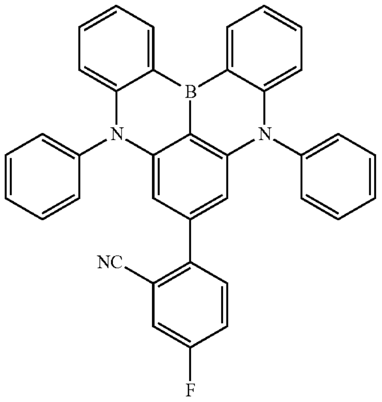
C-58
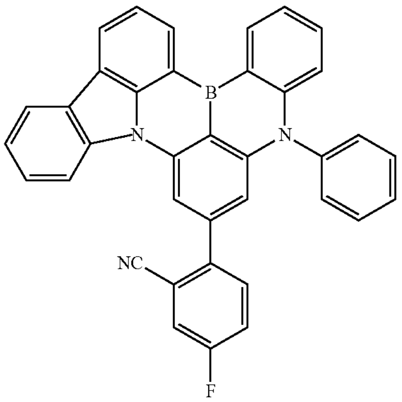
C-59
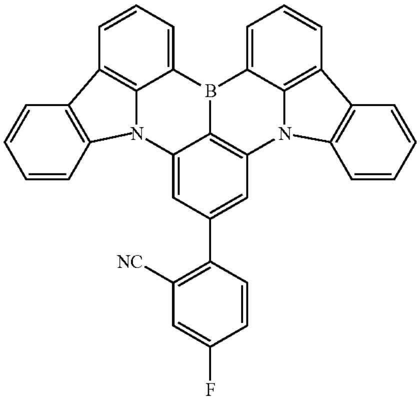
-continued
C-60
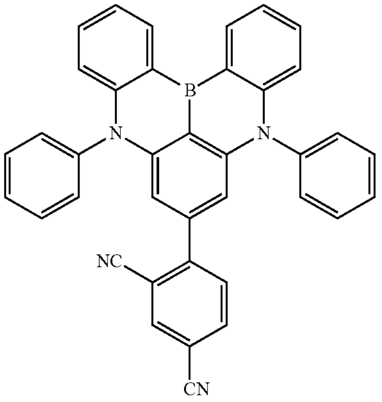
C-61
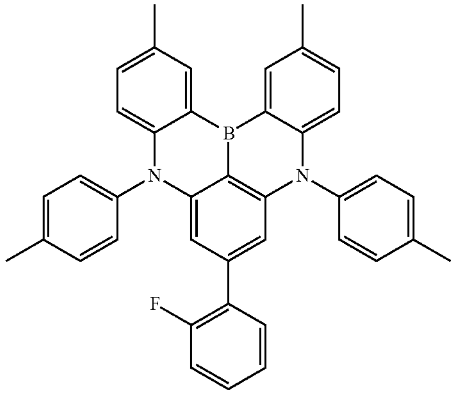
C-62
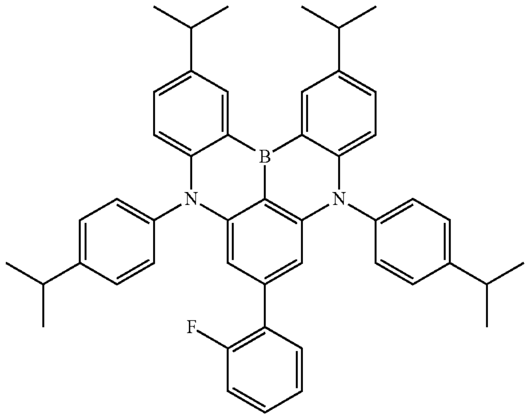

-continued
C-63
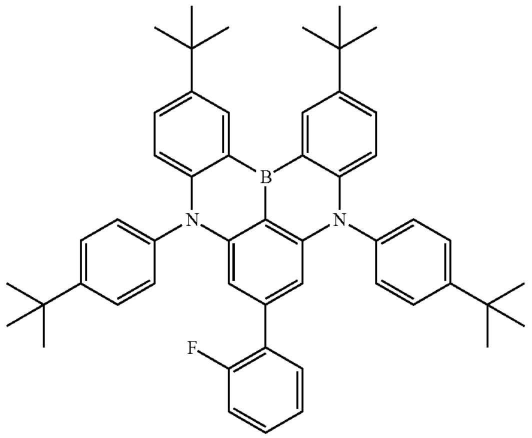
C-64
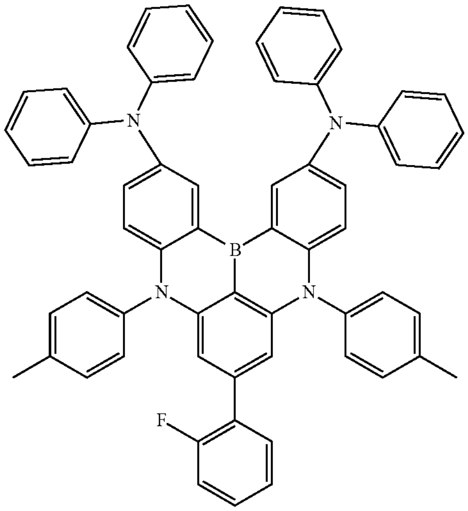
C-65
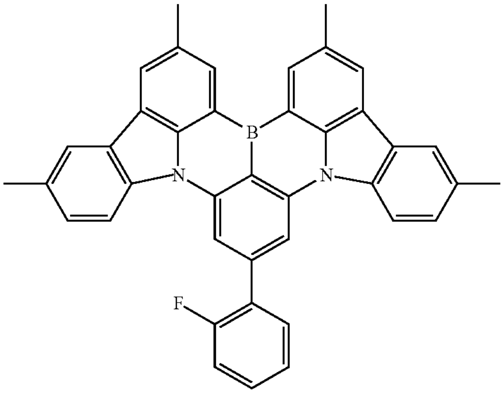
-continued
C-66
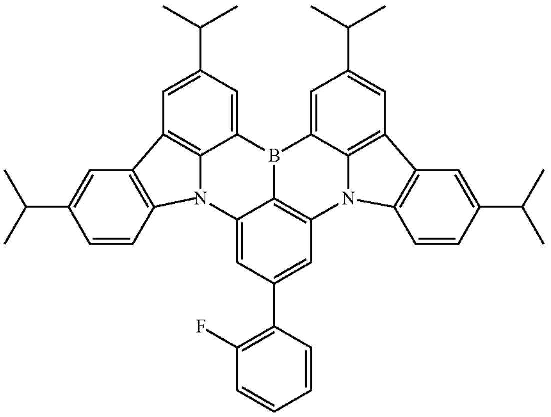
C-67
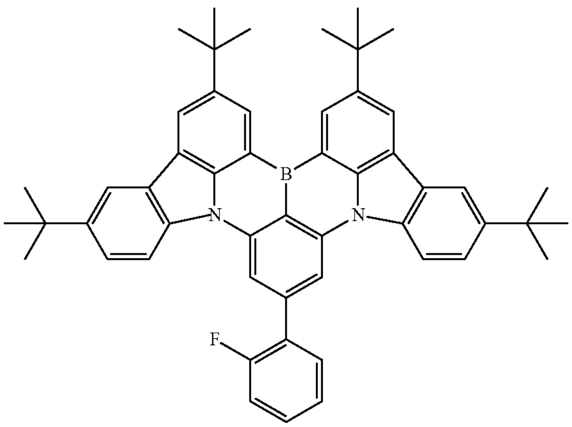
C-68
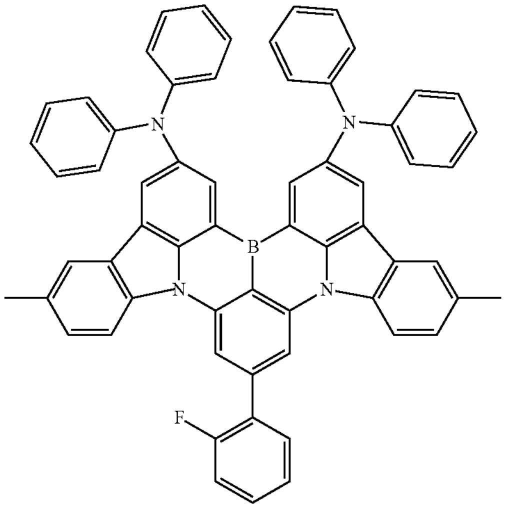

-continued
C-69
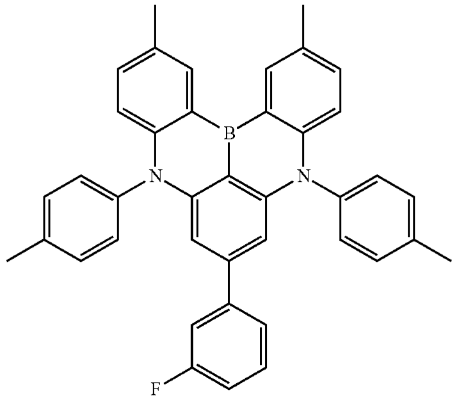
C-70
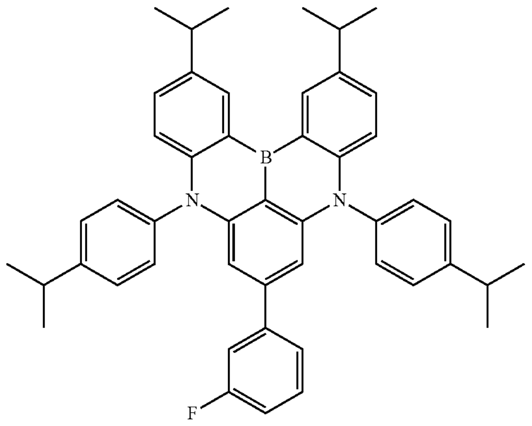
C-71
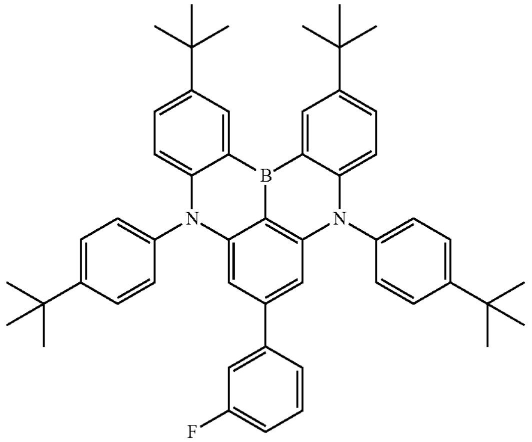
-continued
C-72
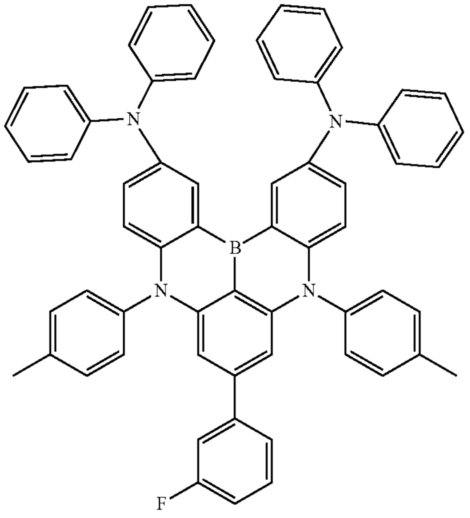
C-73
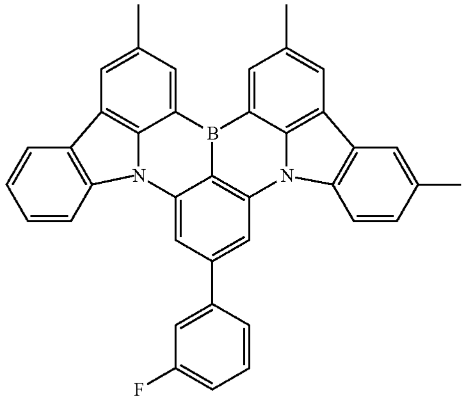
C-74
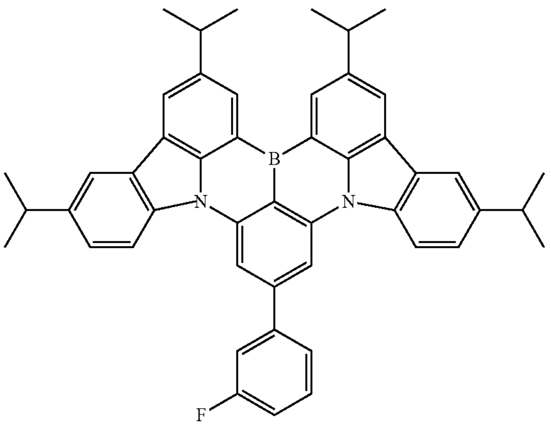

-continued
C-75
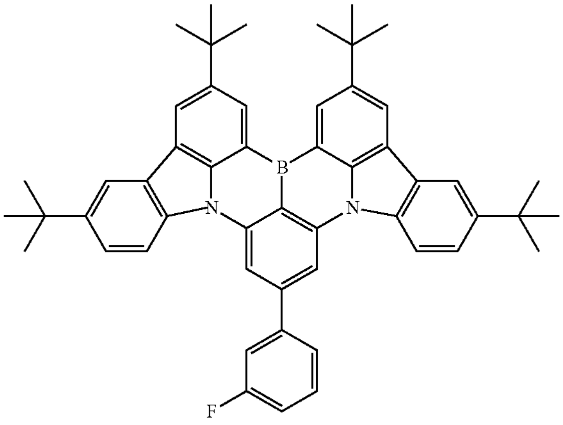
C-76
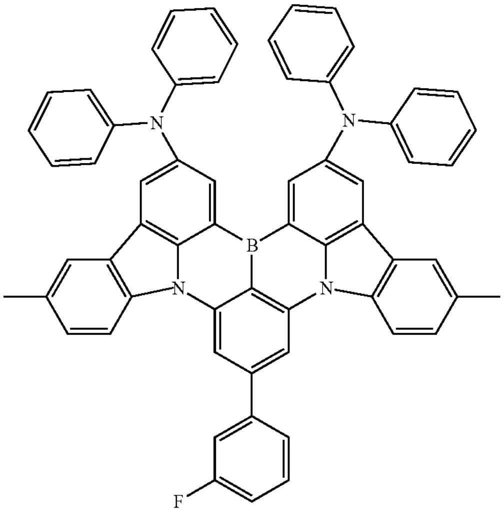
C-77
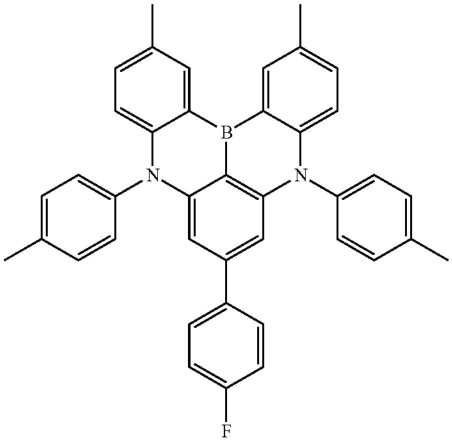
-continued
C-78
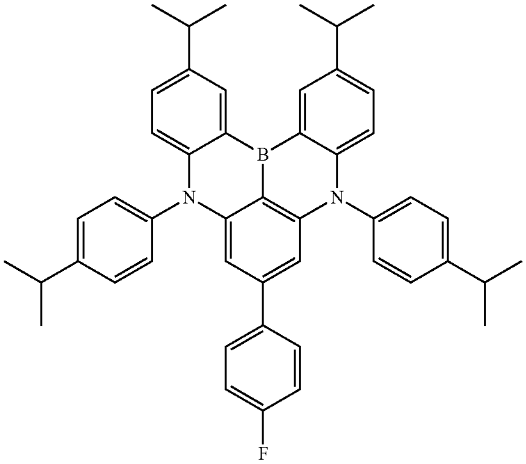
C-79
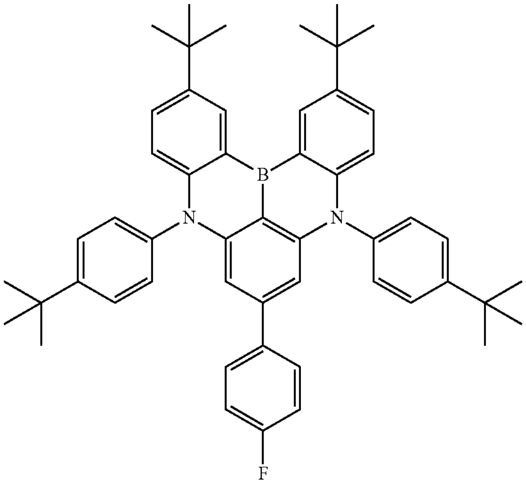
C-80
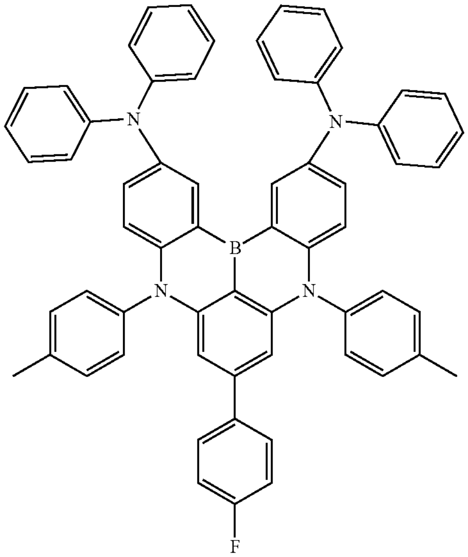

-continued
C-81
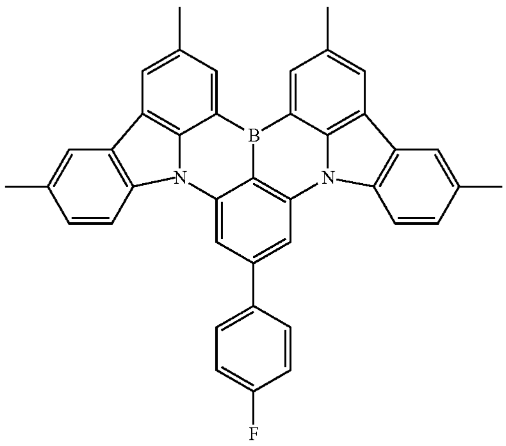
C-82
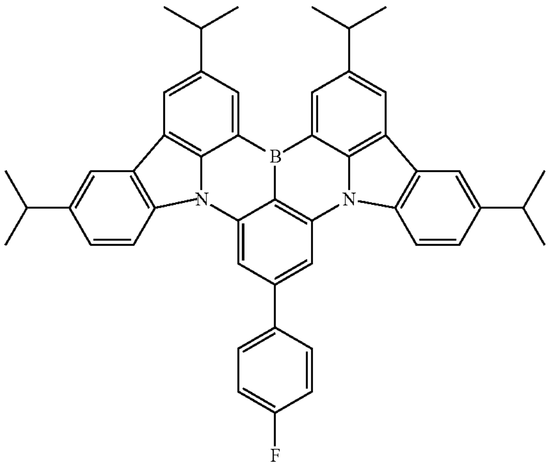
C-83
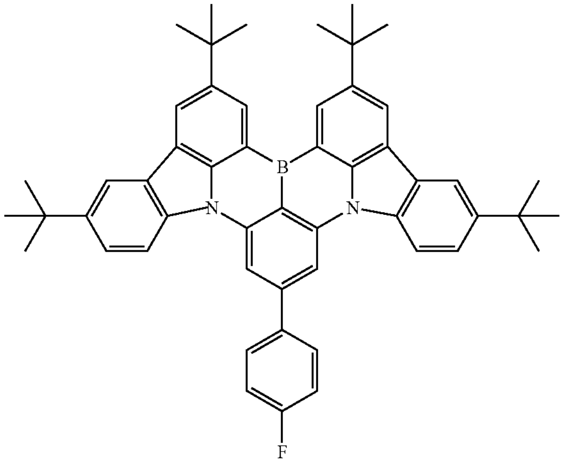
-continued
C-84
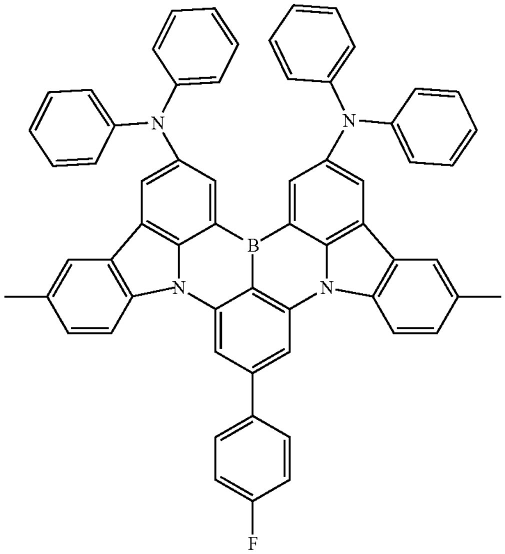
C-85
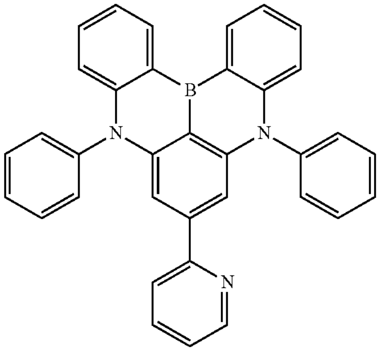
C-86
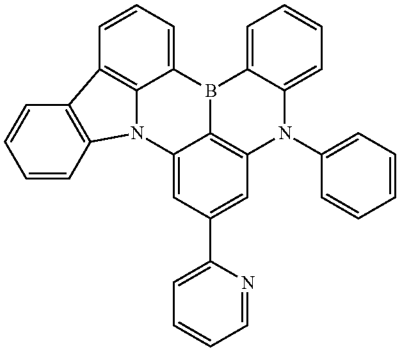
C-87
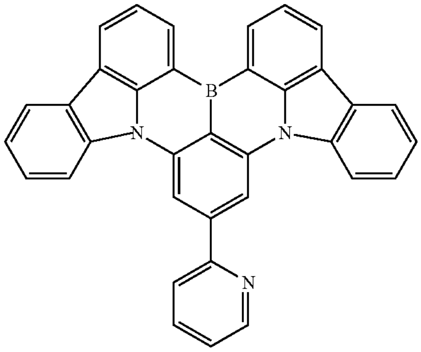

-continued
C-88
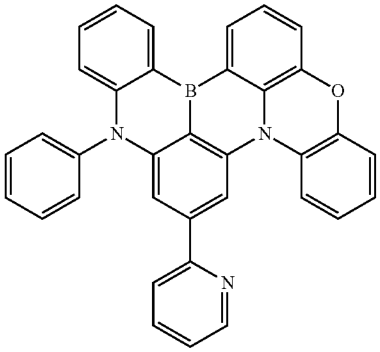
C-89
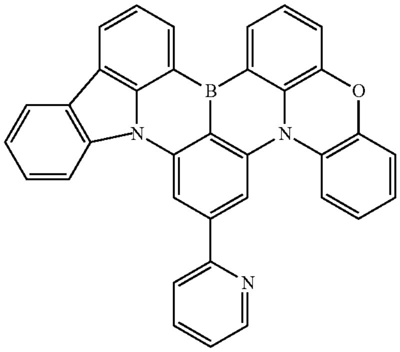
C-90
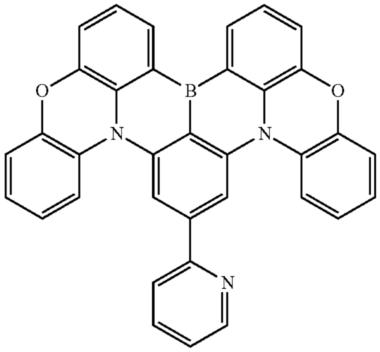
C-91
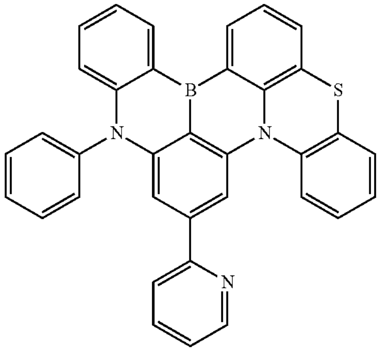
-continued
C-92
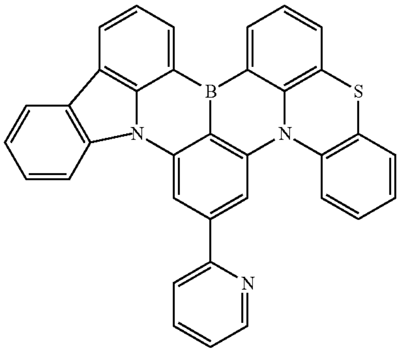
C-93
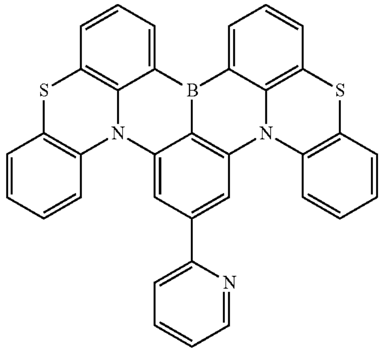
C-94
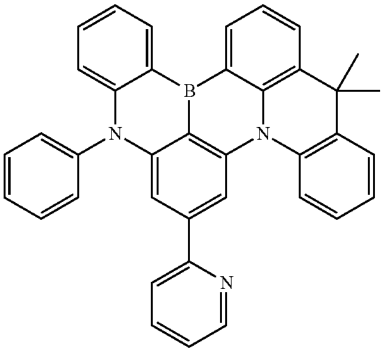
C-95
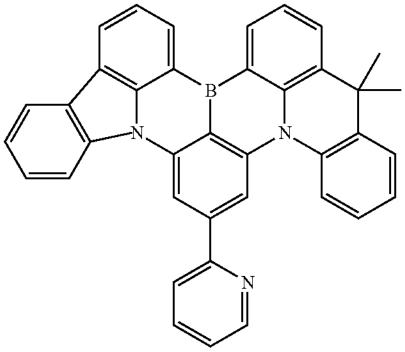

-continued
C-96
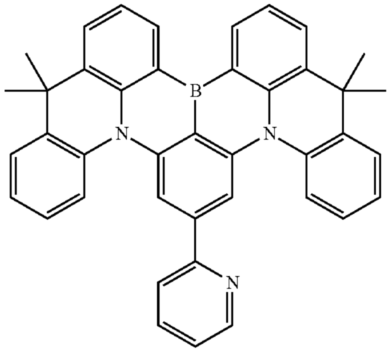
C-97
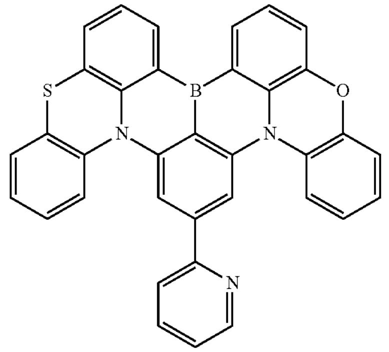
C-98
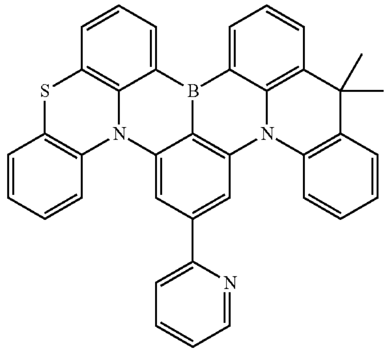
C-99
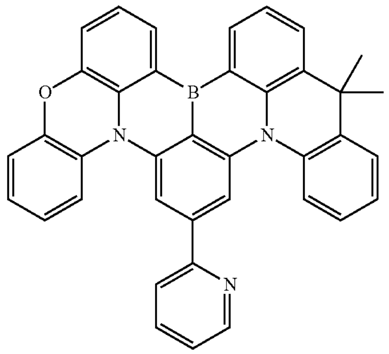
-continued
C-100
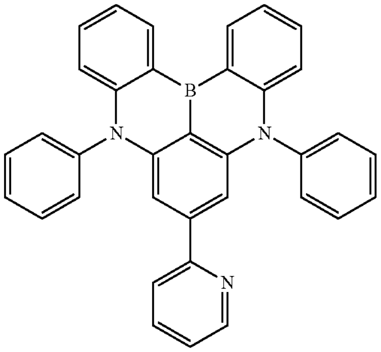
C-101
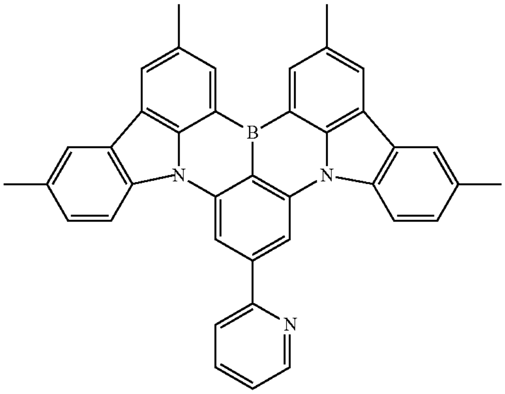
C-102
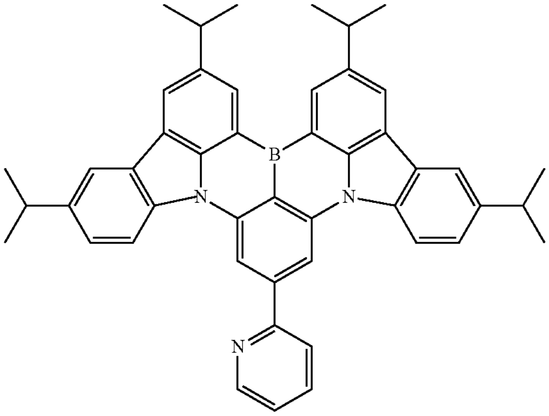
C-103
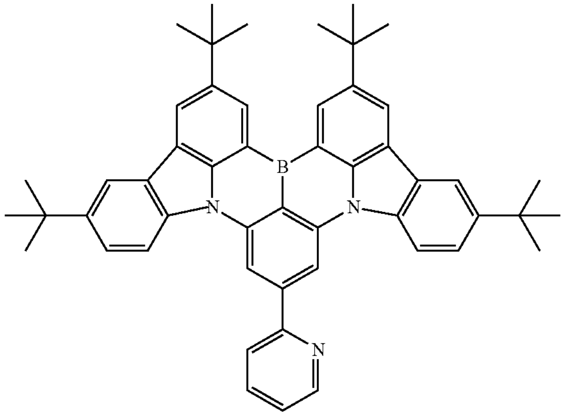

-continued
C-104
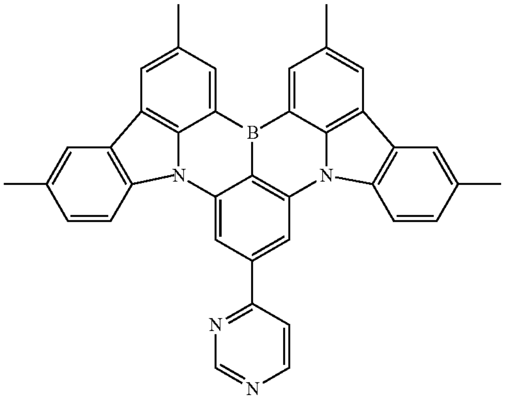
C-105
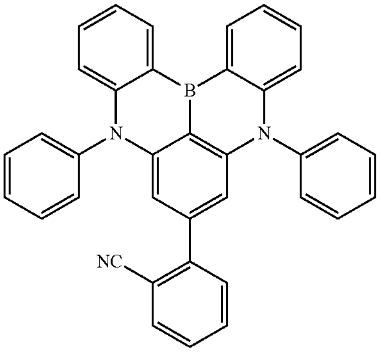
C-106
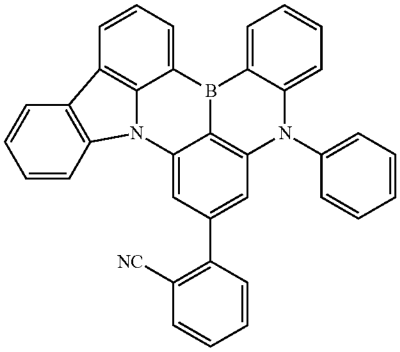
C-107
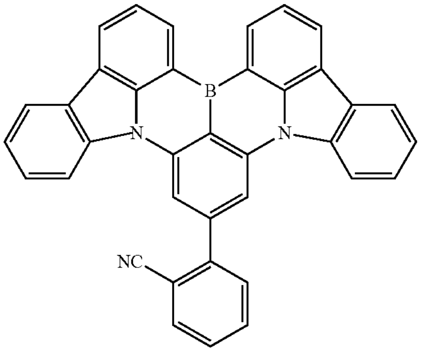
-continued
C-108
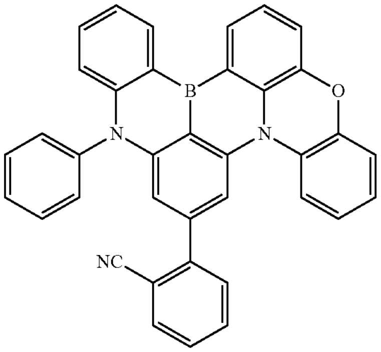
C-109
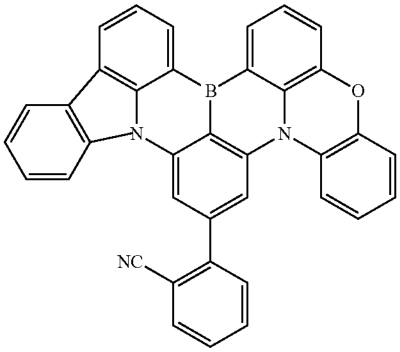
C-110
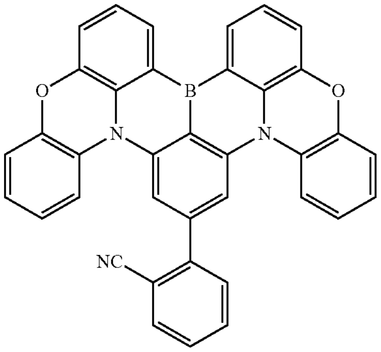
C-111
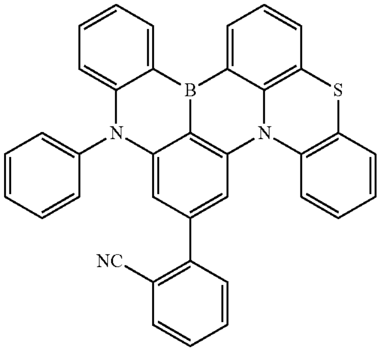

-continued
C-112
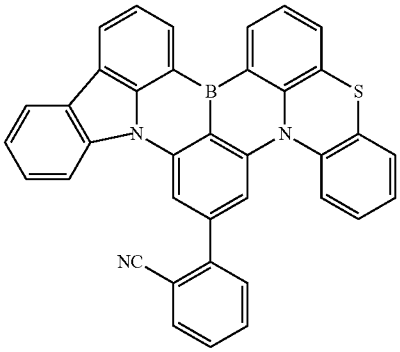
C-113
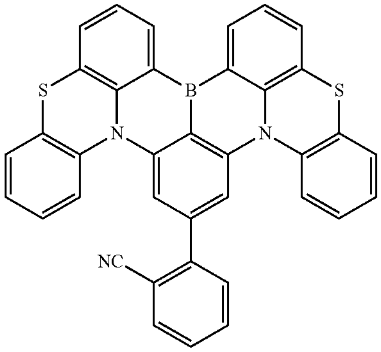
C-114
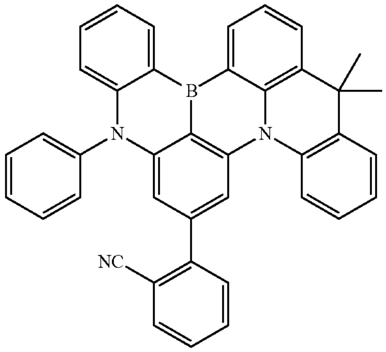
C-115
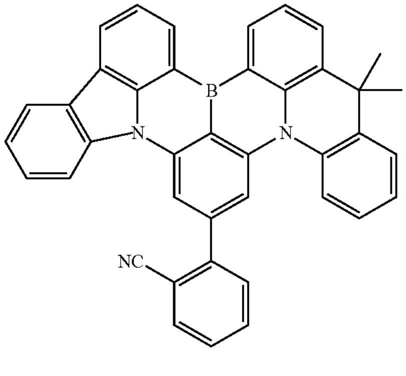
-continued
C-116
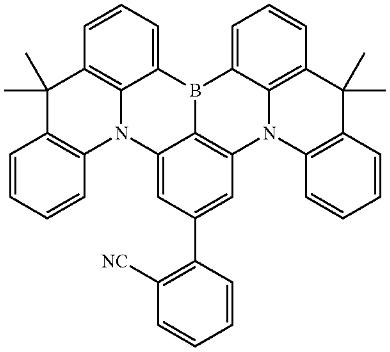
C-117
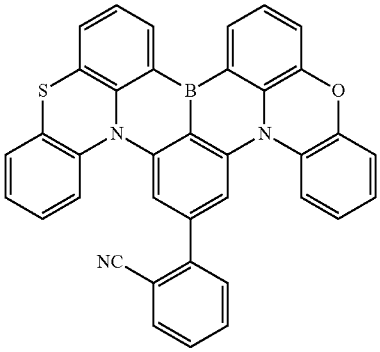
C-118
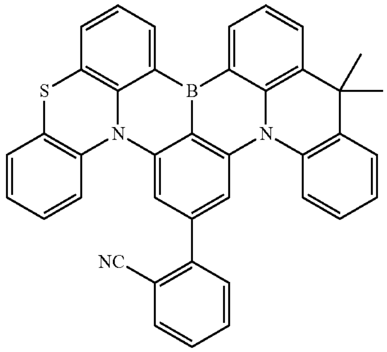
C-119
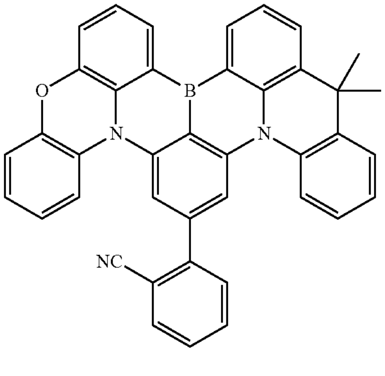

-continued
C-120
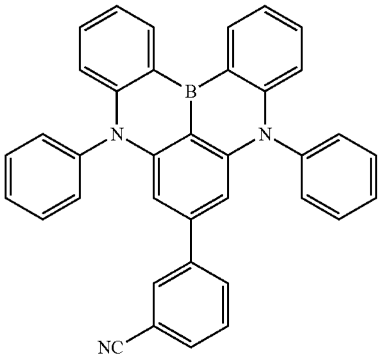
C-121
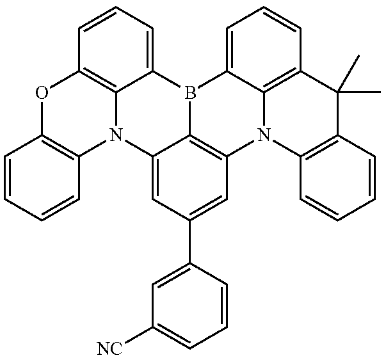
C-122
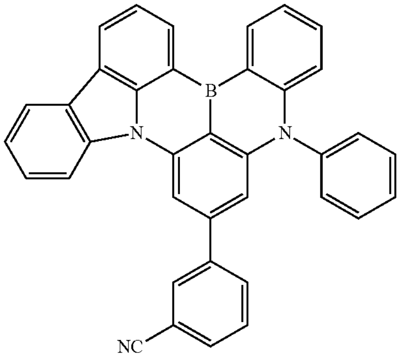
C-123
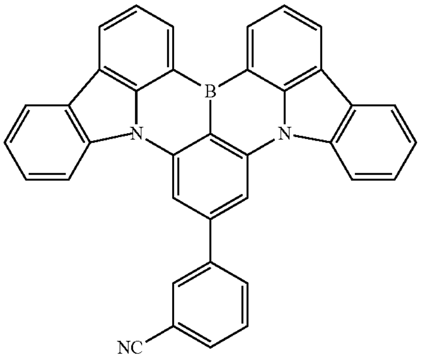
-continued
C-124
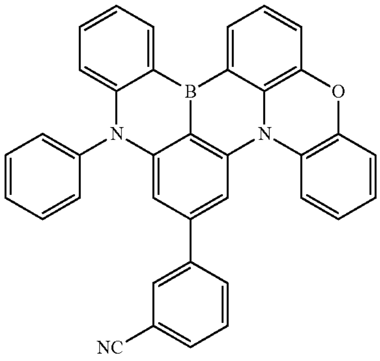
C-125
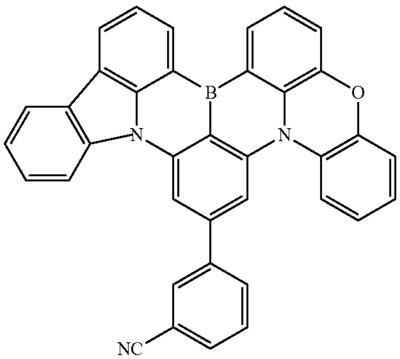
C-126
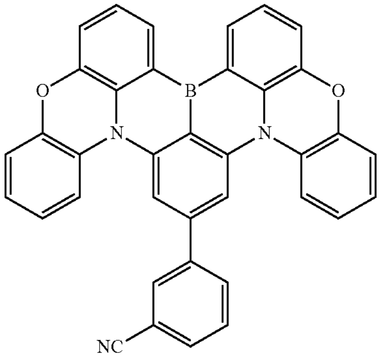
C-127
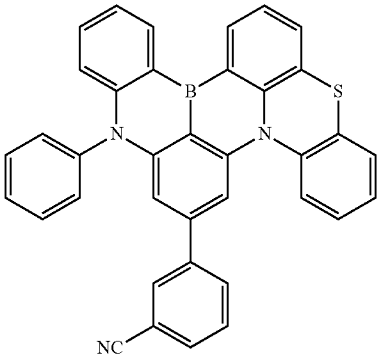

-continued
C-128
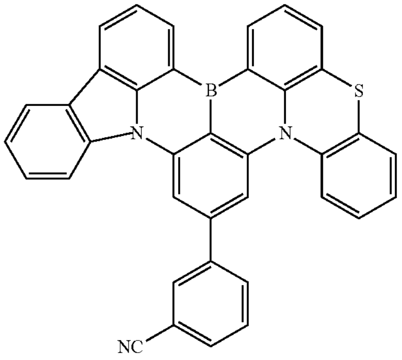
C-129
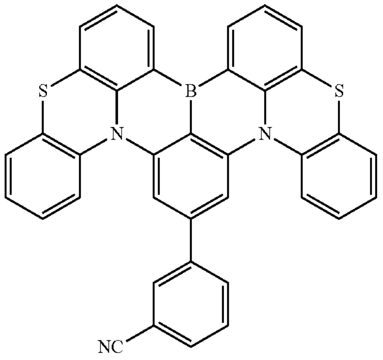
C-130
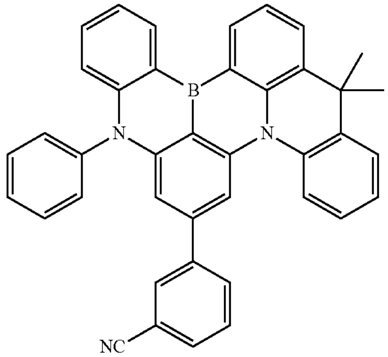
C-131
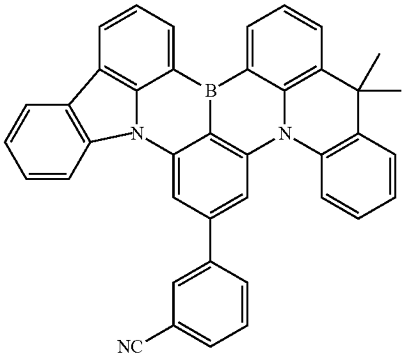
-continued
C-132
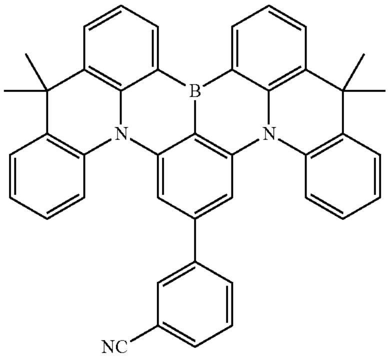
C-133
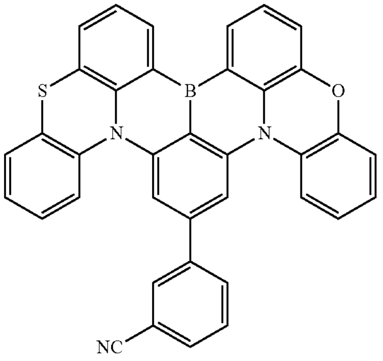
C-134
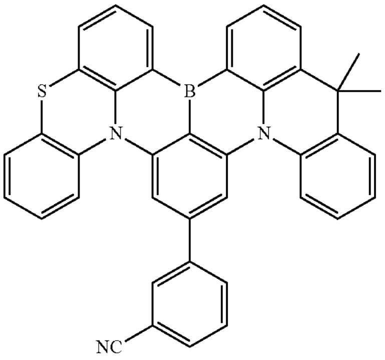
C-135
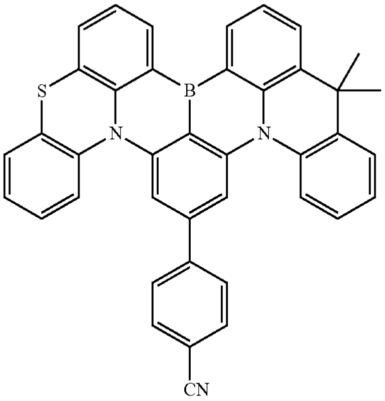

-continued
C-136
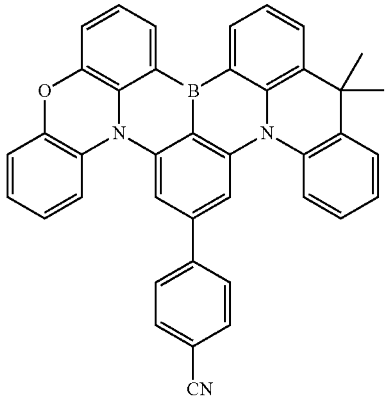
C-137
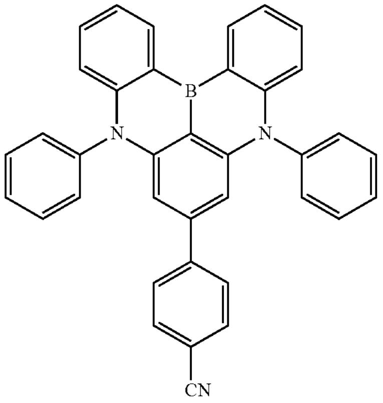
C-138
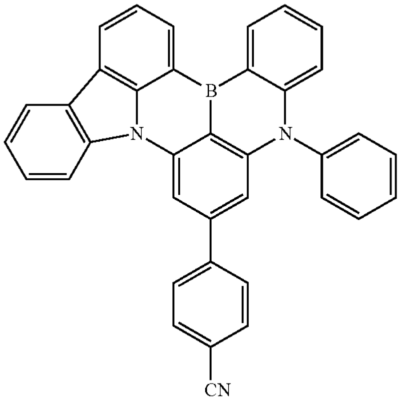
C-139
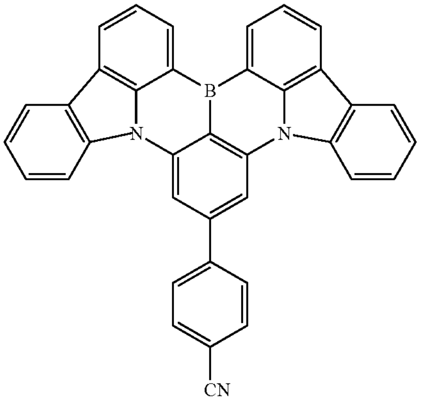
-continued
C-140
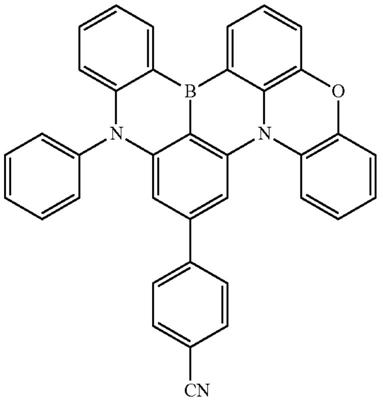
C-141
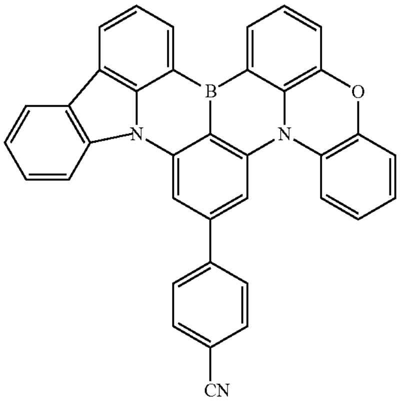
C-142
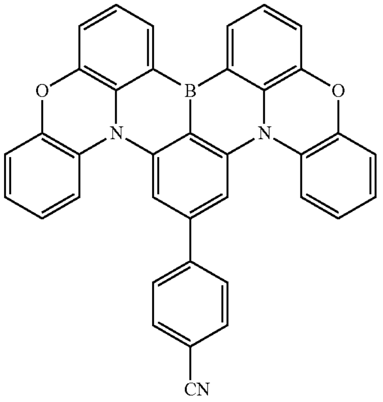
C-143
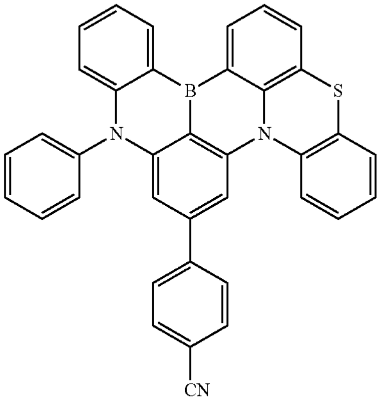

-continued
C-144
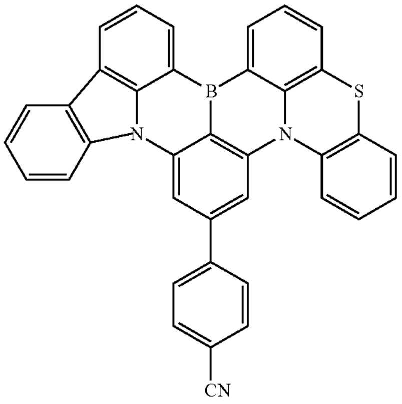
C-145
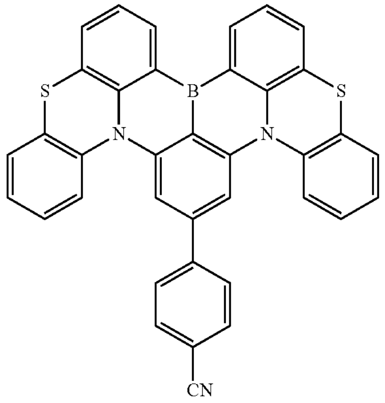
C-146
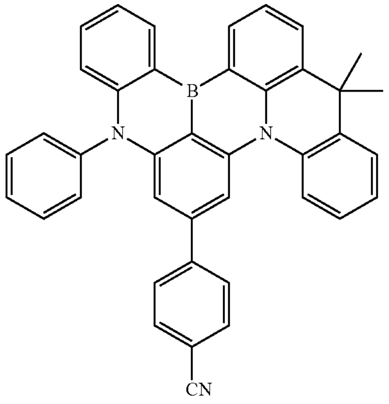
C-147
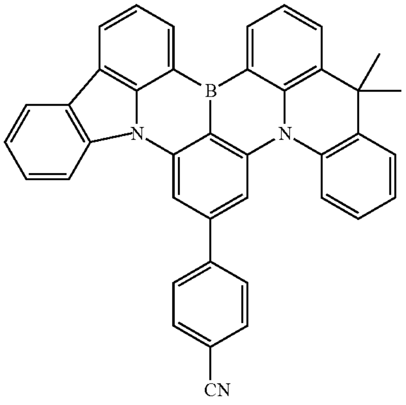
-continued
C-148
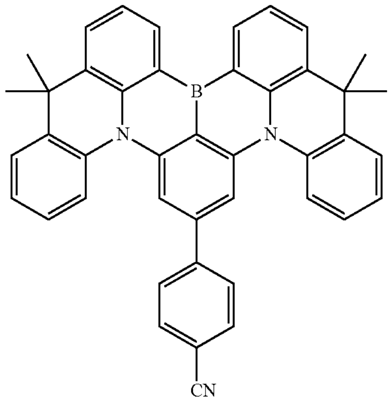
C-149
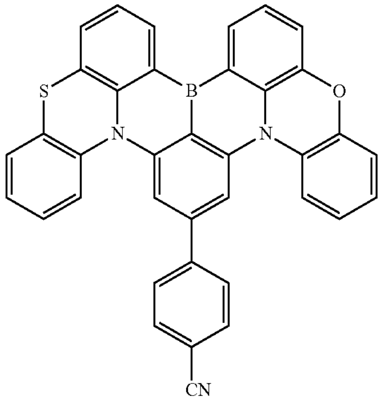
C-150
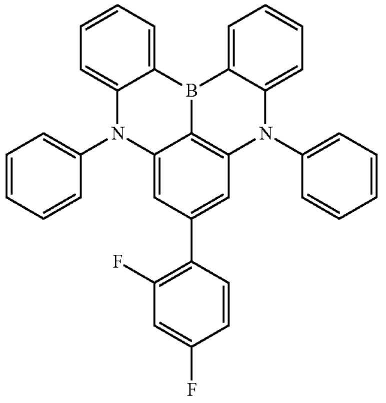
C-151
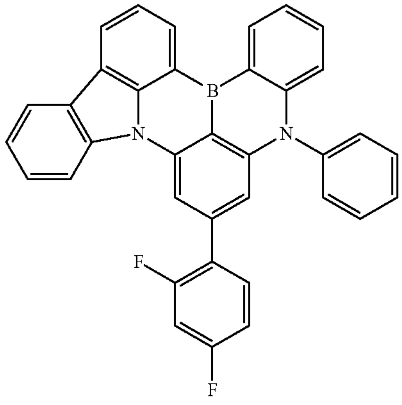

-continued
C-152
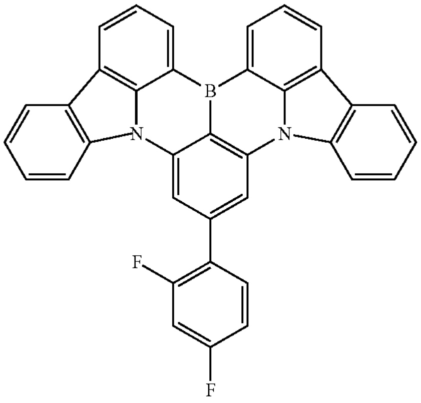
C-153
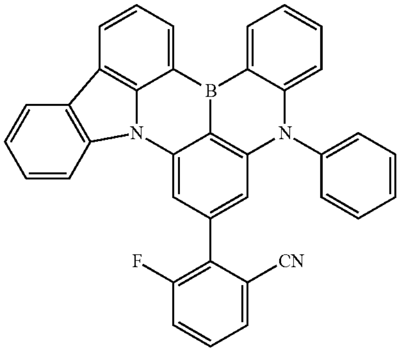
C-154
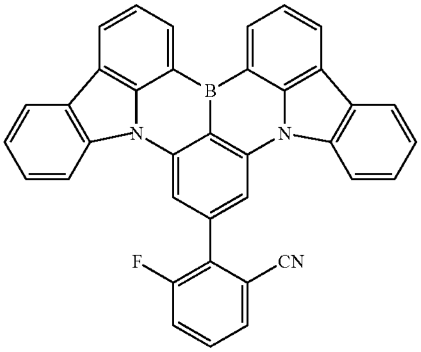
C-155
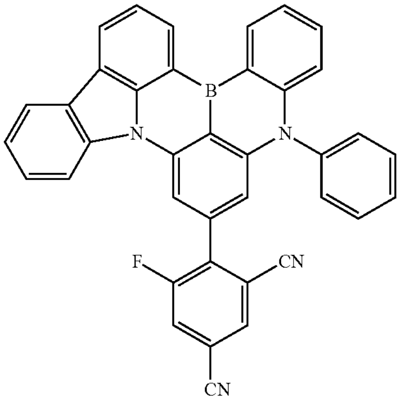
-continued
C-156
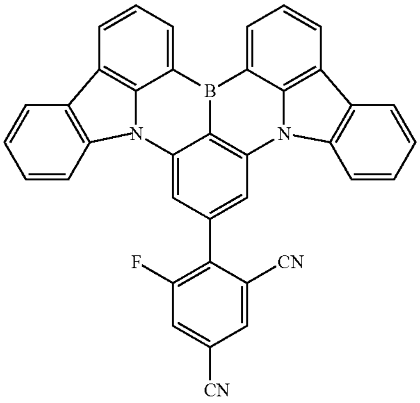
C-157
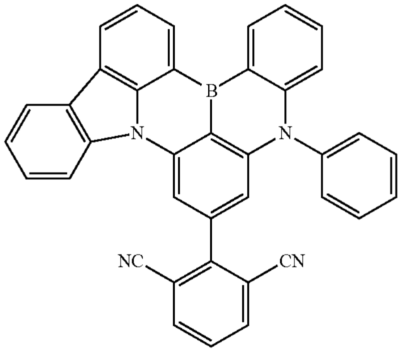
C-158
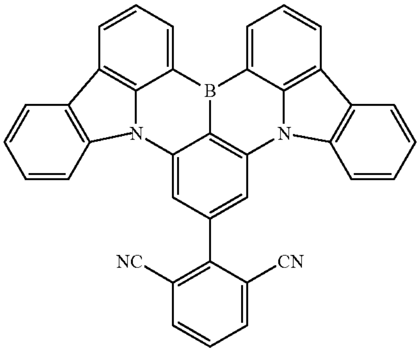
C-159
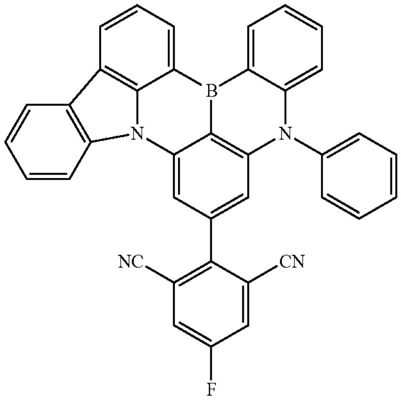

-continued
C-160
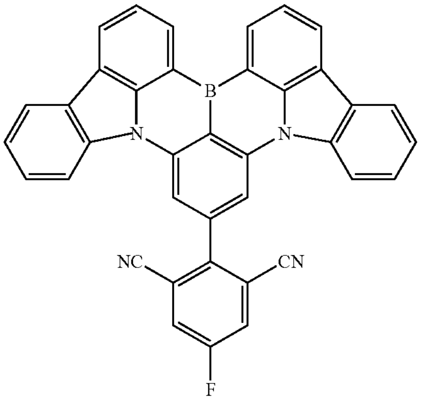
C-161
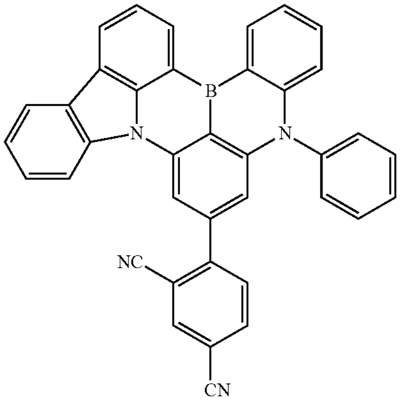
C-162
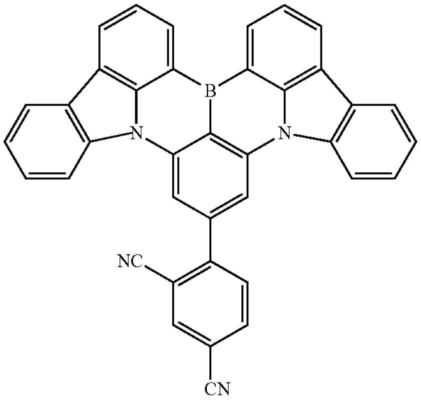
C-163
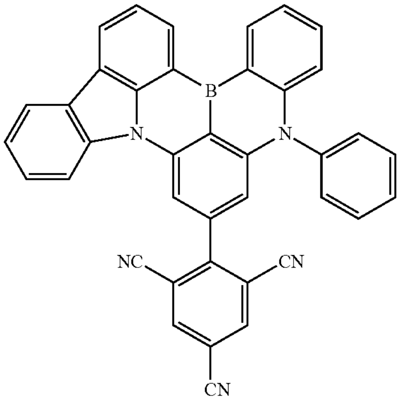
-continued
C-164
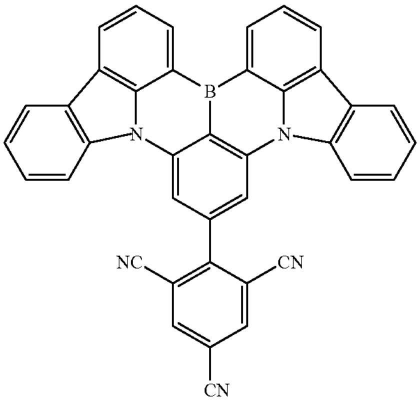
C-165
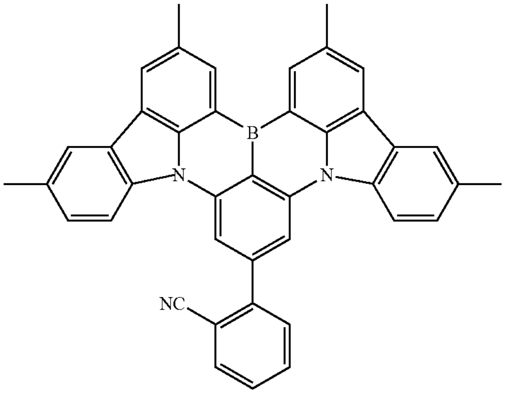
C-166
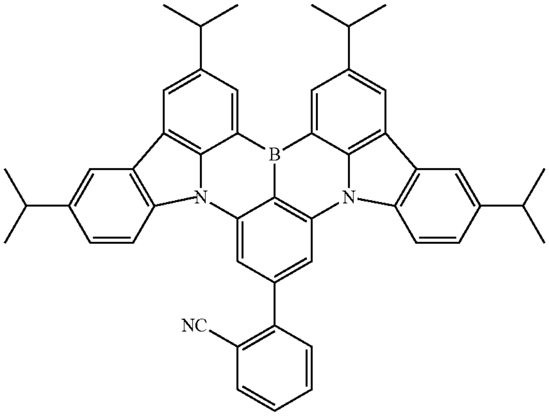

-continued
C-167
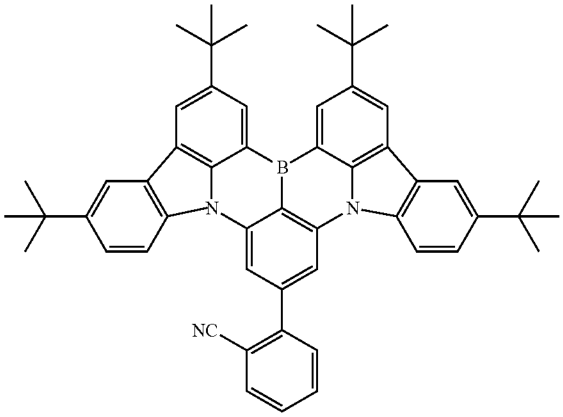
C-168
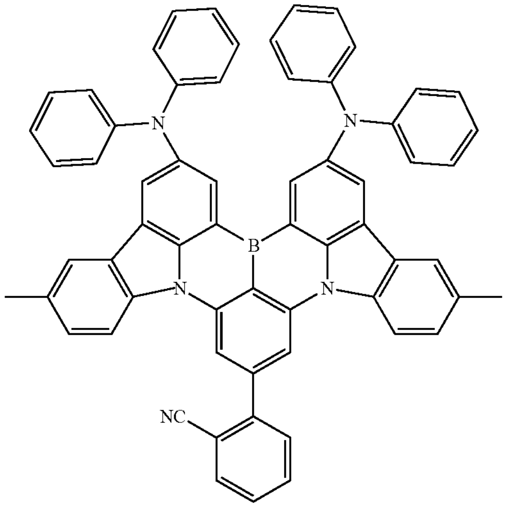
C-169
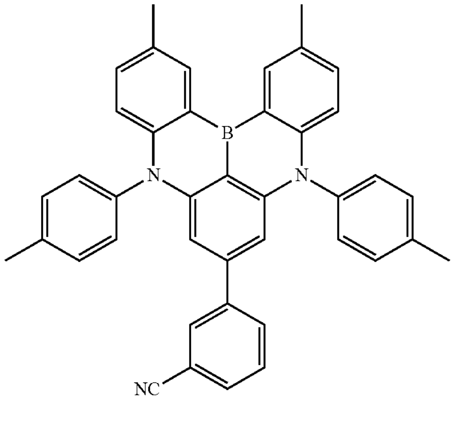
-continued
C-170
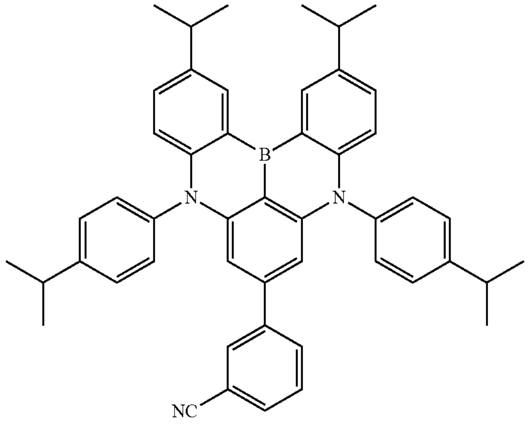
C-171
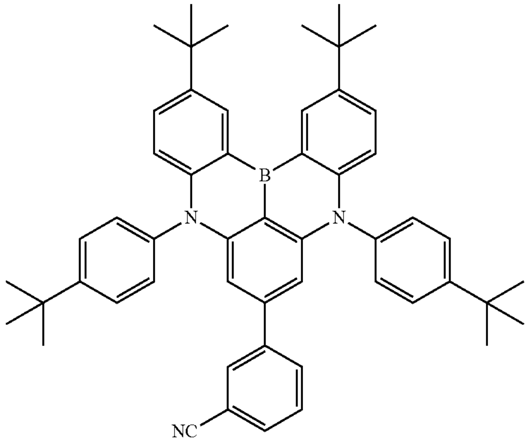
C-172
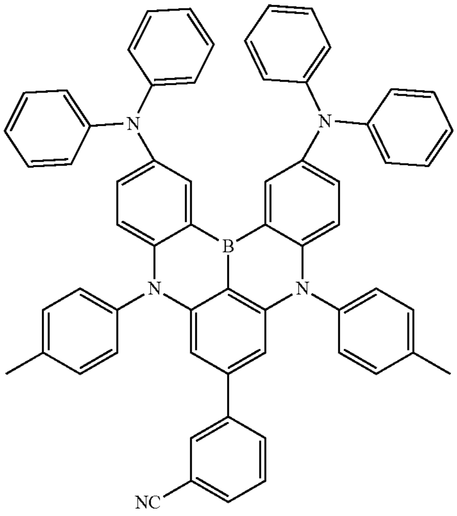

C-173
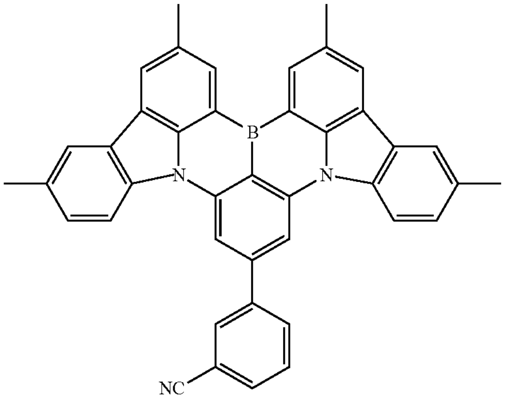
C-174
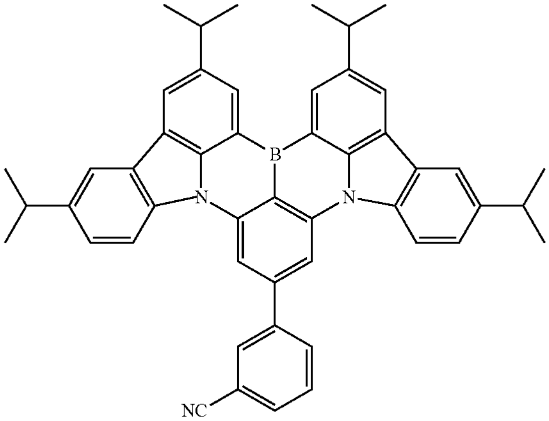
C-175
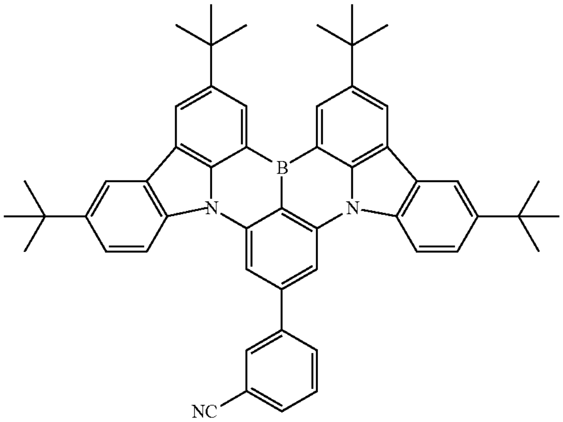
C-176
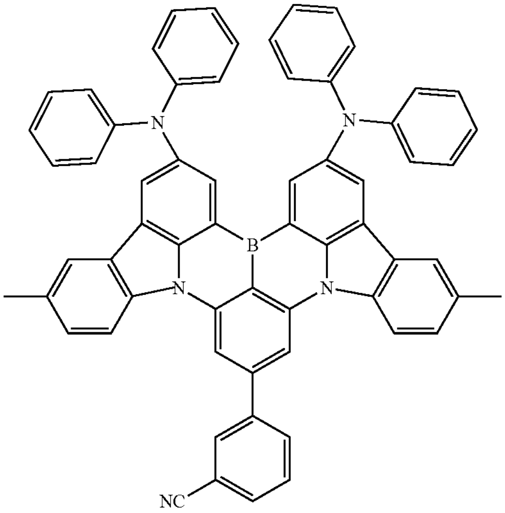
C-177
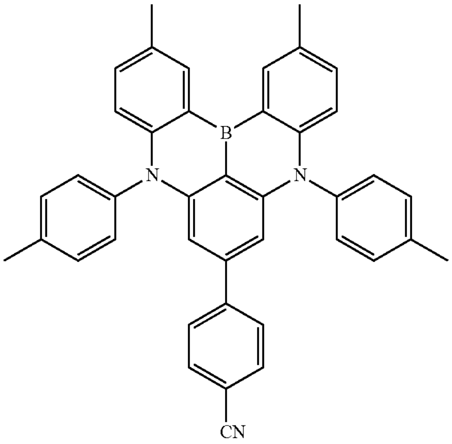
C-178
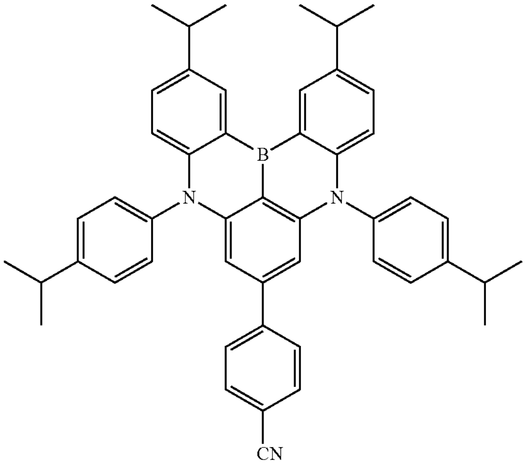

-continued
C-179
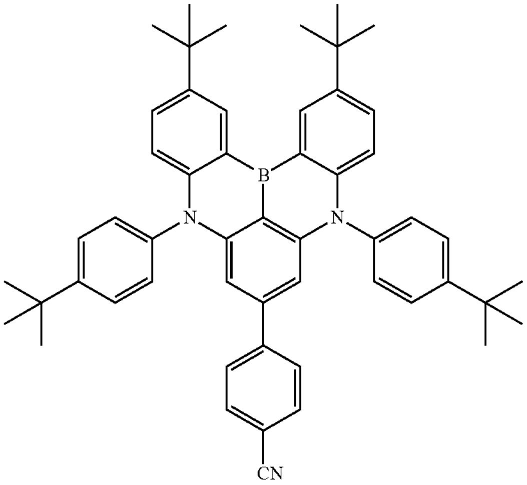
C-180
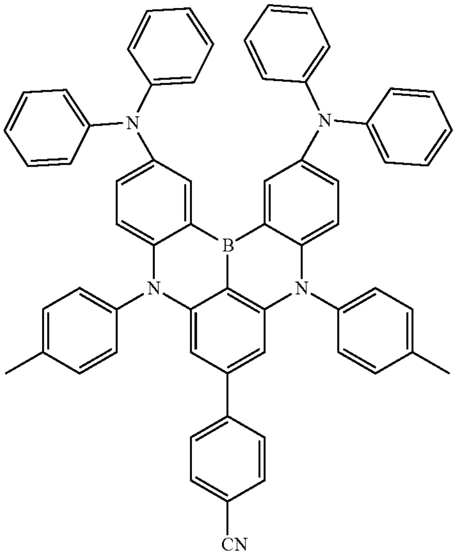
C-181
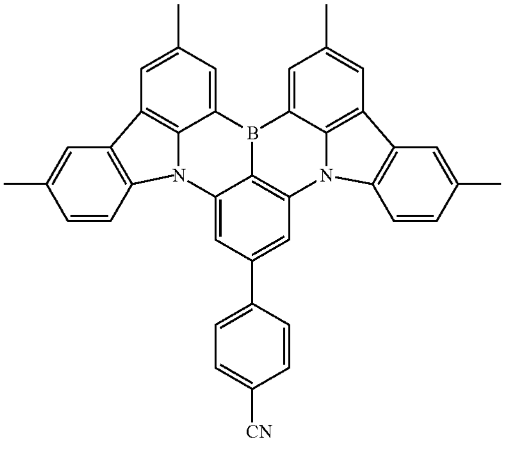
-continued
C-182
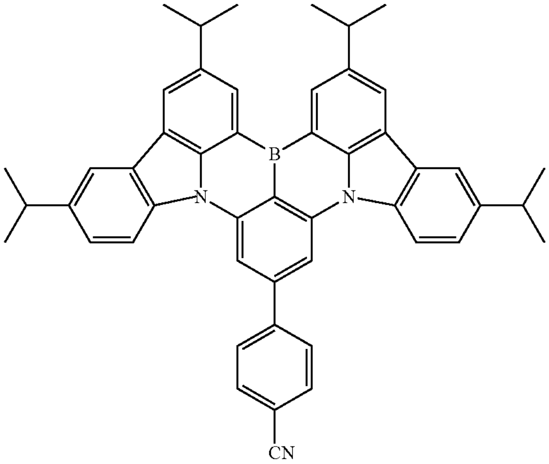
C-183
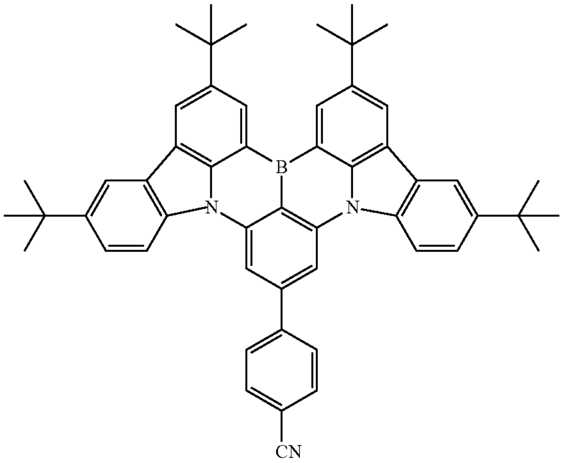
C-184
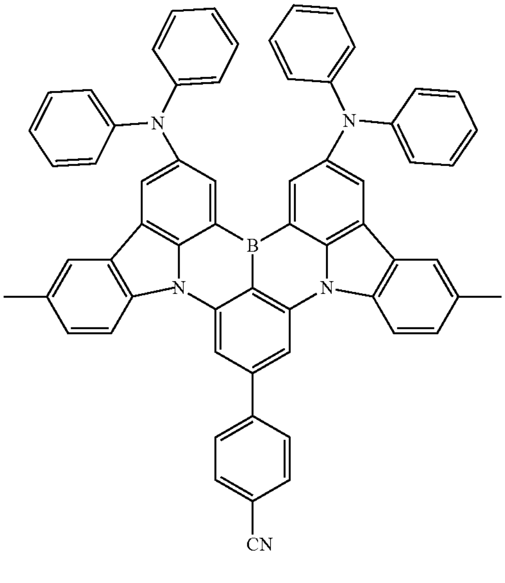

-continued
C-185
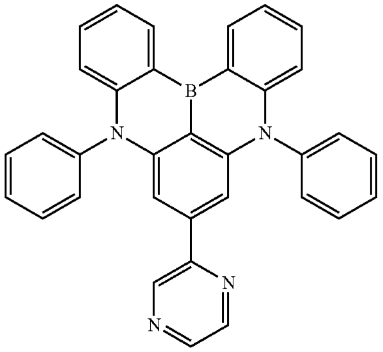
C-186
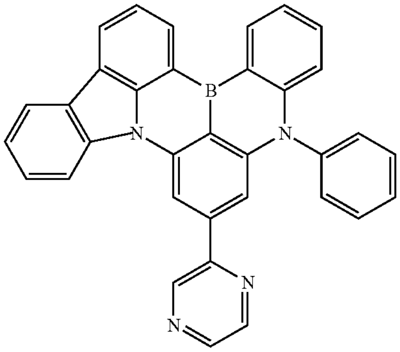
C-187
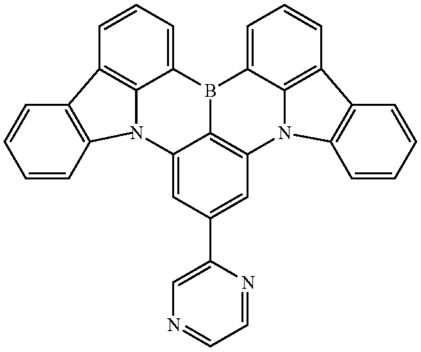
C-188
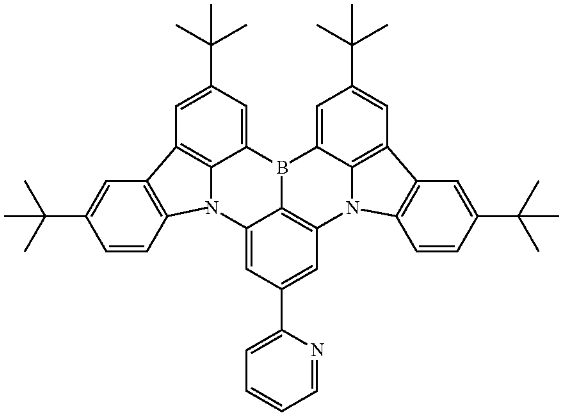
-continued
C-189
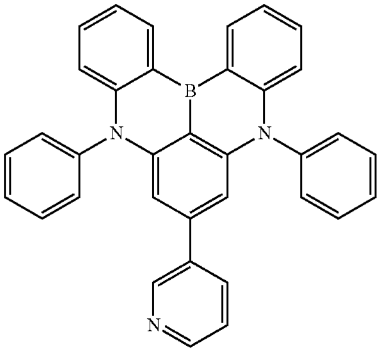
C-190
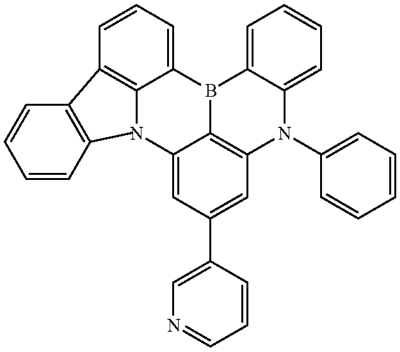
C-191
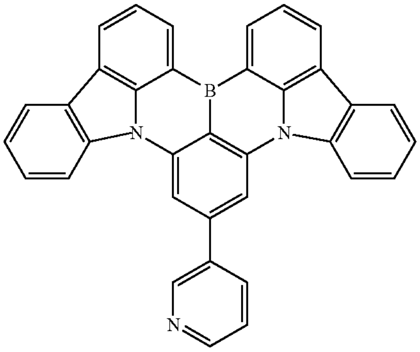
C-192
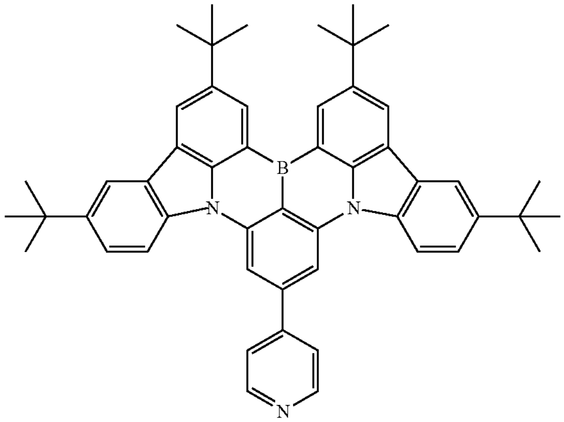

C-193
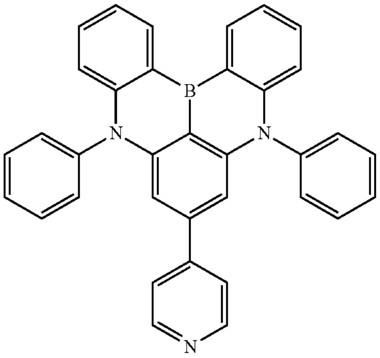
C-194
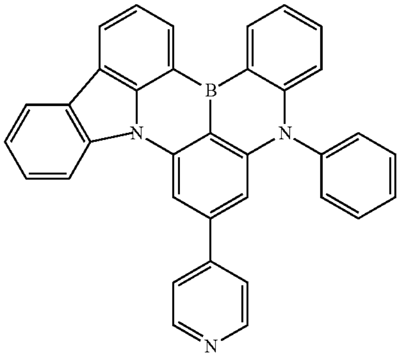
C-195
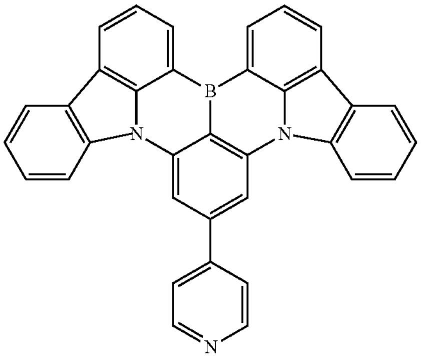
C-196
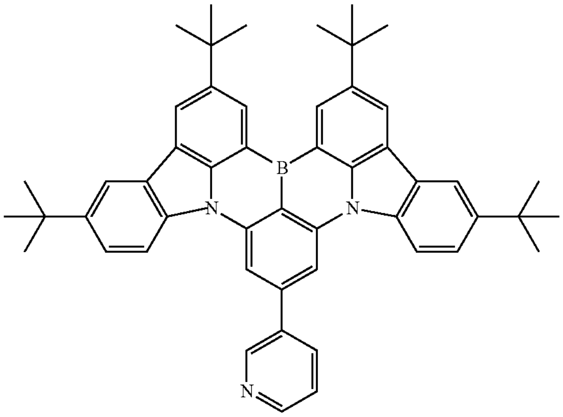
C-197
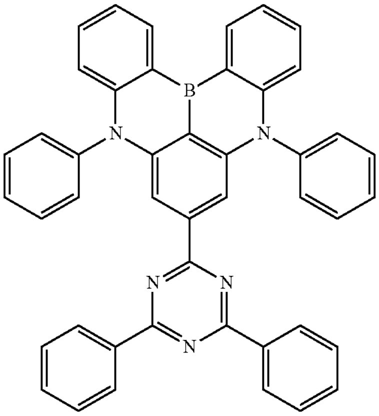
C-198
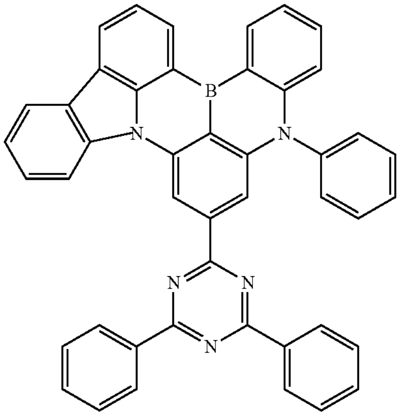
C-199
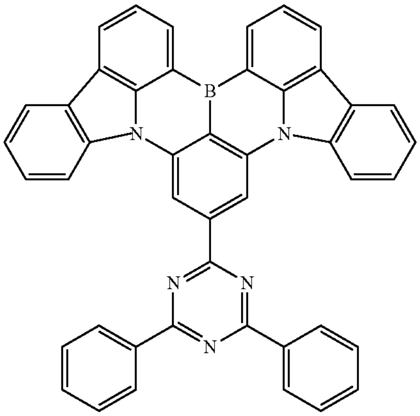

-continued
C-200
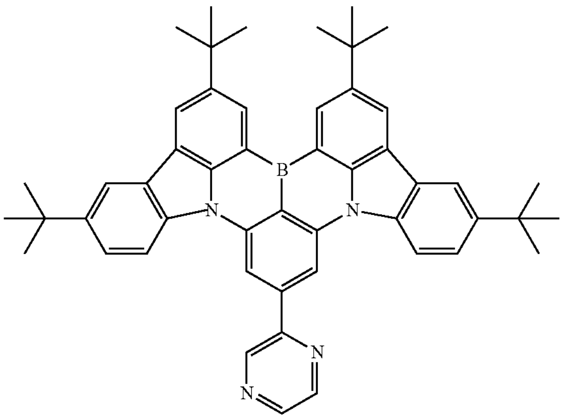
C-201
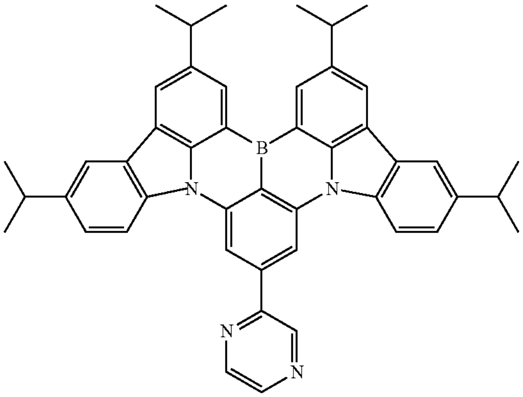
C-202
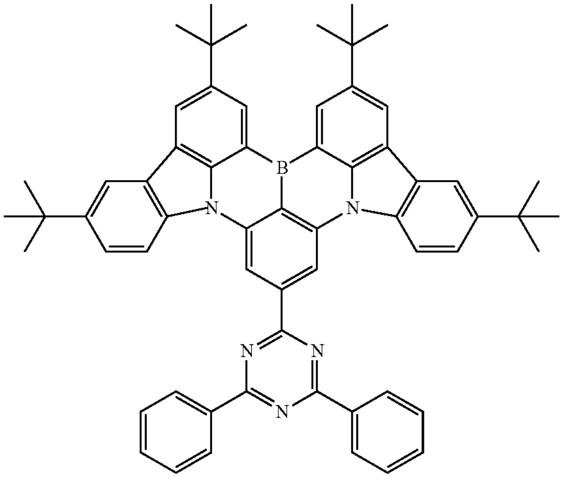
-continued
C-203
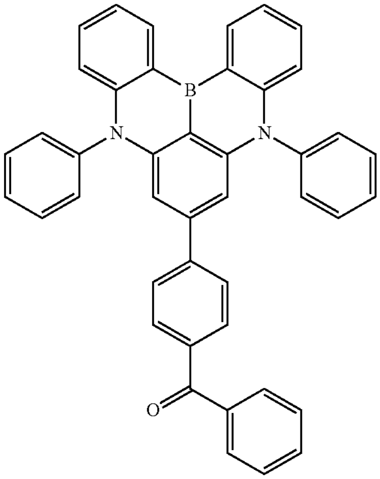
C-204
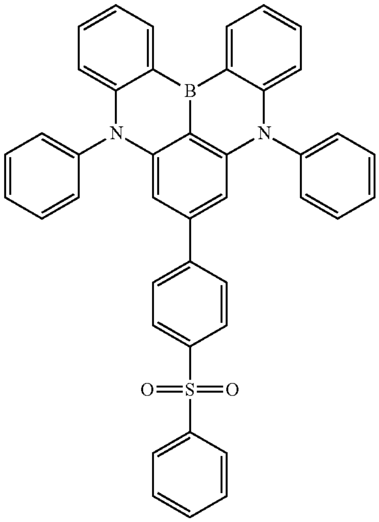
,
the thermally activated delayed fluorescence sensitizer comprises one or a combination of at least two of following compounds as shown in T-1 to T-99:
T-1
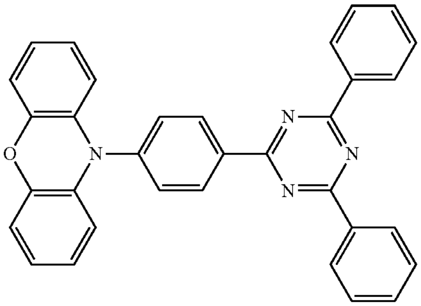

-continued
T-2
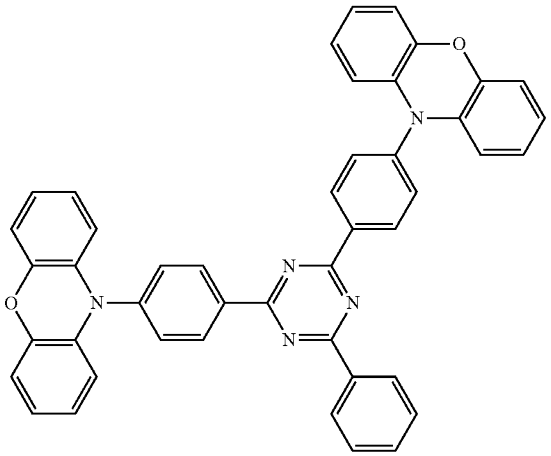
T-3
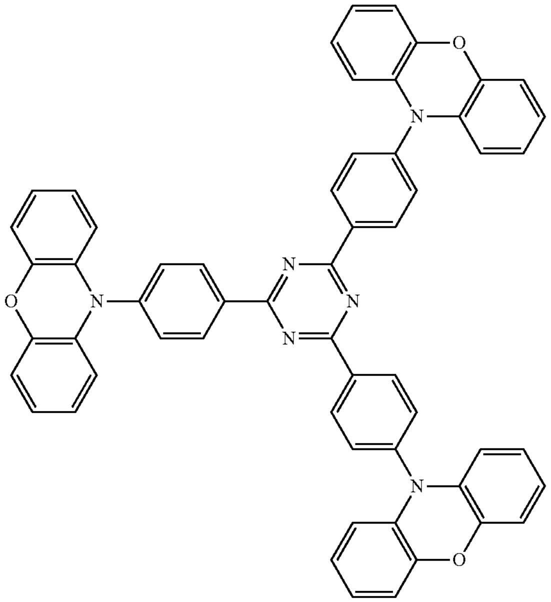
T-4
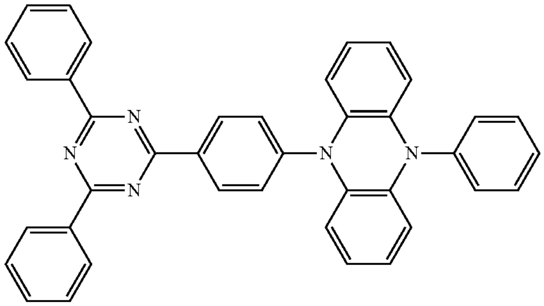
-continued
T-5
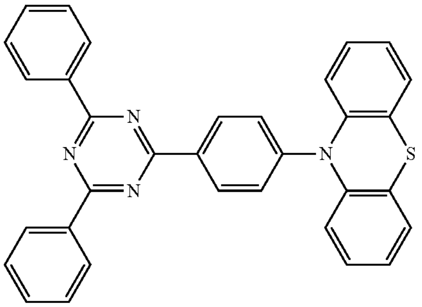
T-6
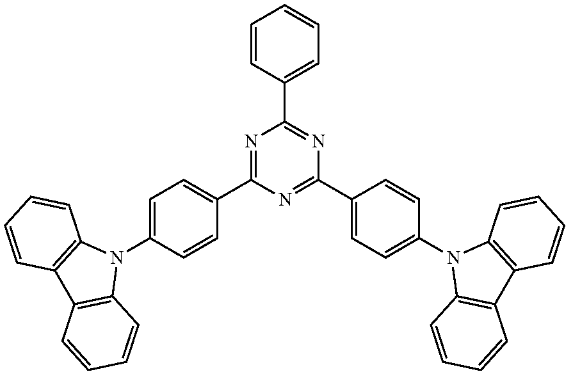
T-7
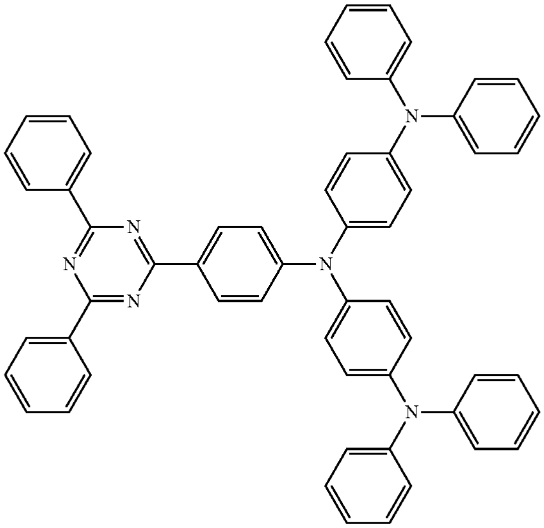

-continued
T-8
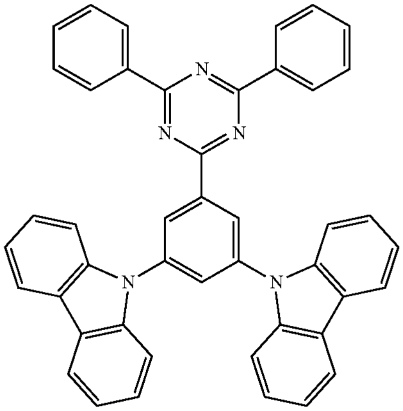
T-9
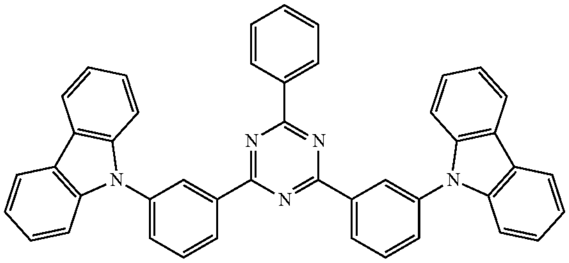
T-10
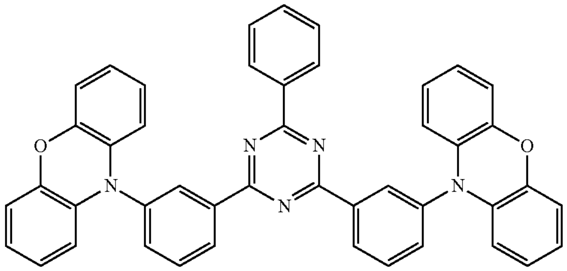
T-11
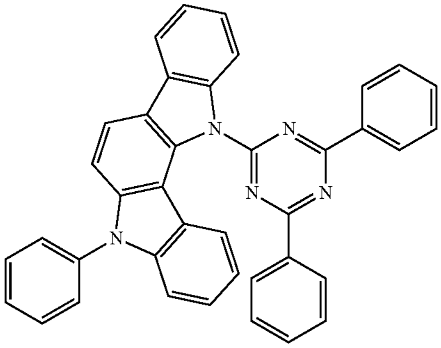
-continued
T-12
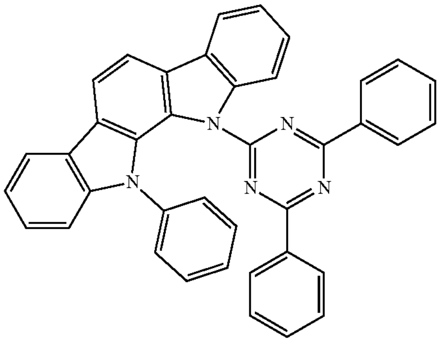
T-13
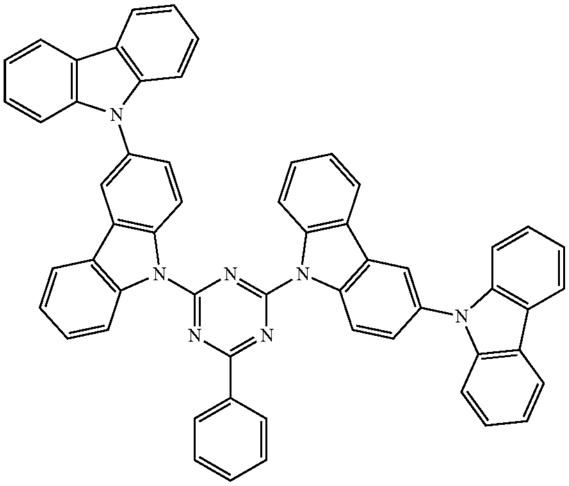
T-14
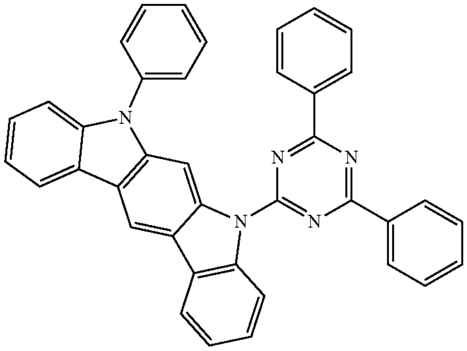
T-15
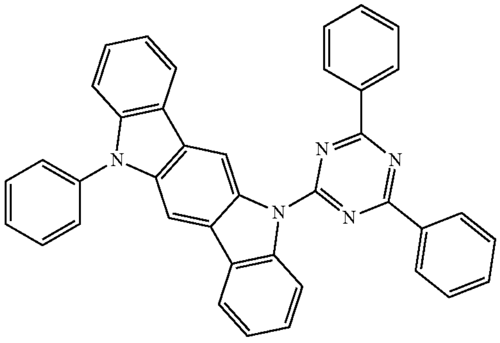

-continued
T-16
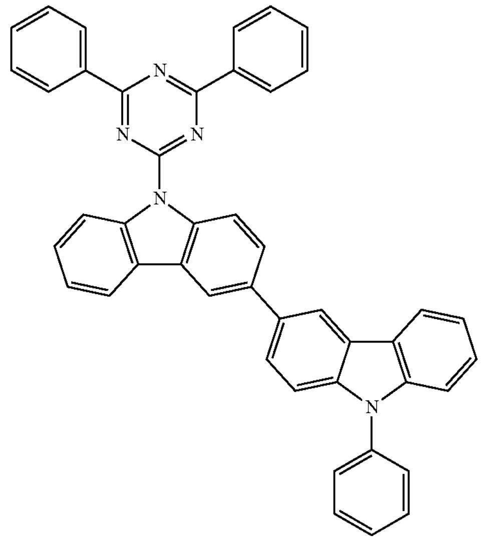
T-17
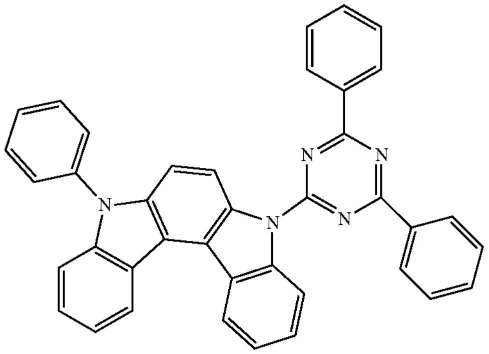
T-18
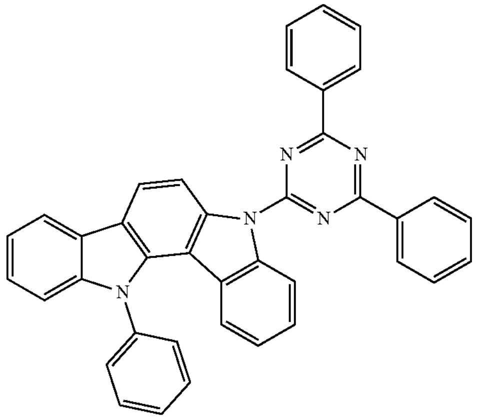
-continued
T-19
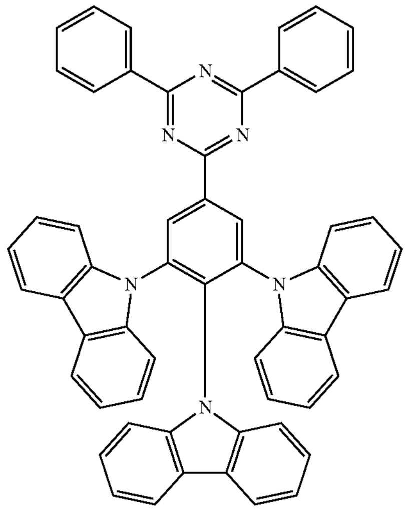
T-20
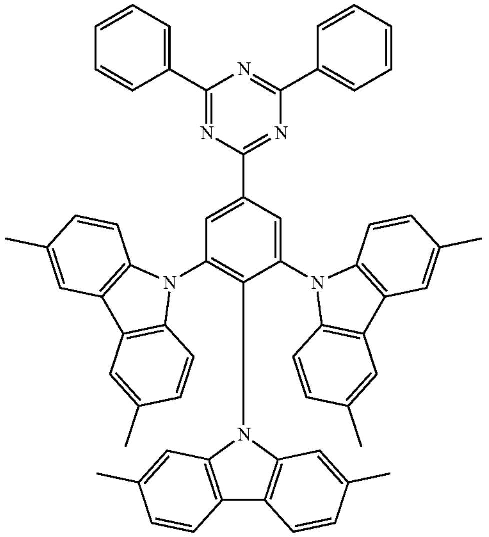
T-21
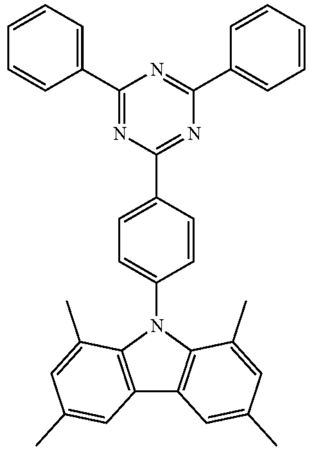

-continued
T-22
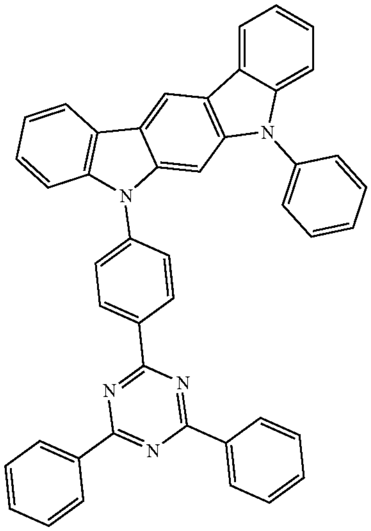
T-23
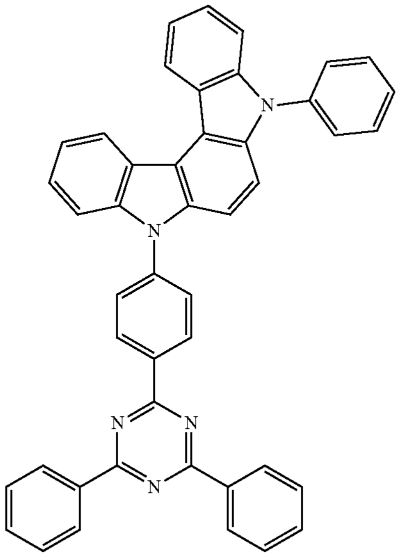
T-24
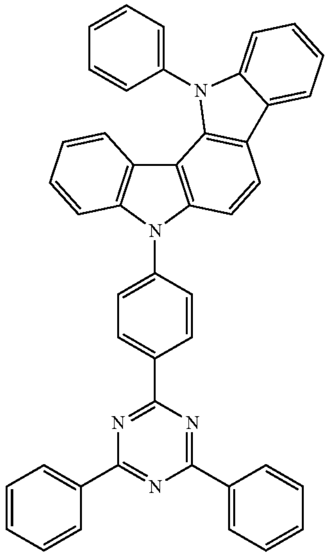
-continued
T-25
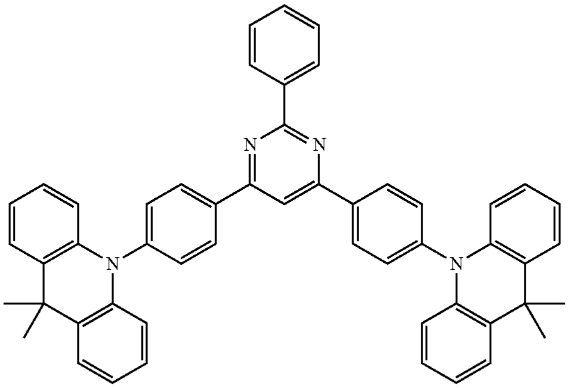
T-26
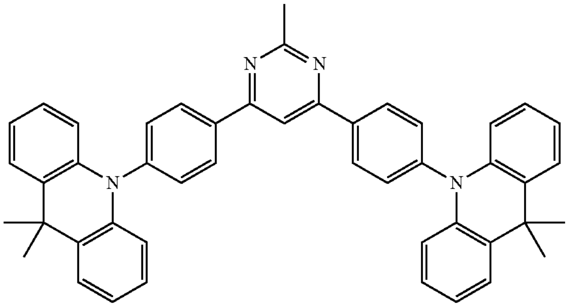
T-27
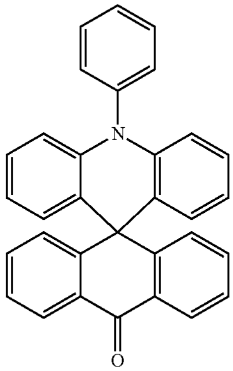
T-28
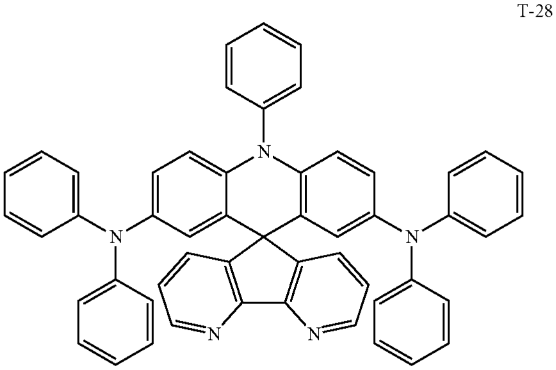

-continued
T-29
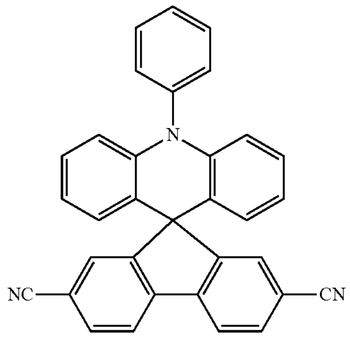
T-30
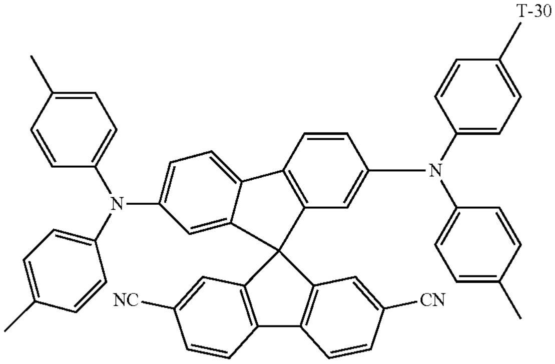
T-31
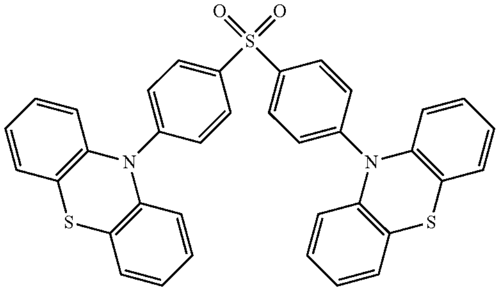
T-32
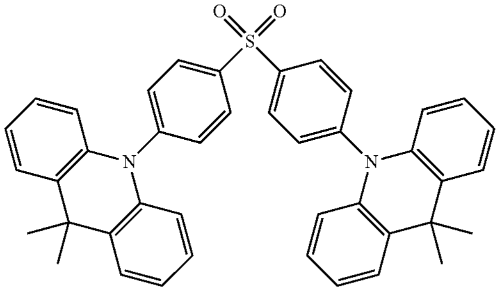
T-33
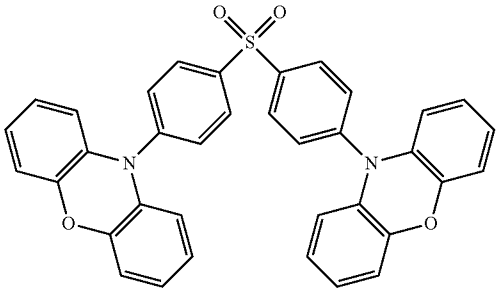
-continued
T-34
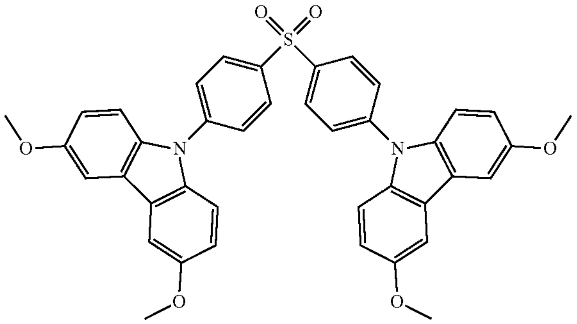
T-35
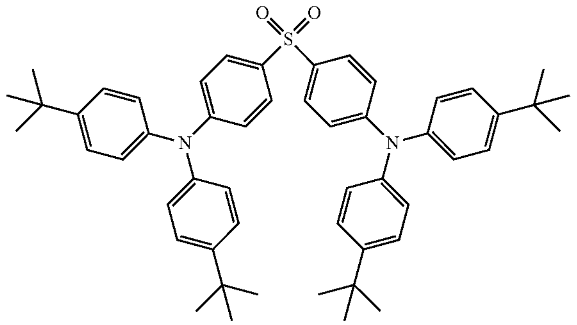
T-36
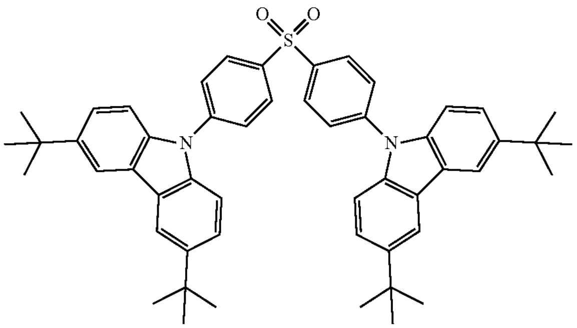
T-37
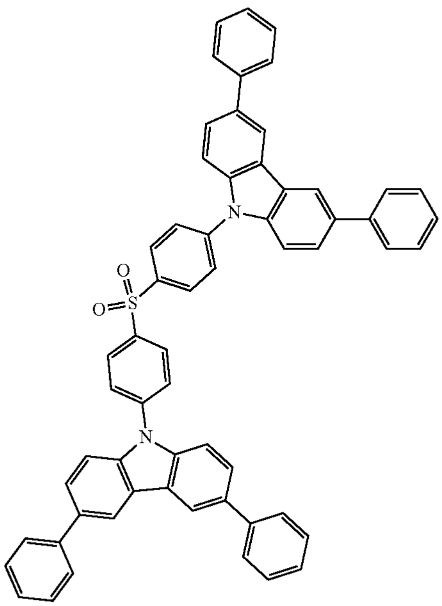

-continued
T-38
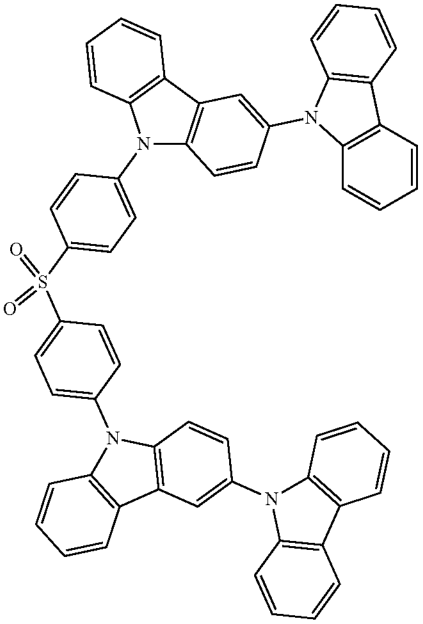
T-39
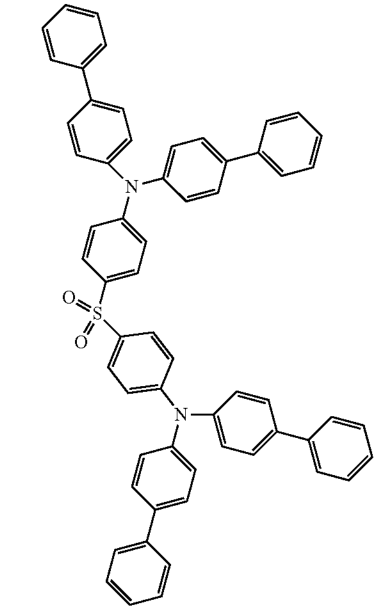
T-40
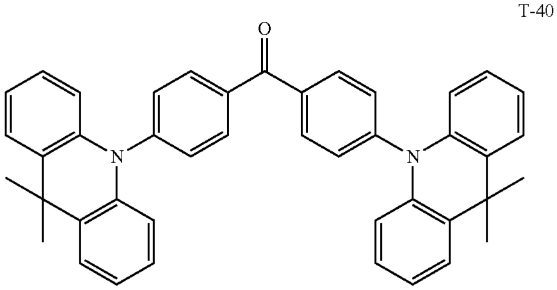
-continued
T-41
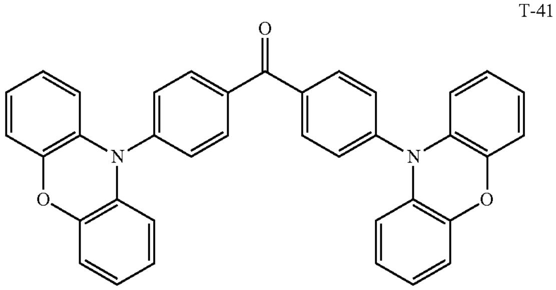
T-42
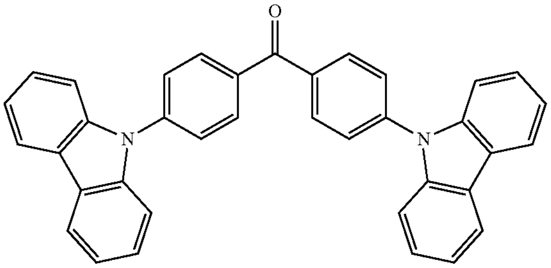
T-43
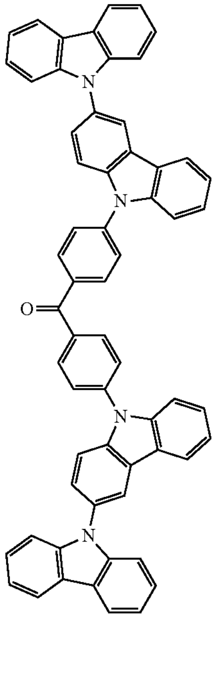

-continued
T-44
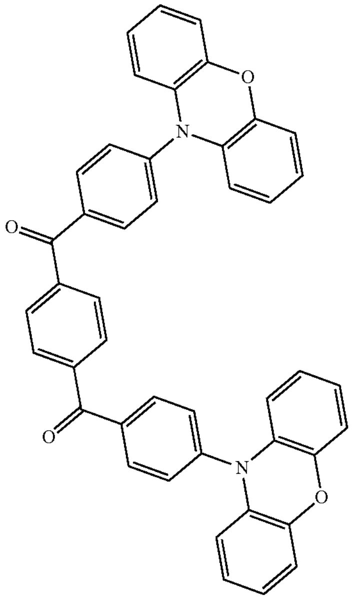
T-45
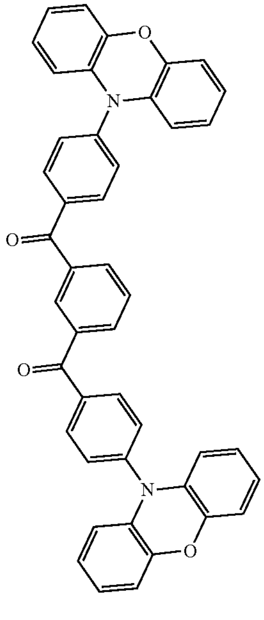
-continued
T-46
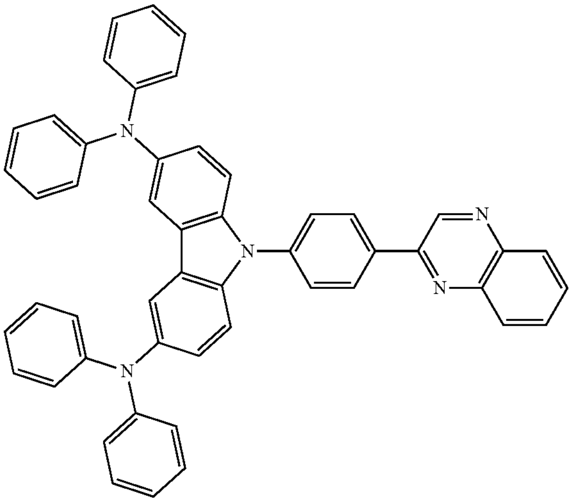
T-47
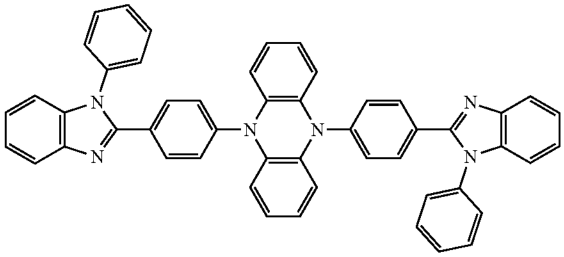
T-48
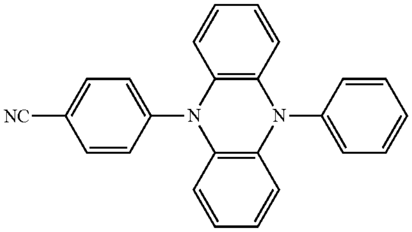
T-49
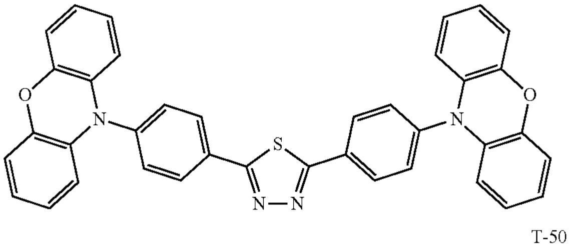
T-50
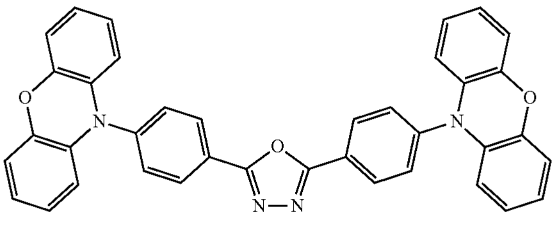

-continued
T-51
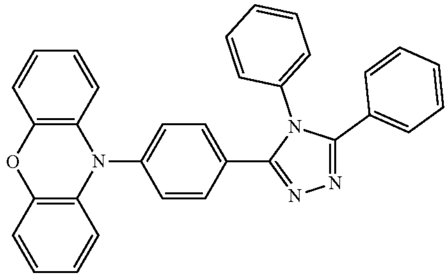
T-52
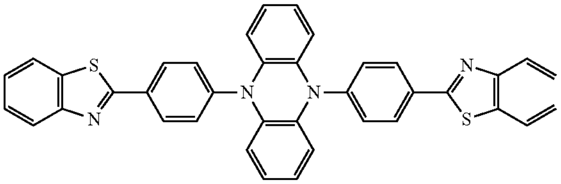
T-53
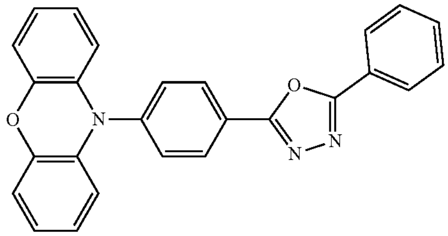
T-54
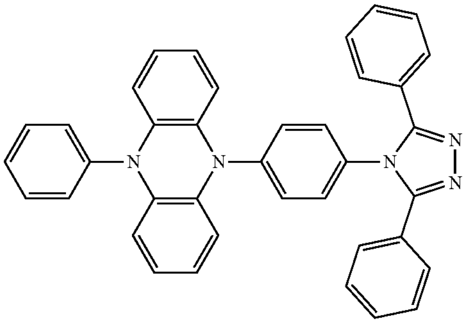
T-55
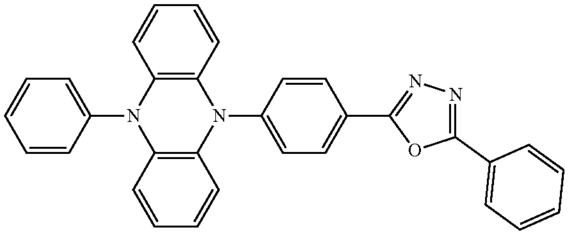
T-56
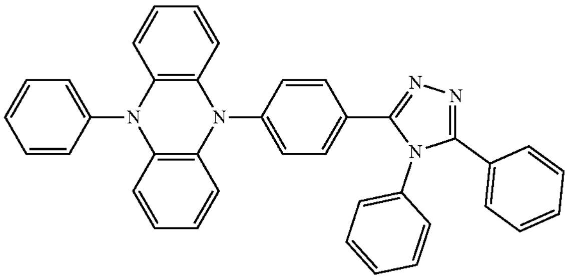
-continued
T-57
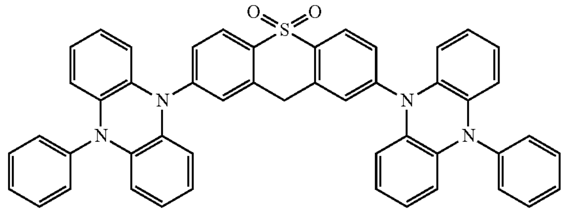
T-58
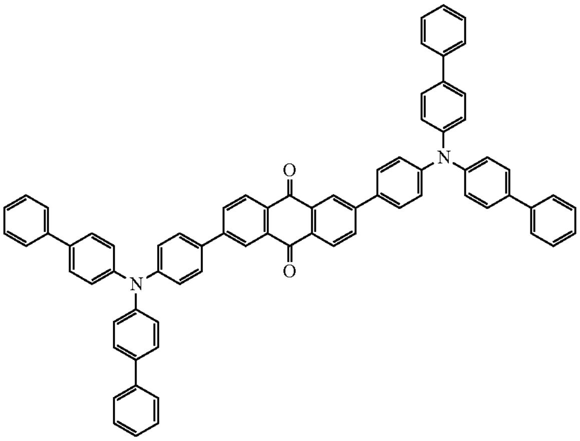
T-59
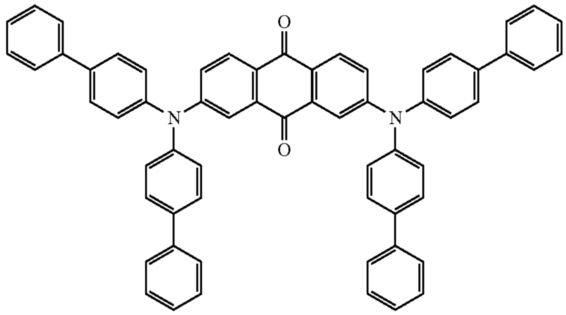
T-60
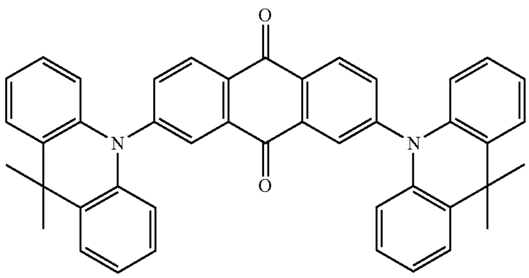

-continued
T-61
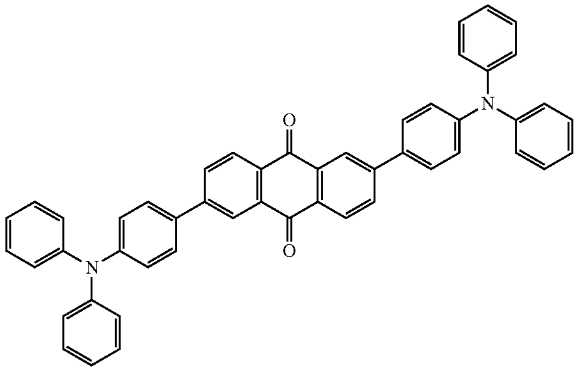
T62
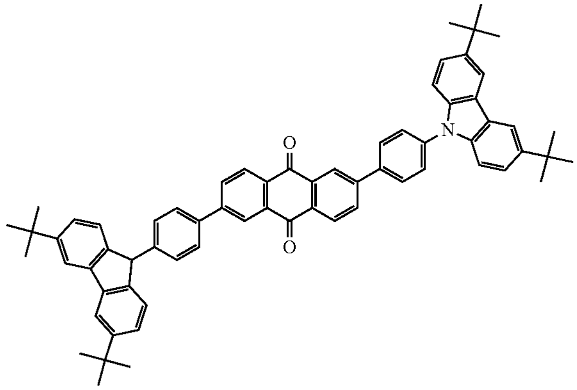
T-63
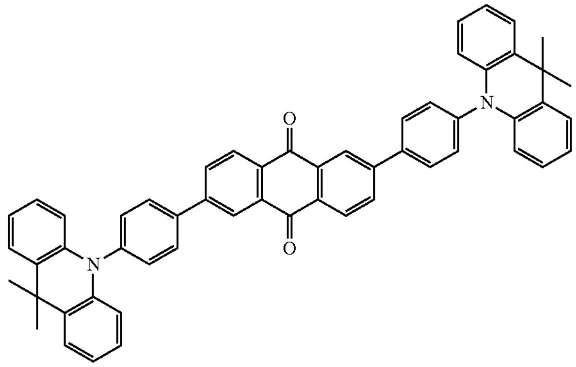
T-64
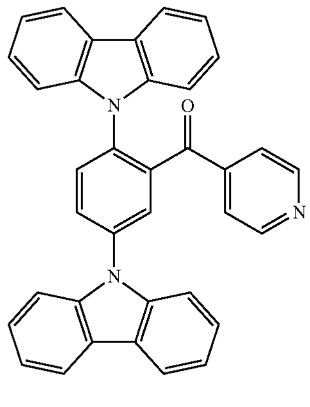
-continued
T-65
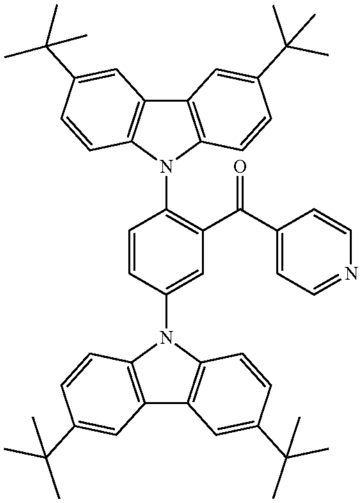
T-66
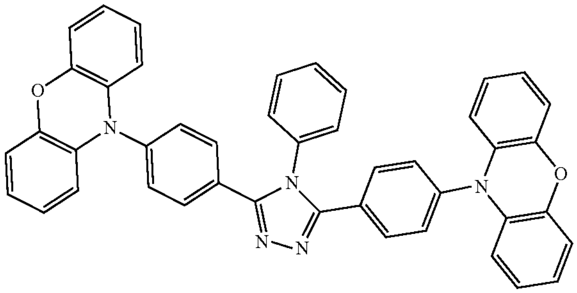
T-67
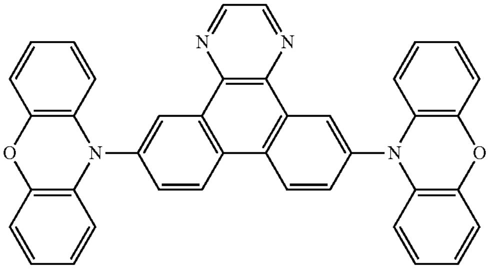
T-68
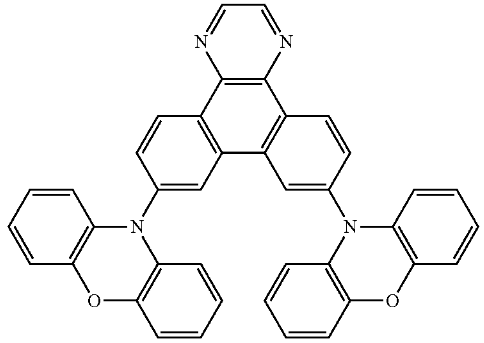

-continued
T-69
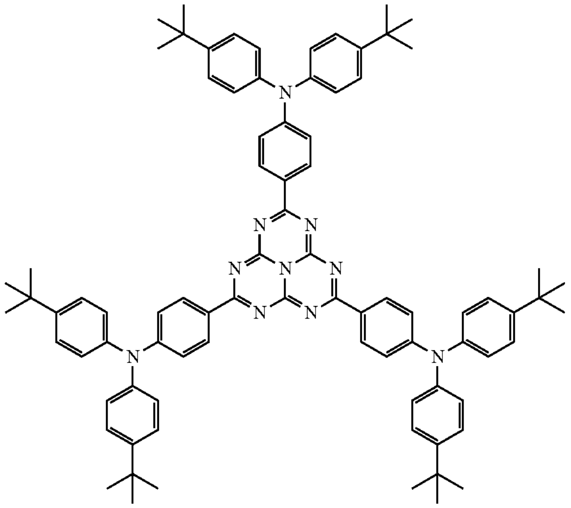
T-70
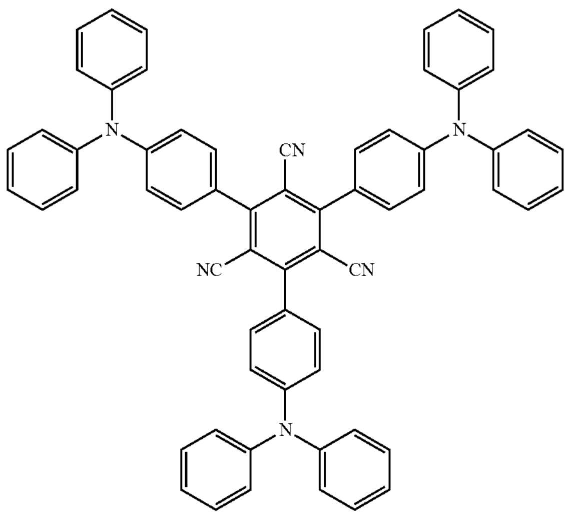
T-71
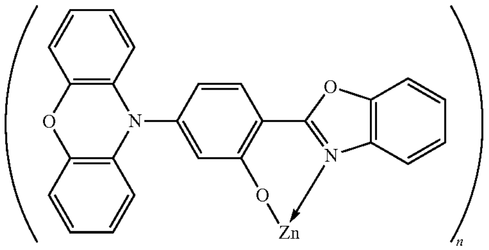
T-72
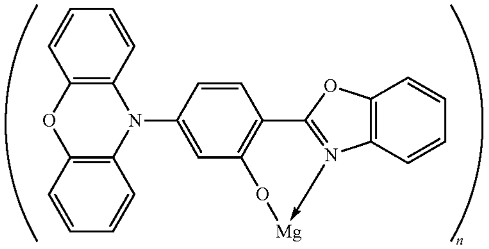
-continued
T-73
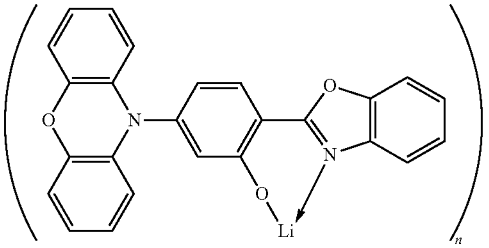
T-74
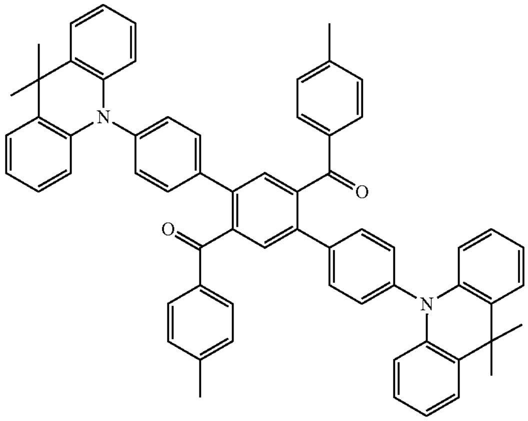
T-75
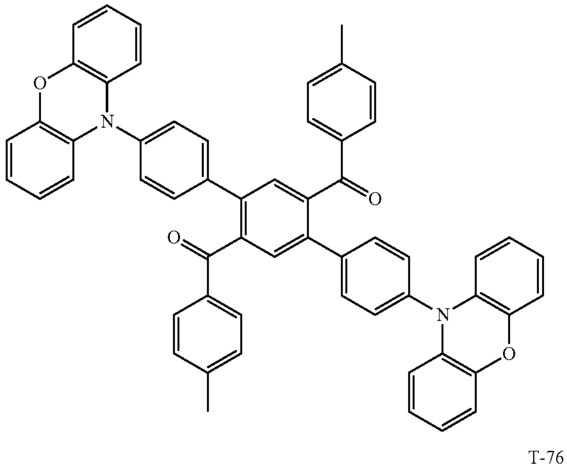
T-76
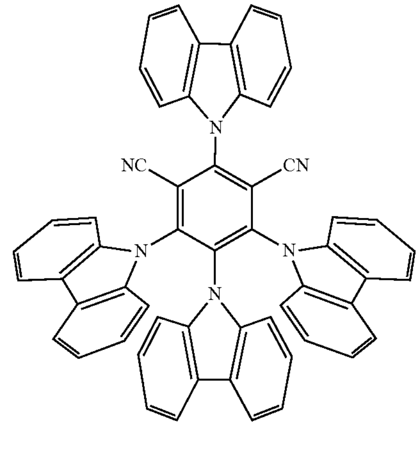

-continued
T-77
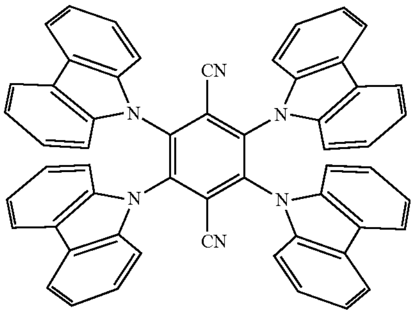
T-78
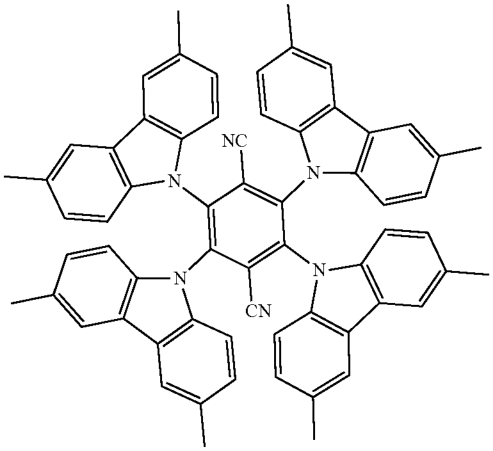
T-79
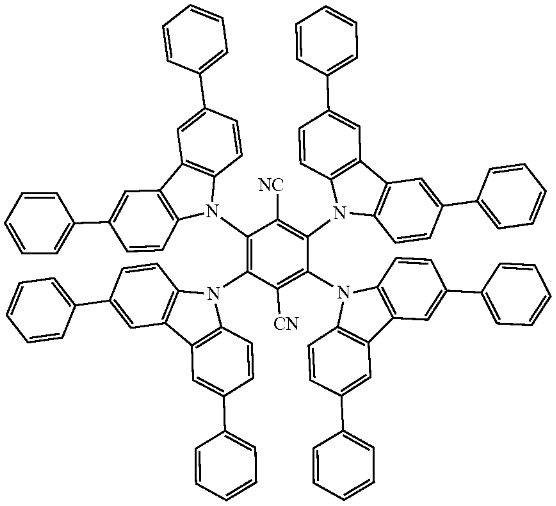
T-80
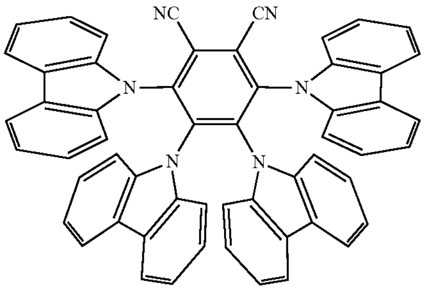
-continued
T-81
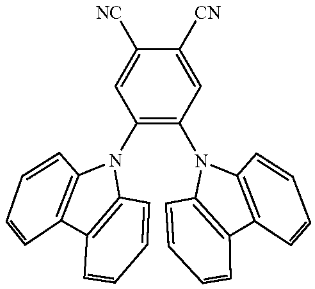
T-82
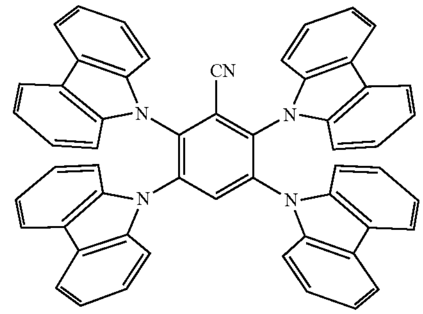
T-83
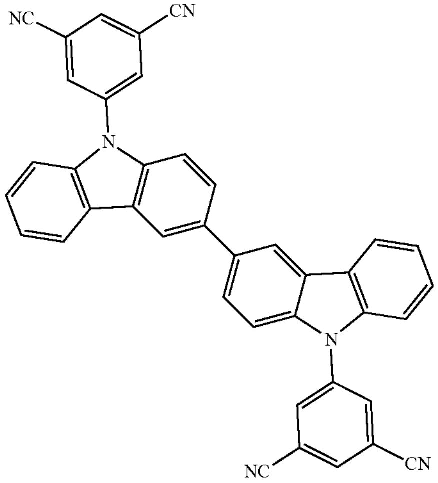
T-84
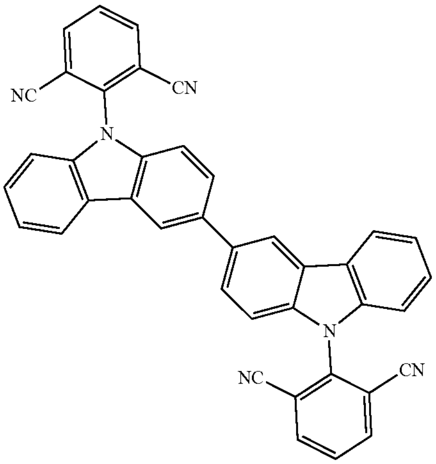

T-85
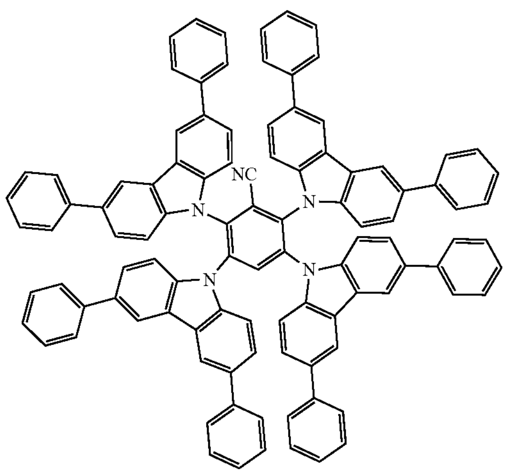
T-86
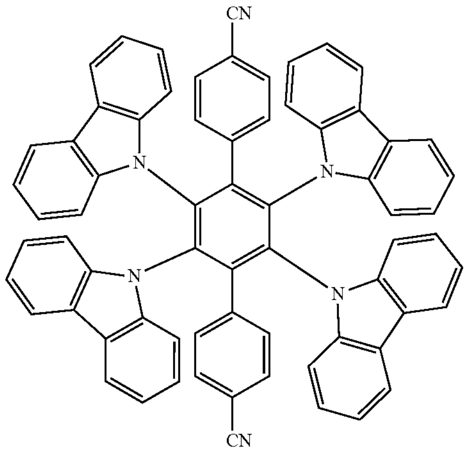
T-87
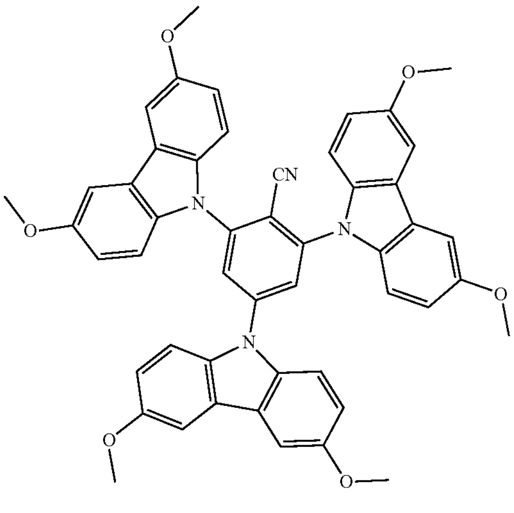
T-88
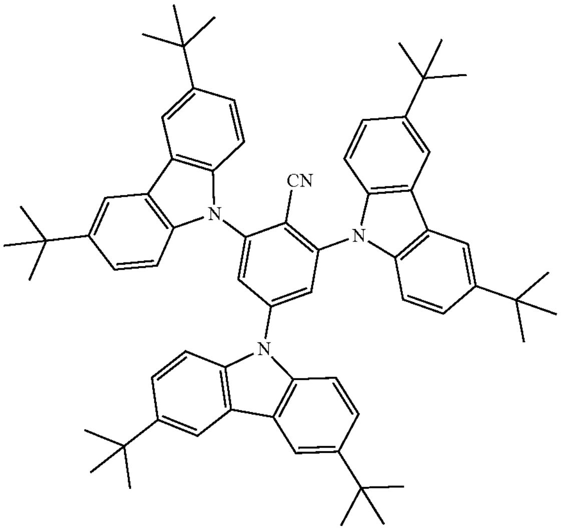
T-89
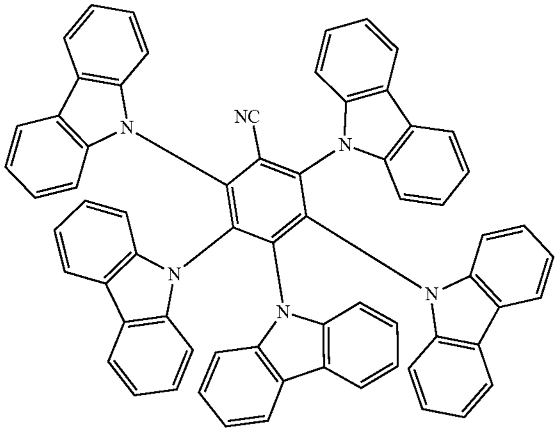
T-90
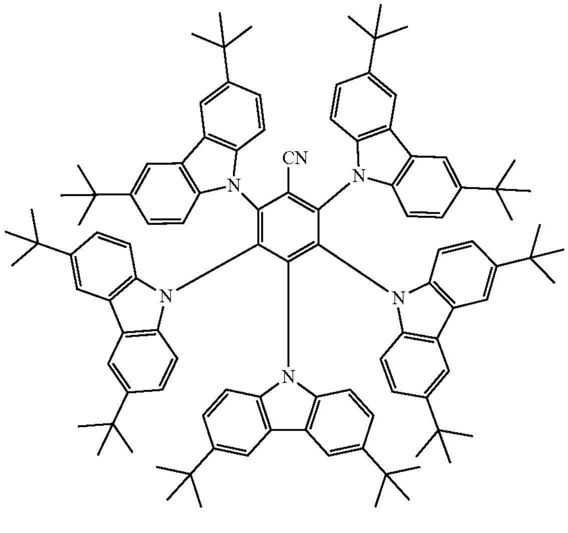

-continued
T-91
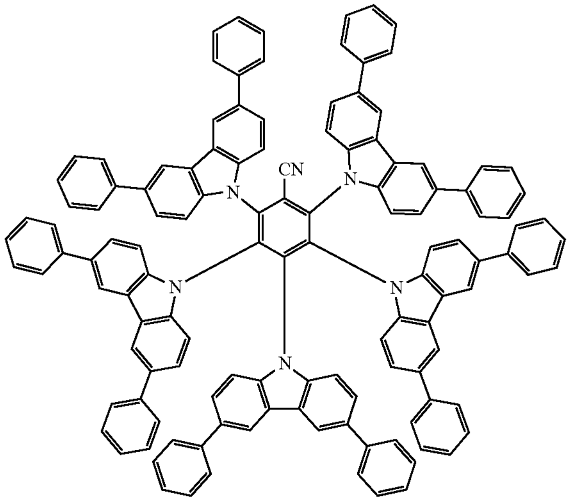
T-92
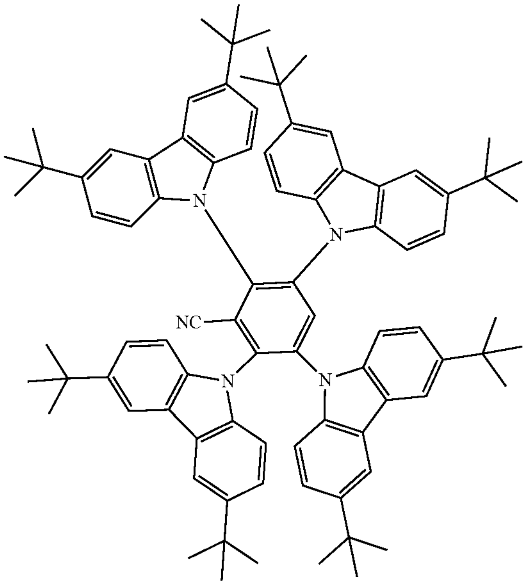
T-93
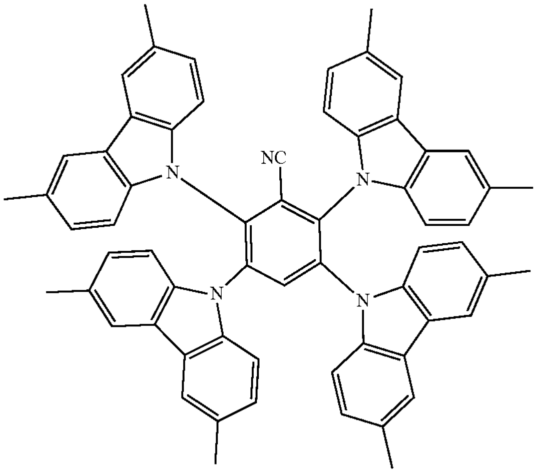
-continued
T-94
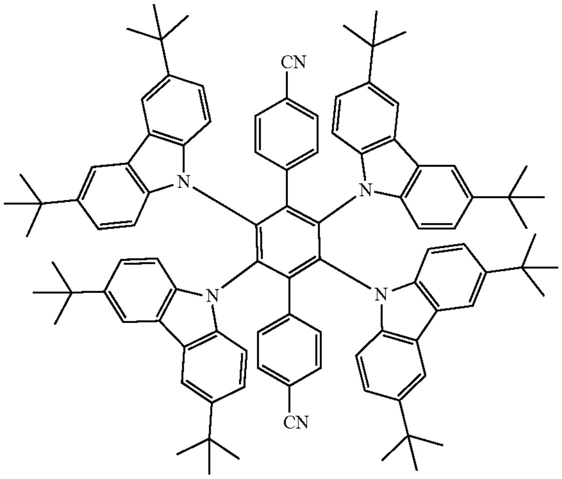
T-95
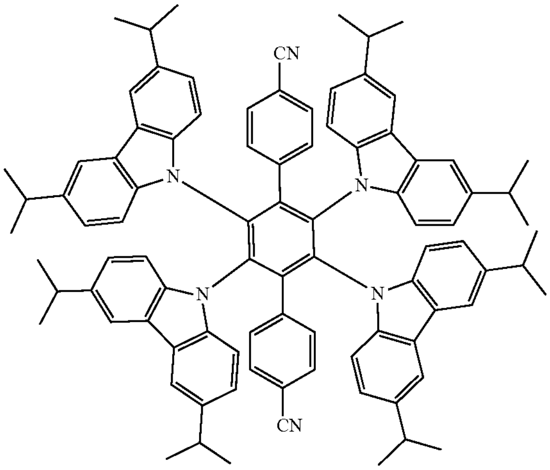
T-96
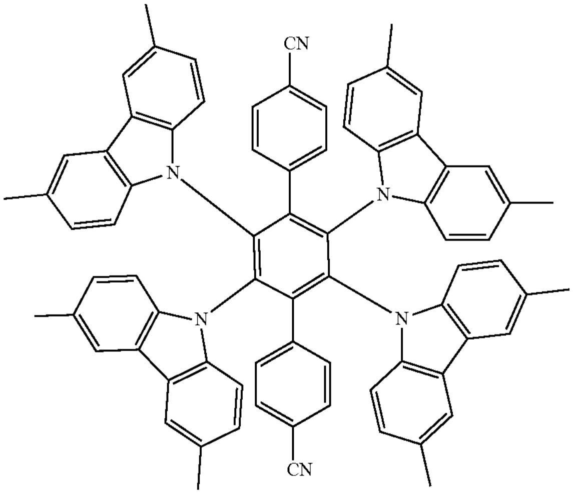

-continued
T-97
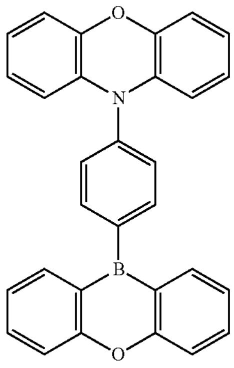
T-98
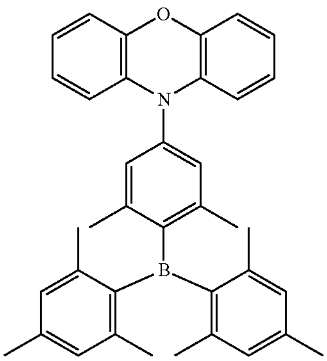
T-99
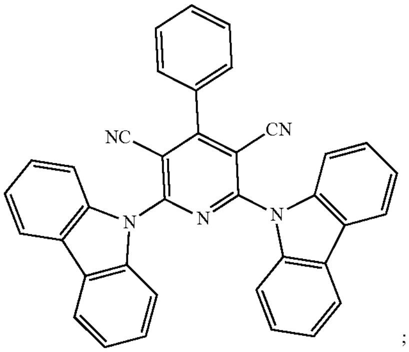
;
wherein in T-71, T-72 and T-73, n is either 1, 2 or 3 independently;
the host material comprises one or a combination of at least two of following compounds as shown in GPH-1 to GPH-75 and GPH-77 to GPH-80:
GPH-1
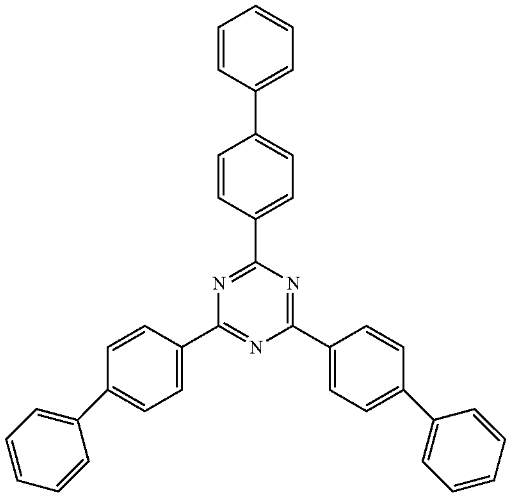
GPH-2
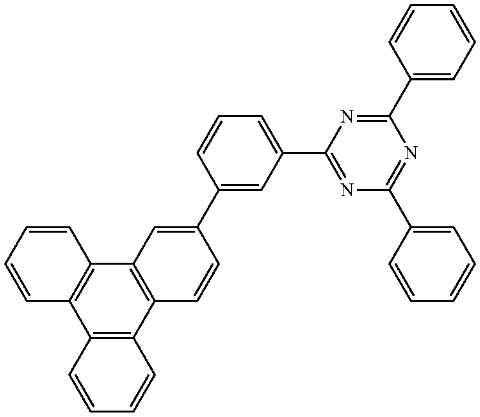
GPH-3
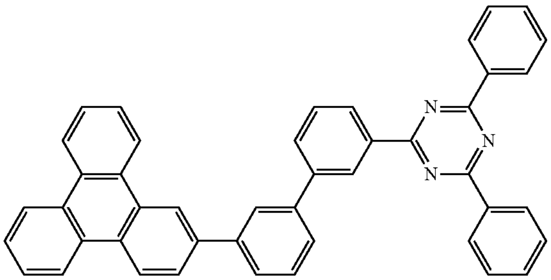
GPH-4
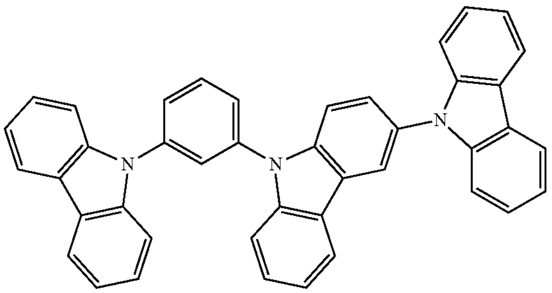

-continued
GPH-5
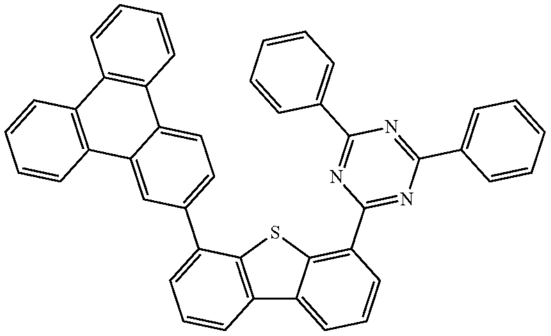
GPH-6
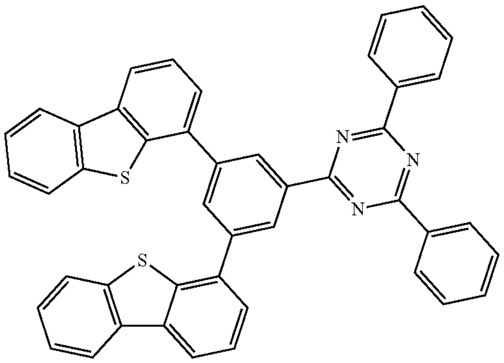
GPH-7
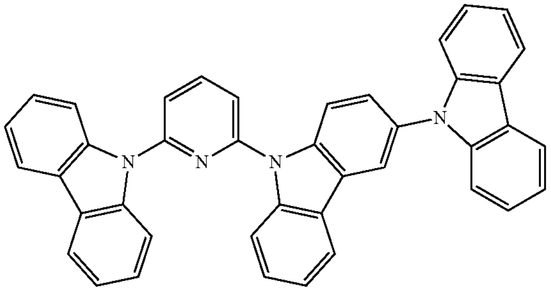
GPH-8
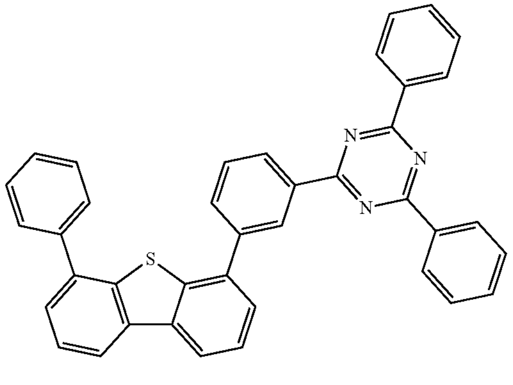
-continued
GPH-9
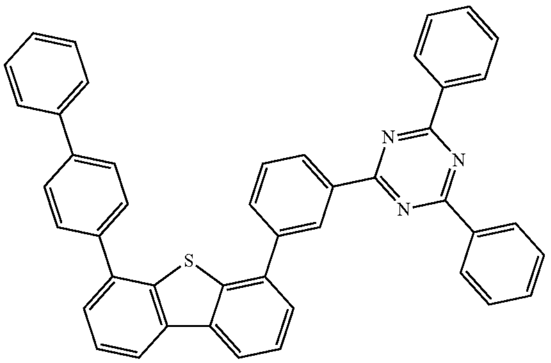
GPH-10
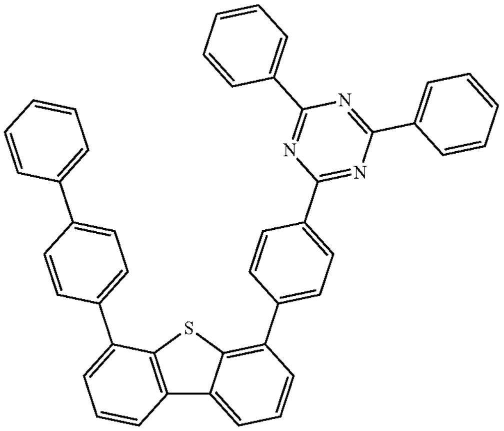
GPH-11
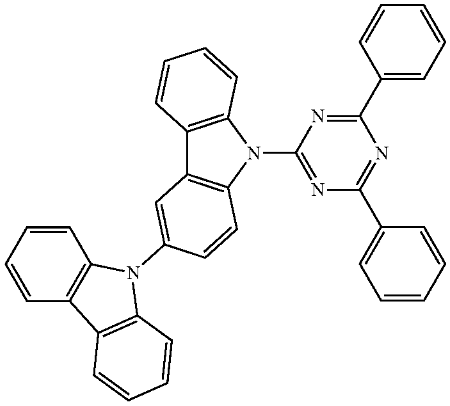
GPH-12
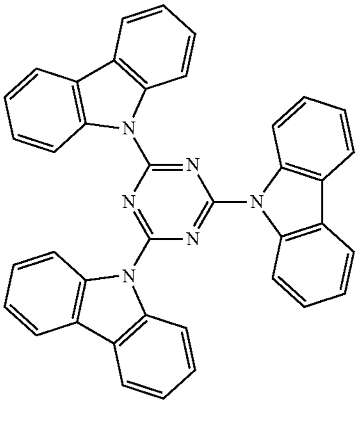

-continued
GPH-13
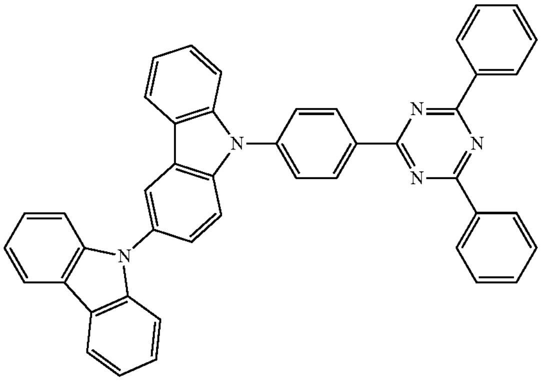
GPH-14
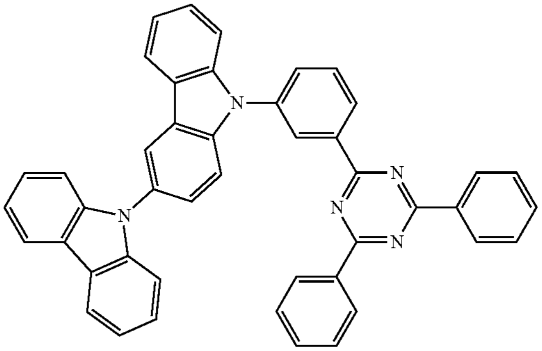
GPH-15
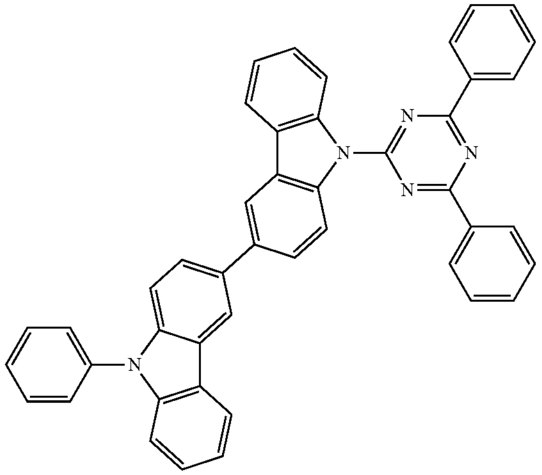
GPH-16
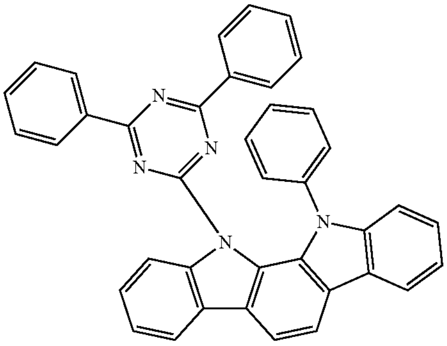
-continued
GPH-17
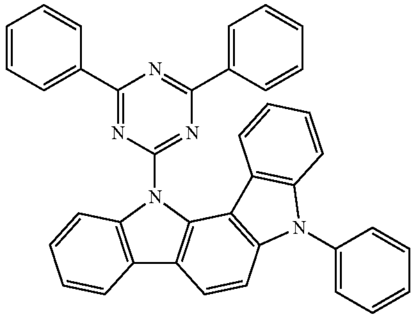
GPH-18
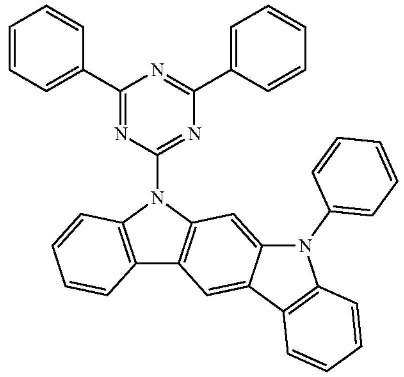
GPH-19
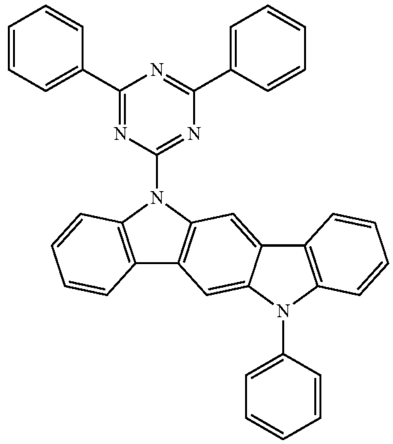
GPH-20
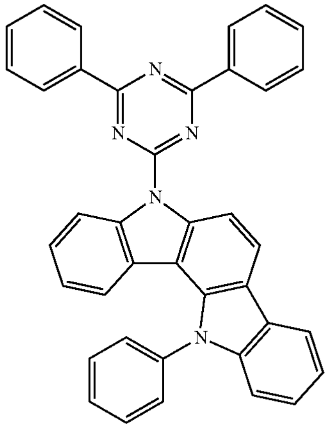

-continued
GPH-21
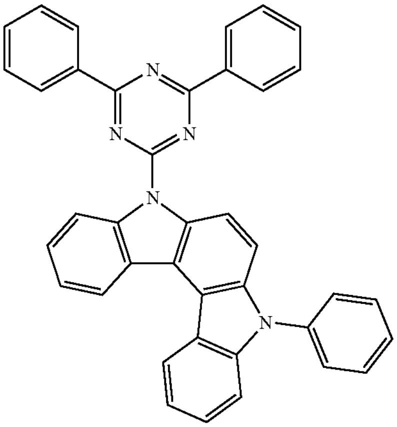
GPH-22
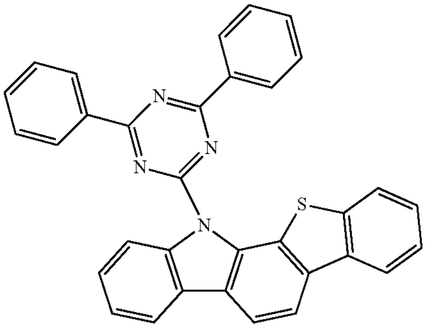
GPH-23
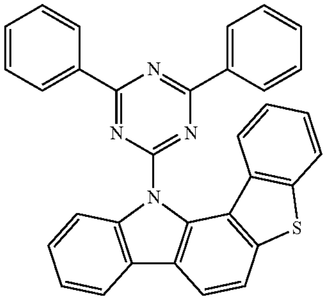
GPH-24
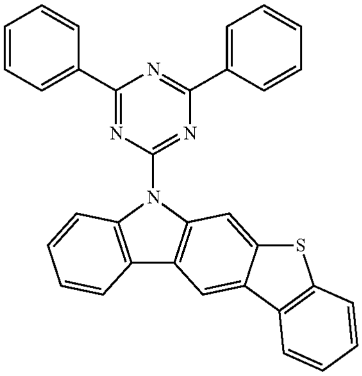
-continued
GPH-25
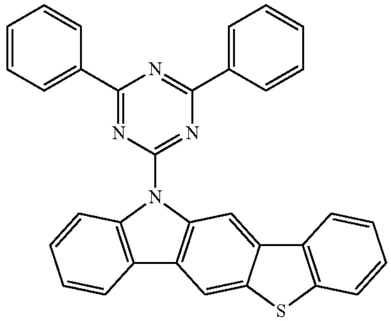
GPH-26
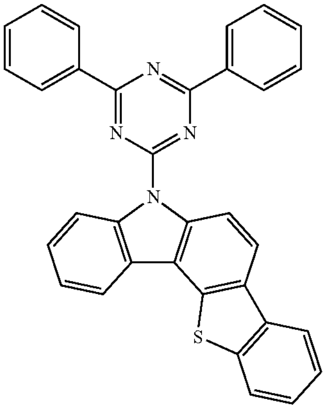
GPH-27
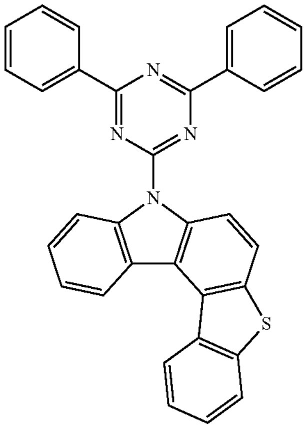
GPH-28
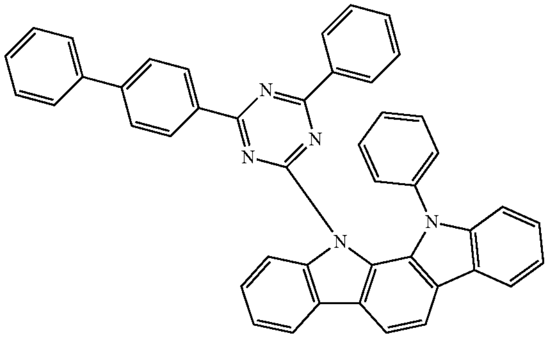

GPH-29
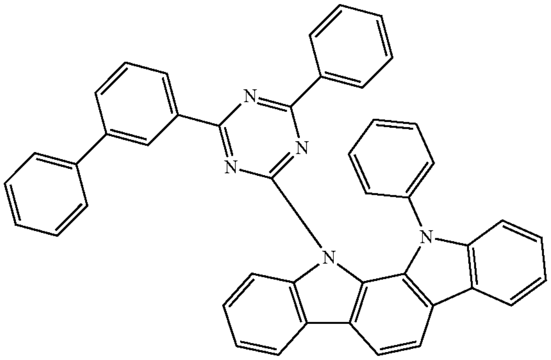
GPH-30
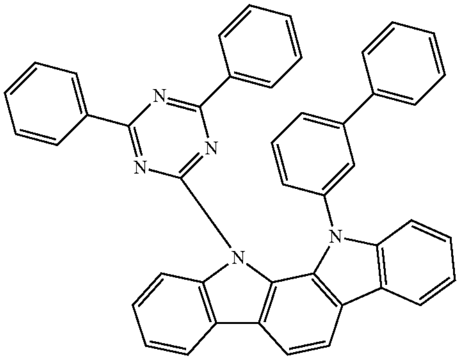
GPH-31
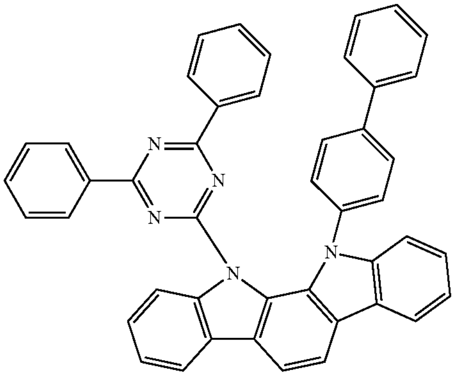
GPH-32
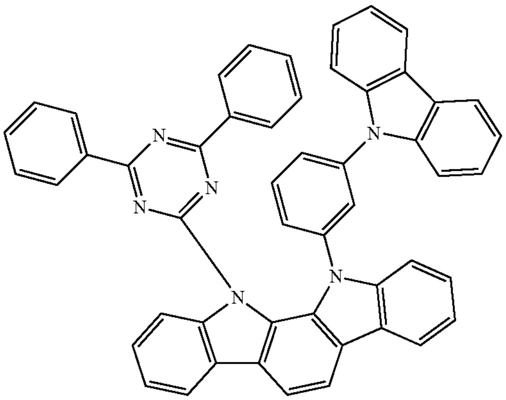
GPH-33
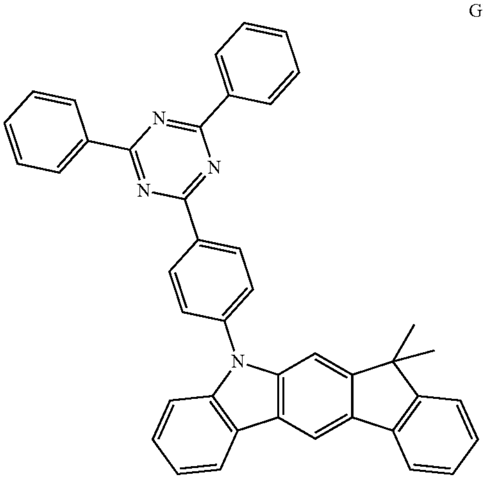
GPH-34
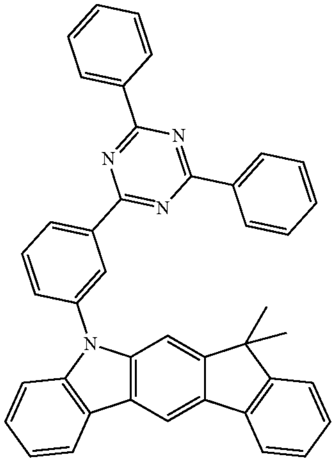
GPH-35
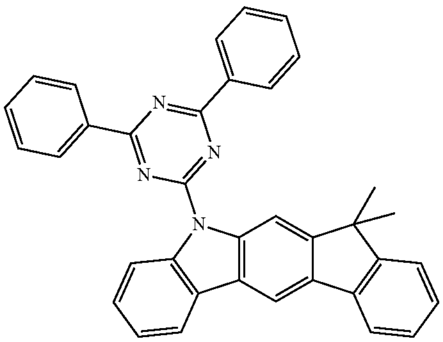

-continued
GPH-36
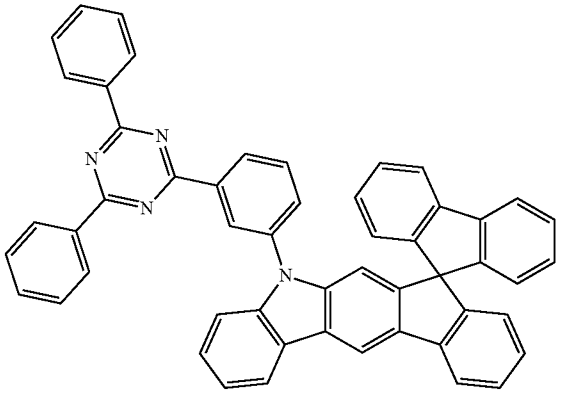
GPH-37
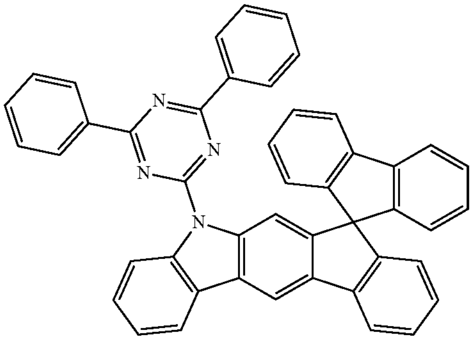
GPH-38
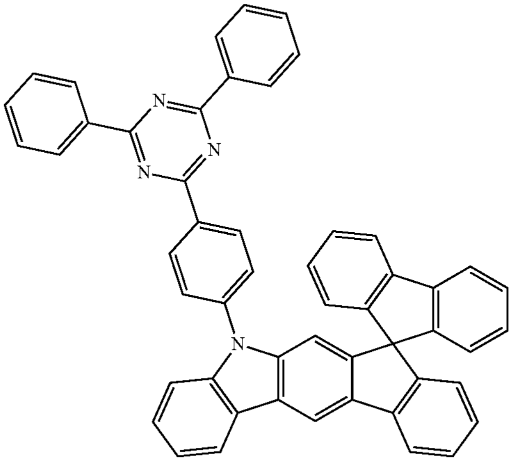
GPH-39
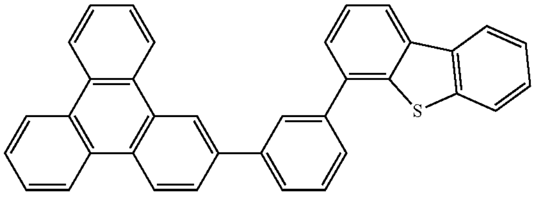
-continued
GPH-40
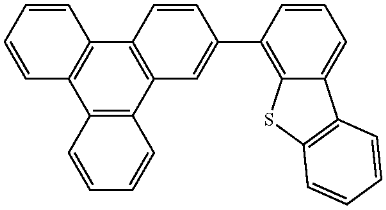
GPH-41
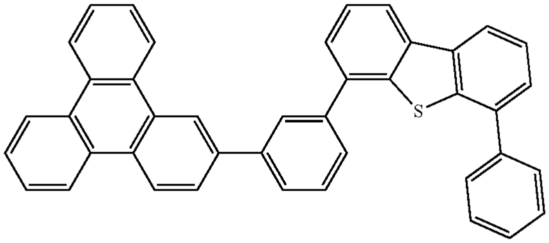
GPH-42
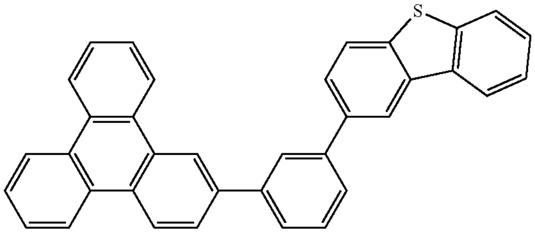
GPH-43
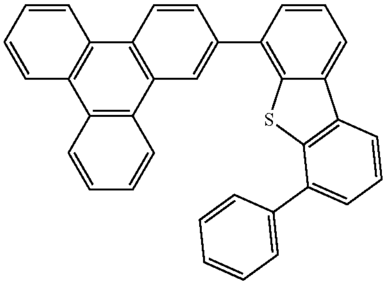
GPH-44
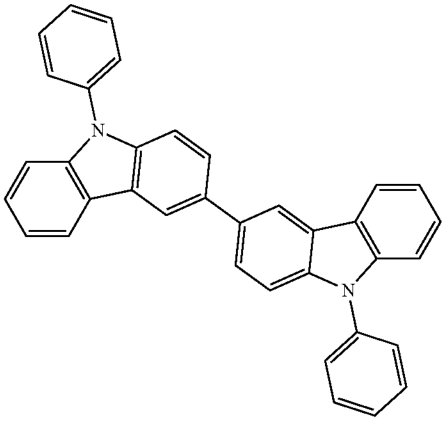

-continued
GPH-45
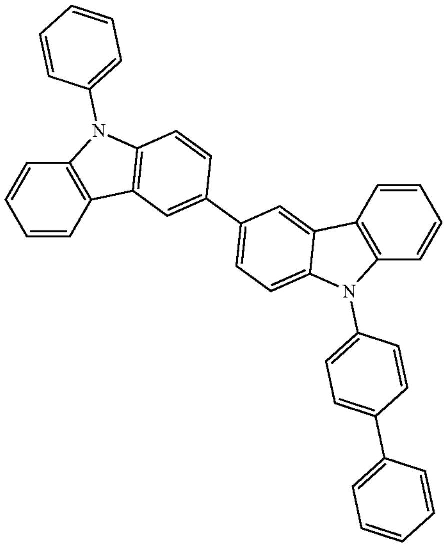
GPH-46
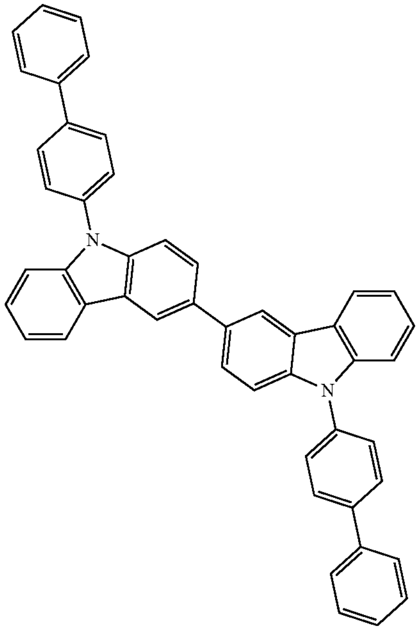
-continued
GPH-47
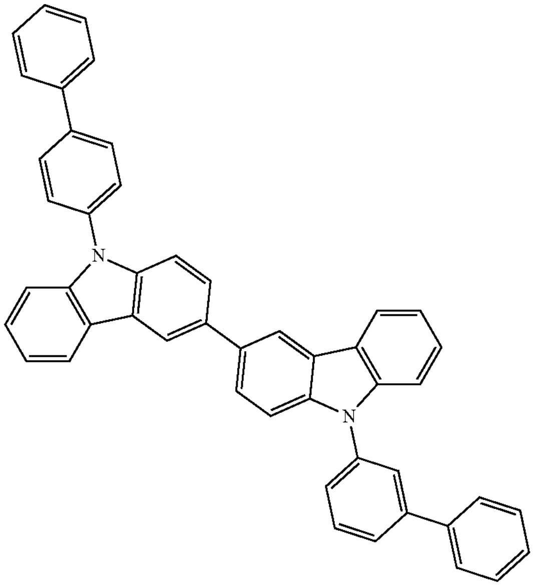
GPH-48
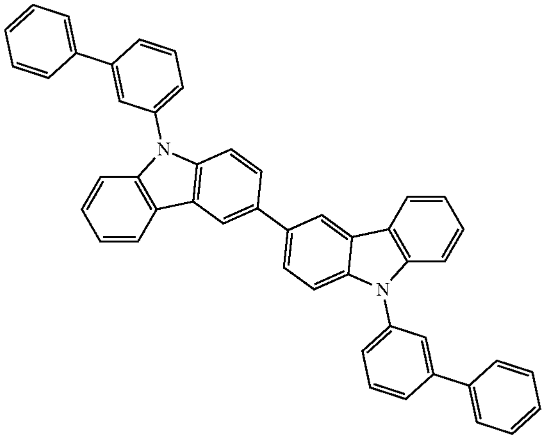
GPH-49
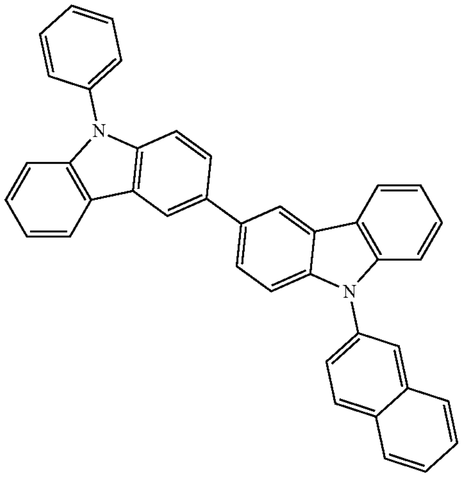

-continued
GPH-50
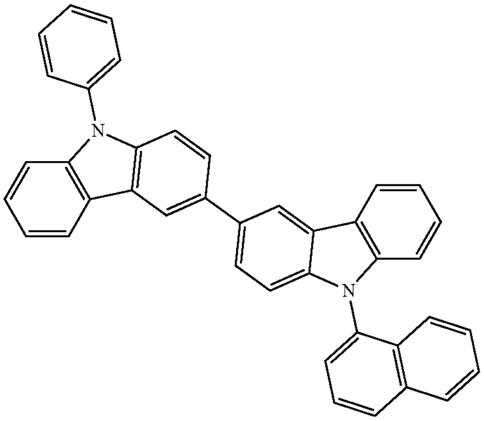
GPH-51
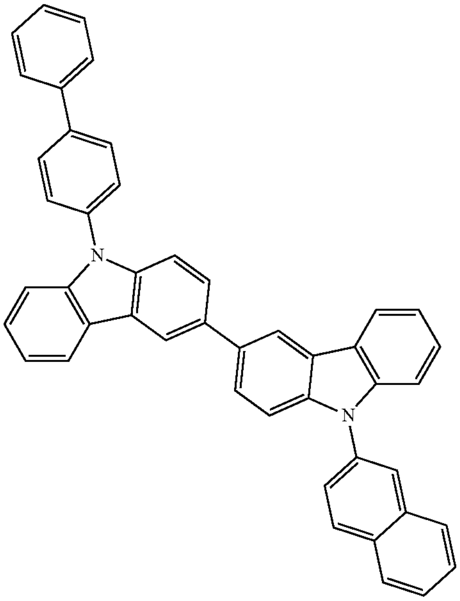
GPH-52
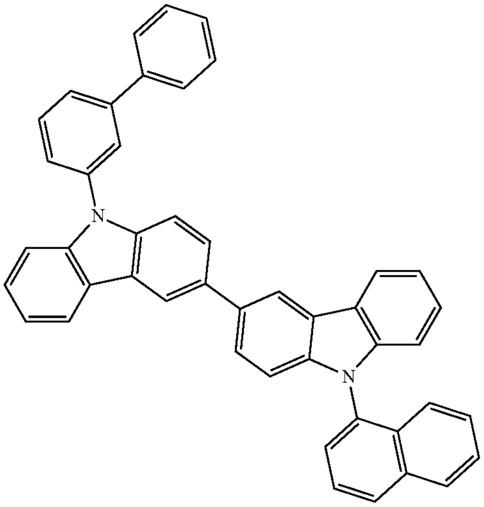
-continued
GPH-53
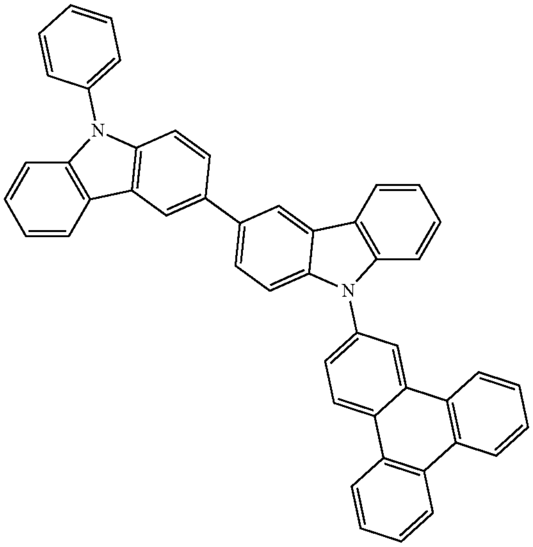
GPH-54
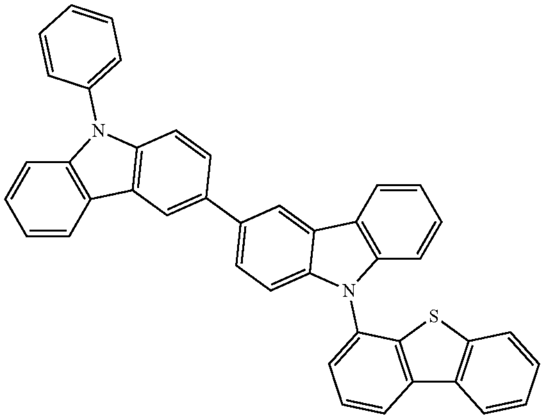
GPH-55
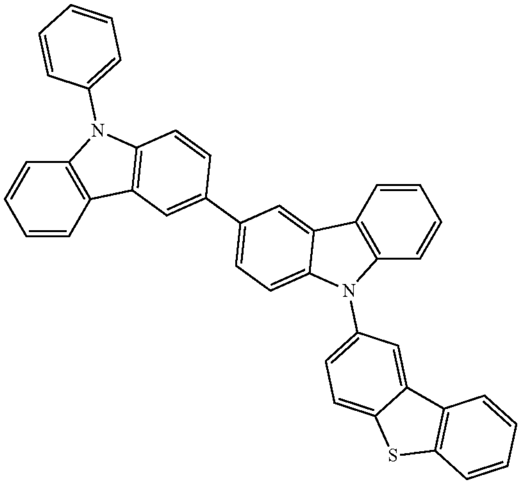

-continued
GPH-56
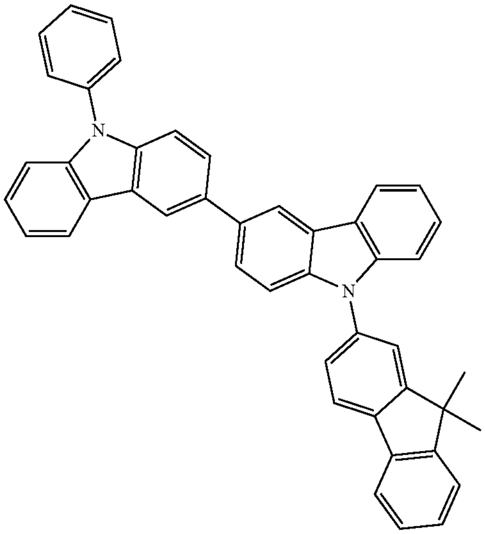
GPH-57
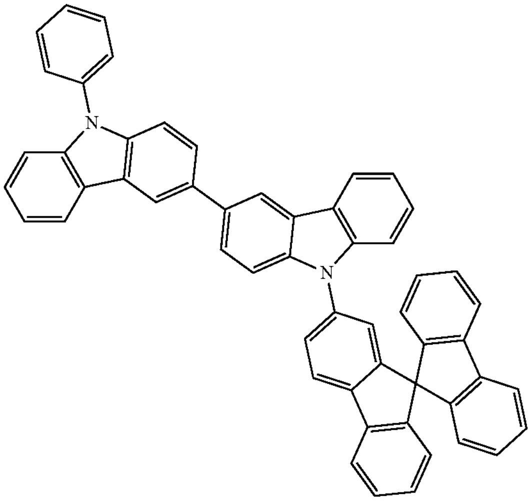
GPH-58
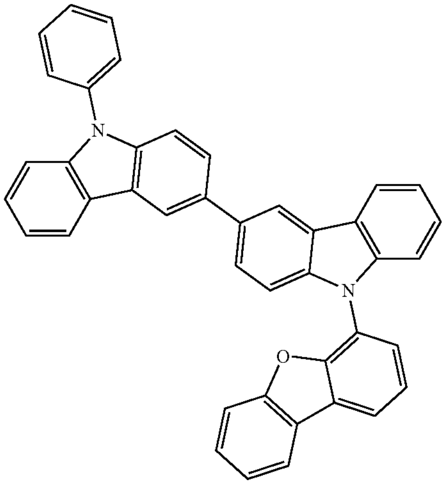
-continued
GPH-59
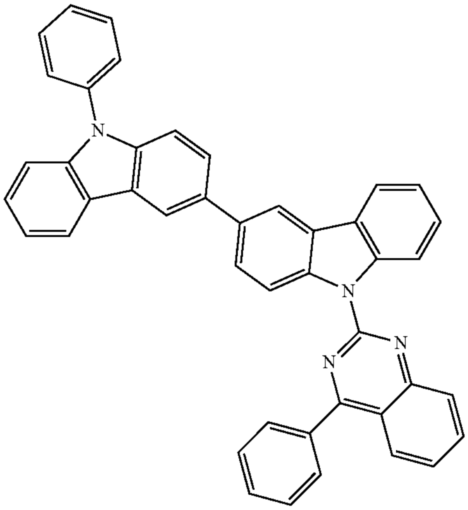
GPH-60
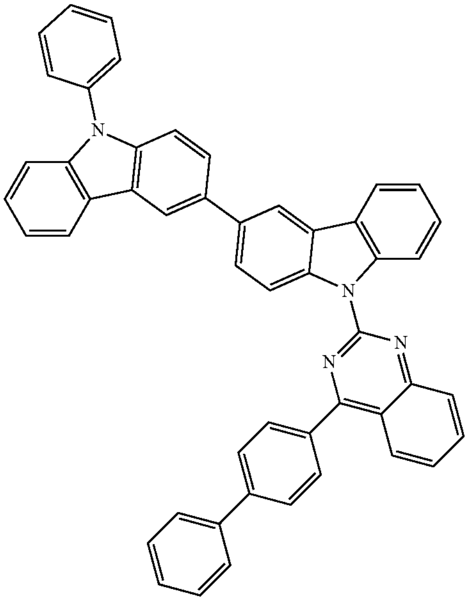

-continued
GPH-61
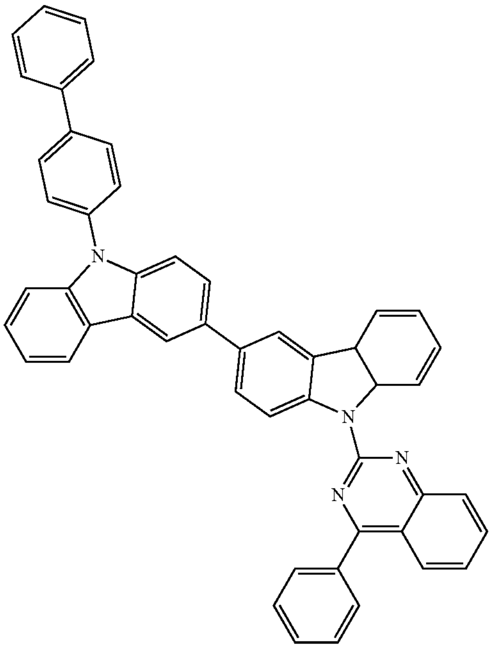
GPH-62
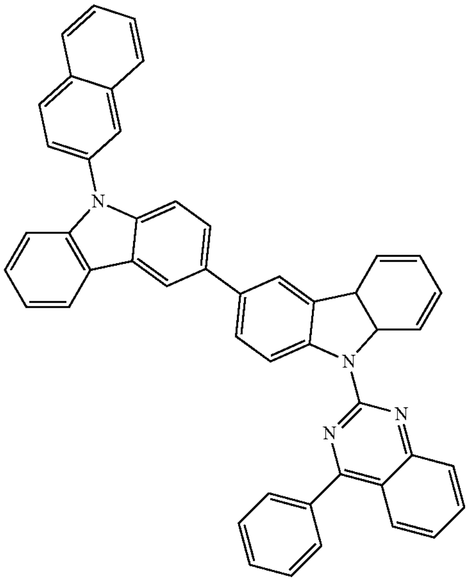
-continued
GPH-63
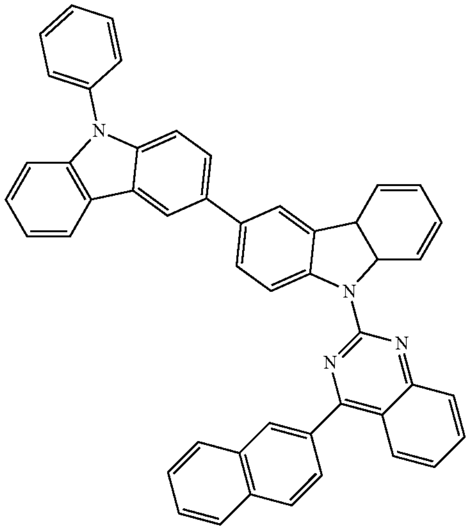
GPH-64
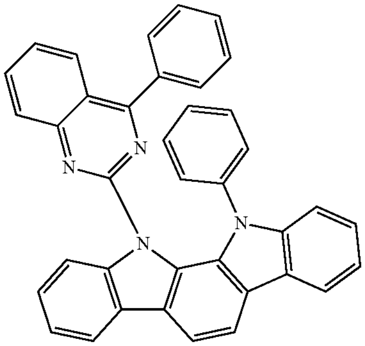
GPH-65
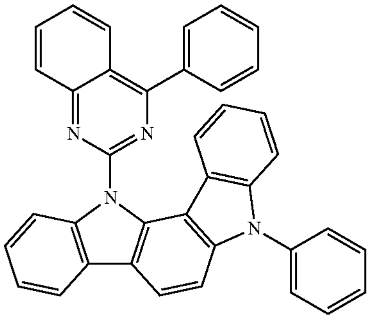
GPH-66
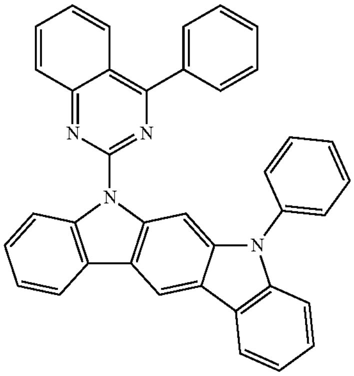

-continued
GPH-67
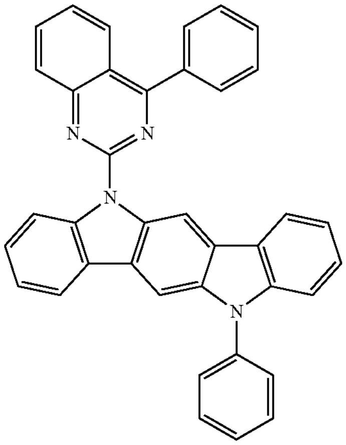
GPH-68
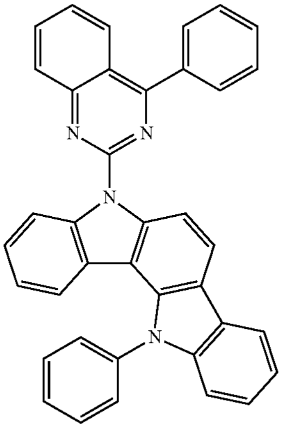
GPH-69
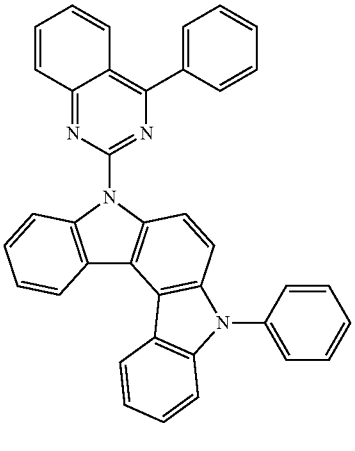
-continued
GPH-70
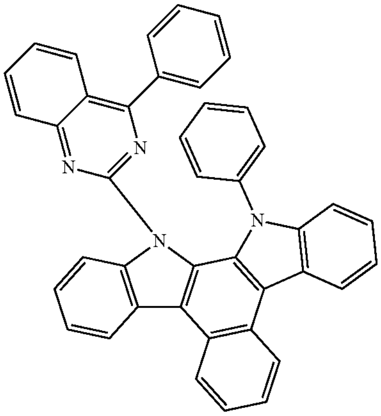
GPH-71
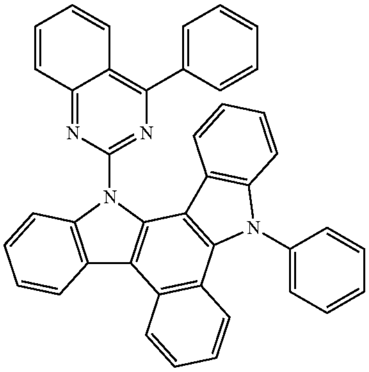
GPH-72
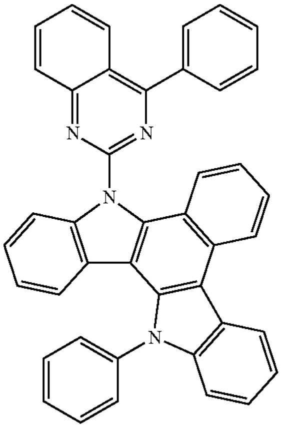
GPH-73
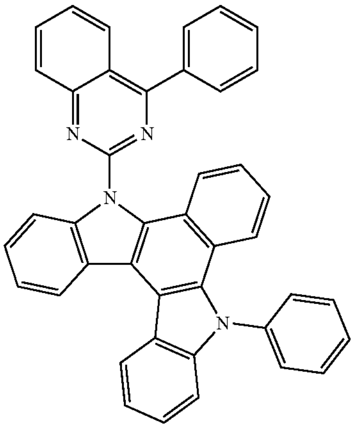

-continued
GPH-74
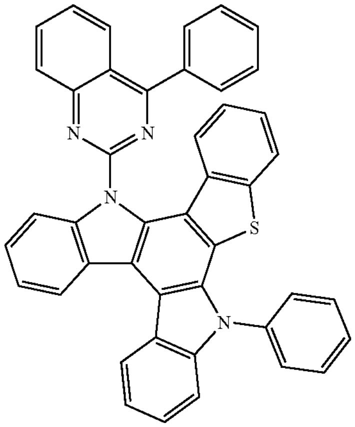
GPH-75
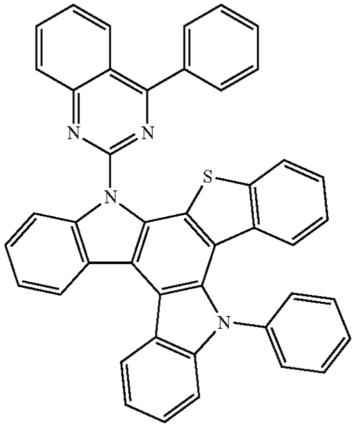
GPH-77
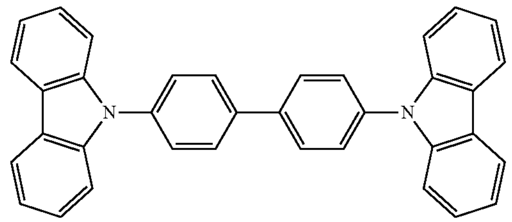
GPH-78
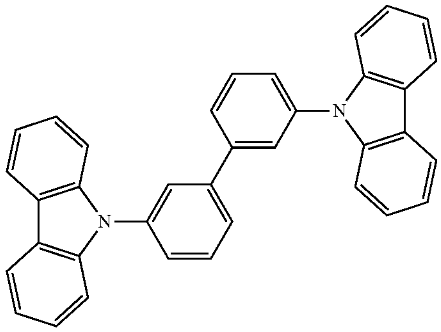
-continued
GPH-79
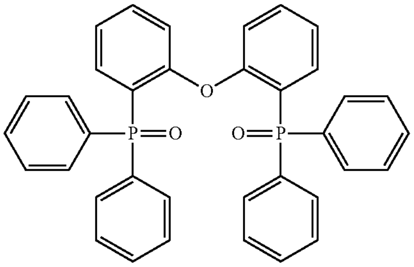
GPH-80
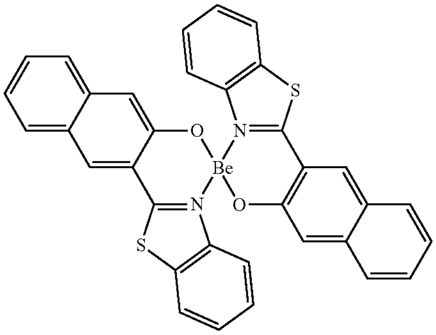
;
wherein the organic layer further comprises a combination of a hole injection layer, a hole transport layer, an electron blocking layer, a hole blocking layer, an electron transport layer, and an electron injection layer; and
wherein a material of the hole injection layer is a co-doped mixed layer of HI-2 and HT-24:
HI-2
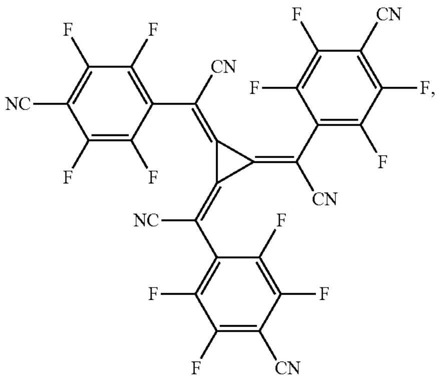
HT-24
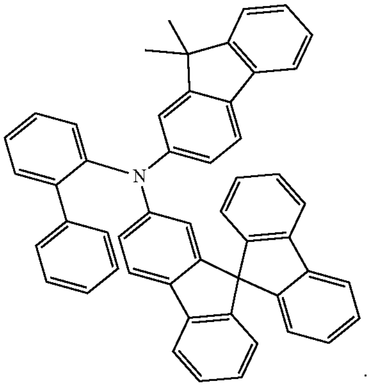
.

2. The organic electroluminescent device according to claim 1, wherein an energy level difference between a singlet state and a triplet state of the thermally activated delayed fluorescence sensitizer is less than or equal to 0.3 eV.

3. The organic electroluminescent device according to claim 1, wherein a mass ratio of the green fluorescent dye to the light-emitting layer is from 0.1% to 30%; and, a mass ratio of the thermally activated delayed fluorescence sensitizer to the light-emitting layer is from 1% to 99%.

4. The organic electroluminescent device according to claim 1, wherein a mass ratio of the thermally activated delayed fluorescence sensitizer to the light-emitting layer is from 10% to 50%.

5. A display panel, comprising the organic electroluminescent device according to claim 1.

6. The organic electroluminescent device according to claim 1, wherein the mass percentage of HI-2 is 3%.

7. The organic electroluminescent device according to claim 1, wherein a thickness of the hole injection layer is 10 nm.

8. The organic electroluminescent device according to claim 1, wherein a material of the hole transport layer is HT-24:

HT-24

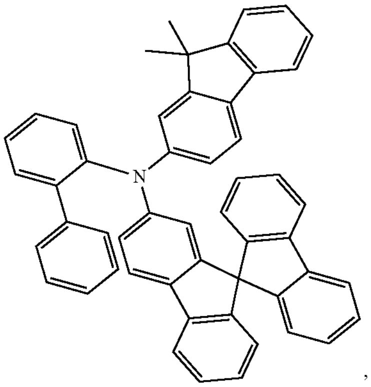

, and a thickness of the hole transport layer is 110 nm.

9. The organic electroluminescent device according to claim 1, wherein a material of the electron blocking layer is EB-1:

EB-1

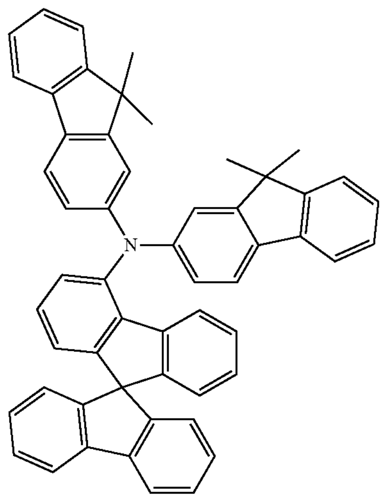

, and a thickness of the electron blocking layer is 35 nm.

10. The organic electroluminescent device according to claim 1, wherein a thickness of the light-emitting layer is 42 nm.

11. The organic electroluminescent device according to claim 1, wherein a material of the hole blocking layer is HB-1:

HB-1

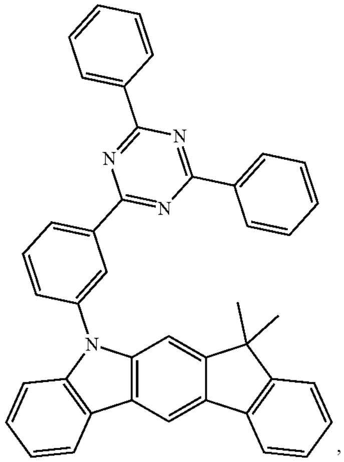

, and a thickness of the hole blocking layer is 5 nm.

12. The organic electroluminescent device according to claim 1, wherein a material of the electron transport layer is a mixed co-evaporation of ET-52 and ET-57:

ET-52

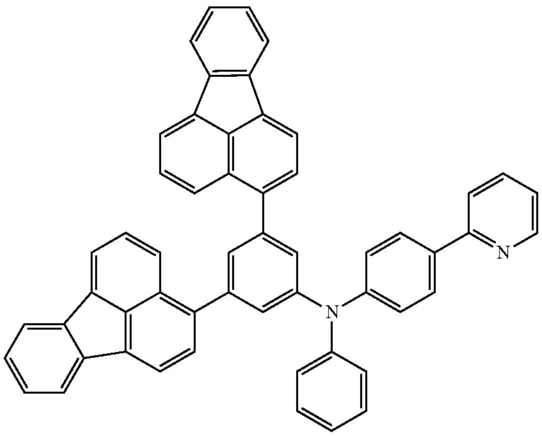

,

ET-57

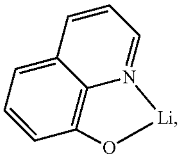

and a mass ratio of the ET-52 to the ET-57 is 1:1.

13. The organic electroluminescent device according to claim 1, wherein a material of the electron injection layer is Yb, and a thickness of the electron injection layer is 1 nm.

14. The organic electroluminescent device according to claim 1, wherein the organic electroluminescent device further comprises a light extraction layer, and a material of the light extraction layer is CPL-1:

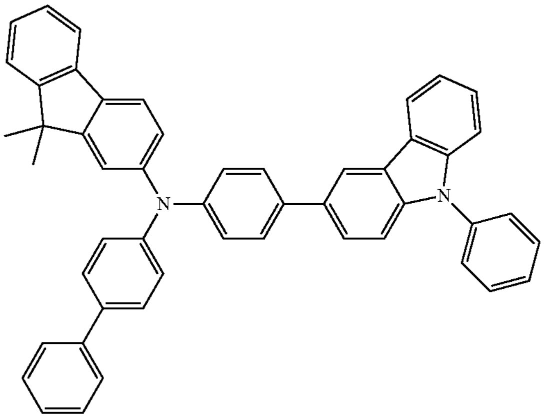

CPL-1 , and a thickness of the light extraction layer is 65 nm.

15. The organic electroluminescent device according to claim 1, wherein the green fluorescent dye is selected from any one of following compounds as shown in C-35, C-51, C-75, C-103, C-120, C-123, C-132, and C-175:

C-35

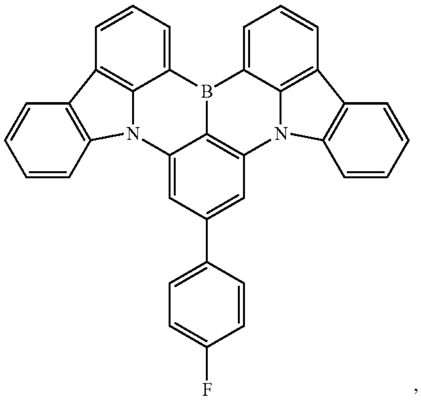

,

C-51

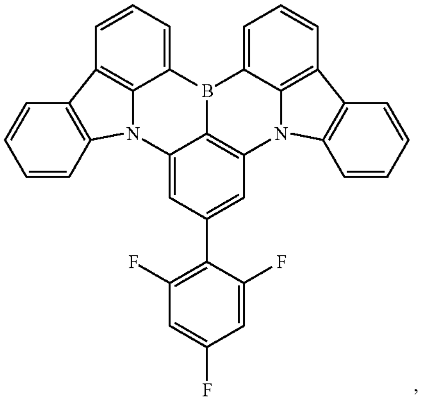

,

C-75

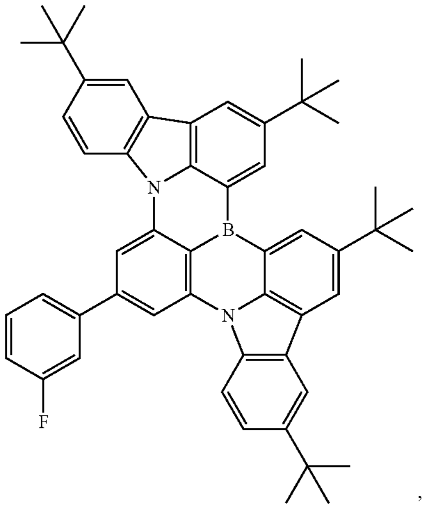

,

-continued
C-103
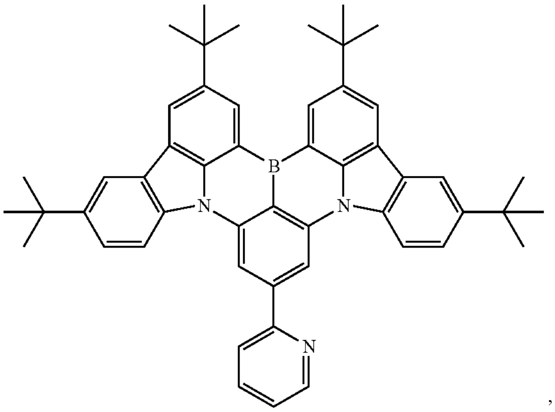
,
C-120
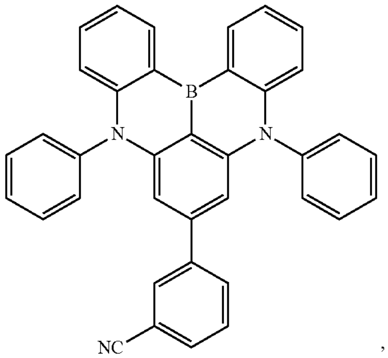
,
C-123
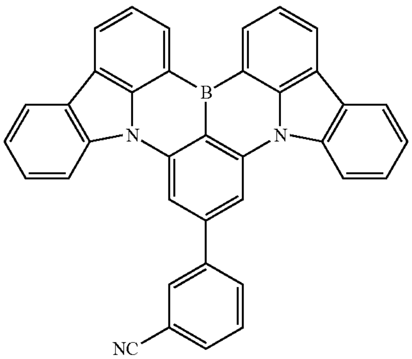
,
C-132
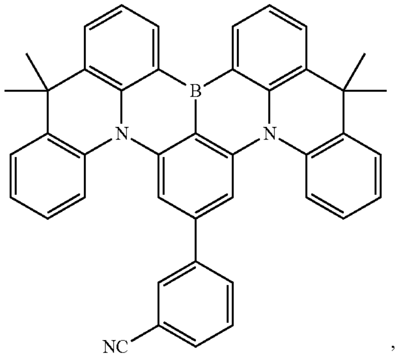
,
-continued
C-175
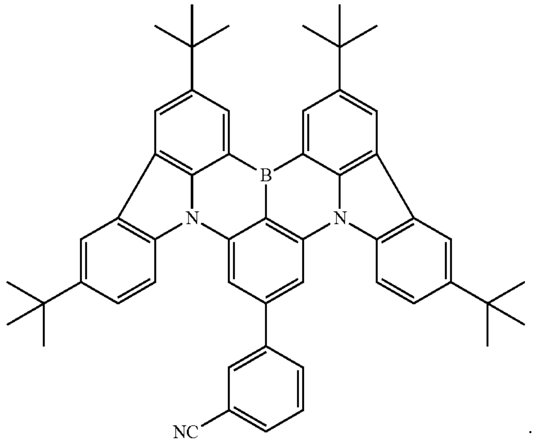
.
16. The organic electroluminescent device according to claim 15, wherein the thermally activated delayed fluorescence sensitizer comprises one or a combination of at least two of following compounds as shown in T-37, T-82, T-89, T-90, and T-91:
T-37
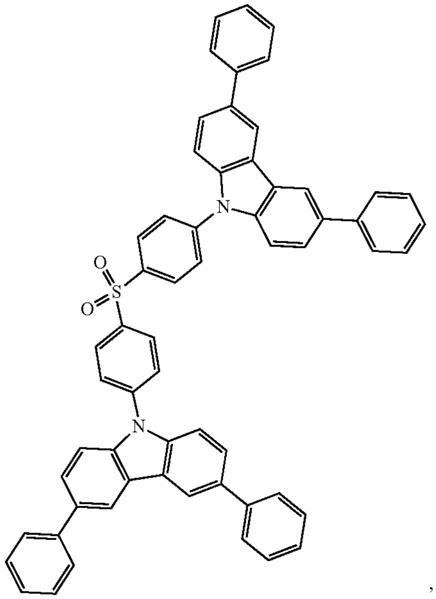
,
T-82
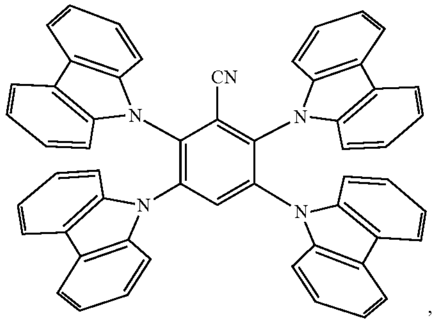
, -continued
T-89
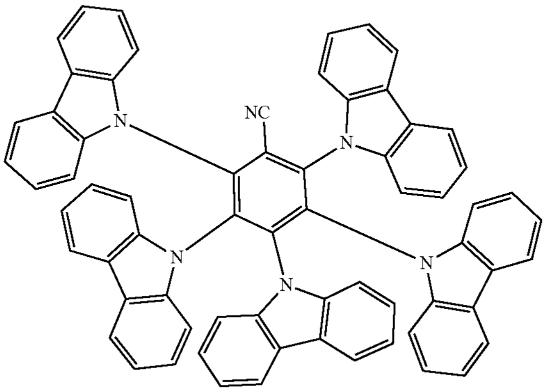
T-90
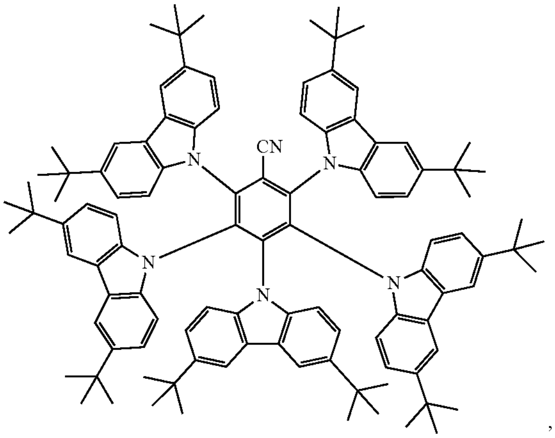
,
T-91
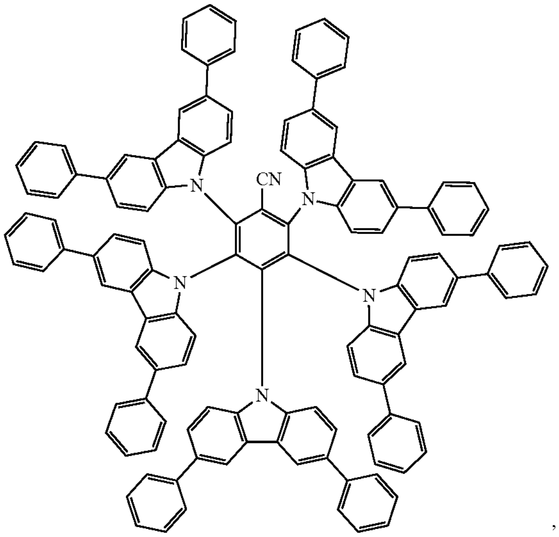
,
17. The organic electroluminescent device according to claim 16, wherein the host material comprises one or a combination of at least two of following compounds as shown in GPH-3, GPH-4, GPH-5, GPH-45, GPH-46, and GPH-78:
GPH-3
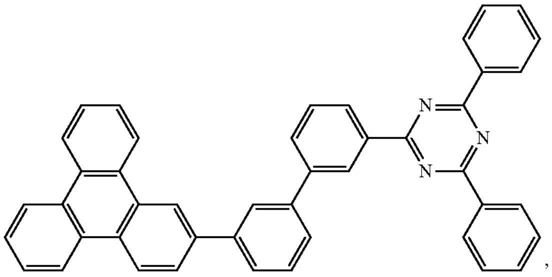
,
GPH-4
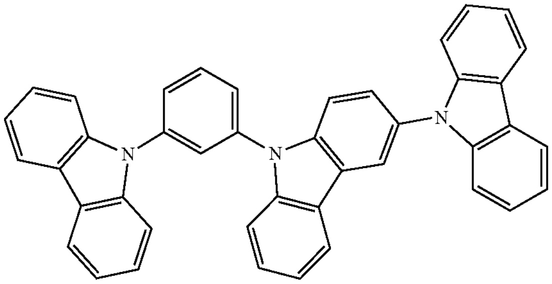
,
GPH-5
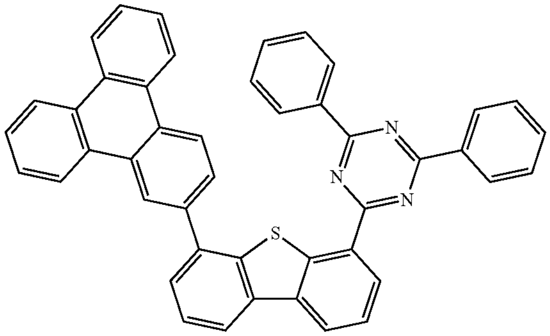
,
GPH-45
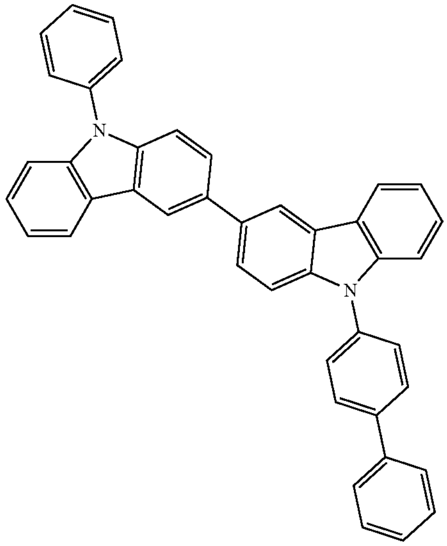
, -continued

GPH-46

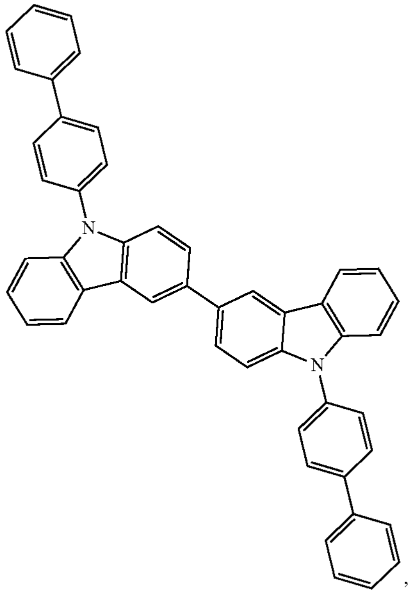

,

GPH-78

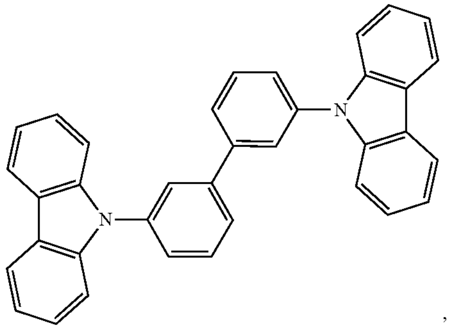

,

18. An organic electroluminescent device comprising:

a first electrode;

a second electrode; and an organic layer located between the first electrode and the second electrode, wherein the organic layer comprises a light-emitting layer, the light-emitting layer comprises a host material, a thermally activated delayed fluorescence sensitizer and a green fluorescent dye, and the green fluorescent dye is selected from any one of following compounds as shown in C-35, C-51, C-75, C-103, C-120, C-123, C-132, and C-175:

C-35

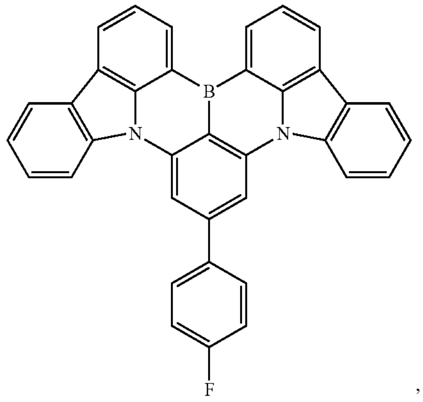

,

C-51

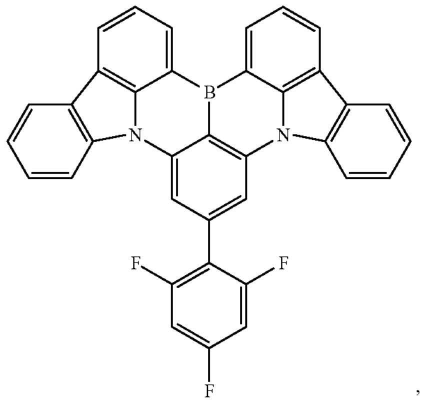

,

C-75

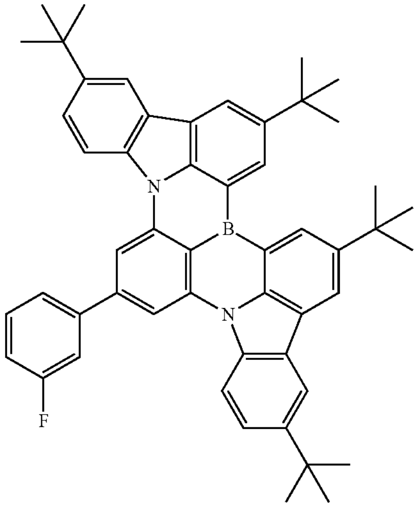

,

-continued
C-103
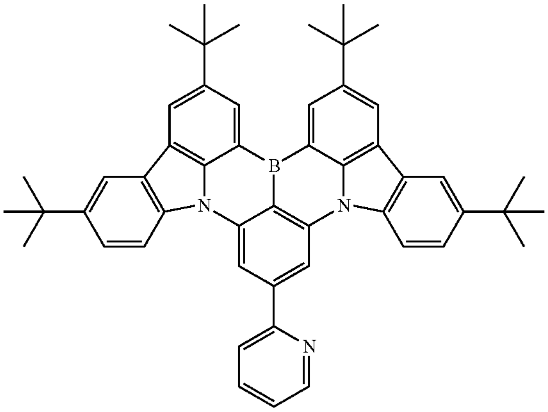
,
C-120
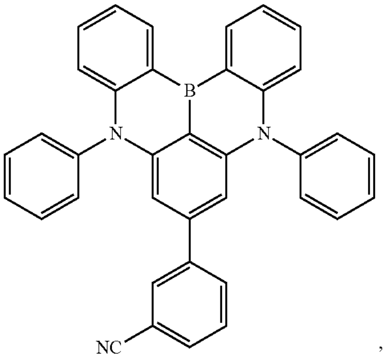
,
C-123
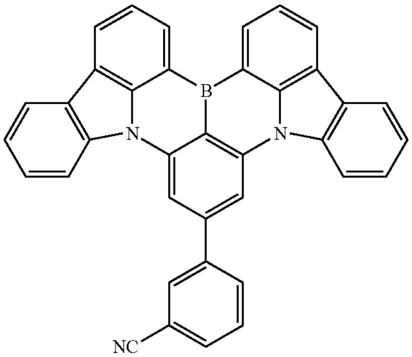
,
C-132
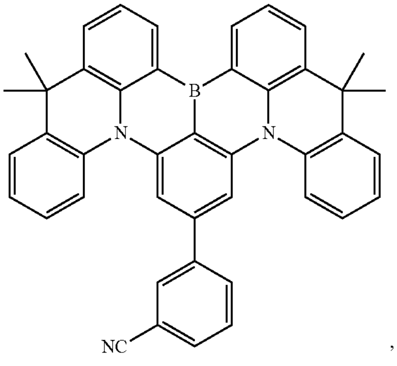
,
-continued
C-175
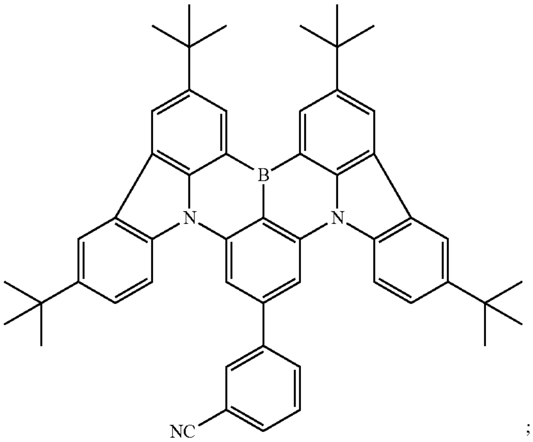
;
the thermally activated delayed fluorescence sensitizer comprises one or a combination of at least two of following compounds as shown in T-37, T-82, T-89, T-90, and T-91:
T-37
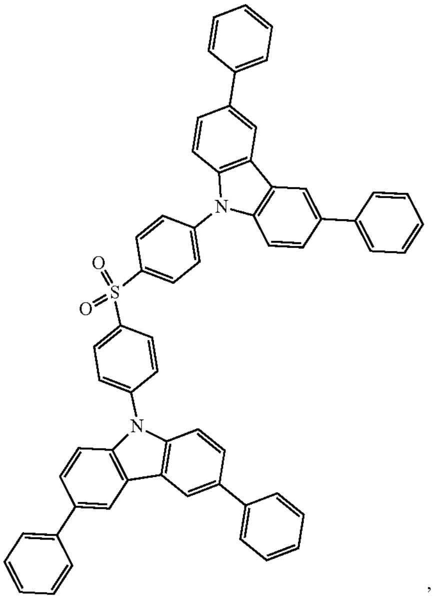
,
T-82
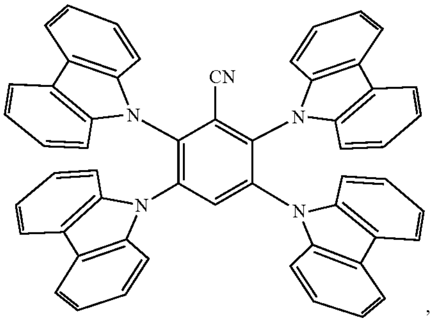
, -continued
T-89
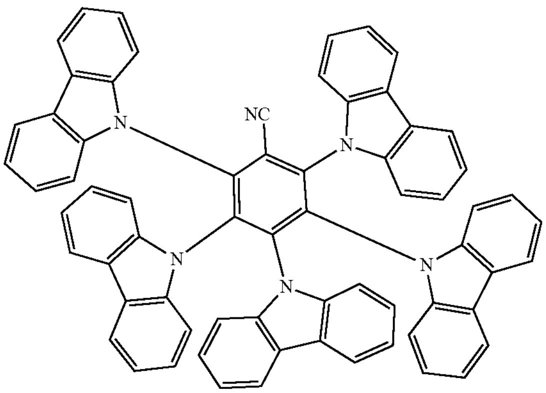
T-90
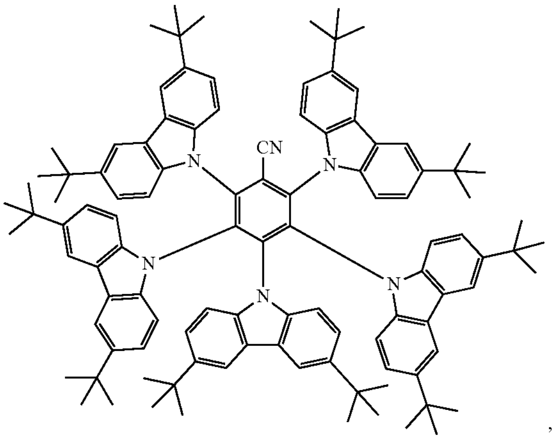
,
T-91
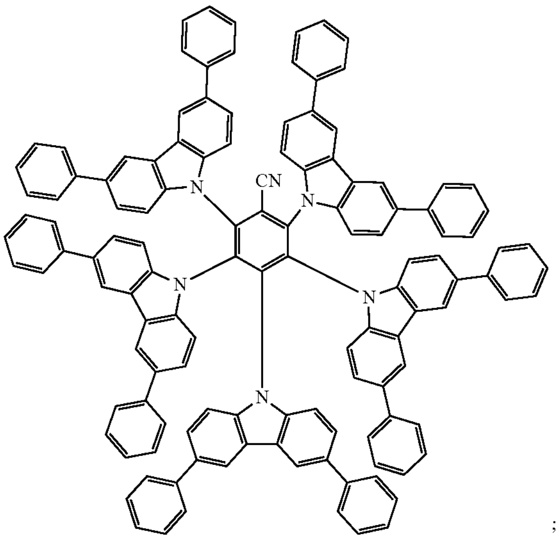
;
the host material comprises one or a combination of at least two of following compounds as shown in GPH-1 to GPH-75 and GPH-77 to GPH-80:
GPH-1
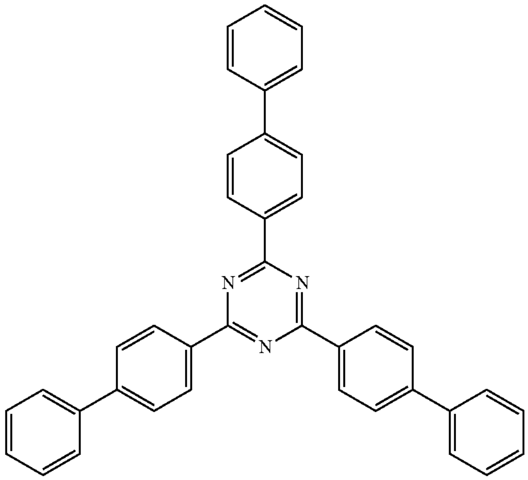
GPH-2
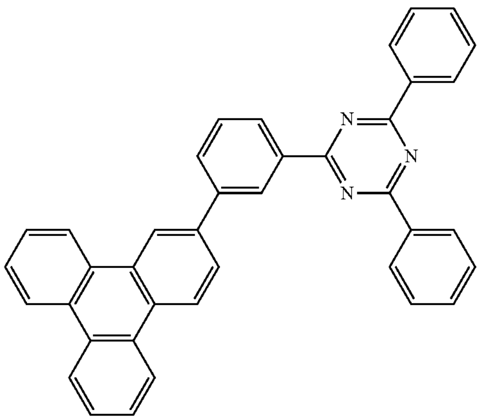
GPH-3
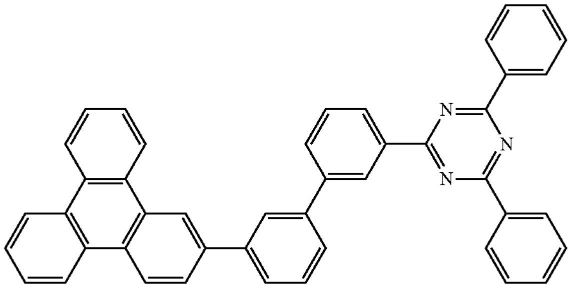
GPH-4
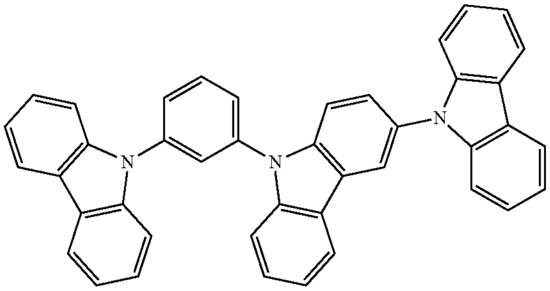

-continued
GPH-5
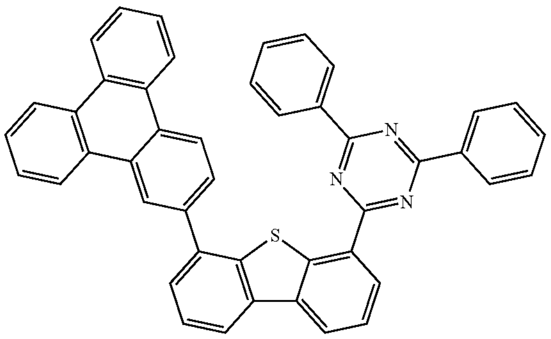
GPH-6
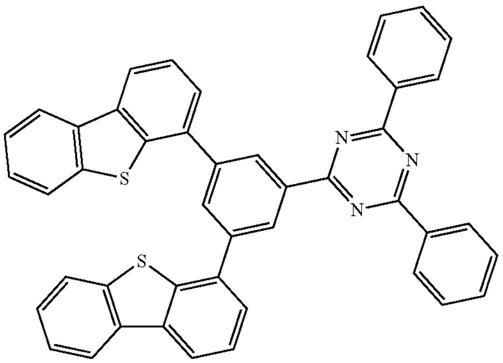
GPH-7
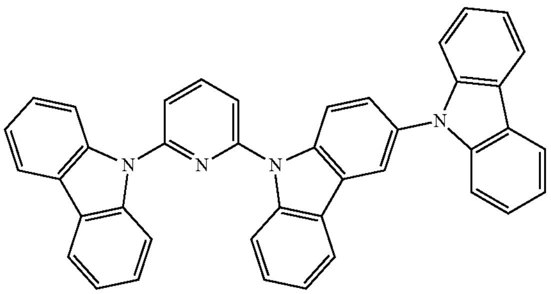
GPH-8
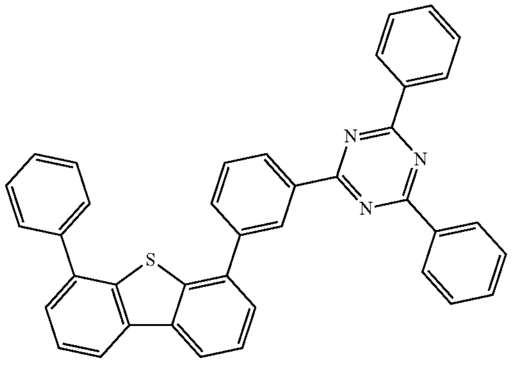
-continued
GPH-9
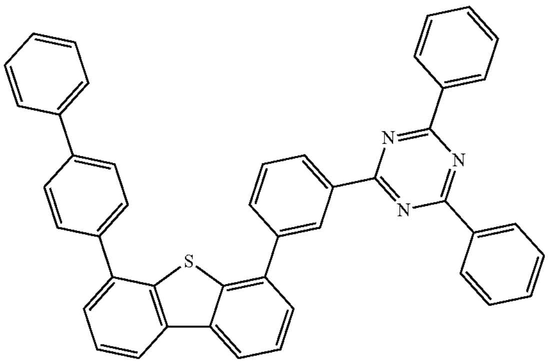
GPH-10
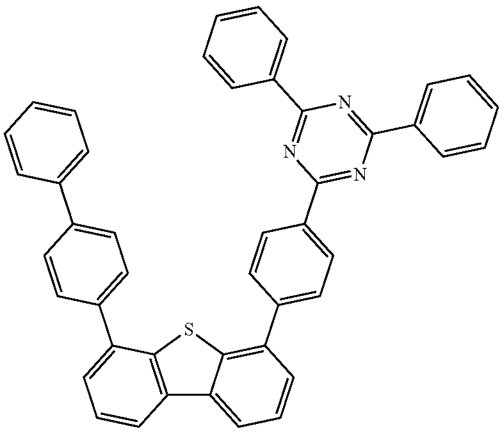
GPH-11
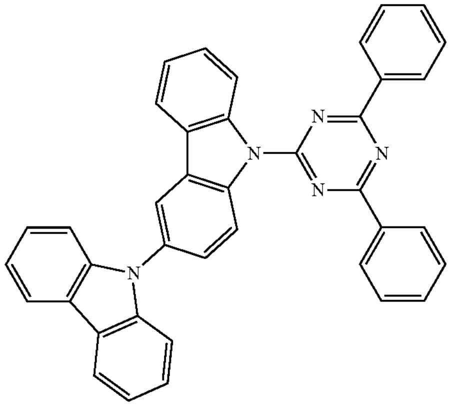
GPH-12
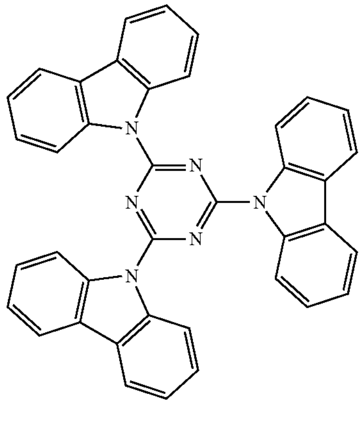

-continued
GPH-13
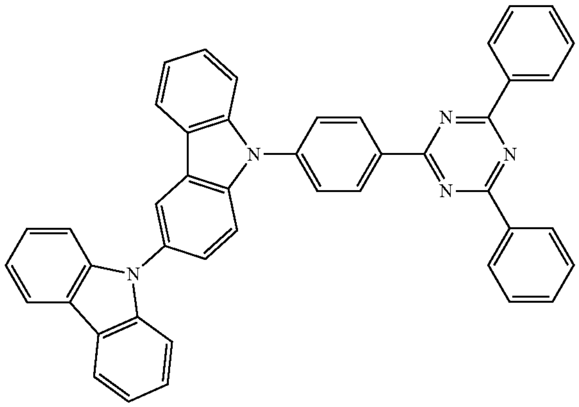
GPH-14
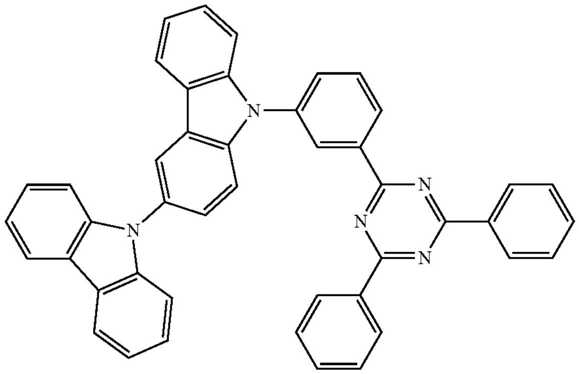
GPH-15
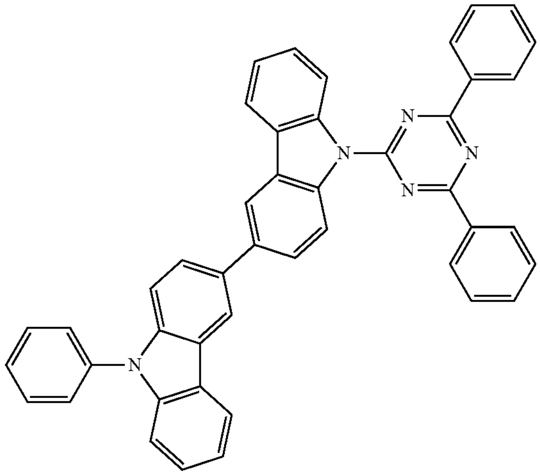
-continued
GPH-16
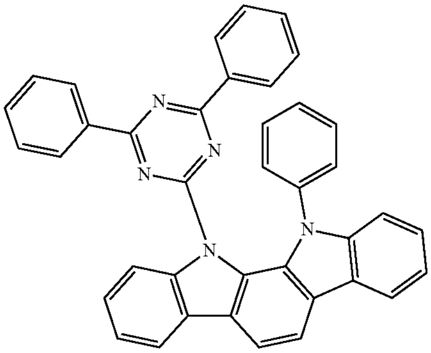
GPH-17
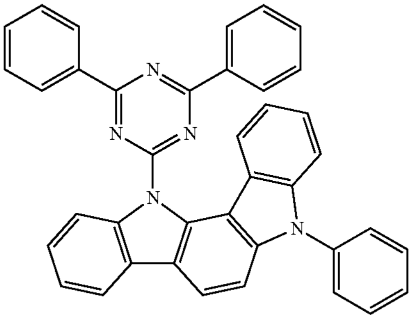
GPH-18
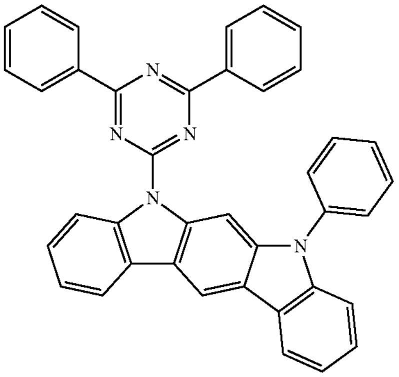
GPH-19
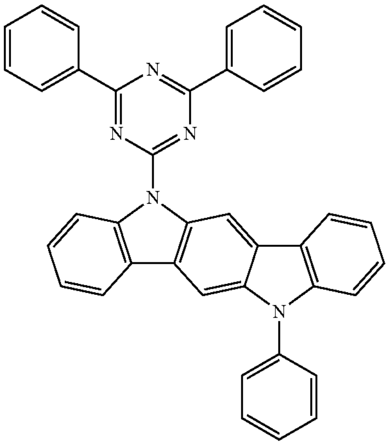

-continued
GPH-20
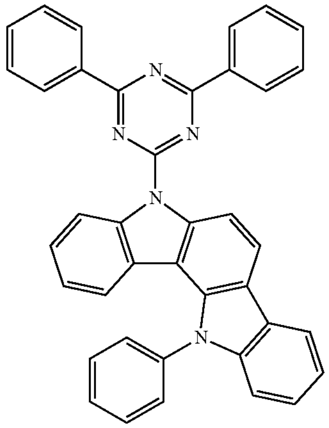
GPH-21
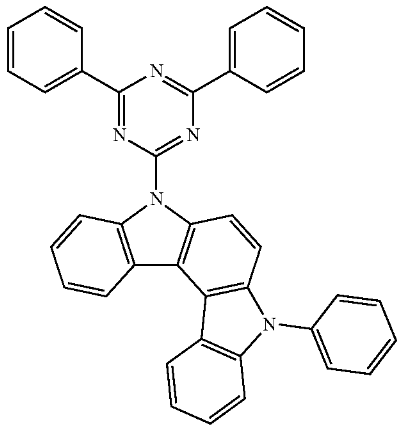
GPH-22
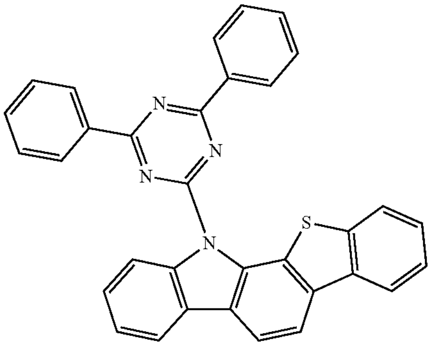
GPH-23
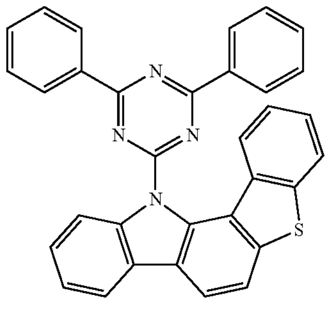
-continued
GPH-24
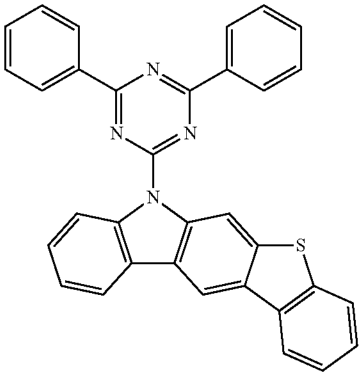
GPH-25
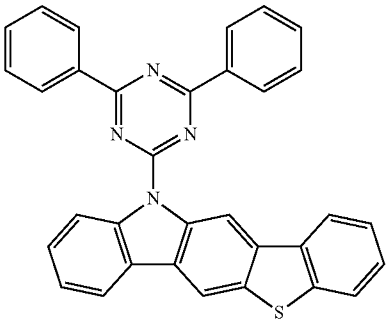
GPH-26
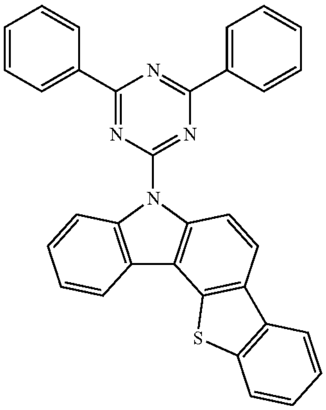
GPH-27
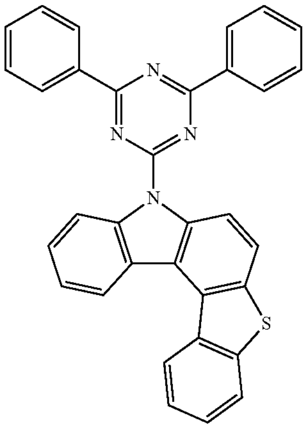

-continued
GPH-28
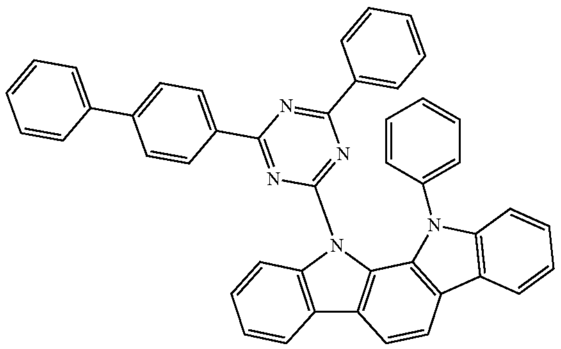
GPH-29
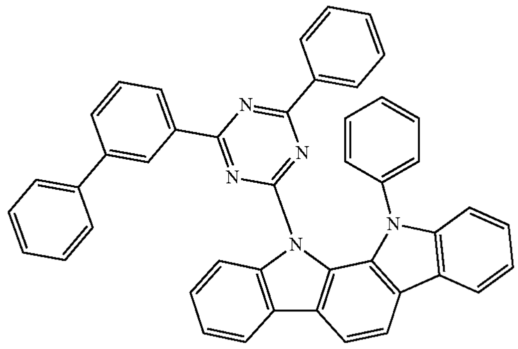
GPH-30
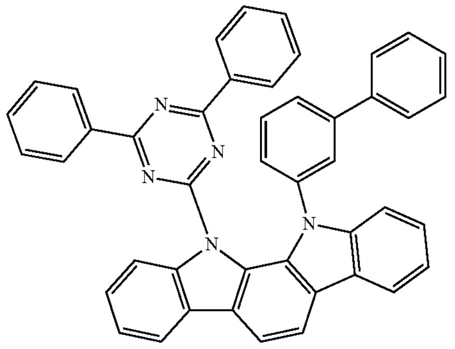
GPH-31
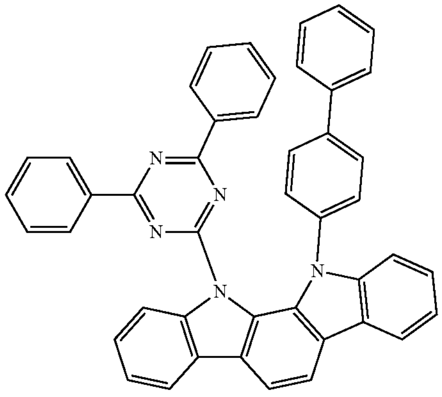
-continued
GPH-32
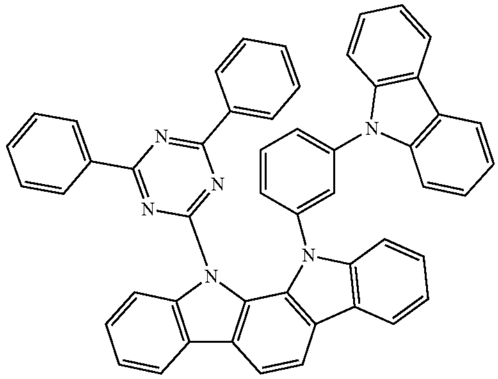
GPH-33
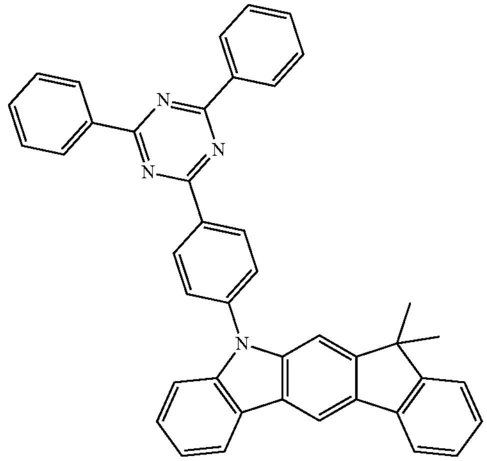
GPH-34
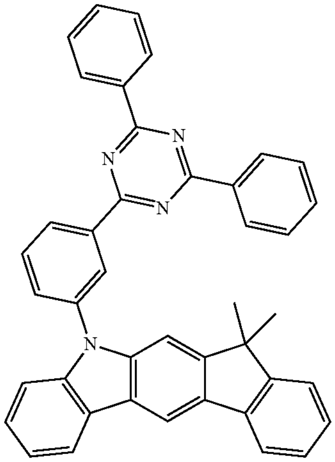

-continued
GPH-35
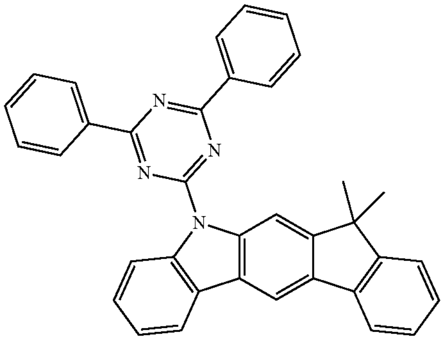
GPH-36
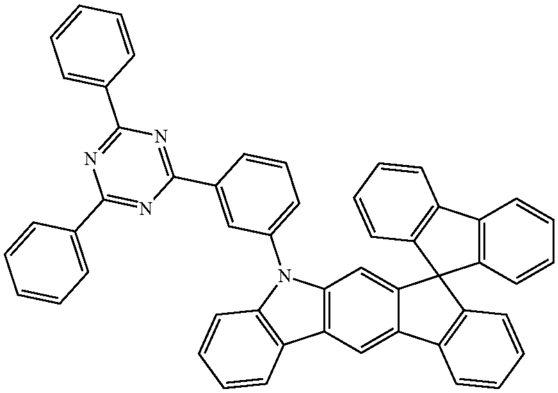
GPH-37
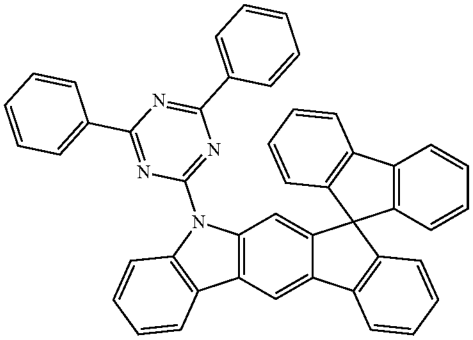
GPH-38
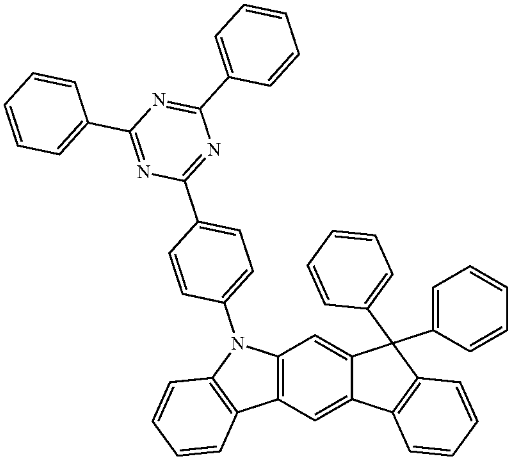
-continued
GPH-39
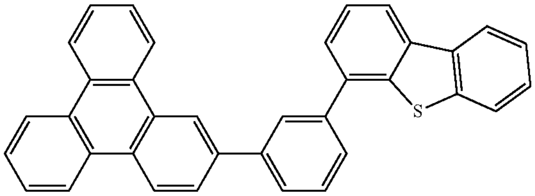
GPH-40
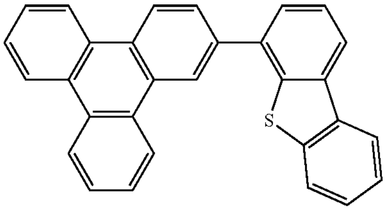
GPH-41
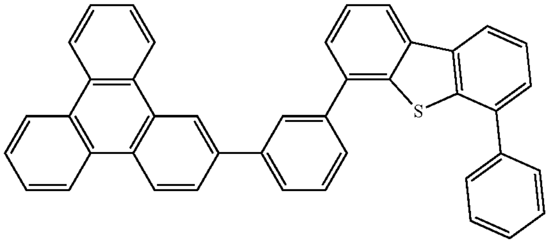
GPH-42
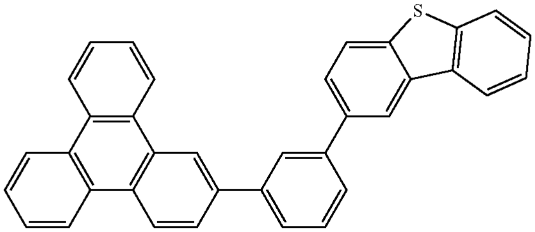
GPH-43
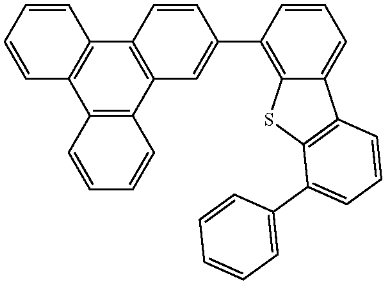

-continued
GPH-44
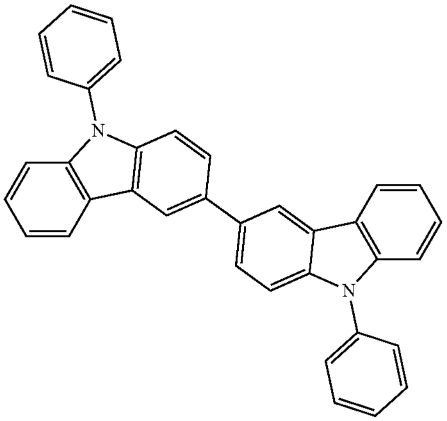
GPH-45
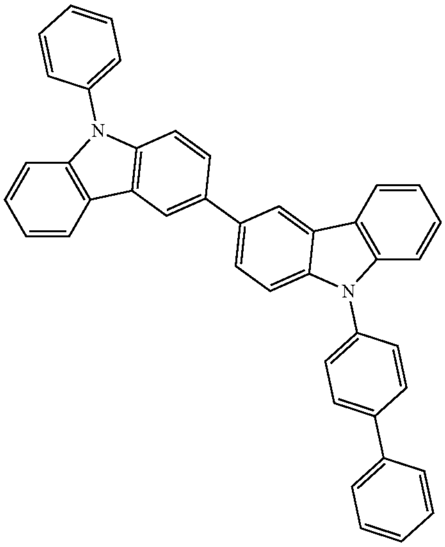
GPH-46
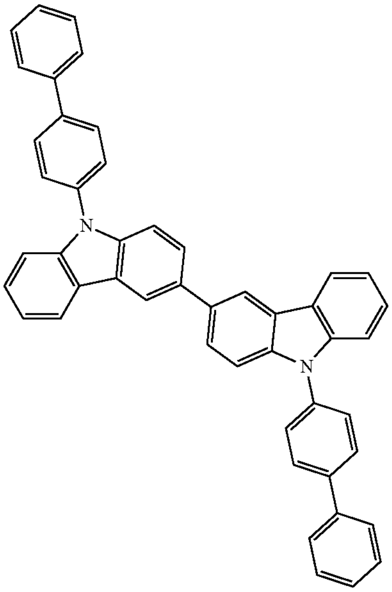
-continued
GPH-47
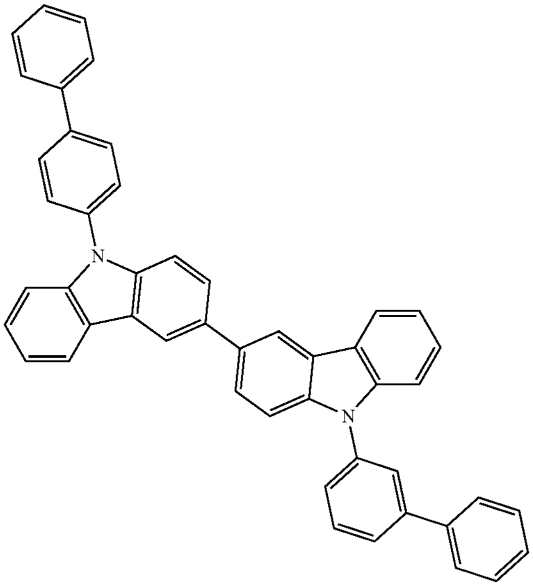
GPH-48
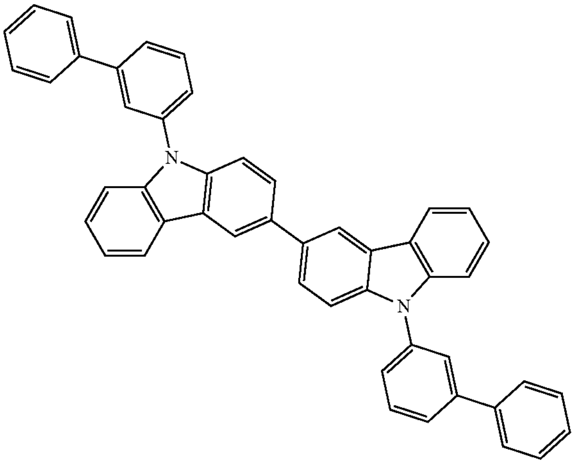
GPH-49
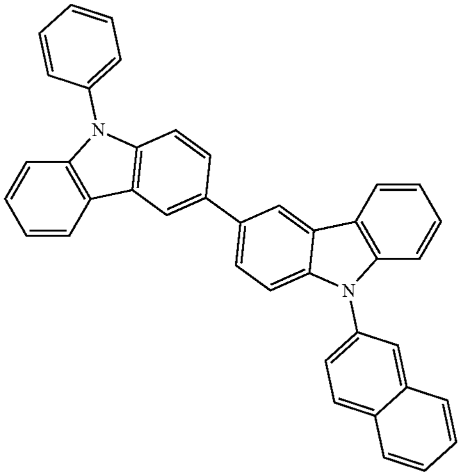

-continued
GPH-50
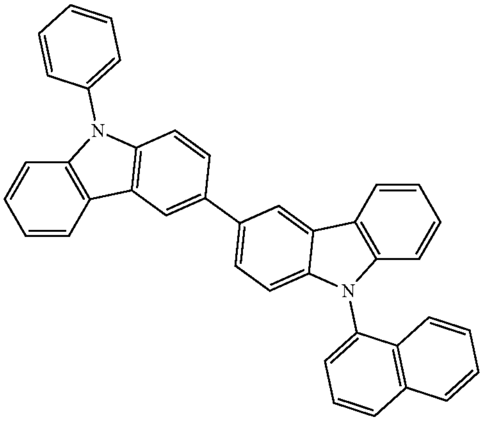
GPH-51
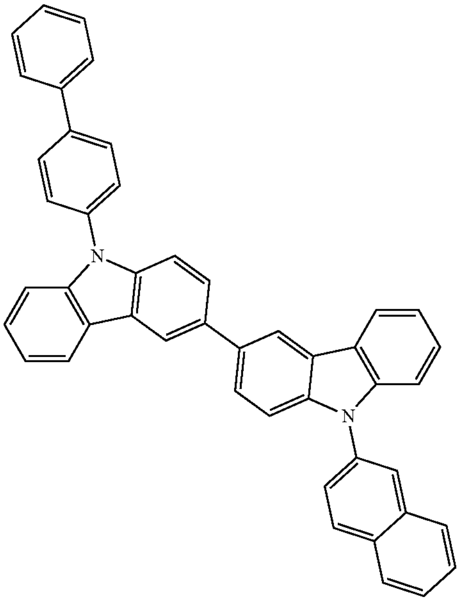
GPH-52
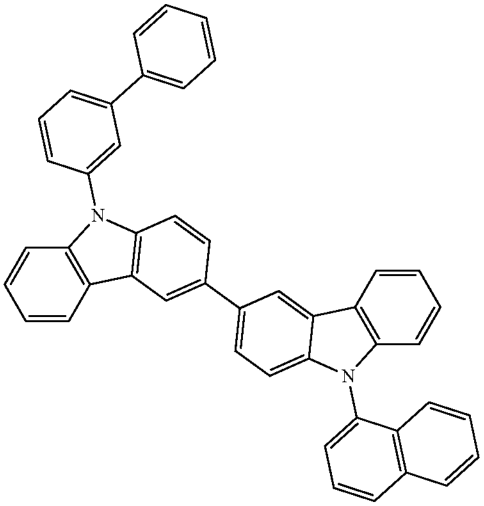
-continued
GPH-53
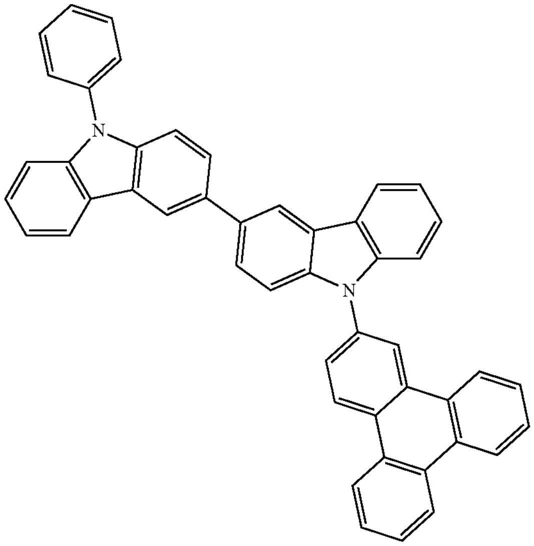
GPH-54
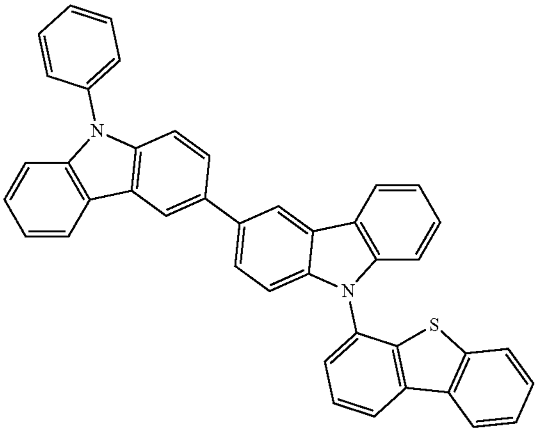
GPH-55
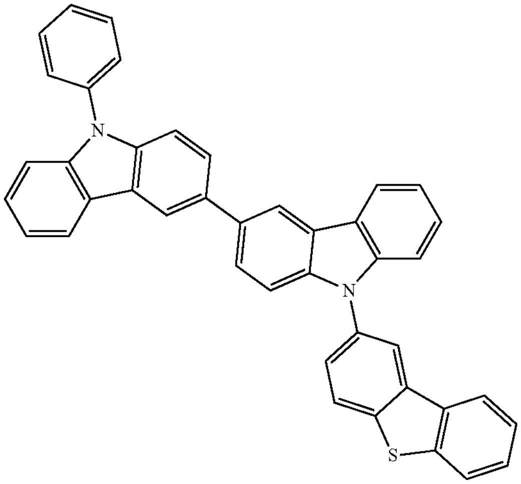

-continued
GPH-56
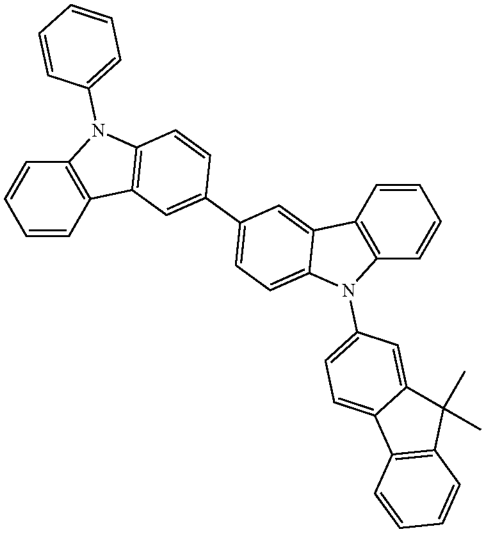
GPH-57
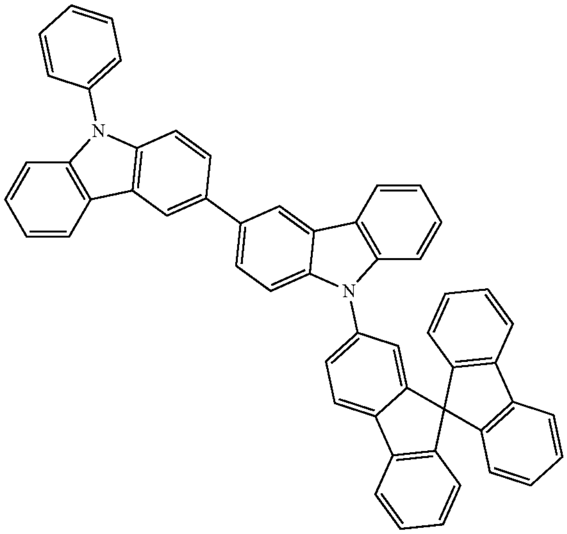
GPH-58
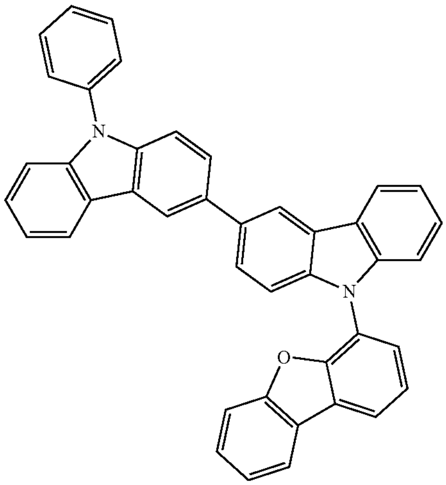
-continued
GPH-59
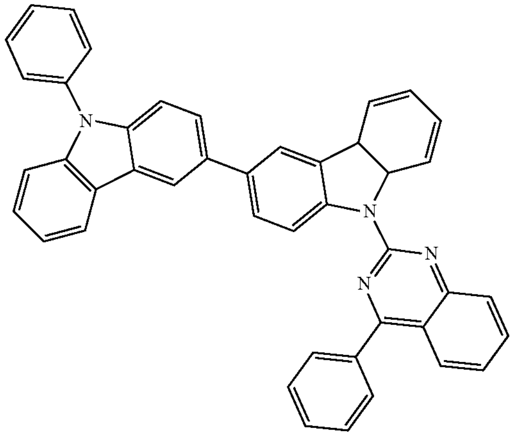
GPH-60
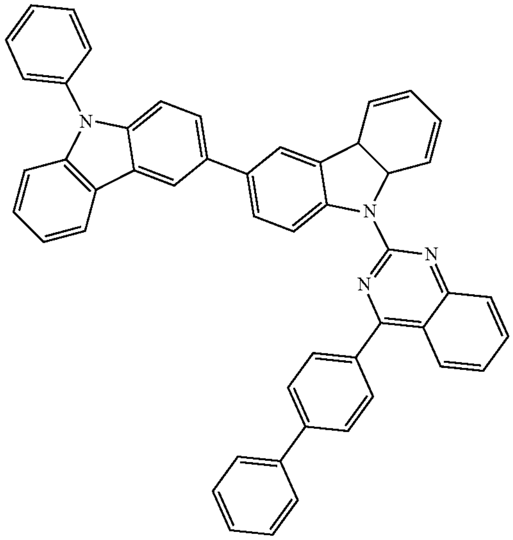
GPH-61
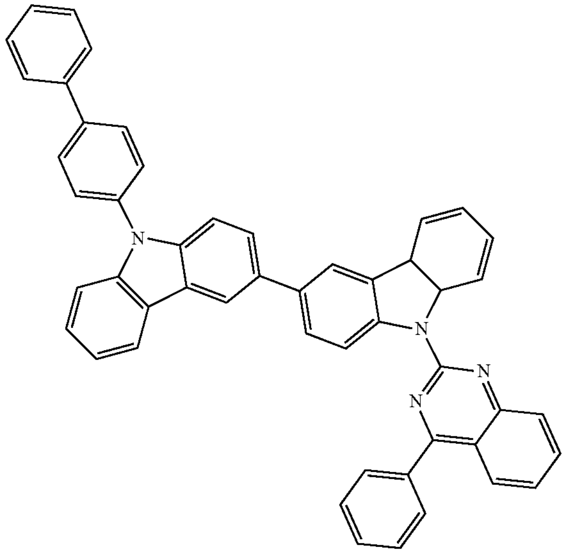

-continued
GPH-62
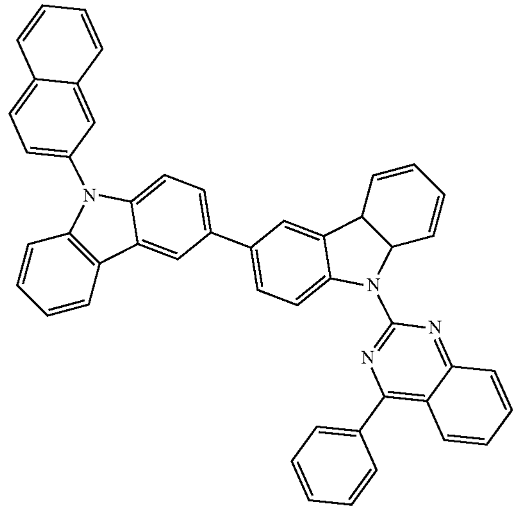
GPH-63
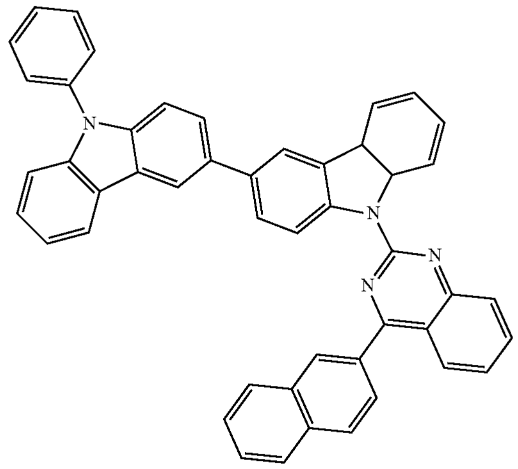
GPH-64
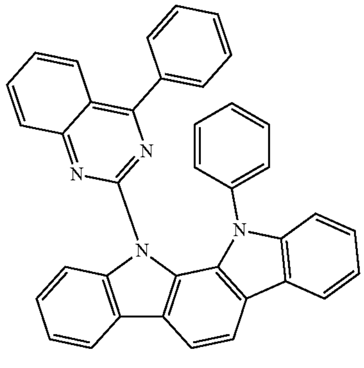
-continued
GPH-65
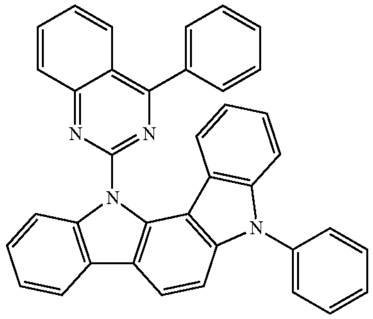
GPH-66
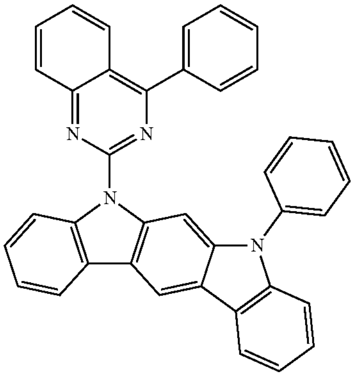
GPH-67
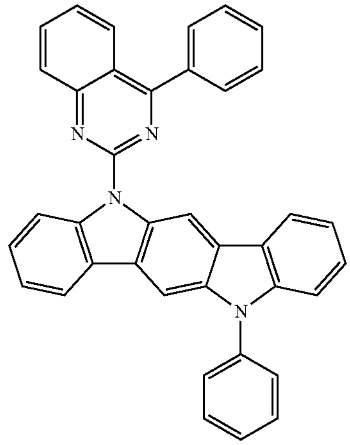
GPH-68
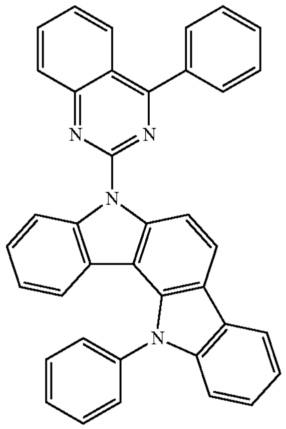

-continued
GPH-69
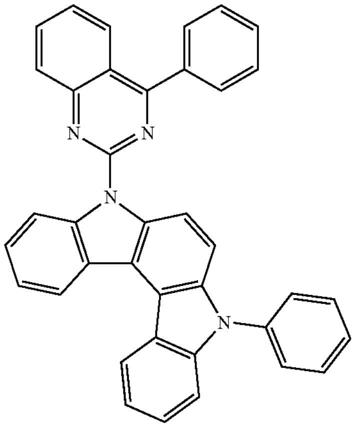
GPH-70
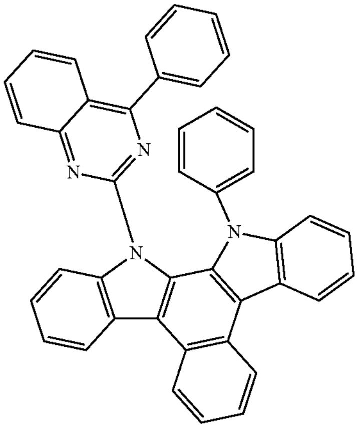
GPH-71
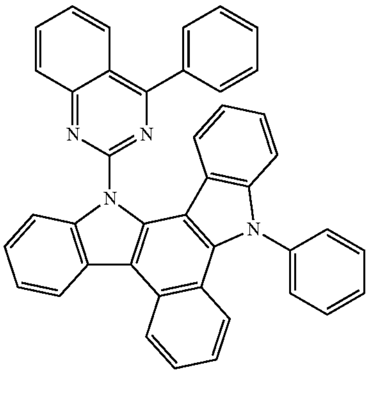
-continued
GPH-72
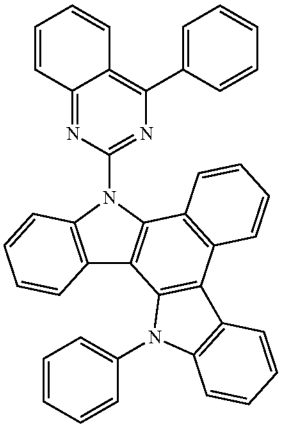
GPH-73
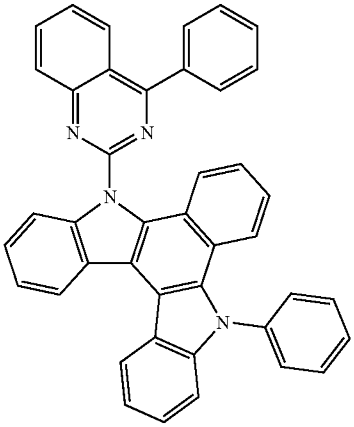
GPH-74
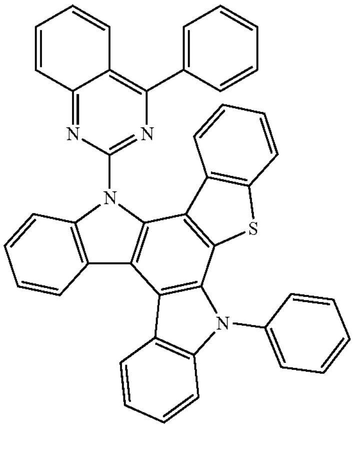

-continued
GPH-75
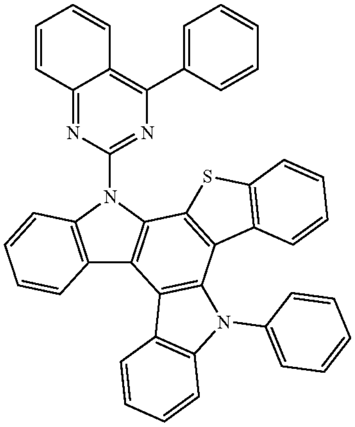
GPH-77
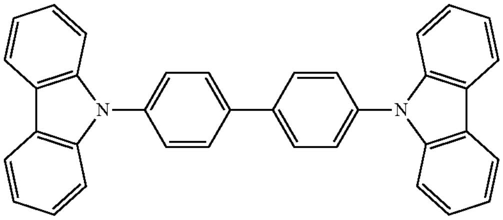
GPH-78
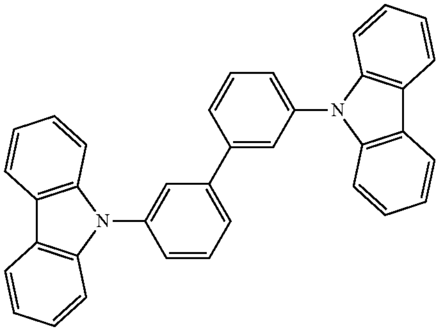
-continued
GPH-79
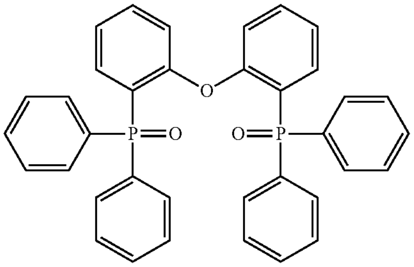
GPH-80
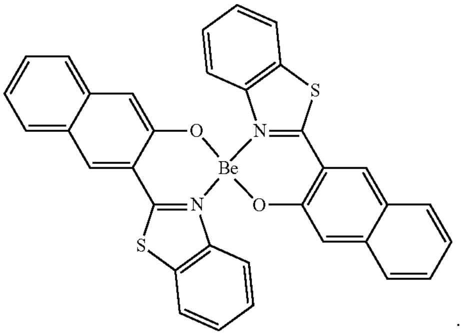
.
* * * * *